US012799389B2

(12) United States Patent
Jung et al.

(10) Patent No.: US 12,799,389 B2
(45) Date of Patent: Nov. 17, 2026

(54) ORGANIC ELECTROLUMINESCENT COMPOUND, A PLURALITY OF HOST MATERIALS, AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: So-Young Jung, Gyeonggi-do (KR); Su-Hyun Lee, Gyeonggi-do (KR); Jin-Ri Hong, Gyeonggi-do (KR); Ji-Song Jun, Gyeonggi-do (KR); Sang-Hee Cho, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 728 days.

(21) Appl. No.: 17/224,075

(22) Filed: Apr. 6, 2021

(65) Prior Publication Data

US 2021/0320263 A1 Oct. 14, 2021

(30) Foreign Application Priority Data

Apr. 6, 2020 (KR) ........................ 10-2020-0041645
Feb. 3, 2021 (KR) ........................ 10-2021-0015149

(51) Int. Cl.

| | |
|---|---|
| ***C09K 11/06*** | (2006.01) |
| ***H10K 50/17*** | (2023.01) |
| ***H10K 85/60*** | (2023.01) |
| ***H10K 101/00*** | (2023.01) |

(52) U.S. Cl.

CPC ............ *C09K 11/06* (2013.01); *H10K 85/622* (2023.02); *H10K 85/624* (2023.02); *H10K 85/633* (2023.02); *H10K 85/6572* (2023.02); *H10K 85/6574* (2023.02); *H10K 85/6576* (2023.02); *H10K 50/17* (2023.02); *H10K 2101/90* (2023.02)

(58) Field of Classification Search

CPC ......................... H10K 2101/90; H10K 85/624
See application file for complete search history.

(56) References Cited

U.S. PATENT DOCUMENTS

| | | | | |
|---|---|---|---|---|
| 2009/0079329 | A1 | 3/2009 | Murakami et al. | |
| 2014/0231769 | A1* | 8/2014 | Nishimura | H10K 50/00 257/40 |
| 2016/0181548 | A1 | 6/2016 | Parham et al. | |
| 2016/0233436 | A1 | 8/2016 | Zeng et al. | |
| 2019/0036059 | A1* | 1/2019 | Ji | H10K 85/625 |
| 2019/0165282 | A1 | 5/2019 | Parham et al. | |
| 2019/0214573 | A1 | 7/2019 | Ryu et al. | |
| 2020/0203623 | A1 | 6/2020 | Lee et al. | |
| 2020/0388768 | A1 | 12/2020 | Masuda et al. | |
| 2021/0111350 | A1 | 4/2021 | Smith | |
| 2021/0151693 | A1 | 5/2021 | Lee et al. | |
| 2021/0179596 | A1 | 6/2021 | Park et al. | |
| 2021/0296595 | A1 | 9/2021 | Cho et al. | |
| 2021/0340103 | A1 | 11/2021 | Mun et al. | |
| 2021/0359216 | A1 | 11/2021 | Kim et al. | |
| 2022/0109110 | A1 | 4/2022 | Park et al. | |
| 2022/0384744 | A1 | 12/2022 | Lee et al. | |
| 2023/0086039 | A1* | 3/2023 | Kim | H10K 85/633 257/40 |

FOREIGN PATENT DOCUMENTS

| | | | | |
|---|---|---|---|---|
| JP | 2011077330 | A | 4/2011 | |
| JP | 2019057484 | A | 4/2019 | |
| KR | 20120033017 | A | 4/2012 | |
| KR | 20130128322 | A | 11/2013 | |
| KR | 2015086069 | A * | 7/2015 | C07D 401/04 |
| KR | 20150086069 | A | 7/2015 | |
| KR | 20160049083 | A | 5/2016 | |
| KR | 20170134264 | A † | 12/2016 | |
| KR | 20190038109 | A † | 4/2019 | |
| KR | 20190085878 | A | 7/2019 | |
| KR | 20190085880 | A | 7/2019 | |
| KR | 20190135707 | A † | 12/2019 | |
| KR | 20200000122 | A † | 1/2020 | |
| KR | 20200018229 | A † | 2/2020 | |
| KR | 20210113959 | A | 9/2021 | |
| KR | 20210113960 | A | 9/2021 | |
| WO | 21182833 | A1 † | 9/2021 | |
| WO | 21182893 | A1 † | 9/2021 | |

OTHER PUBLICATIONS

Expedited Examination Report from KIPO for Korean application No. 10-2021-0015149; Application Date: Feb. 3, 2021.
3rd Party Observation for Korean application No. 10-2021-0015149; Application Date: Feb. 3, 2021.
Search Report from Korea Intellectual Property Office for Korea patent application No. 10-2024-0060466; Application Date: May 8, 2024.
Cited Reference from Japan Patent Office for Japan patent application No. 2021-052278; Application Date: Mar. 25, 2021.

* cited by examiner
† cited by third party

*Primary Examiner* — Sean M DeGuire
(74) *Attorney, Agent, or Firm* — G. Creston Campbell

(57) ABSTRACT

The present disclosure relates to an organic electroluminescent compound, a plurality of host materials comprising at least one first host compound and at least one second host compound, and an organic electroluminescent device comprising the same. By comprising the organic electroluminescent compound according to the present disclosure as a single host material, or the specific combination of compounds according to the present disclosure as a plurality of host materials, it is possible to provide an organic electroluminescent device having improved driving voltage, luminous efficiency, power efficiency and/or lifetime properties.

8 Claims, No Drawings

ORGANIC ELECTROLUMINESCENT COMPOUND, A PLURALITY OF HOST MATERIALS, AND ORGANIC ELECTROLUMINESCENT DEVICE COMPRISING THE SAME

TECHNICAL FIELD

The present disclosure relates to an organic electroluminescent compound, a plurality of host materials, and an organic electroluminescent device comprising the same.

BACKGROUND ART

A small molecular green organic electroluminescent device (OLED) was first developed by Tang, et al., of Eastman Kodak in 1987 by using TPD/ALq3 bi-layer consisting of a light-emitting layer and a charge transport layer. Thereafter, the development of OLEDs was rapidly effected and OLEDs have been commercialized. At present, OLEDs primarily use phosphorescent materials having excellent luminous efficiency in panel implementation. An OLED having low driving voltage, high luminous efficiency and/or long lifetime is required for long time use and high resolution of a display.

Korean Patent Application Laying-Open No. 2018-0038834 discloses a composition for an organic optoelectronic device comprising a compound having a dibenzofuran-based heteroaryl moiety and a carbazole-carbazole compound. However, said reference does not specifically disclose a specific combination of host materials claimed in the present disclosure. In addition, development of a light-emitting material having improved performances, for example, improved driving voltage, luminous efficiency, power efficiency and/or lifetime properties as compared with a combination of the specific compounds disclosed in the aforementioned reference is still required.

DISCLOSURE OF INVENTION

Technical Problem

The objective of the present disclosure is to provide an organic electroluminescent compound having a new structure suitable for applying it to an organic electroluminescent device. Another objective of the present disclosure is to provide an improved organic electroluminescent material capable of providing an organic electroluminescent device having improved driving voltage, luminous efficiency, and/or lifetime properties. Further objective of the present disclosure is to provide an organic electroluminescent device having improved driving voltage, luminous efficiency, power efficiency and/or lifetime properties by comprising a compound according to the present disclosure as a single host material, or a specific combination of compounds according to the present disclosure as a plurality of host materials.

Solution to Problem

As a result of intensive studies to solve the technical problems, the present inventors found that the above objective can be achieved by an organic electroluminescent compound represented by the following formula 1-A:

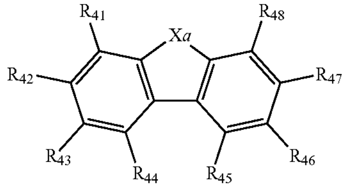

(1-A)

in formula 1-A, $X_a$ represents O or S; and at least one of $R_{41}$ to $R_{48}$ is represented by the following formula A-1, and the others, each independently, represent hydrogen, deuterium, or a (C6-C18)aryl unsubstituted or substituted with at least one of deuterium, a (C1-C6)alkyl(s), and a (C6-C18)aryl(s);

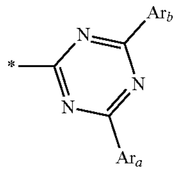

(A-1)

in formula A-1, $Ar_a$ and $Ar_b$, each independently, represent a phenyl unsubstituted or substituted with at least one of deuterium and naphthyl(s), a substituted or unsubstituted naphthyl, a biphenyl unsubstituted or substituted with deuterium, a terphenyl unsubstituted or substituted with deuterium, or a combination thereof, with the proviso that at least one of $Ar_a$ and $Ar_b$ represents a substituted or unsubstituted naphthyl;

with the proviso that in formula 1-A, if $R_{41}$ to $R_{43}$, and $R_{45}$ to $R_{48}$ are all hydrogen, $R_{44}$ is represented by formula A-1, and any one of $Ar_a$ and $Ar_b$ represents an unsubstituted naphthyl, the other of $Ar_a$ and $Ar_b$ represents a phenyl unsubstituted or substituted with at least one of deuterium and naphthyl(s), a substituted naphthyl, a biphenyl substituted with deuterium, or a terphenyl unsubstituted or substituted with deuterium.

In addition, the present inventors found that the above objective can be achieved by a plurality of host materials comprising at least one first host compound and at least one second host compound, wherein the first host compound is represented by the following formula 1, and a second host compound is represented by the following formula 2.

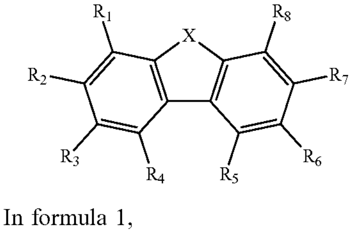

(1)

In formula 1,

X represents O or S;

$R_1$ to $R_8$, each independently, represent *-$(L_1)_a$-$L_2$-$(HAr)_b$, hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $—NR_{22}R_{23}$, or $—SiR_{24}R_{25}R_{26}$; or may be linked to an adjacent substituent to form a ring(s);

with the proviso that at least one of $R_1$ to $R_8$ represents $*-(L_1)_a-L_2-(HAr)_b$;

$L_1$, each independently, represents a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene;

$L_2$ represents an unsubstituted (3- to 30-membered)heteroarylene;

HAr, each independently, represents deuterium, a halogen, a cyano, a substituted or unsubstituted (C1-C30) alkyl, a substituted or unsubstituted (C3-C30)cycloalkyl, a substituted or unsubstituted (C3-C30) cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $—NR_{22}R_{23}$, or $—SiR_{24}R_{25}R_{26}$;

$R_{22}$ to $R_{26}$, each independently, represent hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; or may be linked to an adjacent substituent to form a ring(s); and a represents an integer of 0 to 2, and b represents an integer of 1 to 4, where if each of a and b is an integer of 2 or more, each of $L_1$ and each of HAr may be the same or different.

(2)

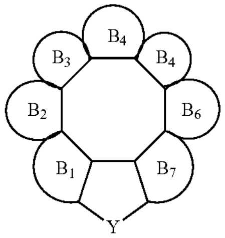

In formula 2, $B_1$ to $B_7$, each independently, are not present, or represent a substituted or unsubstituted (C5-C20) ring, in which carbon atoms of the ring may be replaced with at least one heteroatom selected from nitrogen, oxygen, and sulfur, with the proviso that at least five of $B_1$ to $B_7$ are present, and adjacent rings of $B_1$ to $B_7$ are fused with each other;

Y represents $—N(L_3-(Ar)_n)—$, —O—, —S—, or $—C(R_{31})(R_{32})—$;

$L_3$ represents a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene;

Ar represents a substituted or unsubstituted (C6-C30)aryl, a substituted or unsubstituted (3- to 30-membered) heteroaryl, or $—NR_{33}R_{34}$;

$R_{31}$ to $R_{34}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or may be linked to an adjacent substituent to form a ring(s); and n represents an integer of 1 or 2, where if n is 2, each of Ar may be the same or different.

Advantageous Effects of Invention

The organic electroluminescent compound according to the present disclosure exhibits the performances suitable for using it in an organic electroluminescent device. In addition, by comprising the compound according to the present disclosure as a single host material, or a specific combination of compounds according to the present disclosure as a plurality of host materials, an organic electroluminescent device having improved driving voltage, luminous efficiency, power efficiency, and/or lifetime properties compared to conventional organic electroluminescent devices can be provided, and it is possible to produce a display system or a lighting system using the same.

MODE FOR THE INVENTION

Hereinafter, the present disclosure will be described in detail. However, the following description is intended to explain the invention and is not meant in any way to restrict the scope of the present disclosure.

The term "organic electroluminescent compound" in the present disclosure means a compound that may be used in an organic electroluminescent device, and may be comprised in any layer constituting an organic electroluminescent device, as necessary.

The term "an organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

The term "a plurality of organic electroluminescent materials" in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials of the present disclosure may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. The at least two compounds may be comprised in the same layer or different layers, and may be mixture-evaporated or co-evaporated, or may be individually evaporated.

The term "a plurality of host materials" in the present disclosure means an organic electroluminescent material comprising a combination of at least two host materials. It may mean both a material before being comprised in an organic electroluminescent device (for example, before vapor deposition) and a material after being comprised in an organic electroluminescent device (for example, after vapor deposition). The plurality of host materials of the present disclosure may be comprised in any light-emitting layer constituting an organic electroluminescent device. At least two compounds comprised in the plurality of host materials of the present disclosure may be comprised together in one light-emitting layer or may respectively be comprised in different light-emitting layers. When at least two host materials are comprised in one layer, for example, they may be mixture-evaporated to form a layer or may be separately co-evaporated at the same time to form a layer.

Herein, the term "(C1-C30)alkyl(ene)" is meant to be a linear or branched alkyl(ene) having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, sec-butyl, tert-butyl, etc. The term "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl(ene)" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30) aryl(ene)" is meant to be a monocyclic or fused ring radical derived from an aromatic hydrocarbon having 6 to 30 ring backbone carbon atoms, in which the number of the ring backbone carbon atoms is preferably 6 to 25, and more preferably 6 to 18. The above aryl(ene) may be partially saturated, and may comprise a spiro structure. The above aryl may include phenyl, biphenyl, terphenyl, naphthyl, binaphthyl, phenylnaphthyl, naphthylphenyl, fluorenyl, phenylfluorenyl, diphenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, spiro[fluorene-benzofluorene]yl, azulenyl, etc. More specifically, the above aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyt, benzo[c]phenanthryl, benzo[g]chrysenyl, 1-triphenylenyl, 2-triphenylenyl, 3-triphenylenyl, 4-triphenylenyl, 1-fluorenyl, 2-fluorenyt, 3-fluorenyl, 4-fluorenyl, 9-fluorenyl, benzo[a]fluorenyl, benzo[b]fluorenyl, benzo[c]fluorenyl, dibenzofluorenyl, 2-biphenytyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenylyl, 4"-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc.

The term "(3- to 30-membered)heteroaryl(ene)" is meant to be an aryl(ene) having 3 to 30 ring backbone atoms, and including at least one, preferably 1 to 4 heteroatoms selected from the group consisting of B, N, O, S. Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, and pyridazinyl, and a fused ring-type heteroaryl such as benzofuranyl, benzothiophenyl, isobenzofuranyl, dibenzofuranyl, benzonaphthofuranyl, dibenzothiophenyl, benzonaphthothiophenyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, pyridopyrazinyl, carbazolyl, benzocarbazolyl, phenoxazinyl, phenanthridinyl, phenanthrooxazolyl, benzodioxolyl, dihydroacridinyl, benzofuropyridyl, benzofuropyrimidinyl, dibenzoselenophenyl, benzofuroquinolinyl, benzofuroquinazolinyl, benzofuronaphthyridinyl, naphthofuropyrimidinyl, benzothienoquinolinyl, benzothienoquinazolinyl, benzothienonaphthyridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzotriazolphenazinyl, imidazopyridyl, chromenoquinazolinyl, thiochromenoquinazolinyl, dimethylbenzoperimidinyl, indolocarbazolyl, indenocarbazolyl, etc. More specifically, the above heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthrdinyl, 10-phenanthridinyl, 1-acridinyl, 2-acridinyl, 3-acridinyl, 4-acrdinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-ted-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. Furthermore, "halogen" includes F, Cl, Br, and I.

In addition, "ortho (o-)," "meta (m-)," and "para (p-)" are prefixes, which represent the relative positions of substituents respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

Herein, a ring formed by a linkage of adjacent substituents may be a substituted or unsubstituted, mono- or polycyclic, (3- to 30-membered) alicyclic or aromatic ring, or the combination thereof, which two or more adjacent substituents are linked or fused to form. Preferably, the ring may be a substituted or unsubstituted, mono- or polycyclic, (3- to 26-membered) alicyclic or aromatic ring, or the combination thereof. More preferably, the ring may be an unsubstituted, mono- or polycyclic. (5- to 20-membered) aromatic ring. In addition, the formed ring may contain at least one heteroatom selected from B, N, O, S, Si, and P, preferably at least one heteroatom selected from N, O, and S. For example, the ring may be a substituted or unsubstituted, benzene, naphthalene, phenanthrene, fluorene, indene, indole, benzoindole, benzofuran, benzothiophene, dibenzothiophene, dibenzofuran, carbazole ring, etc.

Herein, "substituted" in the expression "substituted or unsubstituted" means that a hydrogen atom in a certain functional group is replaced with another atom or another functional group, i.e., a substituent, and also includes that the hydrogen atom is replaced with a group formed by a linkage of two or more substituents of the above substituents. For example, the "group formed by a linkage of two or more substituents" may be pyridine-triazine. That is, pyridine-triazine may be interpreted as one heteroaryl substituent, or as substituents in which two heteroaryl substituents are linked. Herein, the substituent(s) of the substituted alkyl, the substituted alkylene, the substituted aryl, the substituted arylene, the substituted heteroaryl, the substituted heteroarylene, the substituted cycloalkyl, the substituted cycloalkylene, the substituted cycloalkenyl, the substituted heterocycloalkyl, and the substituted ring(s), each independently, are at least one selected from the group consisting of deuterium; a halogen; a cyano; a carboxyl; a nitro; a hydroxyl; a phosphineoxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with at least one of a (C1-C30)alkyl(s) and a (C6-C30)aryl(s); a (C6-C30)aryl unsubstituted or substituted with at least one of deuterium, a (C1-C30)alkyl(s), a (3- to 30-membered) heteroaryl(s), and a mono- or di- (C1-C30)arylamino(s); a tri(C1-C30)alkylsilyl; a tri(C6-C30)arylsilyl; a di(C1-C30) alkyl(C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di- (C1-C30)alkylamino; a mono- or di- (C2-C30)alkenylamino; a mono- or di- (C6-C30)arylamino; a mono- or di- (3- to 30-membered)heteroarylamino; a (C1-C30)alkyl(C2-C30) alkenylamino; a (C1-C30)alkyl(C6-C30)arylamino; a (C1-C30)alkyl(3- to 30-membered)heteroarylamino; a (C2-C30) alkenyl(C6-C30)arylamino; a (C2-C30)alkenyl(3- to 30-membered)heteroarylamino; a (C6-C30)aryl(3- to 30-membered)heteroarylamino; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl. According to one embodiment of the present disclosure, the substituent(s), each independently, are at least one selected from the group consisting of deuterium; a (C1-C20)alkyl; a (5- to 30-membered)heteroaryl unsubstituted or substituted with a (C6-C25)aryl(s); a (C6-C25)aryl unsubstituted or substituted with at least one of deuterium, a (C1-C20)alkyl (s), a (5- to 30-membered)heteroaryl(s), and di(C6-C25) arylamino(s); and a mono- or di- (C6-C25)arylamino. According to another embodiment of the present disclosure, the substituent(s), each independently, are at least one selected from the group consisting of deuterium; a (C1-C10) alkyl; a (5- to 26-membered)heteroaryl unsubstituted or substituted with a (C6-C18)aryl(s); a (C6-C18)aryl unsubstituted or substituted with at least one of deuterium, a (C1-C10)alkyl(s), a (5- to 26-membered)heteroaryl(s), and di(C6-C18)arylamino(s); and a di(C6-C18)arylamino. For example, the substituent(s), each independently, may be at least one selected from the group consisting of deuterium; a methyl; a phenyl unsubstituted or substituted with at least one of deuterium, a dibenzofuranyl(s), a carbazolyl(s), a phenylquinoxalyl(s), a 26-membered heteroaryl(s), and a diphenylamino(s); a naphthyl; a biphenyl; a naphthylphenyl; a phenylnaphthyl; a phenanthrenyl; a dimethylfluorenyl; a dimethylbenzofluorenyl; a terphenyl; a triphenylenyl; a pyridyl unsubstituted or substituted with a phenyl(s); a triazinyl substituted with a phenyl(s); a phenylquinoxalinyl; a dibenzothiophenyl; a dibenzofuranyl; a carbazole unsubstituted or substituted with a phenyl(s); a 26-membered heteroaryl; and a diphenylamino.

In the formulas of the present disclosure, heteroaryl, heteroarylene, and heterocycloalkyl may, each independently, contain at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di- (C1-C30)alkylamino, a substituted or unsubstituted mono- or di- (C6-C30)arylamino, and a substituted or unsubstituted (C1-C30) alkyl(C6-C30)arylamino.

In formula 1, X represents O or S.

In formula 1, $R_1$ to $R_8$, each independently, represent $*-(L_1)_a-L_2-(HAr)_b$, hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $—NR_{22}R_{23}$, or $—SiR_{24}R_{25}R_{26}$; or may be linked to an adjacent substituent to form a ring(s), with the proviso that at least one of $R_1$ to $R_8$ represents $*-(L_1)_a-L_2-(HAr)_b$. According to one embodiment of the present disclosure, $R_1$ to $R_8$, each independently, represent hydrogen, deuterium, a substituted or unsubstituted (C6-C18)aryl, or $*-(L_1)_a-L_2(HAr)_b$, with the proviso that at least one of $R_1$ to $R_8$ represents $*-(L_1)_a-L_2-(HAr)_b$. According to another embodiment of the present disclosure, any one of $R_1$ to $R_8$ represents $*-(L_1)_a-L_2-(HAr)_b$, and the others, each independently, represent hydrogen, deuterium, a (C6-C18)aryl unsubstituted or substituted with at least one of deuterium, a (C1-C6)alkyl(s), and a (C6-C18)aryl(s). For example, any one of $R_1$ to Re may be $*-(L_1)_a-L_2-(HAr)_b$, and the others, each independently, may be hydrogen, a substituted or unsubstituted phenyl, a substituted or unsubstituted naphthyl, a biphenyl, a phenanthrenyl, a chrisenyl, a terphenyl, or a triphenylenyl, etc., in which the substituent(s) of the substituted phenyl and the substituted naphthyl may be at least one selected from the group consisting of a phenyl, a naphthyl, and a phenanthrenyl.

$L_1$, each independently, represents a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene. According to one embodiment of the present disclosure, $L_1$, each independently, represents a substituted or unsubstituted (C6-C25) arylene. According to another embodiment of the present disclosure, $L_1$, each independently, represents an unsubstituted (C6-C18)arylene. For example, $L_1$, each independently, may be a phenylene, a naphthylene, a biphenylene, a phenyinaphthylene, or a naphthylphenylene, etc.

$L_2$ represents an unsubstituted (3- to 30-membered)heteroarylene. According to one embodiment of the present disclosure, $L_2$ represents an unsubstituted (5- to 25-membered)heteroarylene. According to another embodiment of the present disclosure, $L_2$ represents an unsubstituted (5- to 20-membered)heteroarylene. Specifically, $L_2$ may be a triazinylene, a pyridylene, a pyrimidinylene, a quinazolinylene, a benzoquinazolinylene, a quinoxalinylene, a benzoquinoxalinylene, a quinolylene, a benzoquinolylene, an isoquinolylene, a benzoisoquinolylene, a triazolylene, a pyrazolylene, a naphthyridinylene, a triazanaphthylene, a pyridopyrazinylene, a benzothienopyrimidinylene, etc. For example, $L_2$ may be a triazinylene, a quinazolinylene, a benzoquinazolinylene, a quinoxalinylene, a benzoquinoxalinylene, a naphthyridinylene, or a pyridopyrazinylene, etc.

HAr, each independently, represents deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $-NR_{22}R_{23}$, or $-SiR_{24}R_{25}R_{26}$. According to one embodiment of the present disclosure, HAr, each independently, represents a substituted or unsubstituted (C6-C25)aryl, or a substituted or unsubstituted (5- to 25-membered)heteroaryl. According to another embodiment of the present disclosure, HAr, each independently, represents a (C6-C18)aryl unsubstituted or substituted with at least one of a (C1-C10)alkyl(s), a (10- to 20-membered)heteroaryl(s), and di(C6-C18)arylamino(s); or a (5- to 20-membered)heteroaryl unsubstituted or substituted with a (C6-C18)aryl(s). For example, HAr, each independently, may be a phenyl unsubstituted or substituted with at least one of a dibenzofuranyl(s), a carbazolyl(s), a phenylquinoxalinyl(s), and a diphenylamino(s); a naphthyl; a biphenyl; a phenanthrenyl; a dimethylfluorenyl; a dimethylbenzofluorenyl; a naphthylphenyl; a phenylnaphthyl; a terphenyl; a triphenylenyl; a dibenzofuranyl; or a phenylcarbazolyl, etc.

$R_{22}$ to $R_{26}$, each independently, represent hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered) heterocycloalkyl, a substituted or unsubstituted (C6-C30) aryl, or a substituted or unsubstituted (3- to 30-membered) heteroaryl; or may be linked to an adjacent substituent to form a ring(s). According to one embodiment of the present disclosure, $R_{22}$ to $R_{26}$, each independently, represent hydrogen, a substituted or unsubstituted (C1-C20)alkyl, a substituted or unsubstituted (C6-C25)aryl, or a substituted or unsubstituted (5- to 25-membered)heteroaryl.

a represents an integer of 0 to 2, where if a is 2, each of $L_1$ may be the same or different.

b represents an integer of 1 to 4, where if b is an integer of 2 or more, each of HAr may be the same or different. According to one embodiment of the present disclosure, b represents an integer of 1 or 2, where if b is 2, each of HAr may be the same or different.

The formula 1 may be represented by at least one of the following formulas 1-1 to 1-4.

(1-1)

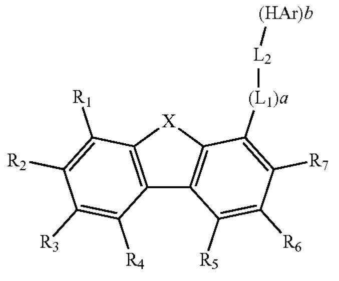

(1-2)

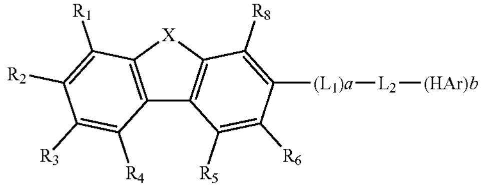

(1-3)

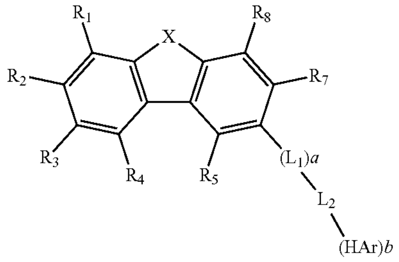

(1-4)

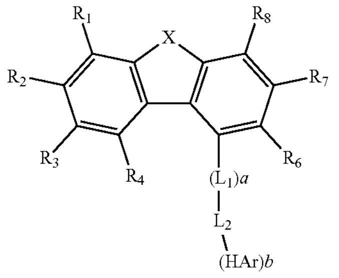

In formulas 1-1 to 1-4, $R_1$ to $R_8$, each independently, represent hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $-NR_{22}R_{23}$, or $-SiR_{24}R_{25}R_{26}$; or may be linked to an adjacent substituent to form a ring(s). For example, $R_1$ to $R_8$ may be hydrogen.

In formulas 1-1 to 1-4, X, $L_1$, $L_2$, HAr, a, b, and $R_{22}$ to $R_{26}$ are as defined in formula 1.

In formula 2, $B_1$ to $B_7$, each independently, are not present, or represent a substituted or unsubstituted (C5-C20) ring, preferably a substituted or unsubstituted (C5-C13) ring, in which carbon atoms of the ring may be replaced with at least one heteroatom selected from nitrogen, oxygen, and sulfur, with the proviso that at least five of $B_1$ to $B_7$ are present, and adjacent rings of $B_1$ to $B_7$ are fused with each other. Herein, "adjacent rings of $B_1$ to $B_7$ are fused with each other" means that ring $B_1$ and ring $B_2$, ring $B_2$ and ring $B_3$, ring $B_3$ and ring $B_4$, ring $B_4$ and ring $B_5$, ring $B_5$ and ring $B_6$, or ring $B_B$ and ring $B_7$ are fused with each other. According to one embodiment of the present disclosure, if any one of $B_1$ to $B_7$ represents a (C6-C20)aryl, an adjacent ring may not be present, or may be a C5 ring, in which carbon atoms of the ring may be replaced with at least one heteroatom selected from nitrogen, oxygen, and sulfur. According to another embodiment of the present disclosure, $B_1$ to $B_7$, each independently, are not present, or represent a substituted or unsubstituted benzene ring, a substituted or unsubstituted naphthalene ring, a substituted or unsubstituted pyrrole ring, a substituted or unsubstituted furan ring, a substituted or unsubstituted thiophene ring, a substituted or unsubstituted cyclopentadiene ring, a substituted or unsubstituted fluorene ring, a substituted or unsubstituted pyridine ring, or a substituted or unsubstituted dibenzofuran ring. For example, $B_1$ to $B_7$, each independently, may not be present, or may represent a benzene ring unsubstituted or substituted with a phenyl(s), a naphthyl(s) and/or a diphenyltriazinyl(s); a naphthalene ring; a cyclopentadiene ring unsubstituted or substituted with a methyl(s); a fluorene ring substituted with a methyl(s); a pyrrole ring substituted with an unsubstituted phenyl(s), a phenyl(s) substituted with at least one deuterium, a biphenyl(s) and/or a pyridyl(s); a furan ring; a thiophene ring; a pyridine ring; or a dibenzofuran ring unsubstituted or substituted with a diphenyltriazinyl(s).

In formula 2, Y represents $-N(L_3\text{-}(Ar)_n)-$, —O—, —S—, or $-C(R_{31})(R_{32})-$. According to one embodiment of the present disclosure, Y represents $-N(L_3\text{-}(Ar)_n)-$.

$L_3$ represents a single bond, a substituted or unsubstituted (C1-C30)alkylene, a substituted or unsubstituted (C6-C30) arylene, a substituted or unsubstituted (3- to 30-membered) heteroarylene, or a substituted or unsubstituted (C3-C30) cycloalkylene. According to one embodiment of the present disclosure, $L_3$ represents a single bond, a substituted or unsubstituted (C6-C25)arylene, or a substituted or unsubstituted (3- to 30-membered)heteroarylene. According to another embodiment of the present disclosure, $L_3$ represents a single bond, an unsubstituted (C6-C18)arylene, or an unsubstituted (5- to 25-membered)heteroarylene. For example, $L_3$ may be a single bond, a phenylene, a naphthylene, a biphenylene, a pyridylene, a pyrimidinylene, a triazinylene, a quinoxalinylene, a quinazolinylene, a dibenzofuranylene, a benzofuropyrimidinylene, a benzothienopyrimidinylene, an indolopyrimidinylene, or a benzoquinoxalinylene.

Ar represents a substituted or unsubstituted (C6-C30)aryl, a substituted or unsubstituted (3- to 30-membered)heteroaryl, or $-NR_{33}R_{34}$. According to one embodiment of the present disclosure, Ar represents a substituted or unsubstituted (C6-C25)aryl, a substituted or unsubstituted (5- to 25-membered)heteroaryl, or $-NR_{33}R_{34}$. According to another embodiment of the present disclosure, Ar represents a (C6-C25)aryl unsubstituted or substituted with at least one of deuterium, a (C1-C6)alkyl(s), and a (3- to 30-membered) heteroaryl(s); a (5- to 25-membered)heteroaryl unsubstituted or substituted with at least one of deuterium, a (C6-C18)aryl(s), and a (3- to 30-membered)heteroaryl(s); or $-NR_{33}R_{34}$. For example, Ar may be an unsubstituted phenyl, a phenyl substituted with at least one deuterium, a phenyl substituted with a 26-membered heteroaryl(s), a naphthyl, a biphenyl, a fluorenyl substituted with a methyl(s), a spirobifluorenyl, a terphenyl, a triphenylenyl, a pyridyl unsubstituted and substituted with a phenyl(s), a pyrimidinyl substituted with a phenyl(s), a substituted triazinyl, a substituted quinoxalinyl, a substituted quinazolinyl, a benzoquinoxalinyl substituted with a phenyl(s), a carbazolyl, a dibenzofuranyl, a dibenzothiophenyl, a benzofuropyrimidinyl substituted with a phenyl(s), a benzothienopyrimidinyl substituted with a phenyl(s), an indolopyrimidinyl substituted with a phenyl(s), or $-NR_{33}R_{34}$. The substituent(s) of the substituted triazinyl, the substituted quinoxalinyl, and the substituted quinazolinyl, each independently, may be at least one selected from the group consisting of a phenyl unsubstituted or substituted with at least one of deuterium and a 26-membered heteroaryl(s), a naphthyl, a biphenyl, a terphenyl, a dibenzofuranyl, a pyridyl substituted with a phenyl(s), a dimethylfluorenyl, and a dibenzothiophenyl.

$R_{31}$ to $R_{34}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or may be linked to an adjacent substituent to form a ring(s). According to one embodiment of the present disclosure, $R_{31}$ to $R_{34}$, each independently, represent hydrogen, deuterium, a substituted or unsubstituted (C1-C20)alkyl, or a substituted or unsubstituted (C6-C25)aryl. According to another embodiment of the present disclosure, $R_{31}$ and $R_{32}$, each independently, represent an unsubstituted (C1-C10) alkyl, and $R_{33}$ and $R_{34}$, each independently, represent an unsubstituted (C6-C18)aryl. For example, $R_{31}$ and $R_{32}$ may be a methyl, and $R_{33}$ and $R_{34}$ may be a phenyl.

n represents an integer of 1 or 2, where if n is 2, each of Ar may be the same or different.

The formula 2 may be represented by at least one of the following formulas 2-1 to 2-4.

(2-1)

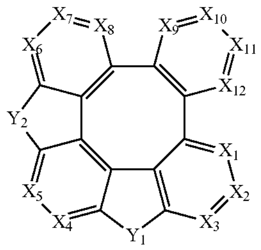

(2-2)

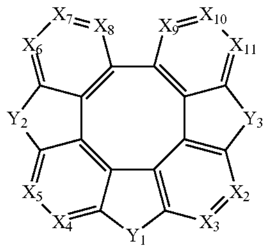

(2-3)

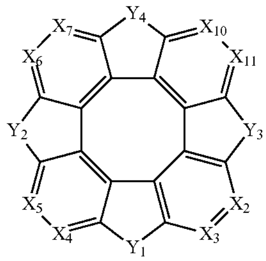

-continued (2-4)

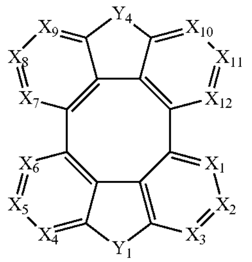

In formulas 2-1 to 2-4, $Y_1$, $Y_2$, $Y_3$, and $Y_4$, each independently, are the same as the definition of Y in formula 2, where if a plurality of Ar's are present, each of Ar may be the same or different; $X_1$ to $X_{12}$, each independently, represent —N═ or —C($R_a$)═; and $R_a$, each independently, represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl; or adjacent $R_a$'s may be linked to each other to form a ring(s), where if a plurality of $R_a$'s are present, each of $R_a$ may be the same or different.

According to one embodiment of the present disclosure, $R_a$ represents hydrogen, deuterium, a substituted or unsubstituted (C6-C25)aryl, or a substituted or unsubstituted (5- to 25-membered)heteroaryl; or adjacent $R_a$'s may be linked to each other to form a ring(s). According to another embodiment of the present disclosure. $R_a$ represents hydrogen, an unsubstituted (C6-C18)aryl, or a (5- to 25-membered)heteroaryl substituted with a (C6-C18)aryl(s); or adjacent $R_a$'s may be linked to each other to form a benzene ring(s), an indene ring(s) substituted with a methyl(s), or a benzofuran ring(s) unsubstituted or substituted with a diphenyltriazinyl (s).

In any one of formulas 2-1 to 2-4, at least one of Ar(s) and $R_a$(s), each independently, may be at least one selected from those listed in the following group 1.

[Group 1]

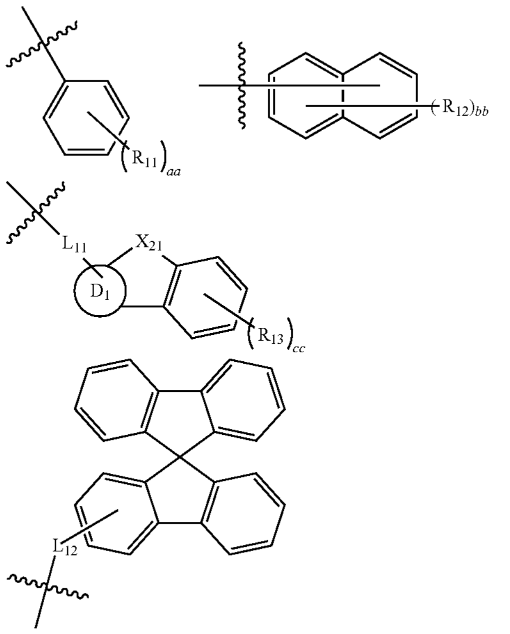

-continued

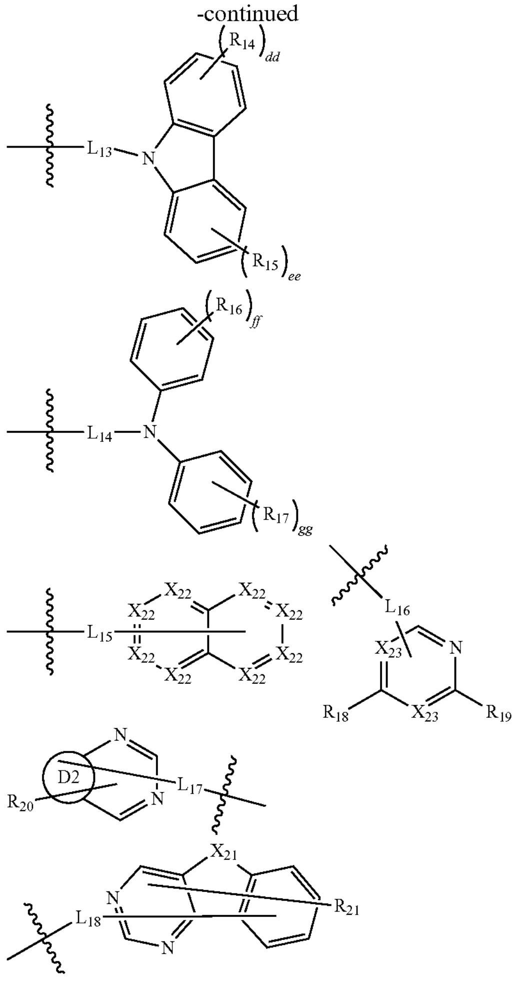

In group 1, D1 and D2, each independently, represent a benzene ring or a naphthalene ring; $X_{21}$ represents O, S, $NR_{35}$, or $CR_{36}R_{37}$; $X_2$, each independently, represents $CR_{38}$ or N, with the proviso that at least one of $X_{22}$ represents N; $X_{23}$, each independently, represents $CR_{39}$ or N; $L_{11}$ to $L_1$a, each independently, represent a single bond, a substituted or unsubstituted (C6-C30)arylene, or a substituted or unsubstituted (3- to 30-membered)heteroarylene; $R_{11}$ to $R_{21}$ and $R_{35}$ to $R_{39}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, or a substituted or unsubstituted (C3-C30)cycloalkyl, or may be linked to an adjacent substituent to form a ring(s); and aa, if, and gg, each independently, represent an integer of 1 to 5, bb represents an integer of 1 to 7, and cc, dd, and ee, each independently, represent an integer of 1 to 4, where each of aa to gg represents an integer of 2 or more, each $R_{11}$ to each of $R_{17}$ may be the same or different.

According to one embodiment of the present disclosure, D1 may be a benzene ring; $X_{21}$ may be O, S, or $CR_{36}R_{37}$; $L_{11}$ to $L_{18}$, each independently, may be a single bond; $R_{11}$ to $R_{21}$ and $R_{35}$ to $R_{39}$, each independently, may be hydrogen, deuterium, a substituted or unsubstituted (C1-C20)alkyl, a substituted or unsubstituted (C6-C25)aryl, or a substituted or unsubstituted (5- to 25-membered)heteroaryl, or may be linked to an adjacent substituent to form a ring(s); and aa, bb, ff, and gg, each independently, may be an integer of 1 to 5, and cc, dd, and ee, each independently, may be an integer of 1 to 4. For example, $R_{11}$ may be hydrogen, deuterium, a phenyl, a biphenyl, or a 26-membered heteroaryl; $R_{12}$ may be hydrogen, or adjacent $R_{12}$'s may be linked to each other to form a benzene ring(s); $R_{13}$, $R_{18}$, and $R_{17}$ may be hydrogen; $R_{18}$ and $R_{19}$ may be hydrogen or a phenyl; $R_{21}$ may be phenyl; Rae and $R_{37}$ may be a methyl; Rae may be hydrogen, a phenyl, a biphenyl, a dibenzofuranyl, or a dibenzothiophenyl, or adjacent $R_3$'s may be linked to each other to form a benzene ring(s); $R_{39}$ may be hydrogen, an unsubstituted phenyl, a phenyl substituted with at least one deuterium, a phenyl substituted with a 26-membered heteroaryl(s), a naphthyl, a biphenyl, a dimethylfluorenyl, a terphenyl, a pyridyl substituted with a phenyl(s), a dibenzofuranyl, or a dibenzothiophenyl; and aa may be an integer of 1 or 5, bb may be an integer of 1 or 4, and cc may be 1.

In any one of formulas 2-1 to 2-4, at least one of Ar(s) and $R_a$(s), each independently, may be at least one selected from those listed in the following group 2.

[Group 2]

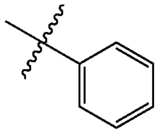

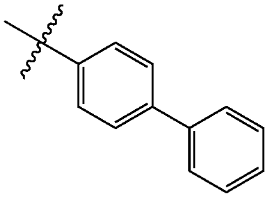

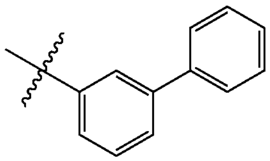

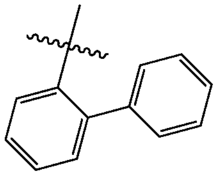

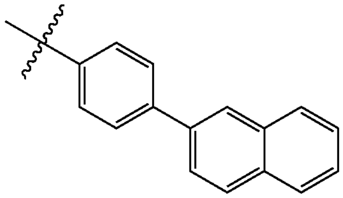

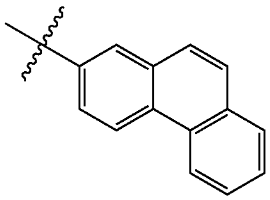

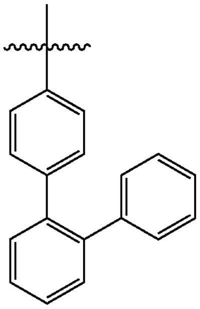

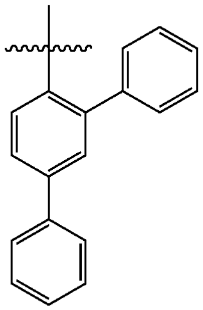

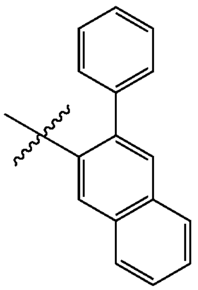

-continued

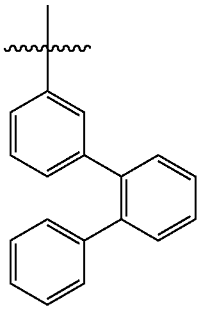

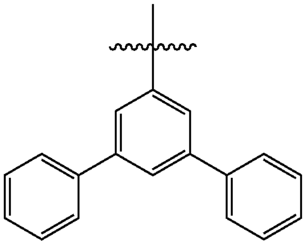

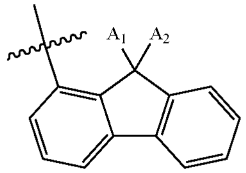

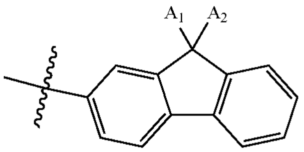

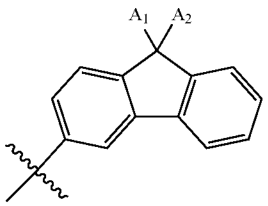

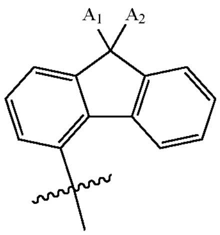

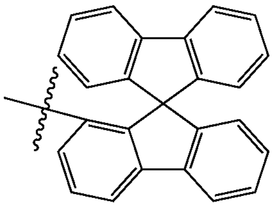

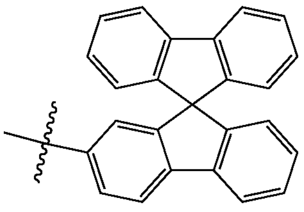

-continued
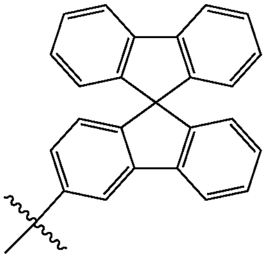
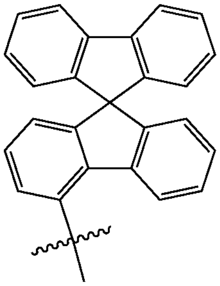
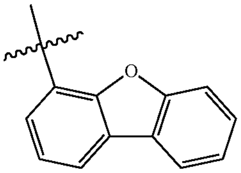
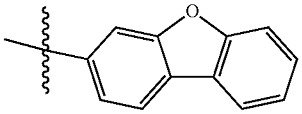
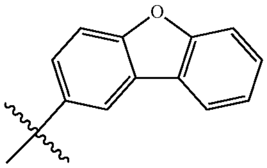
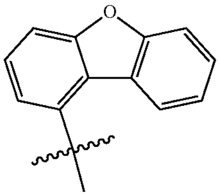
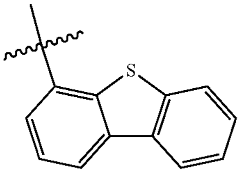
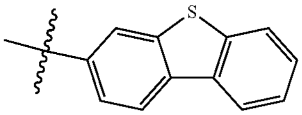
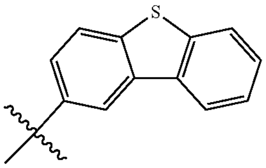
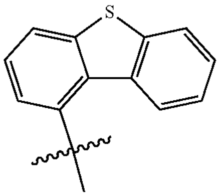
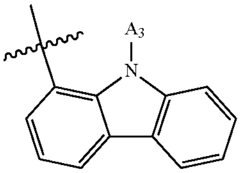
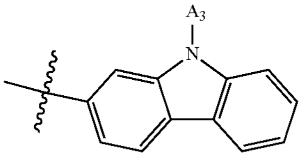
-continued
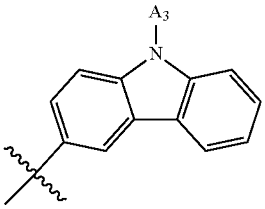
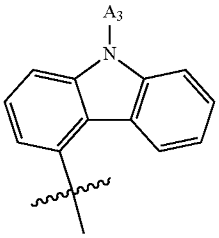
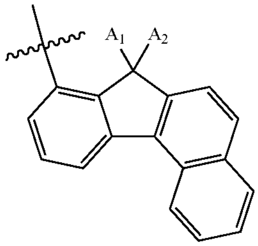
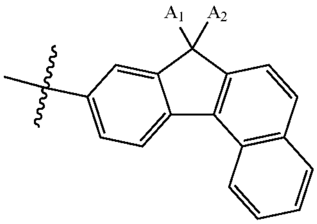
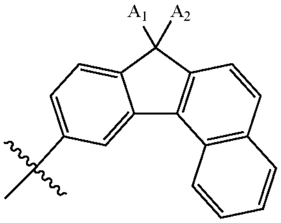
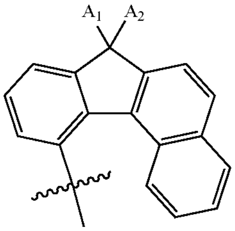
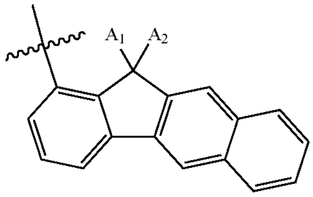
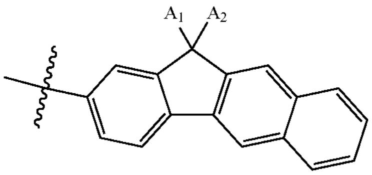
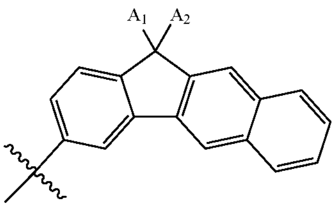

-continued
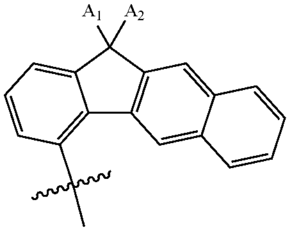
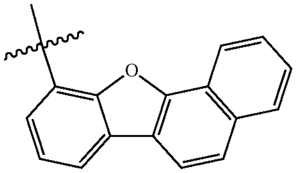
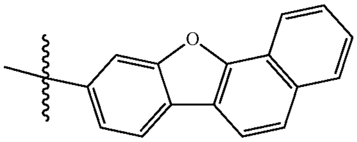
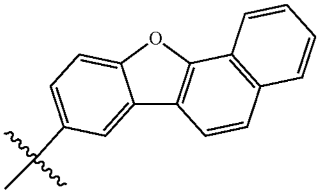
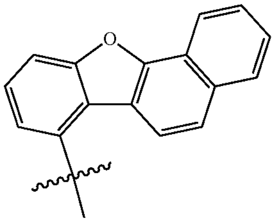
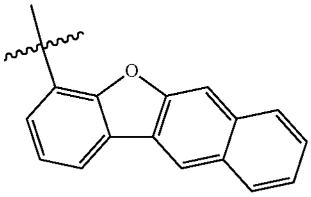
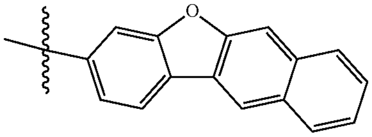
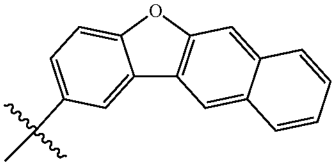
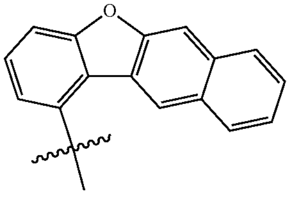
-continued
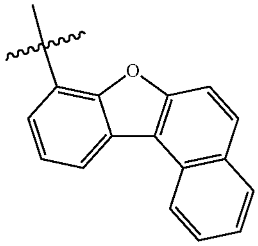
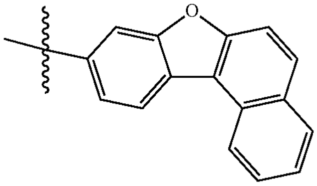
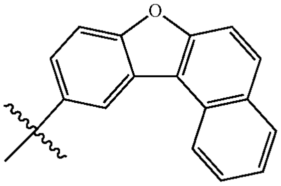
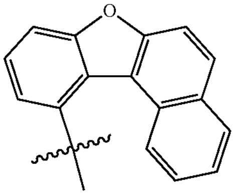
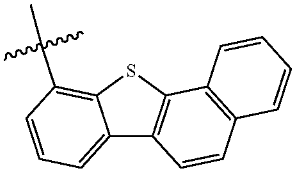
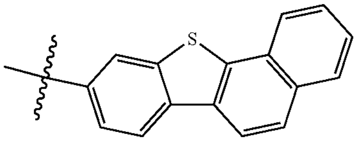
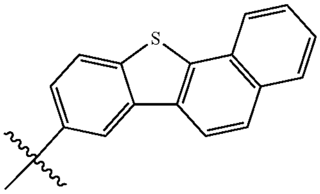
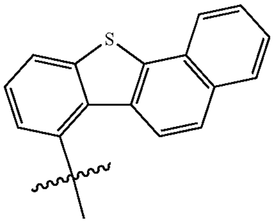
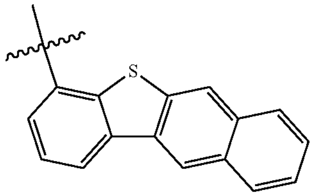
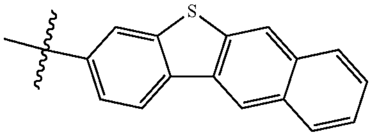

-continued
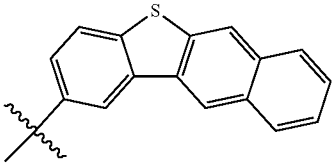
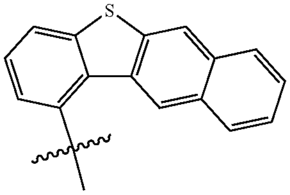
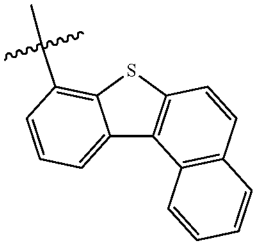
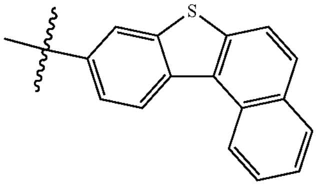
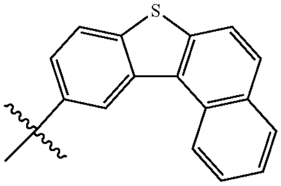
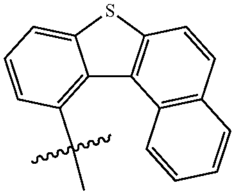
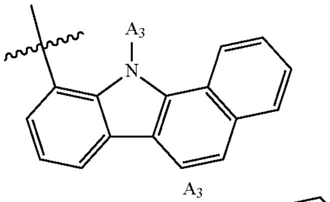
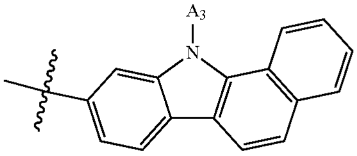
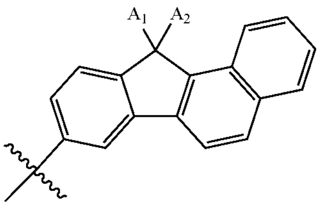
-continued
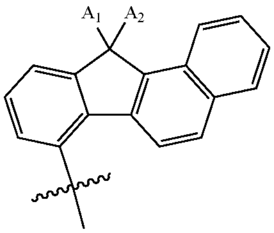
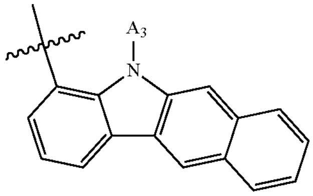
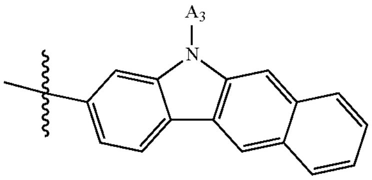
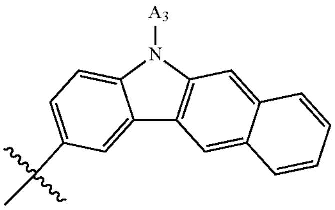
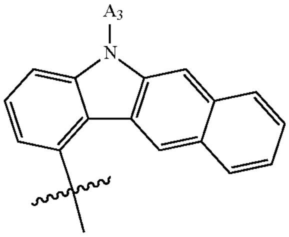
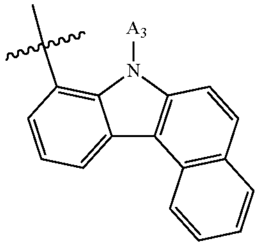
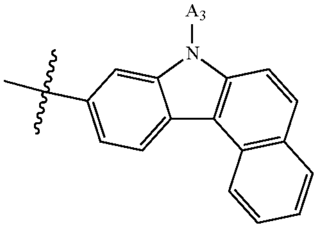

-continued
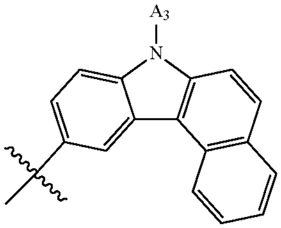
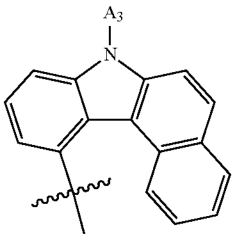
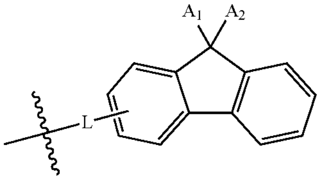
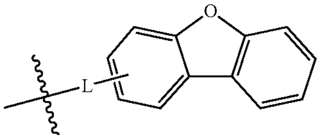
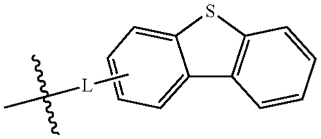
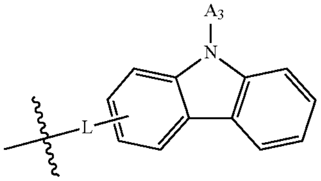
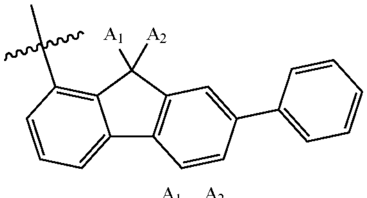
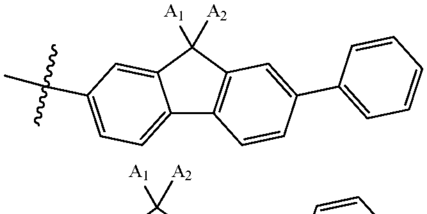
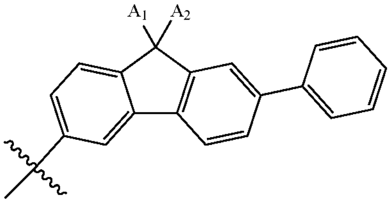
-continued
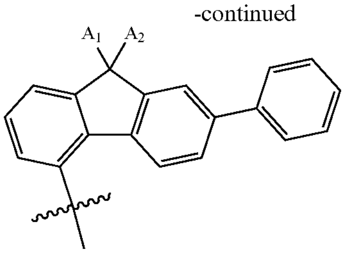
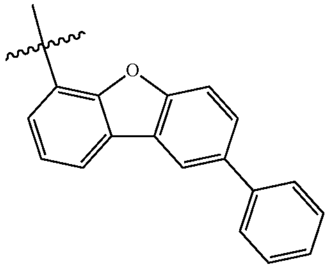
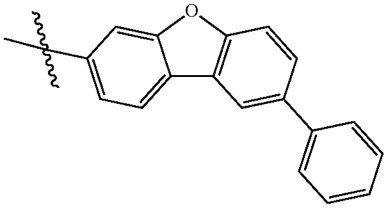
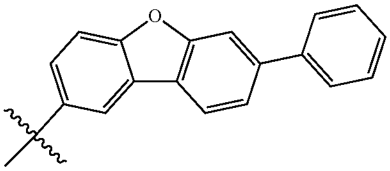
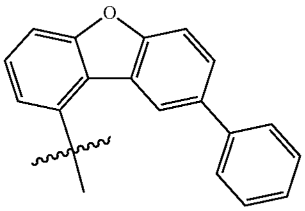
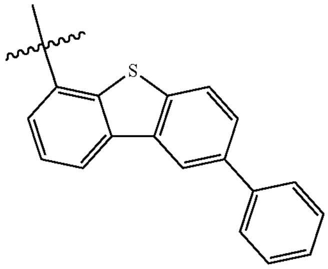
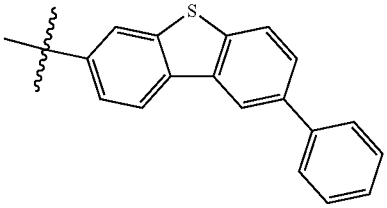
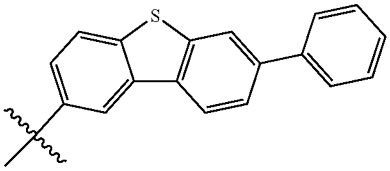

-continued
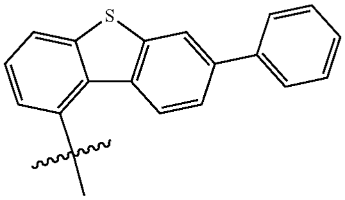
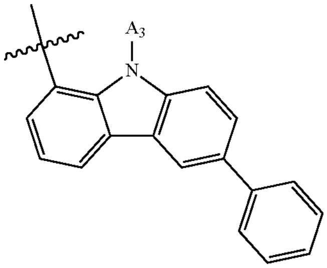
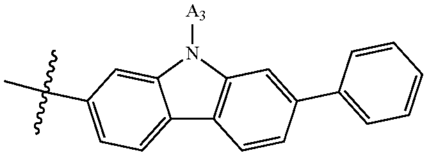
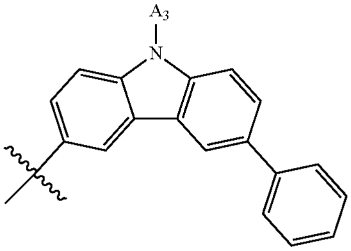
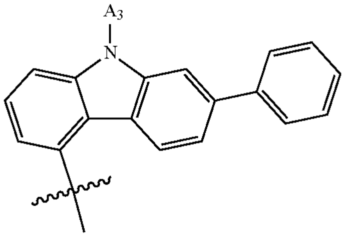
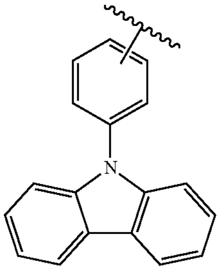
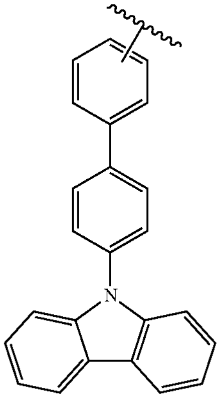
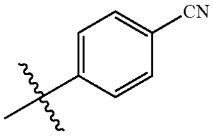
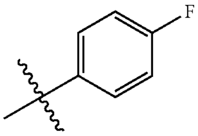
-continued
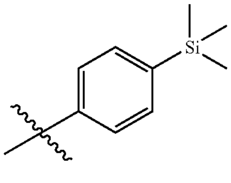
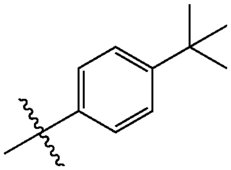
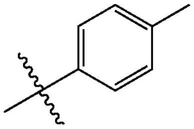
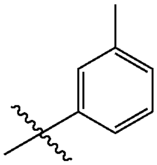
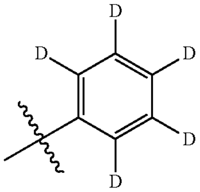
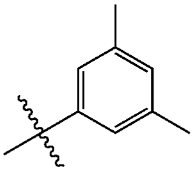
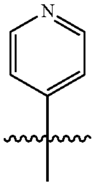
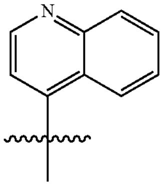
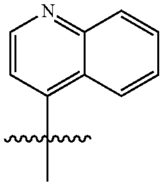
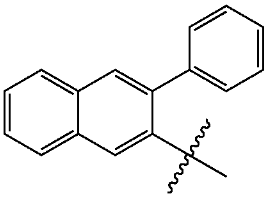
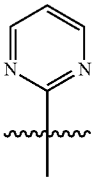
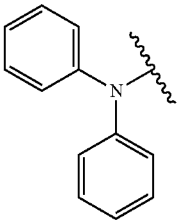
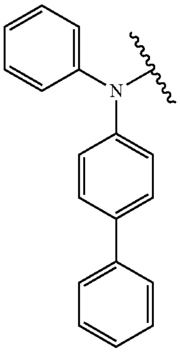
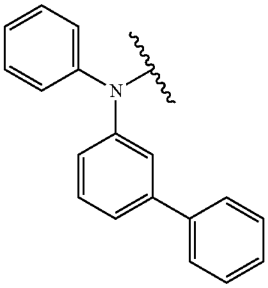
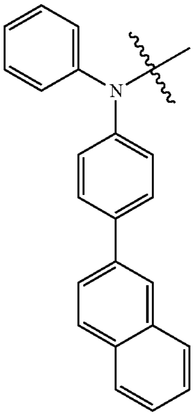

-continued

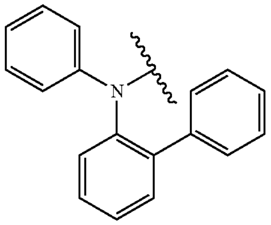

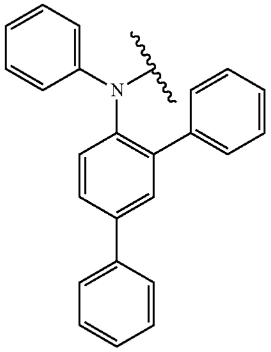

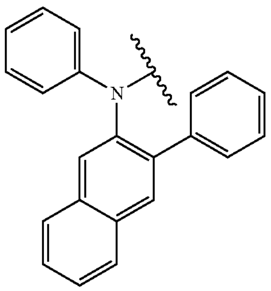

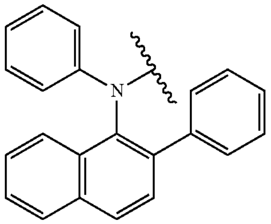

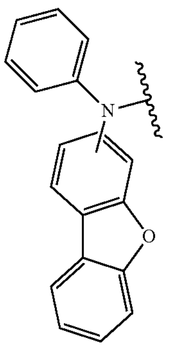

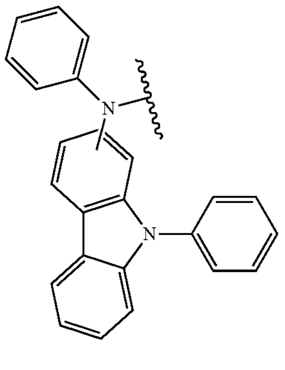

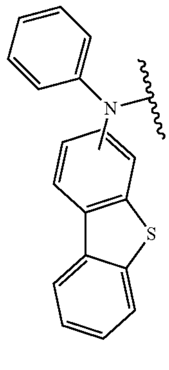

-continued

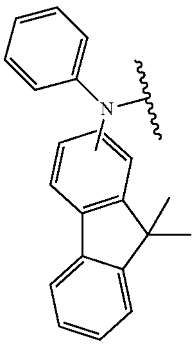

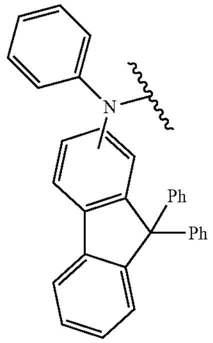

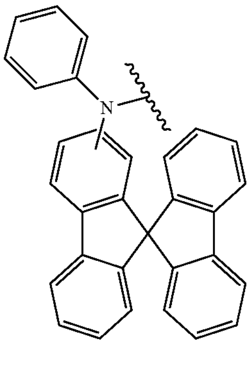

In group 2, L represents a single bond, a substituted or unsubstituted (C1-C30)alkylene, a substituted or unsubstituted (C6-C30)arylene, a substituted or unsubstituted (3- to 30-membered)heteroarylene, or a substituted or unsubstituted (C3-C30)cycloalkylene; and $A_1$ to $A_3$, each independently, represent a substituted or unsubstituted (C1-C30) alkyl, or a substituted or unsubstituted (C6-C30)aryl. According to one embodiment of the present disclosure, L represents a single bond, a substituted or unsubstituted (C6-C25)arylene, or a substituted or unsubstituted (3- to 25-membered)heteroarylene; and $A_1$ to $A_3$, each independently, represent a substituted or unsubstituted (C1-C20) alkyl, or a substituted or unsubstituted (C6-C25)aryl. $A_1$ and $A_2$ may be the same or different. For example, $A_1$ and $A_2$, each independently, may be a methyl or a phenyl.

In any one of formulas 2-1 to 2-4, at least one of Ar(s) and $R_a$(s), each independently, may be at least one selected from those listed in the following group 3.

[Group 3]

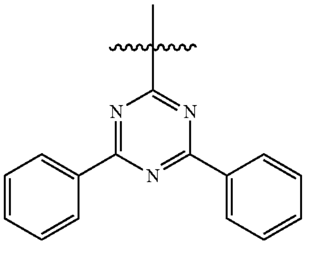

-continued
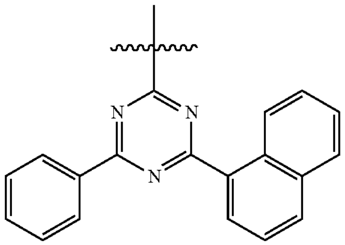
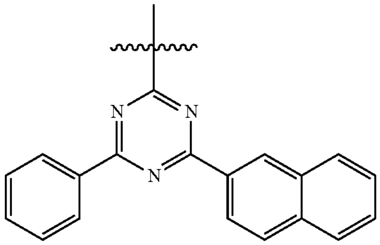
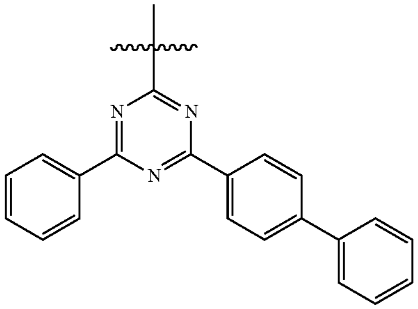
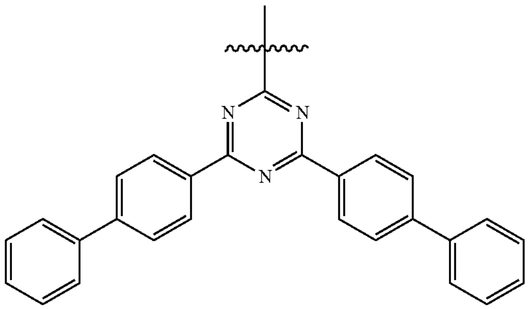
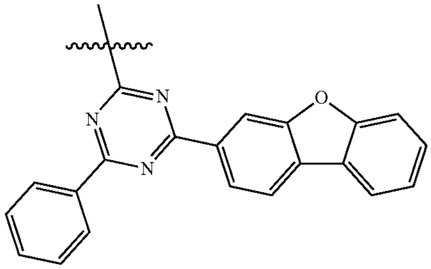
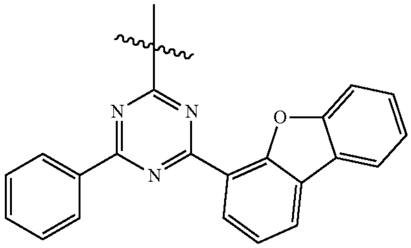
-continued
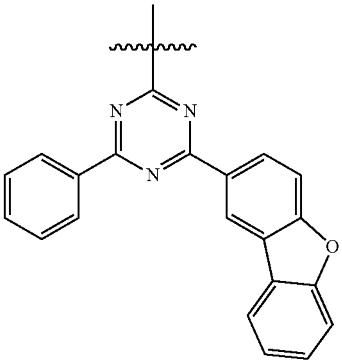
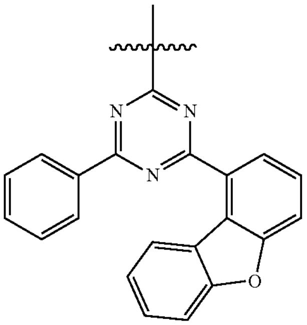
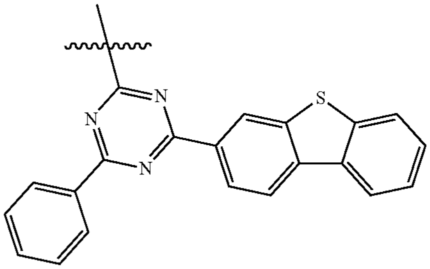
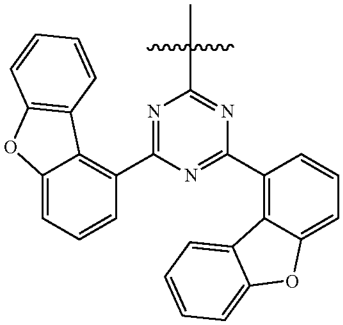
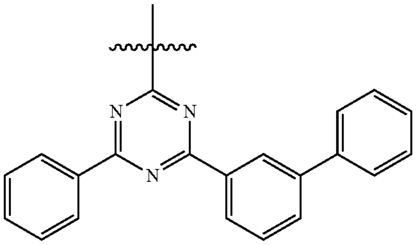

-continued
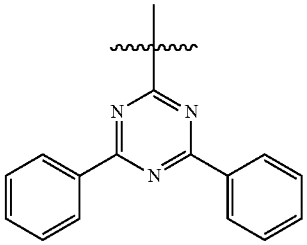
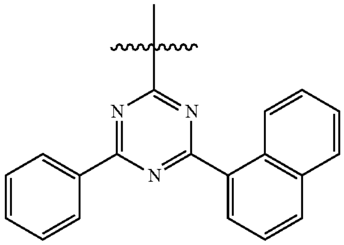
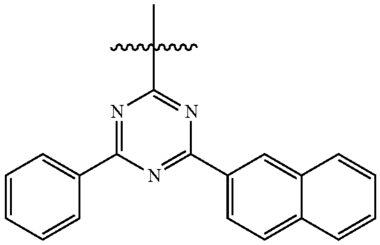
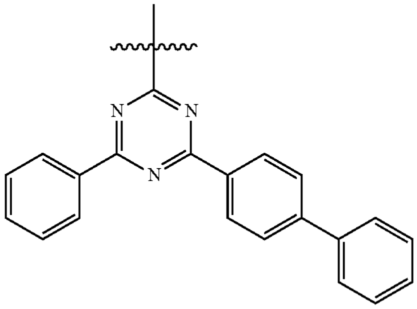
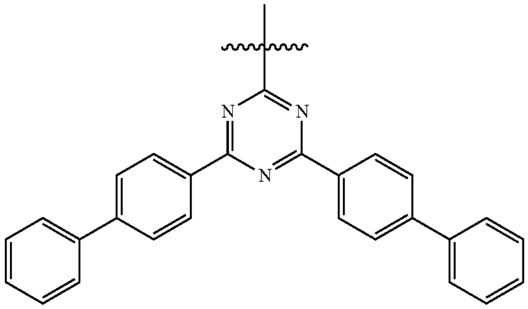
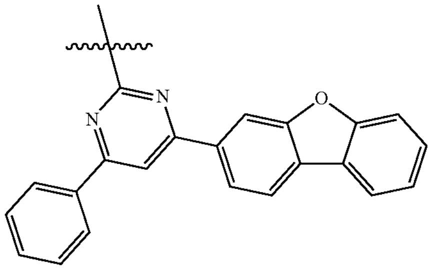
-continued
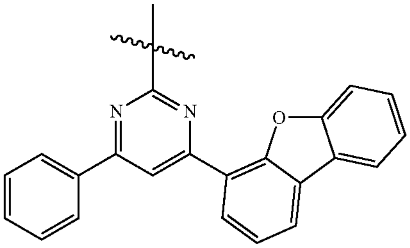
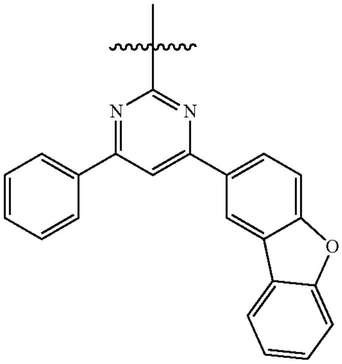
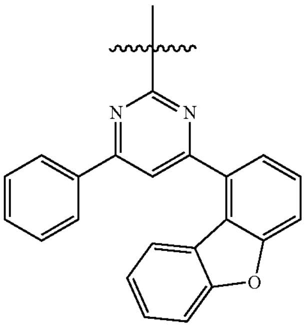
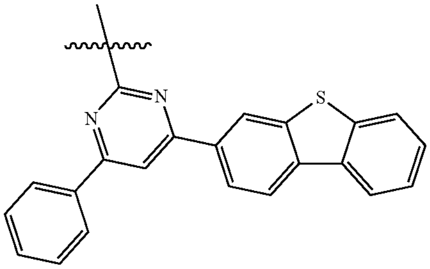
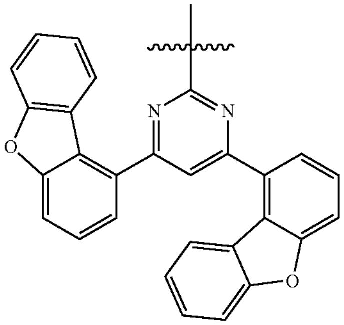

-continued
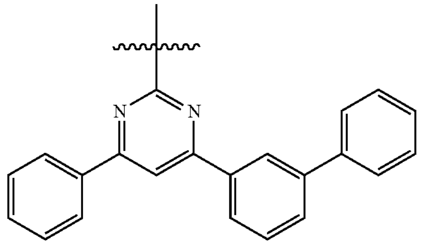
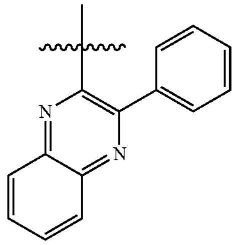
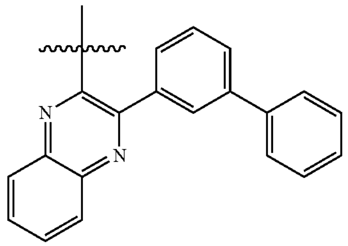
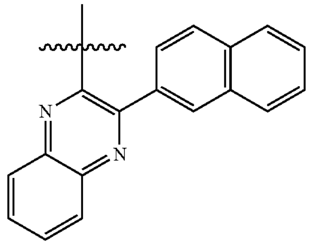
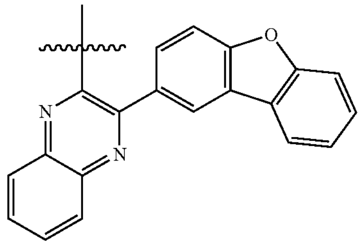
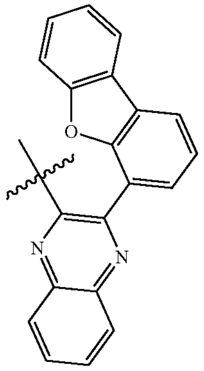
-continued
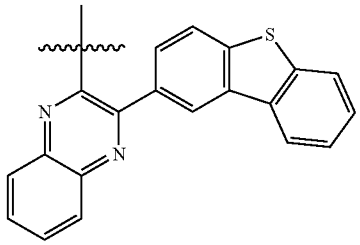
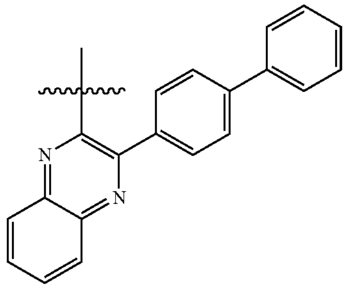
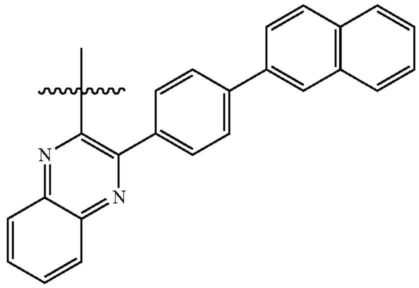
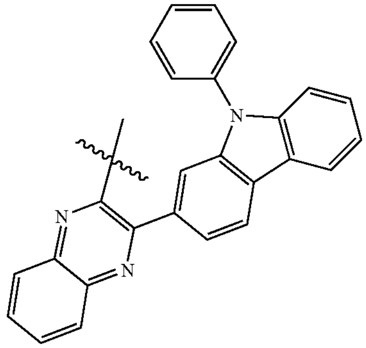
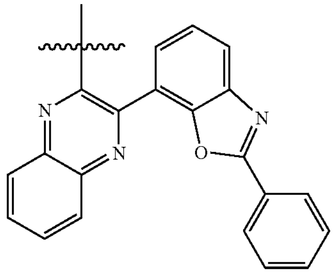

-continued
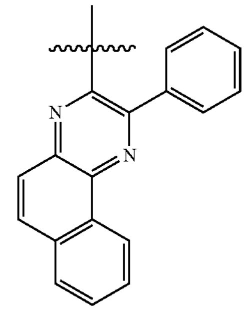
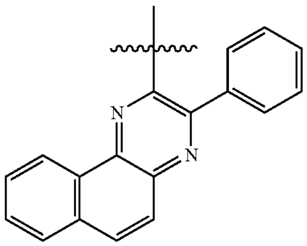
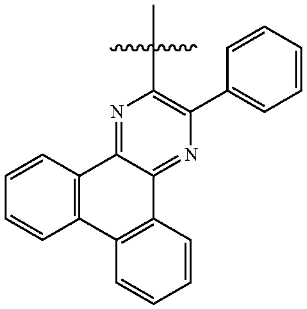
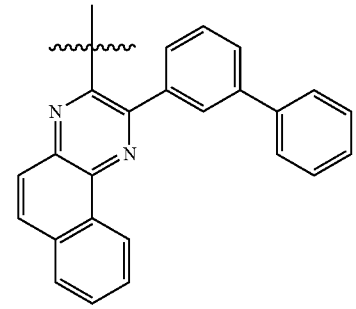
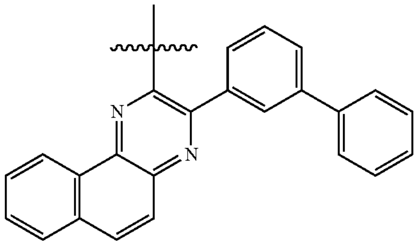
-continued
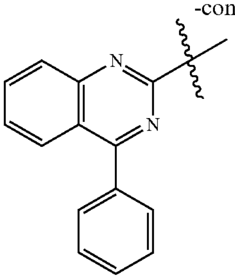
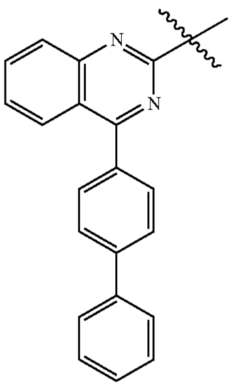
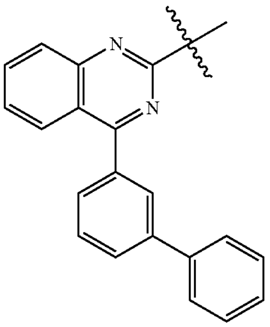
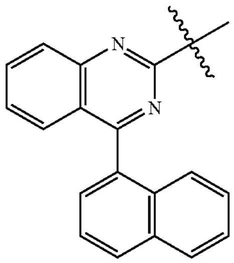
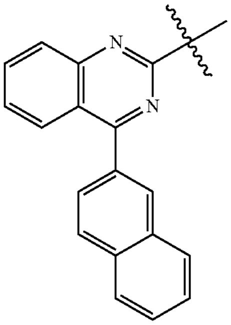
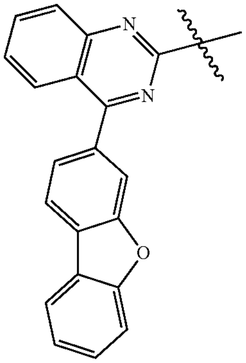
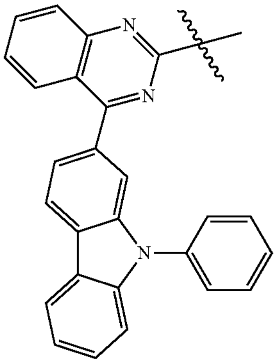
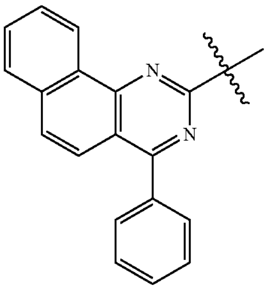

-continued
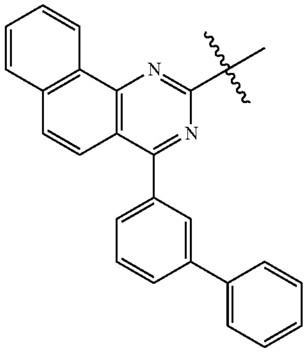
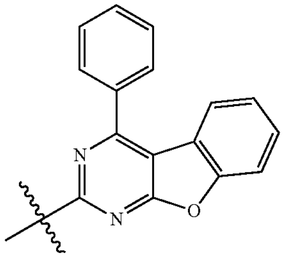
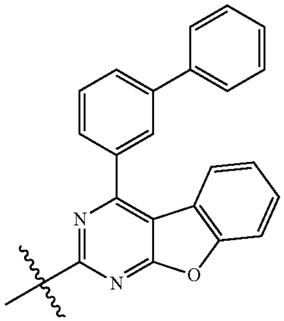
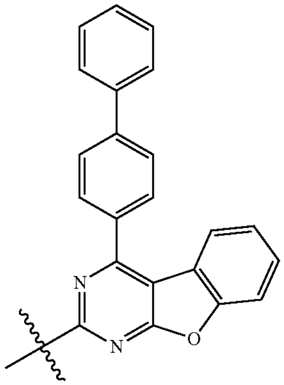
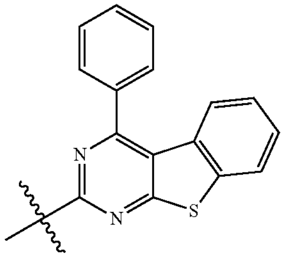
-continued
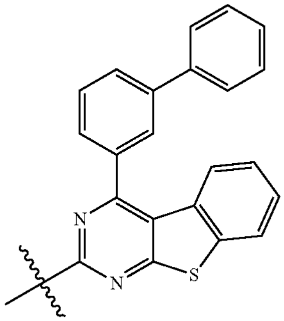
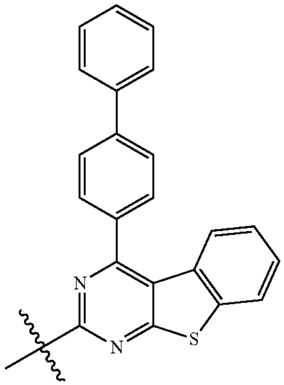
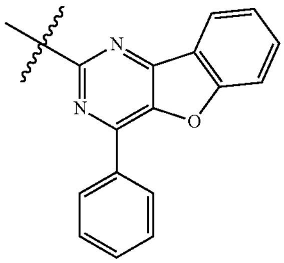
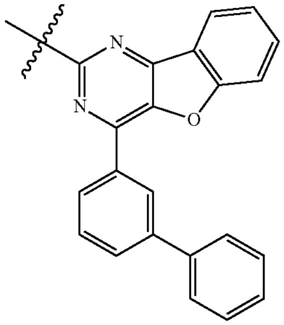
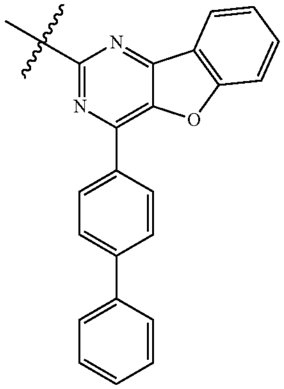

-continued
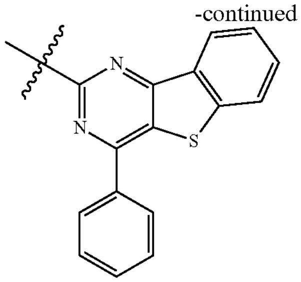
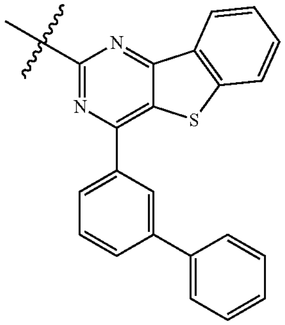
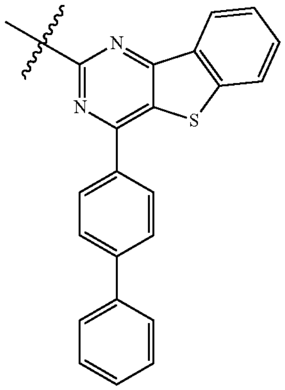
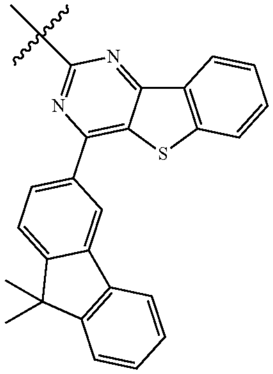
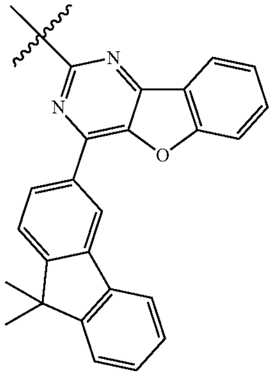
-continued
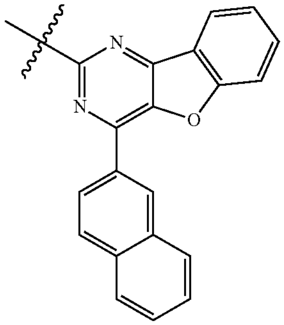
The compound represented by formula 1 may be at least one selected from the following compounds, but is not limited thereto.
E-1
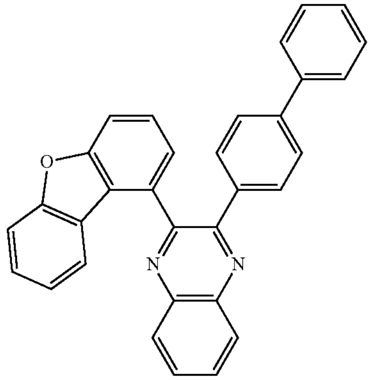
E-2
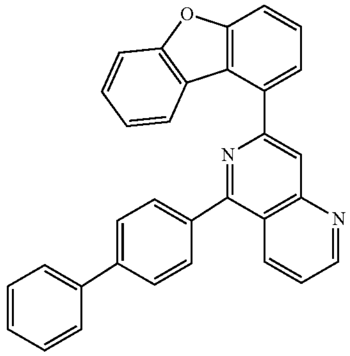
E-3
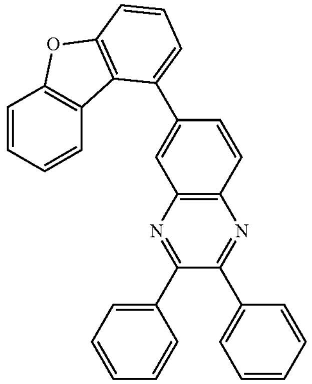

-continued
E-4
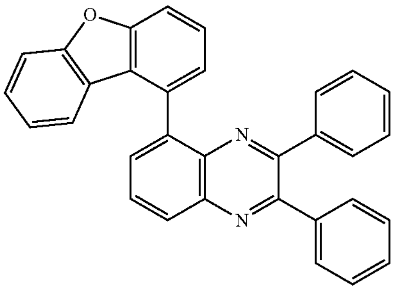
E-5
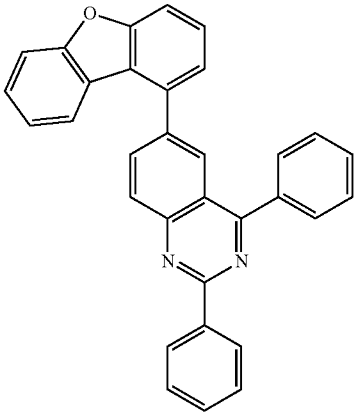
E-6
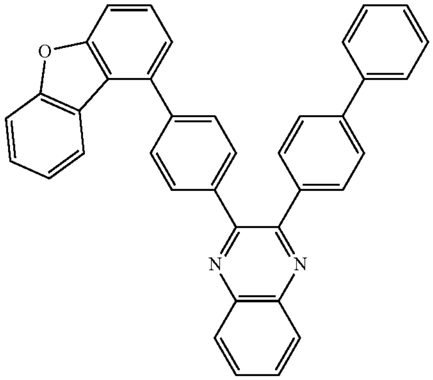
E-7
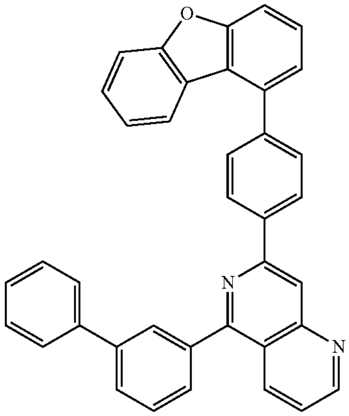
-continued
E-8
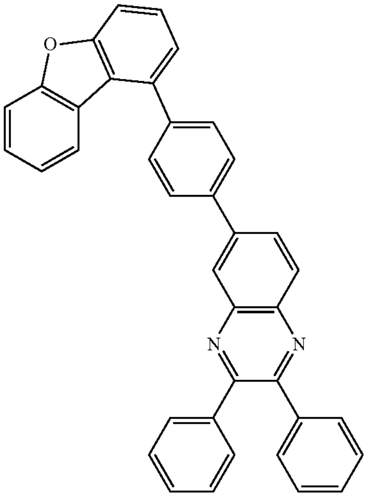
E-9
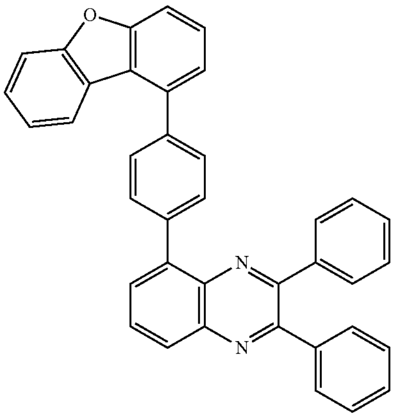
E-10
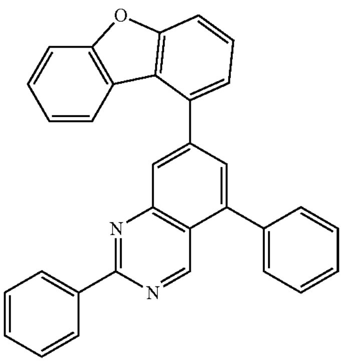

-continued
E-11
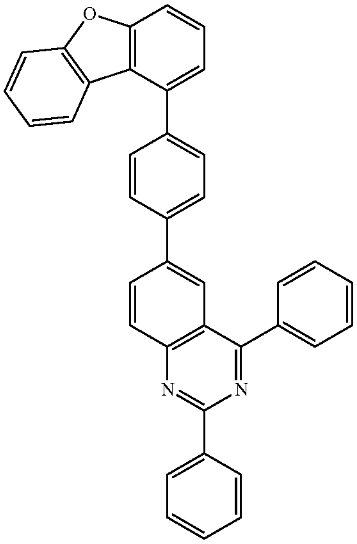
E-12
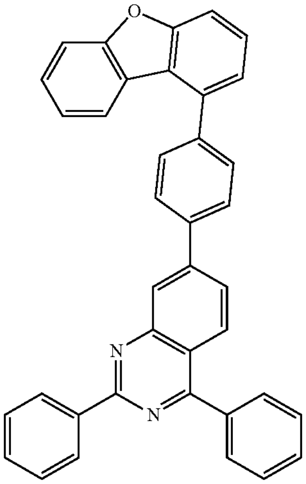
E-13
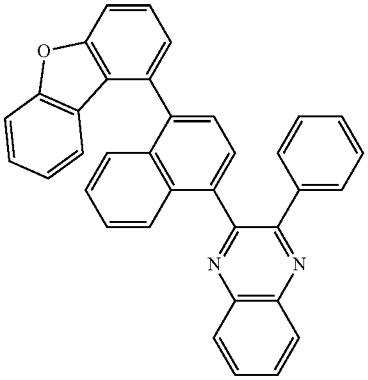
-continued
E-14
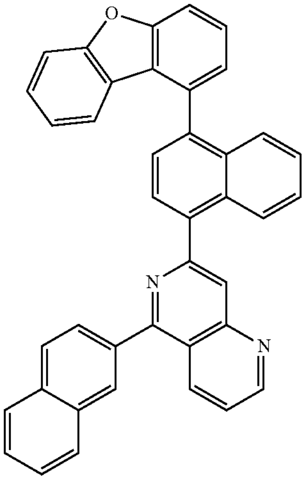
E-15
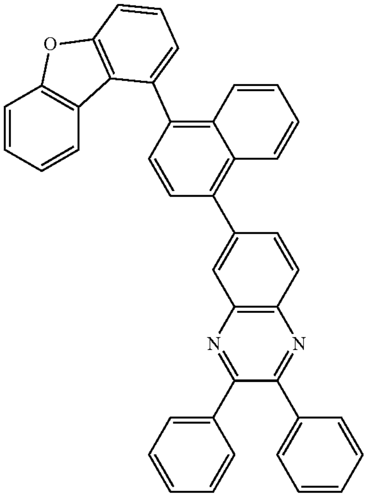
E-16
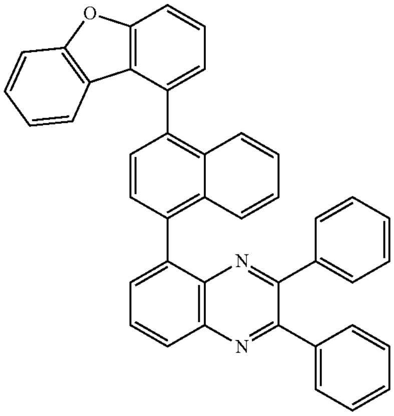

-continued
E-17
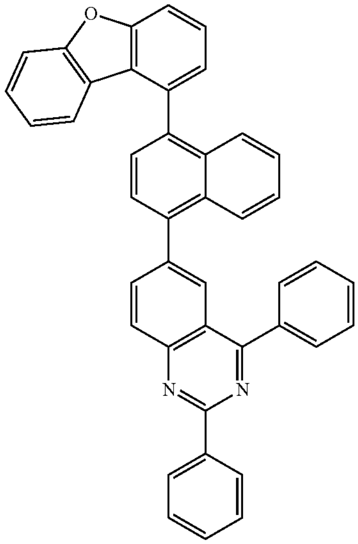
E-18
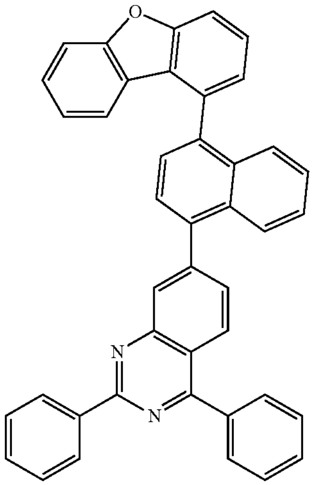
E-19
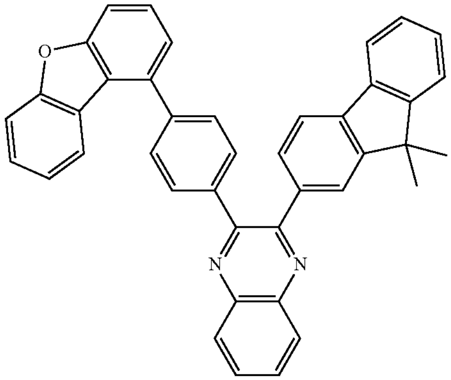
-continued
E-20
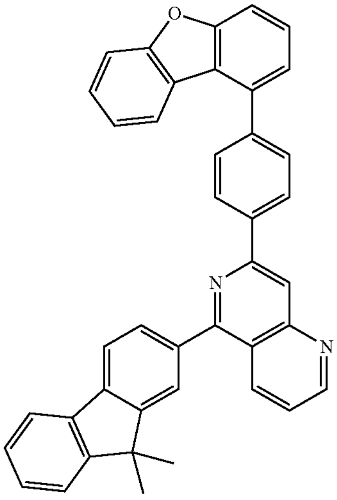
E-21
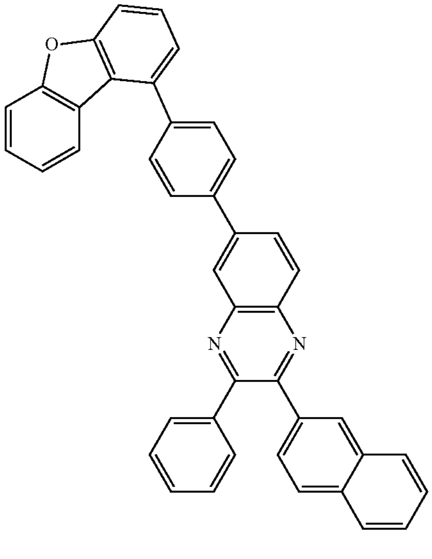
E-22
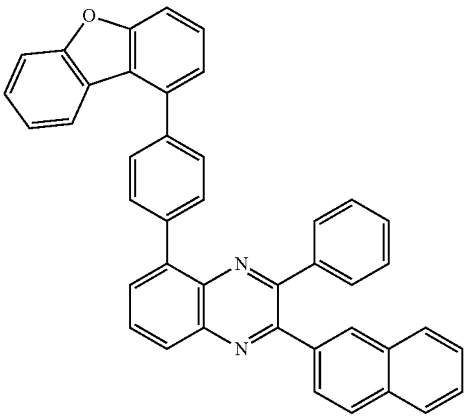

-continued
E-23
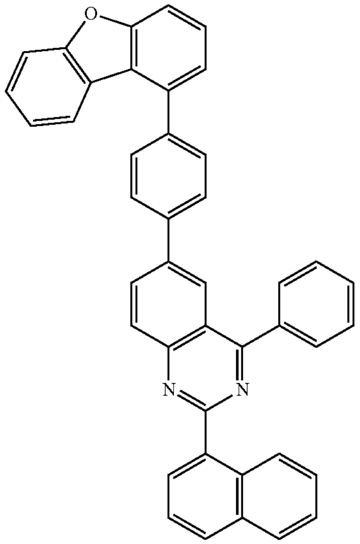
E-24
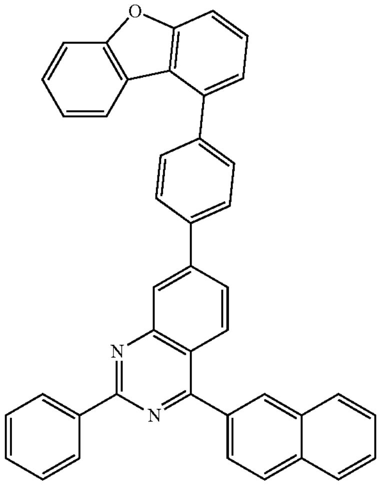
E-25
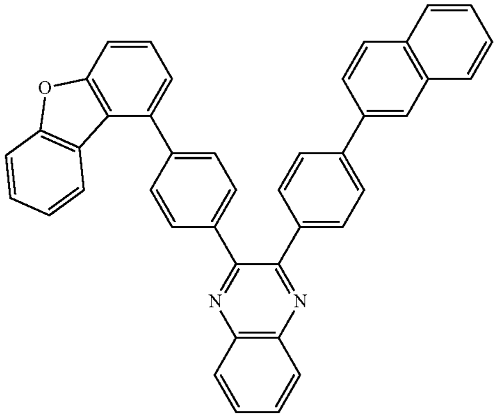
-continued
E-26
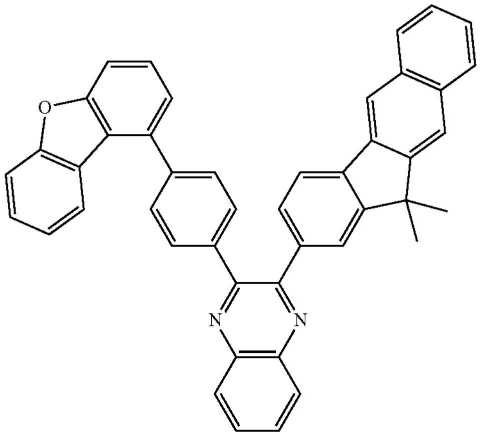
E-27
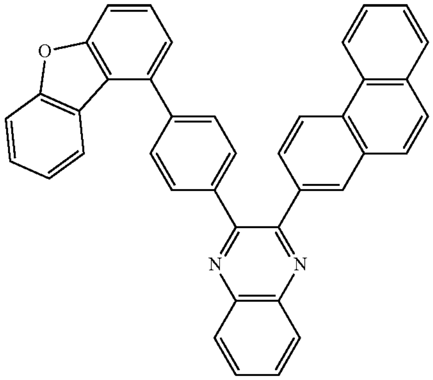
E-28
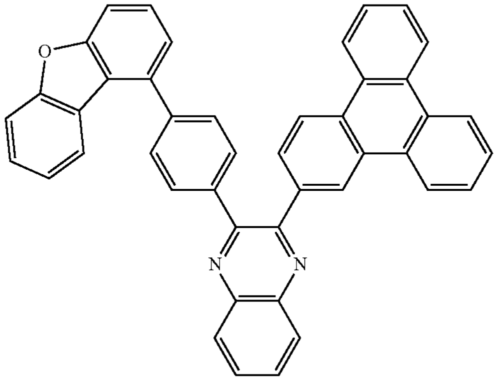

-continued
E-29
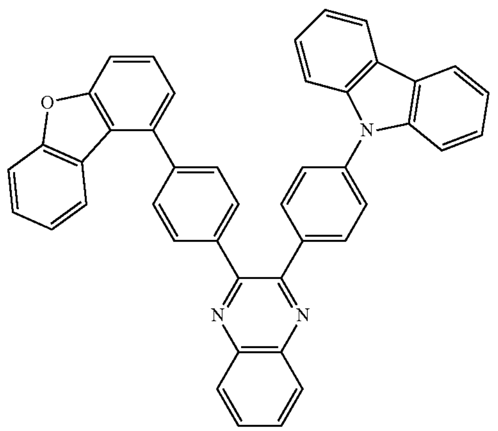
E-30
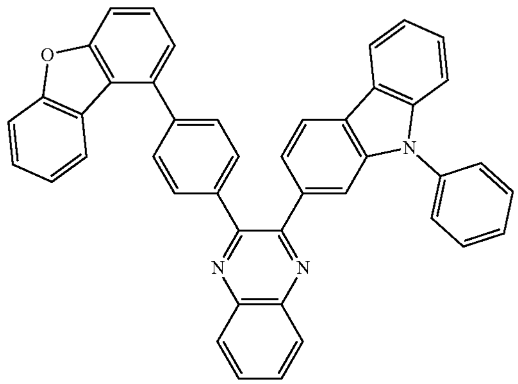
E-31
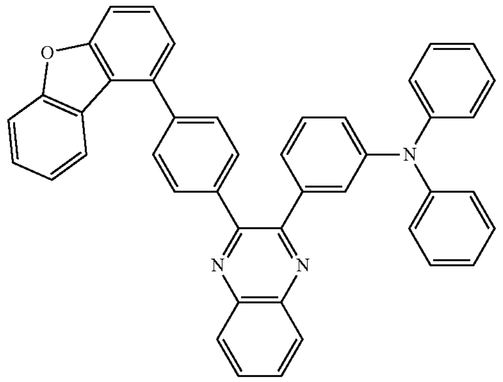
-continued
E-32
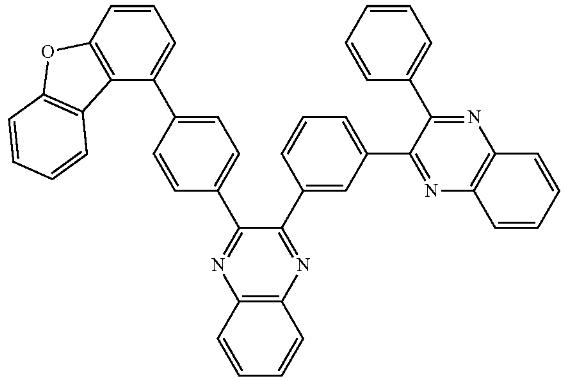
E-33
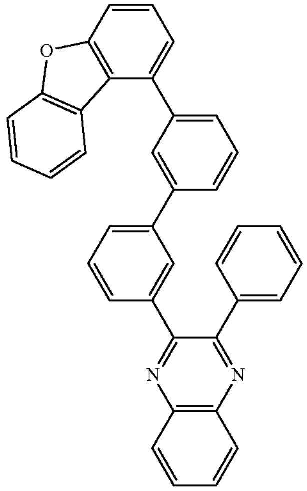
E-34
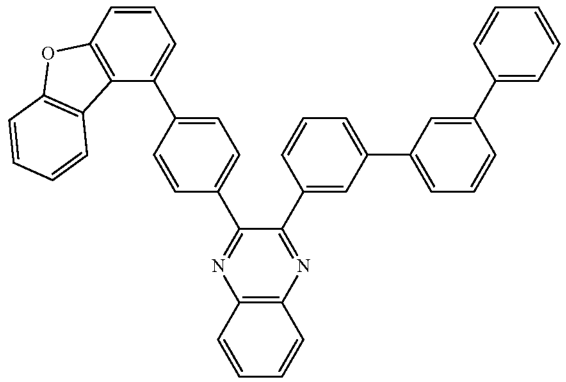

-continued
E-35
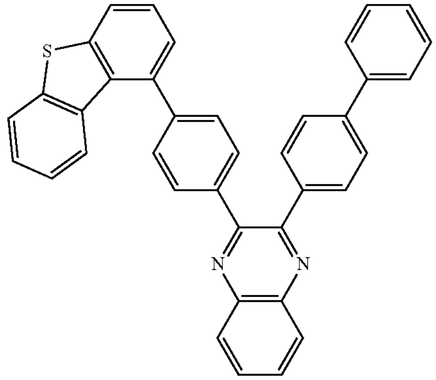
E-36
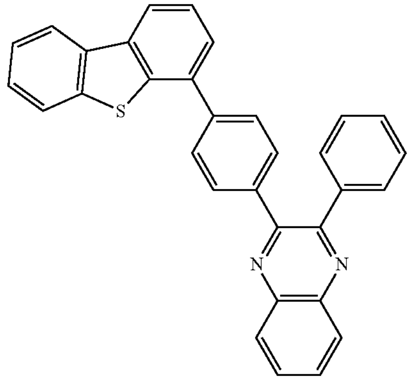
E-37
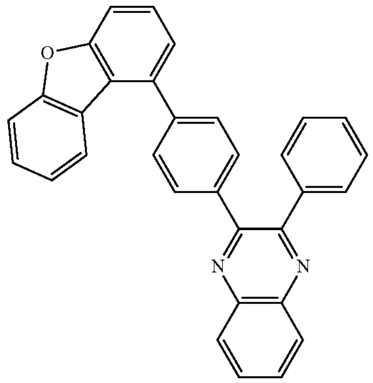
E-38
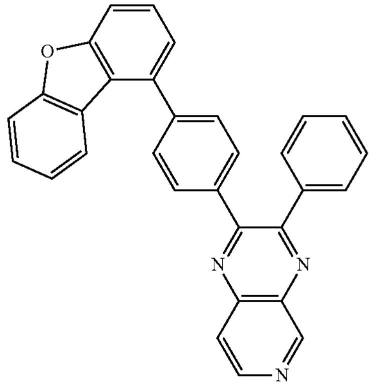
-continued
E-39
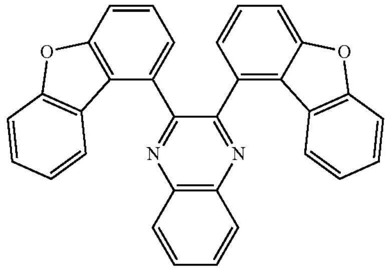
E-40
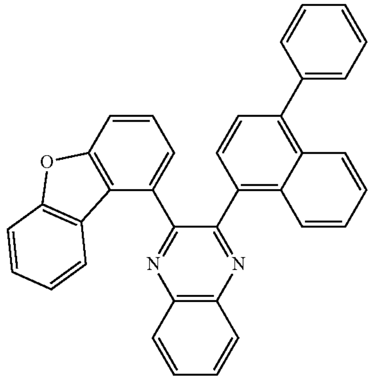
E-41
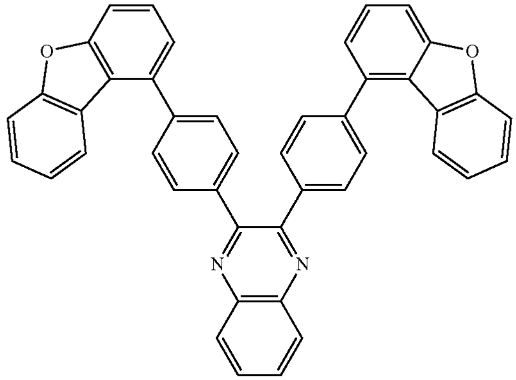
E-42
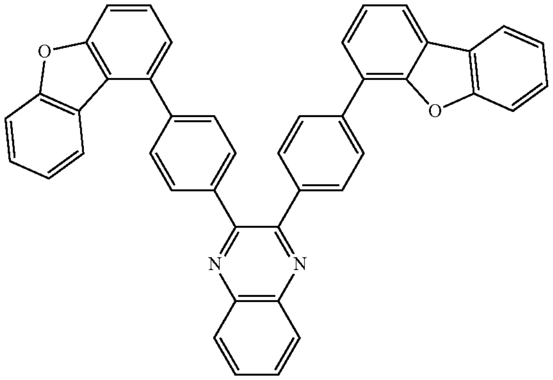

-continued
E-43
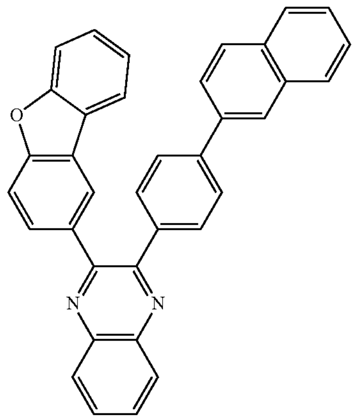
E-44
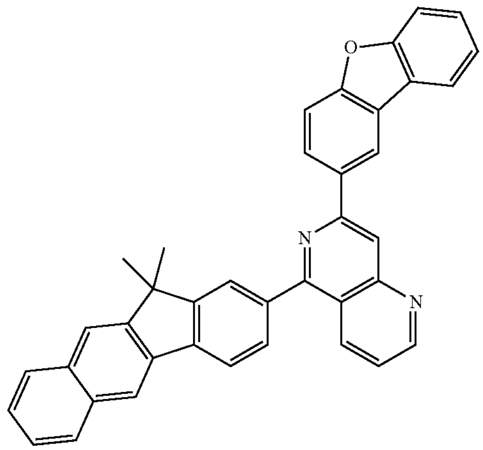
E-45
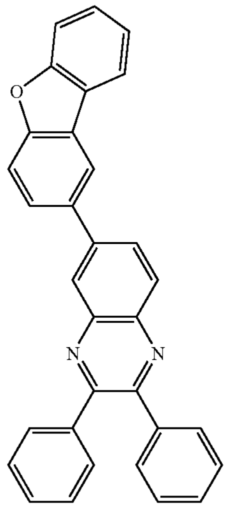
-continued
E-46
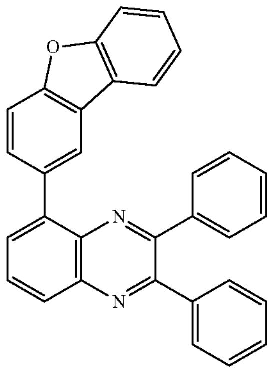
E-47
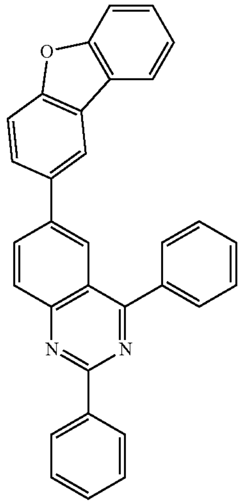
E-48
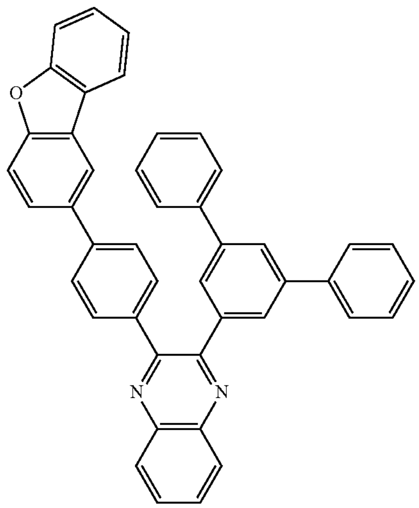

-continued
E-49
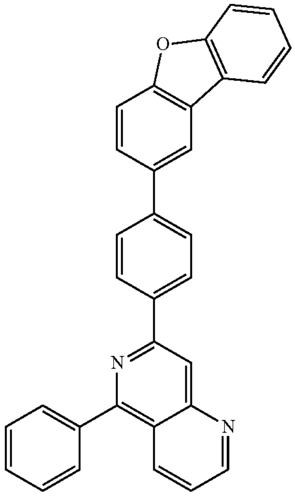
E-50
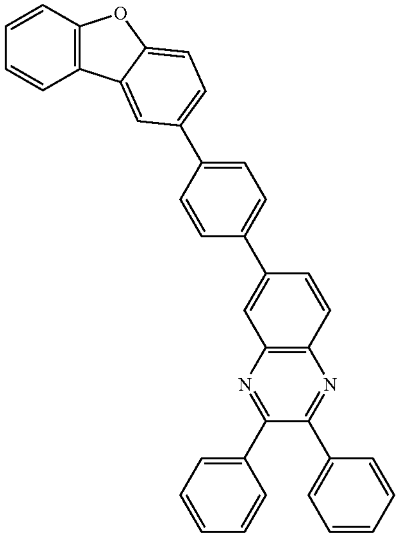
E-51
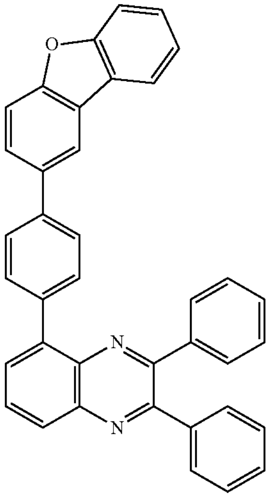
-continued
E-52
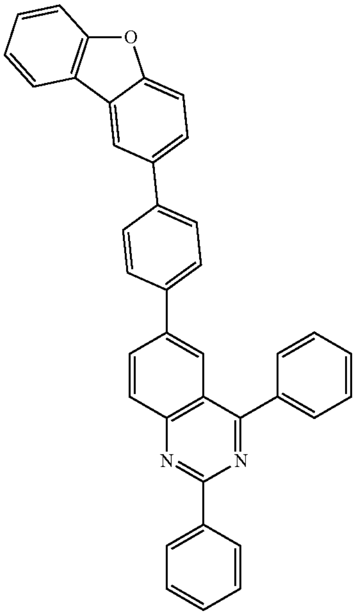
E-53
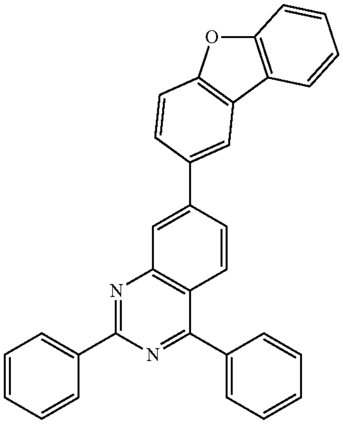
E-54
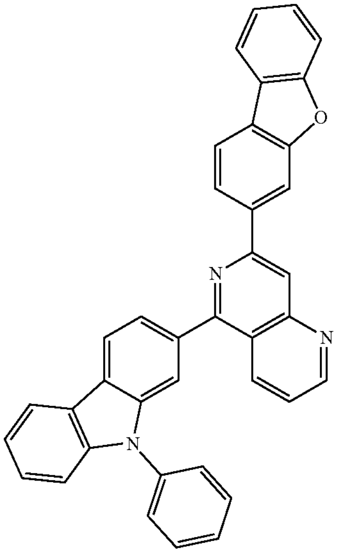

-continued
E-55
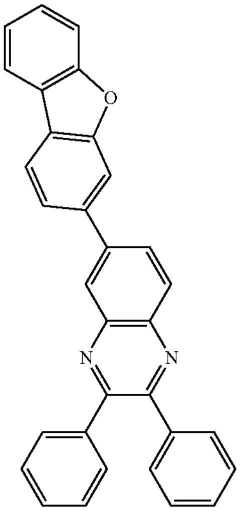
E-56
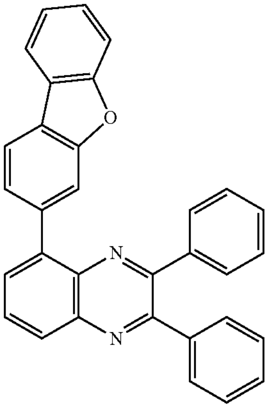
E-57
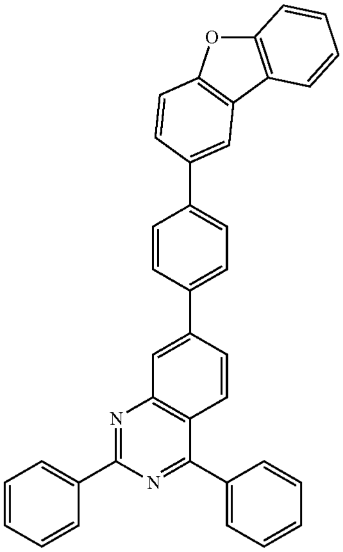
-continued
E-58
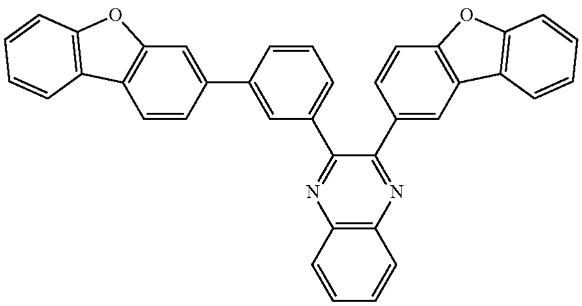
E-59
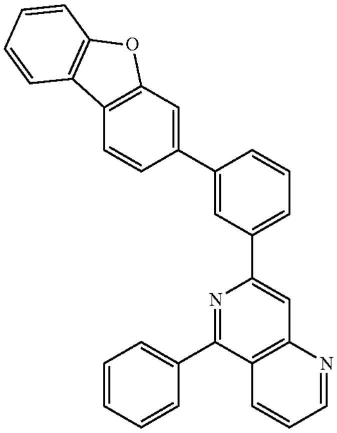
E-60
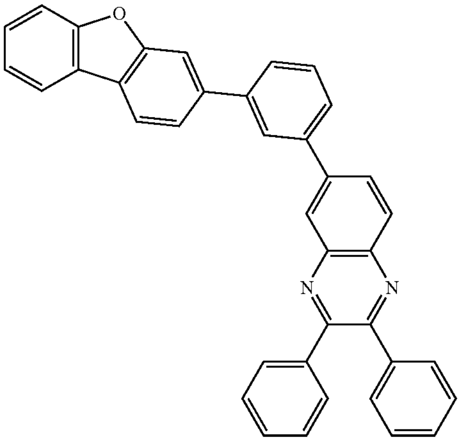
E-61
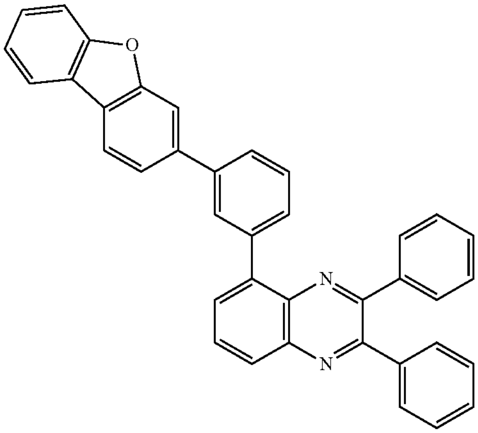

-continued
E-62
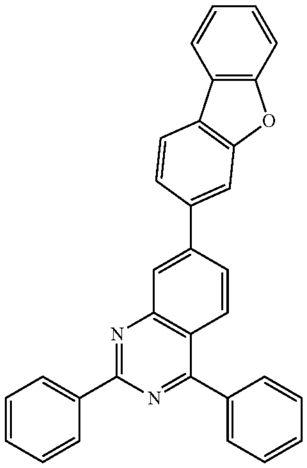
E-63
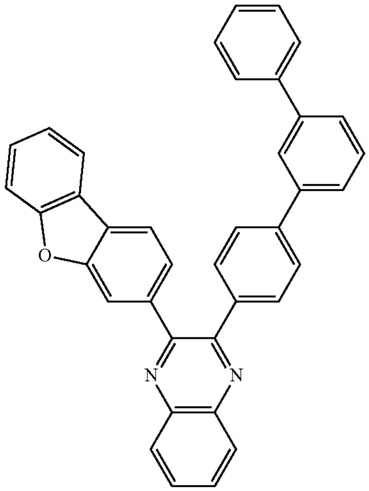
E-64
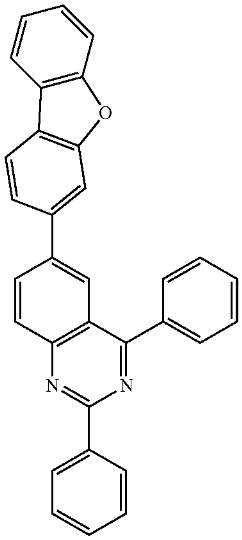
-continued
E-65
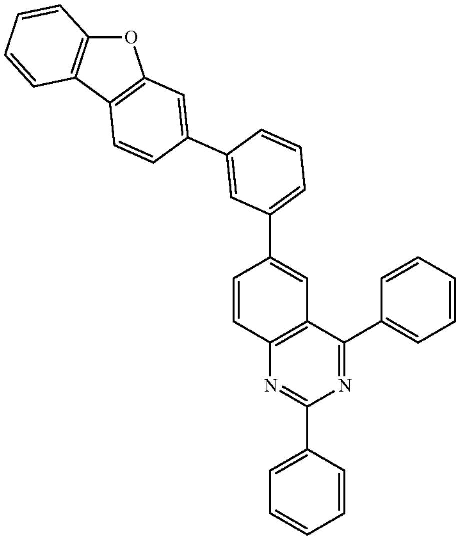
E-66
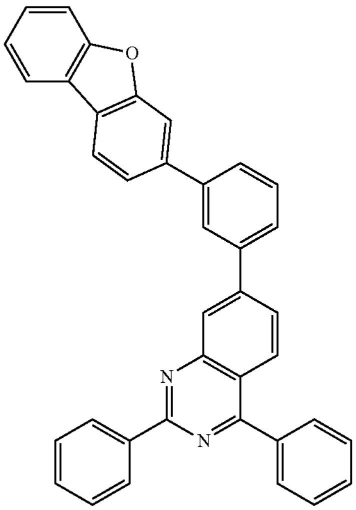
E-67
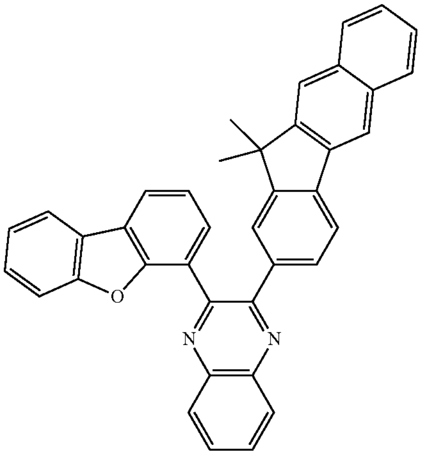

-continued
E-68
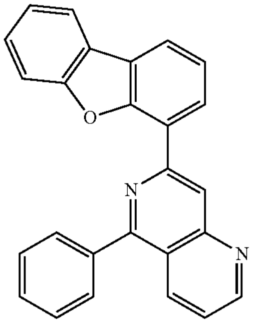
E-69
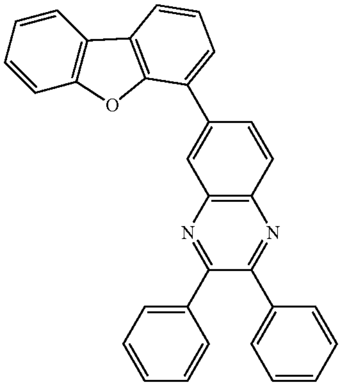
E-70
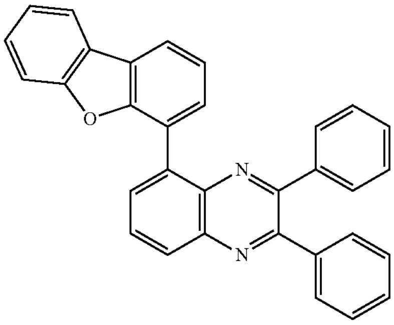
E-71
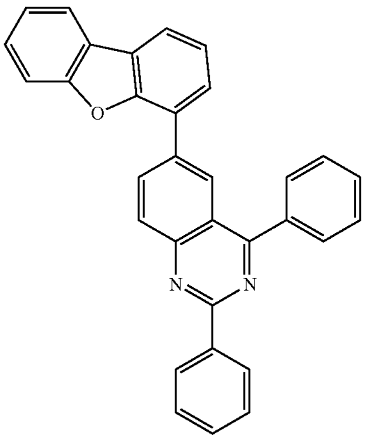
-continued
E-72
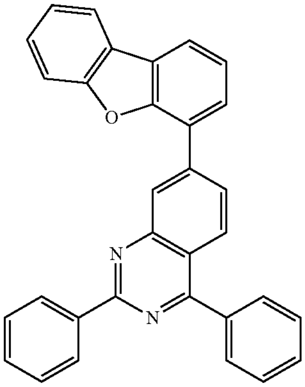
E-73
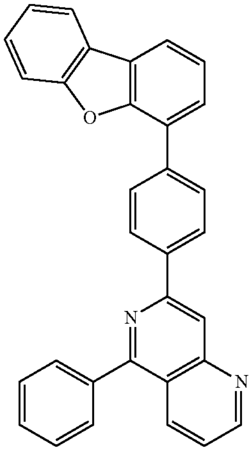
E-74
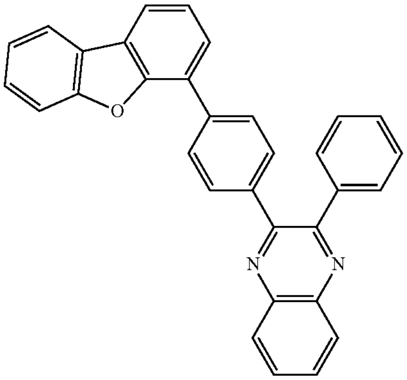

-continued
E-75
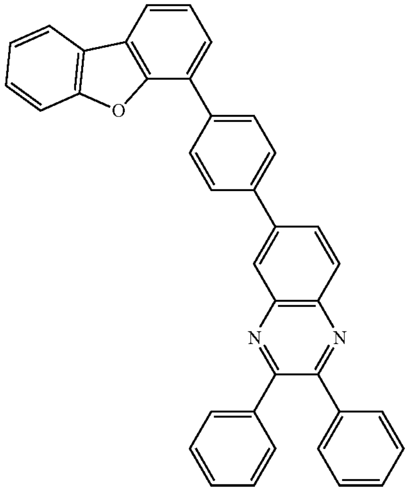
E-76
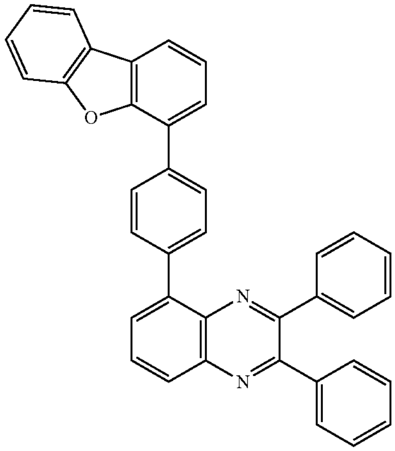
E-77
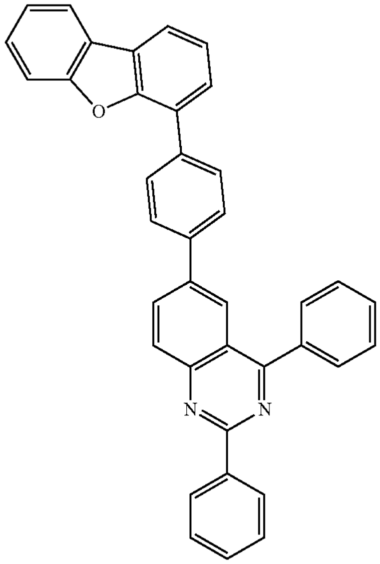
-continued
E-78
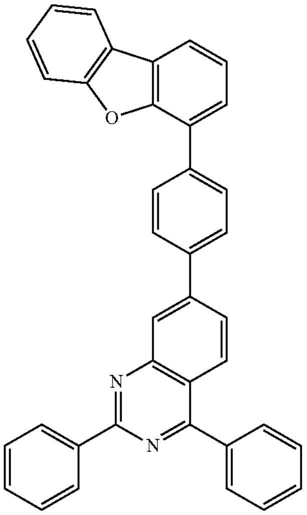
E-79
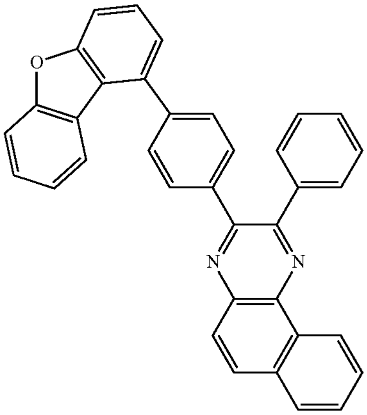
E-80
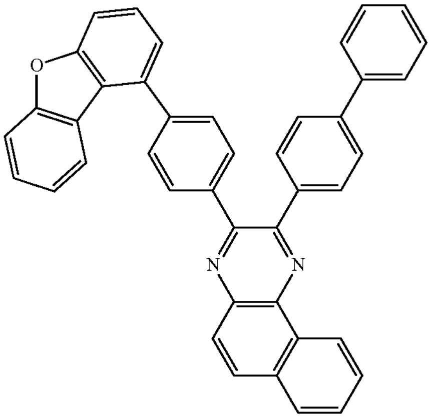

-continued
E-81
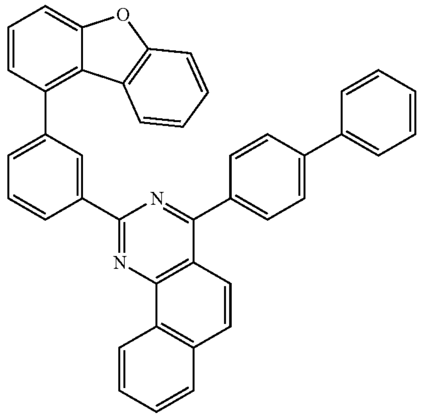
E-82
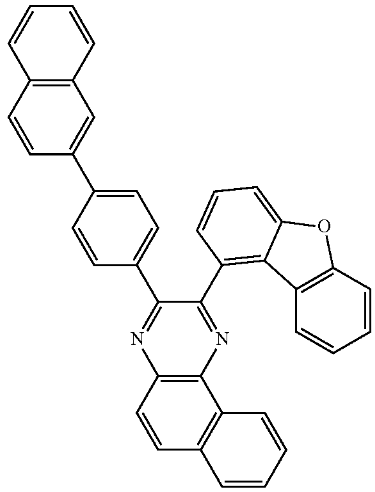
E-83
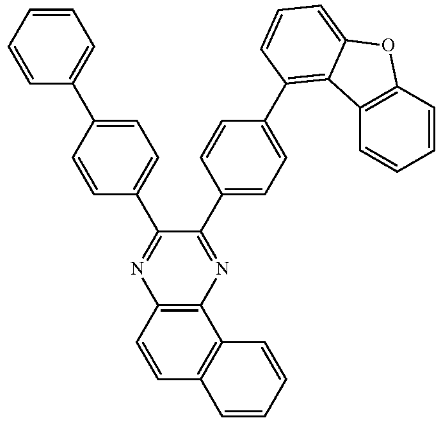
-continued
E-84
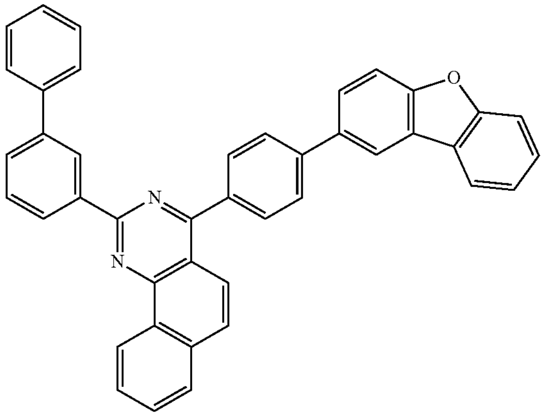
E-85
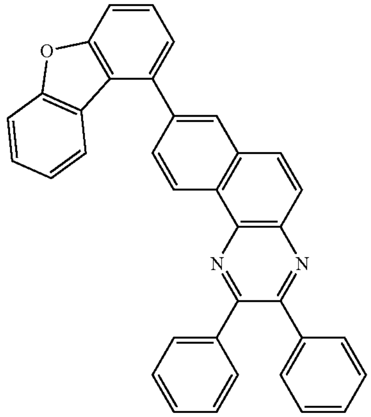
E-86
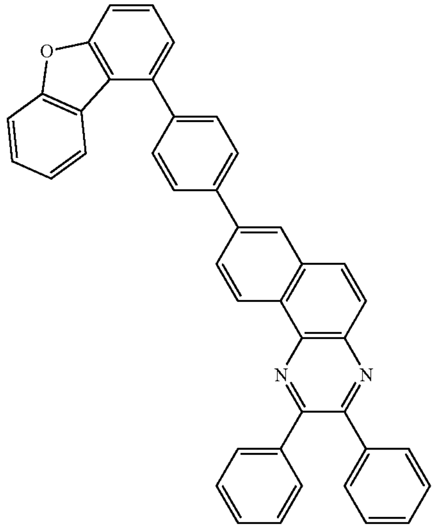

-continued
E-87
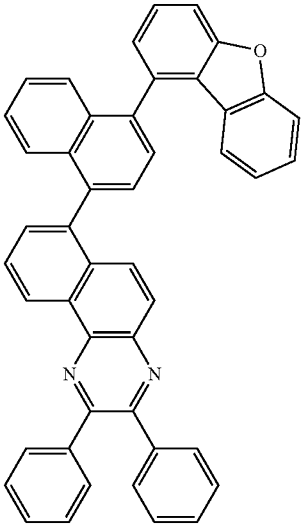
E-88
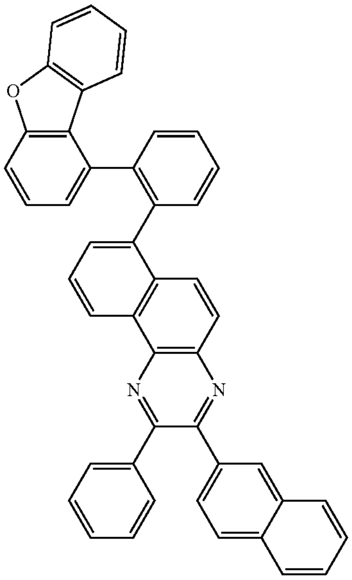
E-89
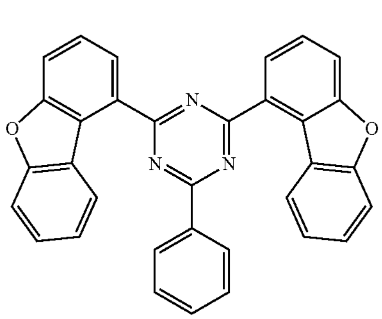
-continued
E-90
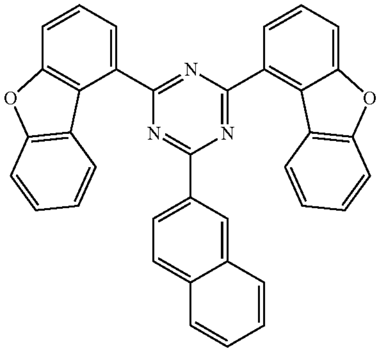
E-91
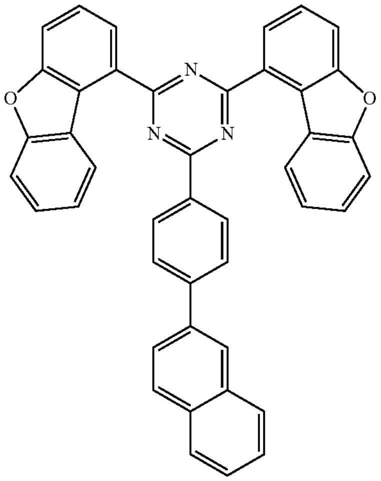
E-92
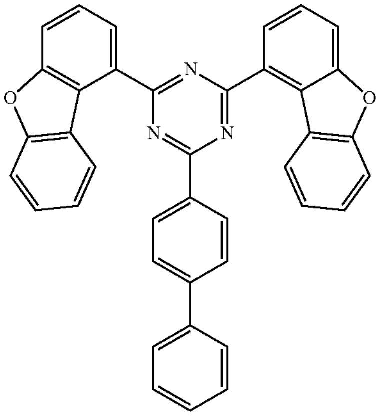
E-93
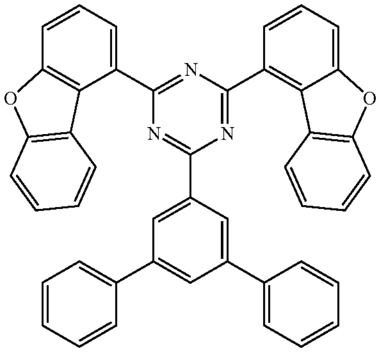

-continued
E-94
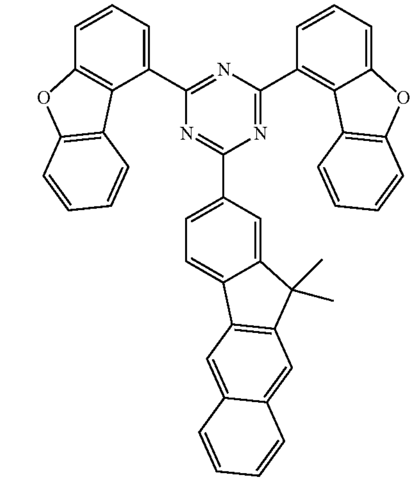
E-95
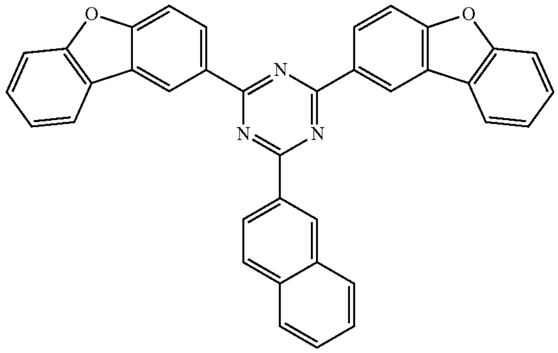
E-96
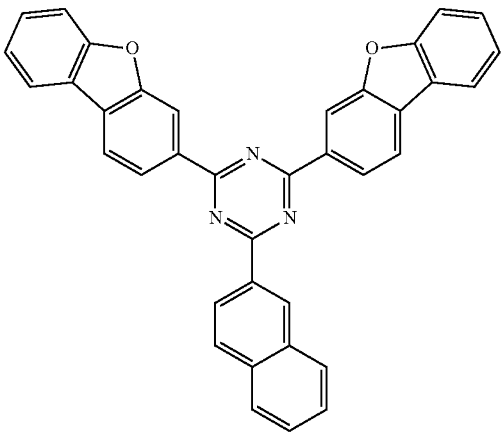
-continued
E-97
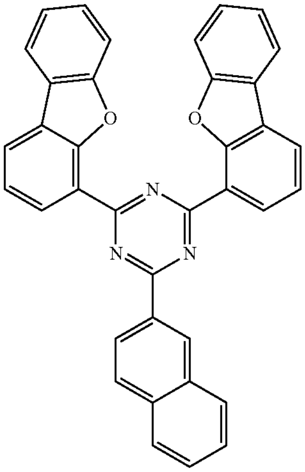
E-98
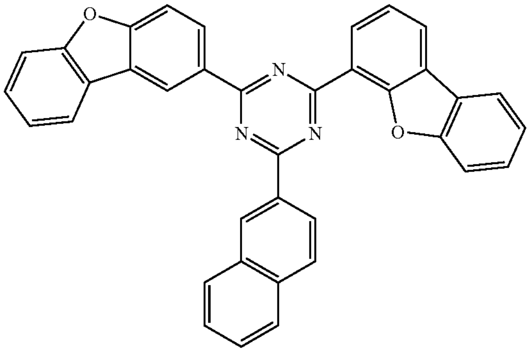
E-99
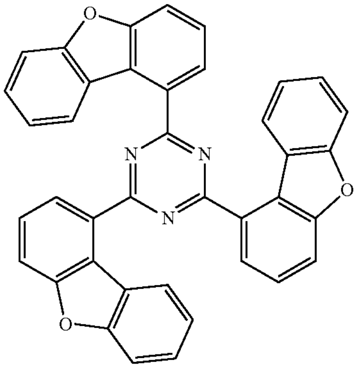
E-100
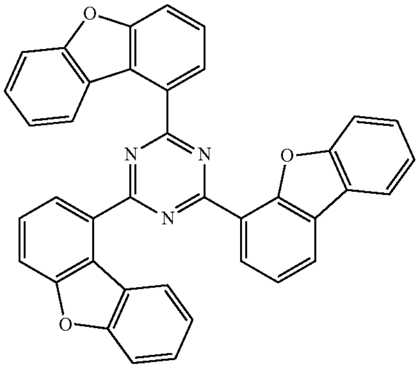

-continued
E-101
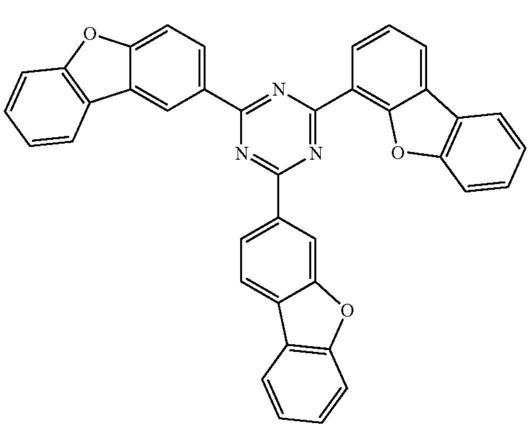
E-102
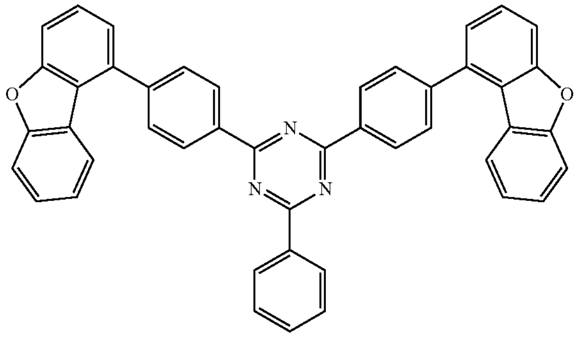
E-103
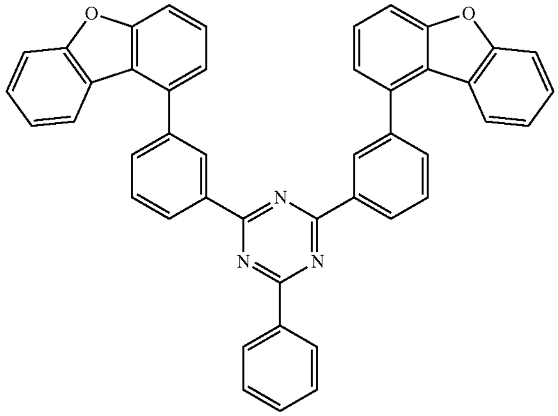
E-104
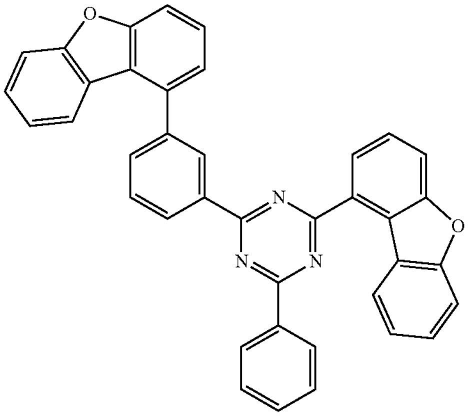
-continued
E-105
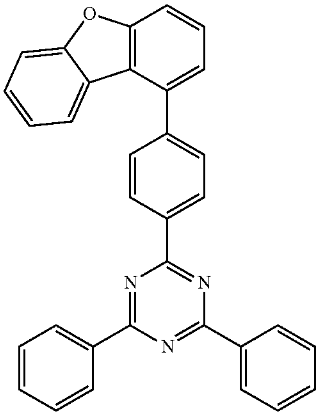
E-106
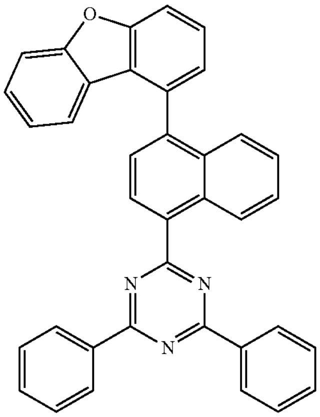
E-107
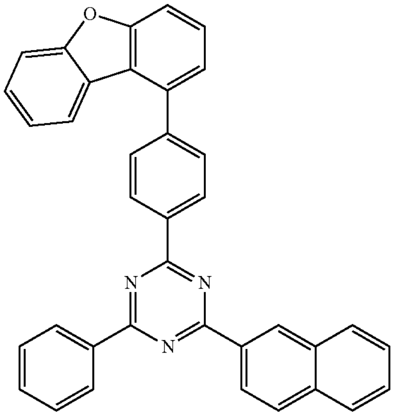

-continued
E-108
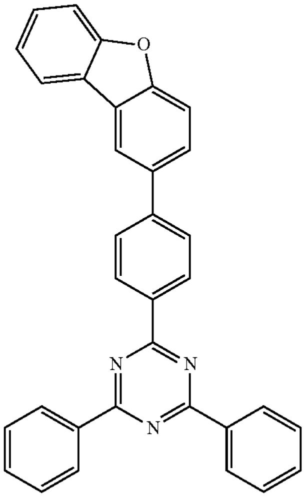
E-109
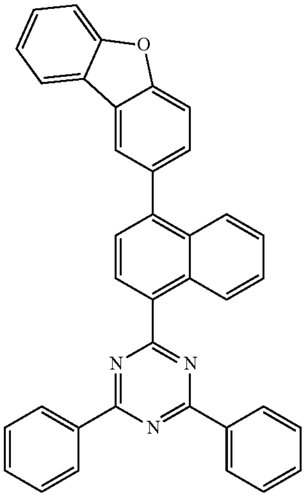
E-110
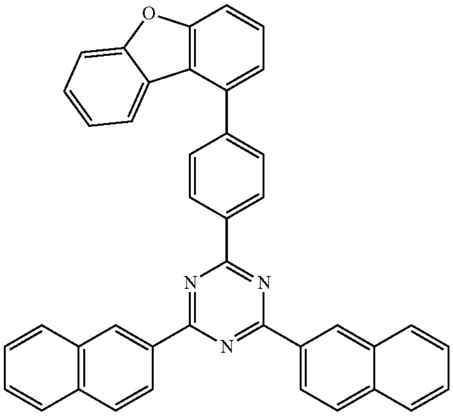
-continued
E-111
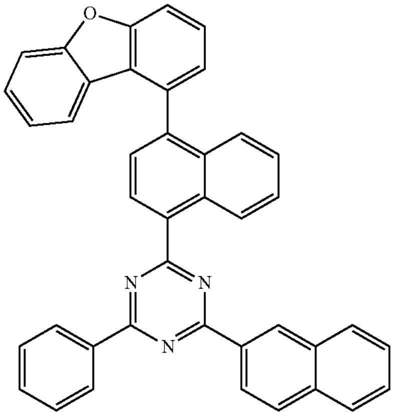
E-112
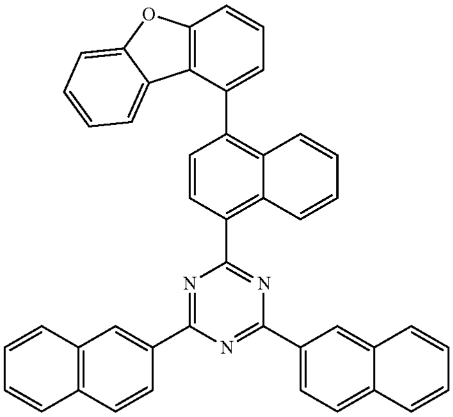
E-113
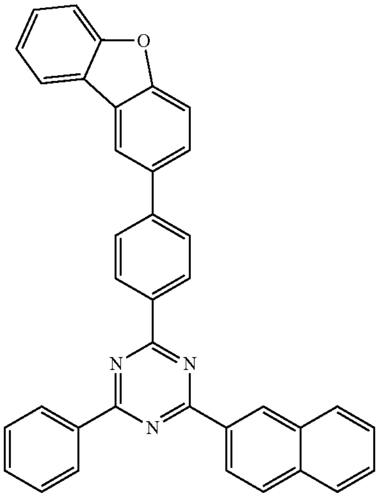

-continued
E-114
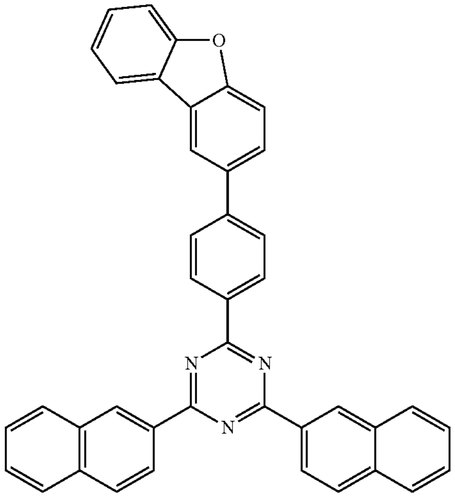
E-115
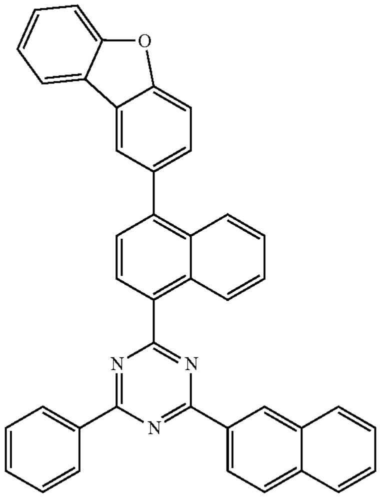
E-116
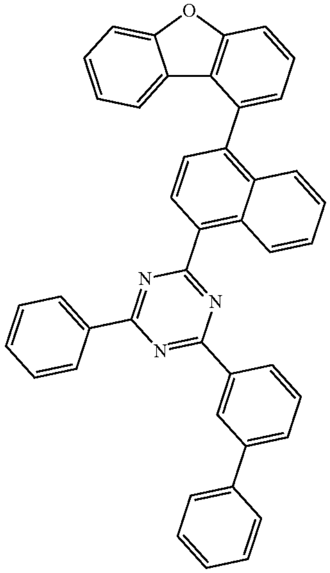
-continued
E-117
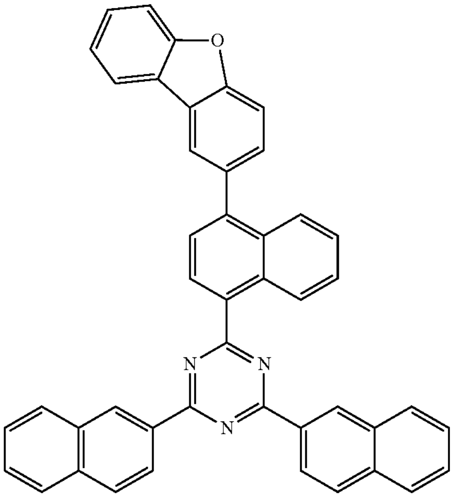
E-118
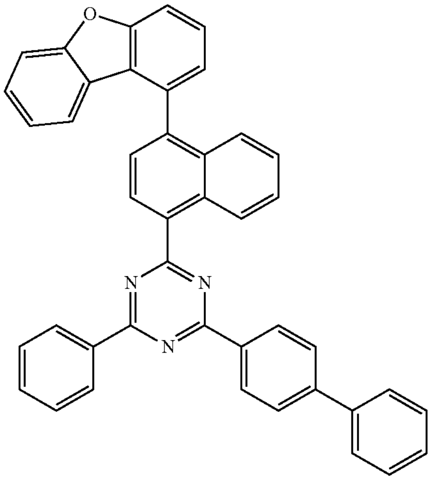
E-119
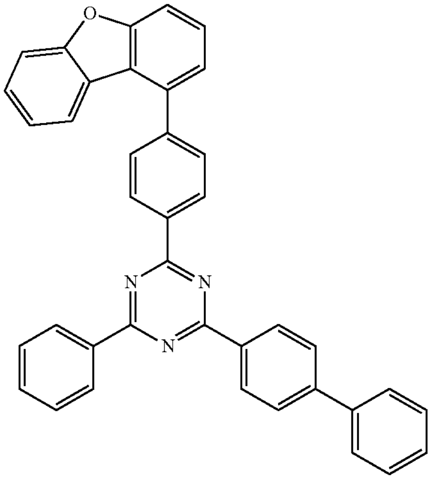

-continued
E-120
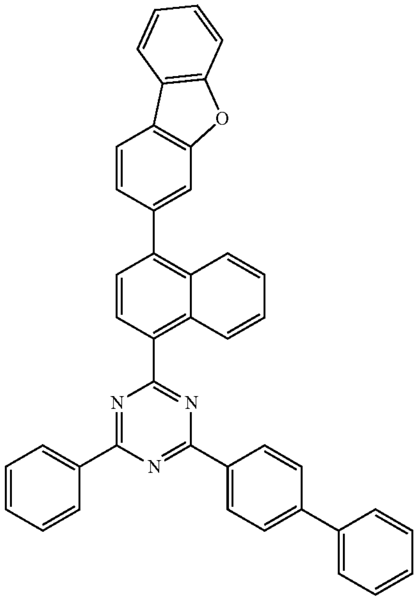
E-121
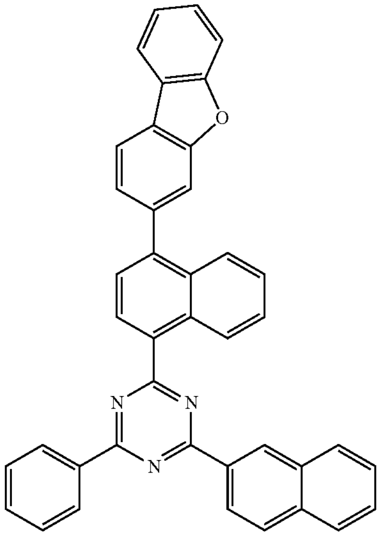
-continued
E-122
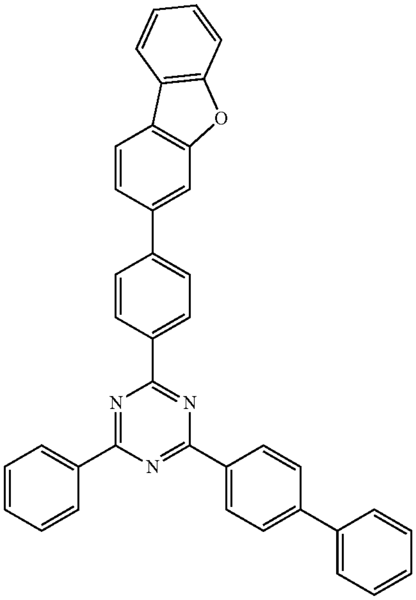
E-123
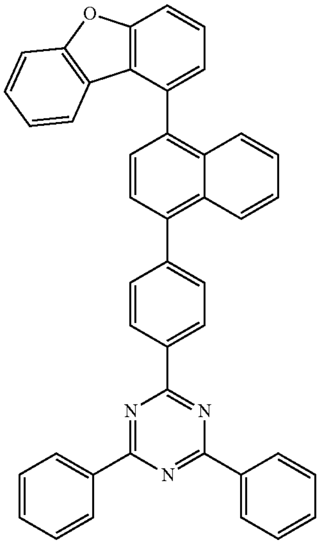
E-124
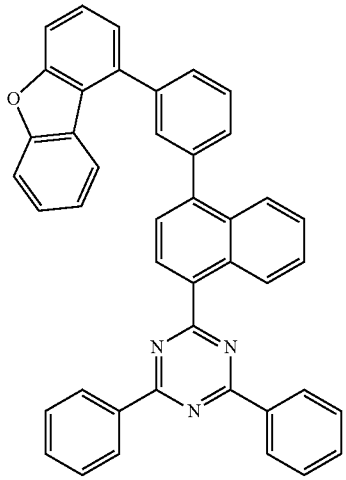

-continued
E-125
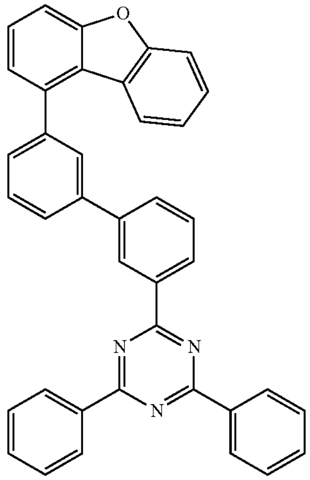
E-126
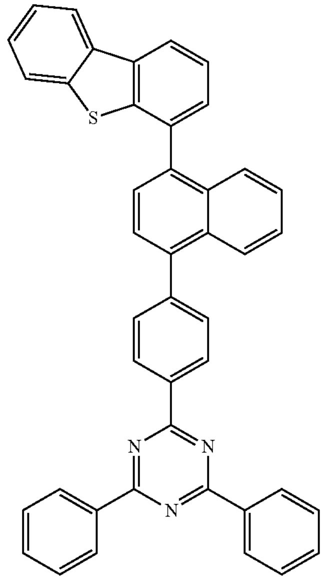
E-127
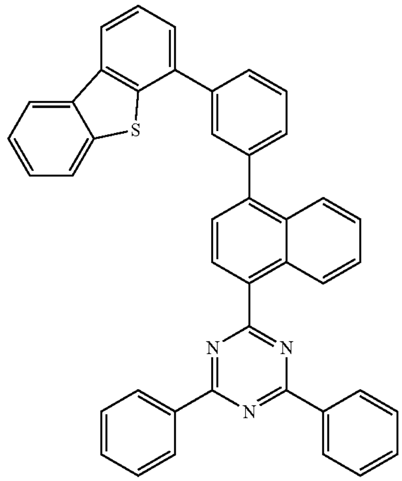
-continued
E-128
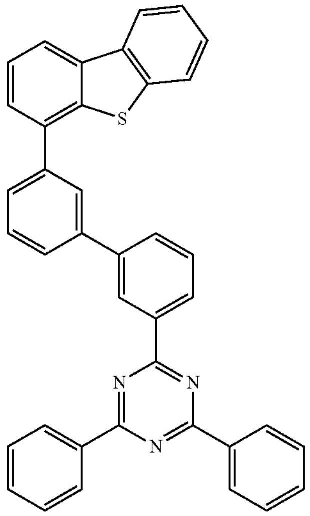
E-129
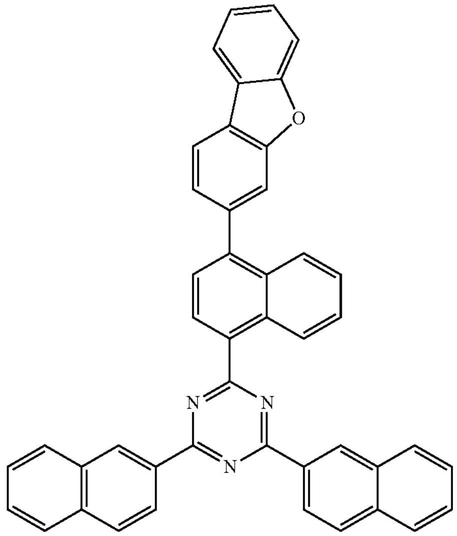
E-130
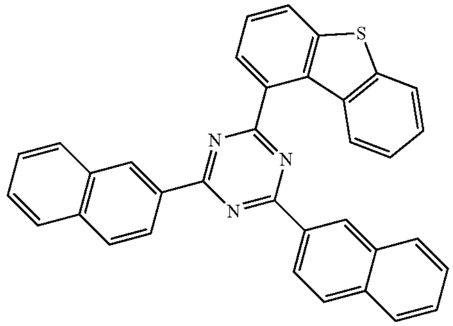

E-131
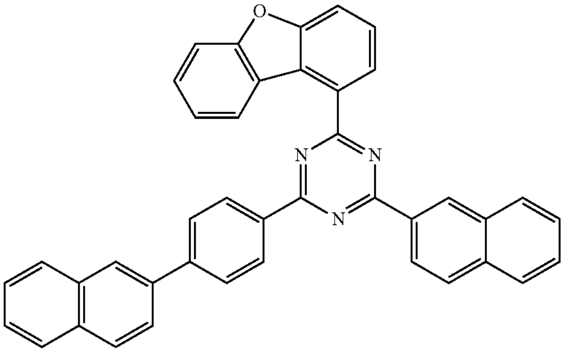
E-132
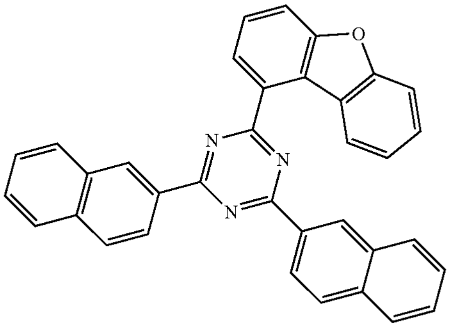
E-133
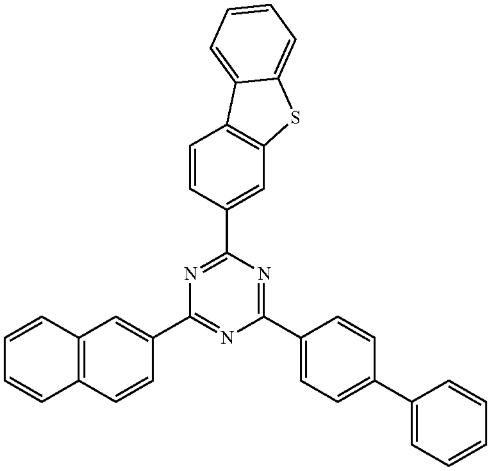
E-134
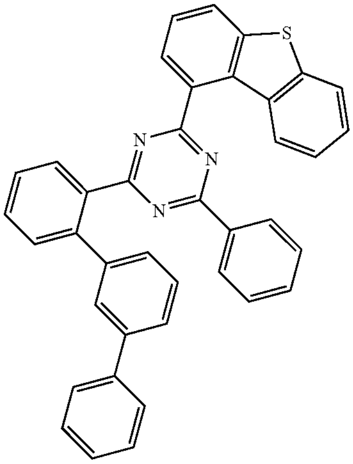
E-135
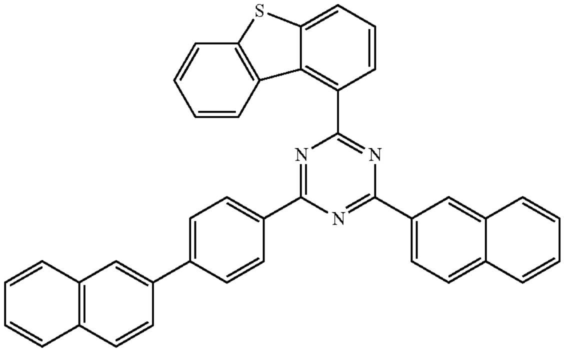
E-136
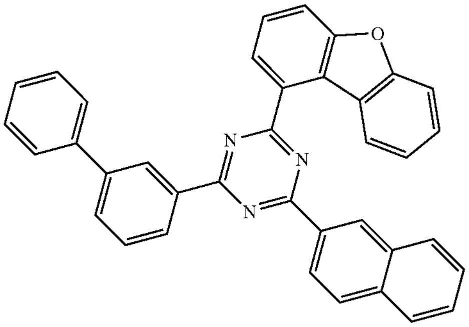
E-137
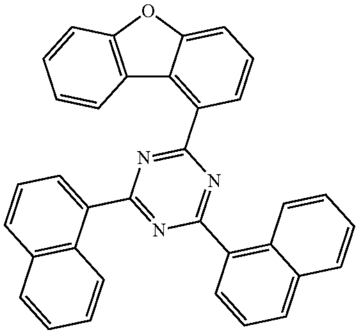

-continued
E-138
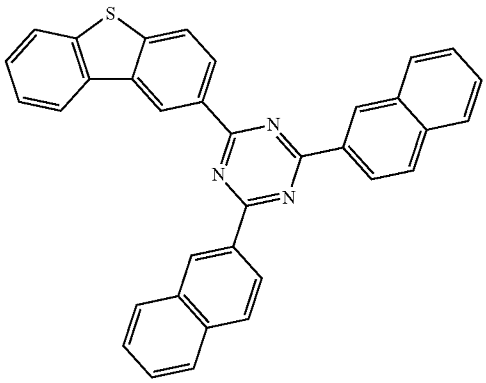
E-139
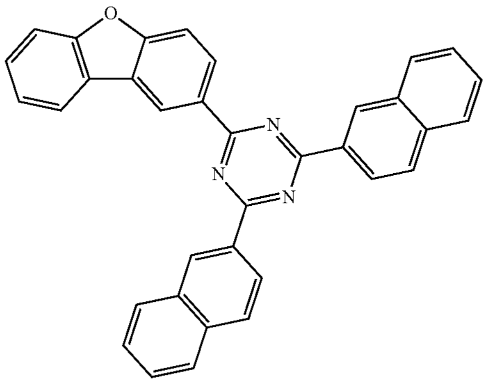
E-140
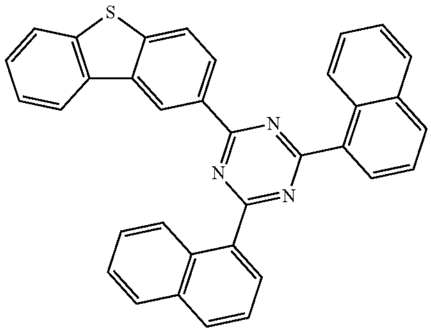
E-141
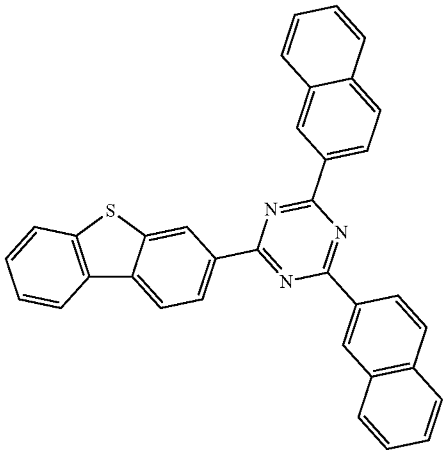
-continued
E-142
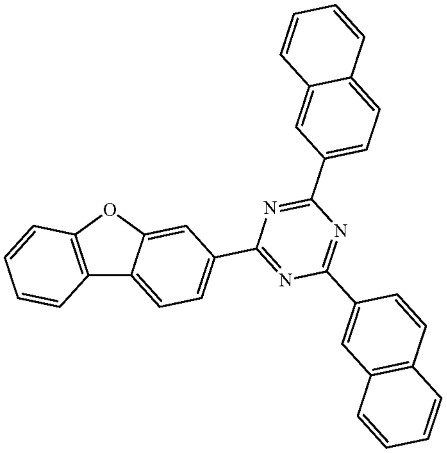
E-143
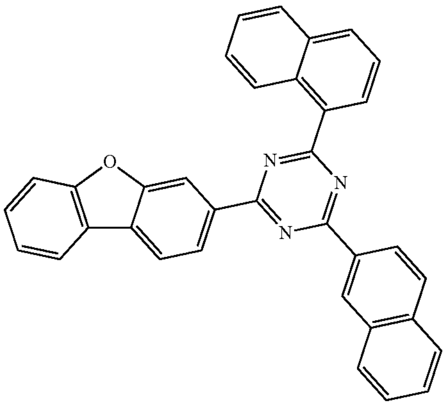
E-144
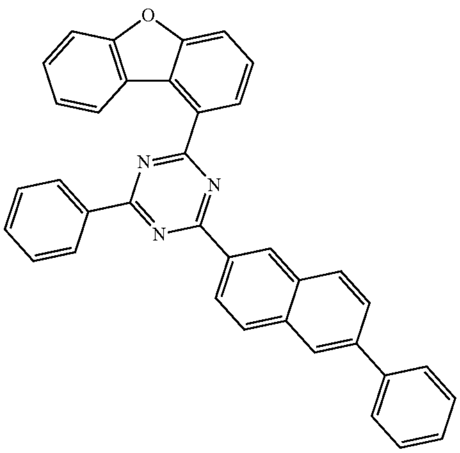

-continued
E-145
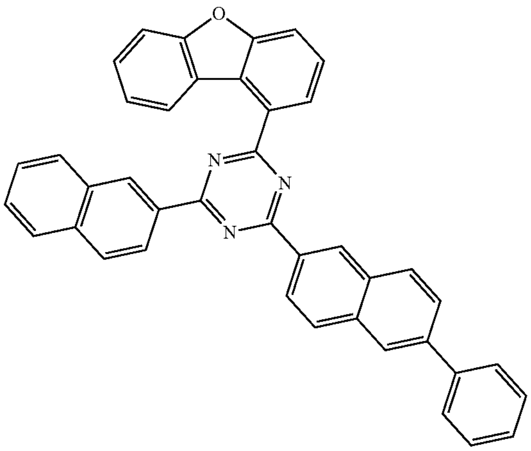
E-146
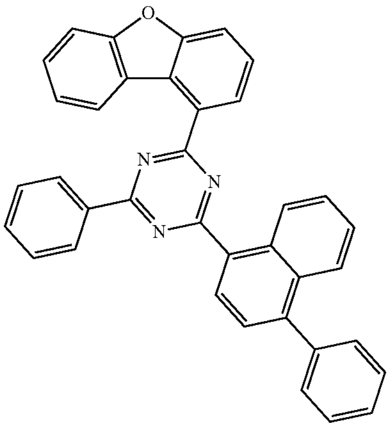
E-147
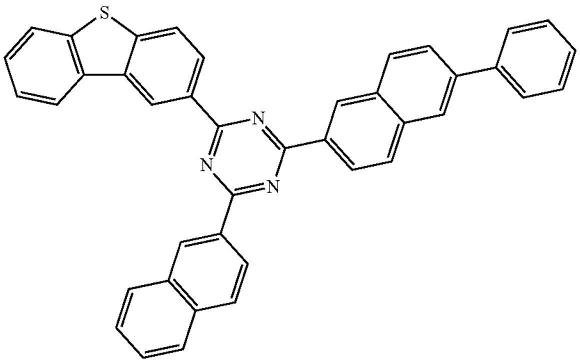
-continued
E-148
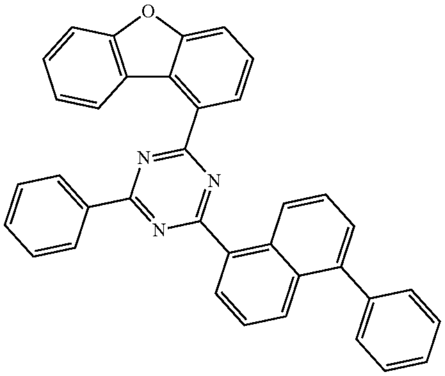
E-149
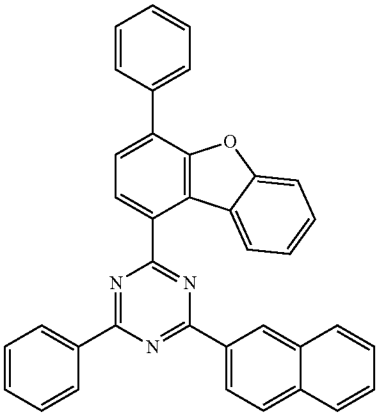
E-150
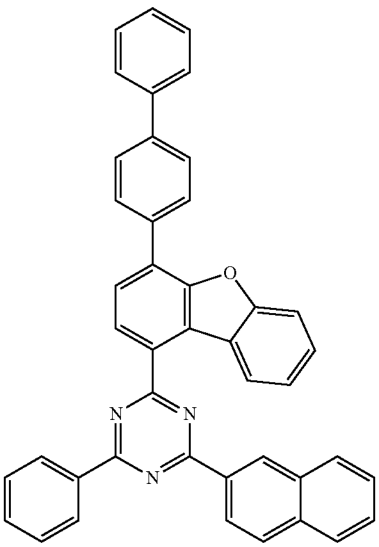

-continued
E-151
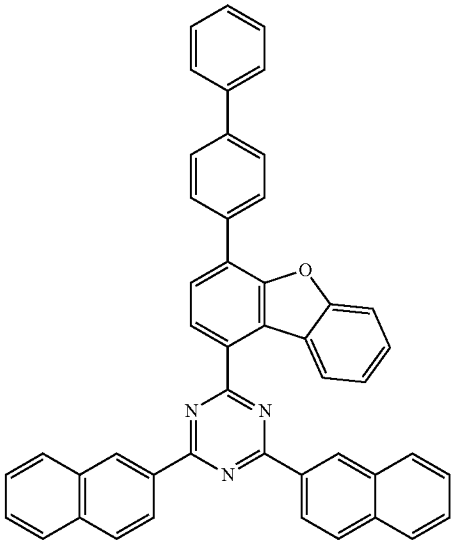
E-152
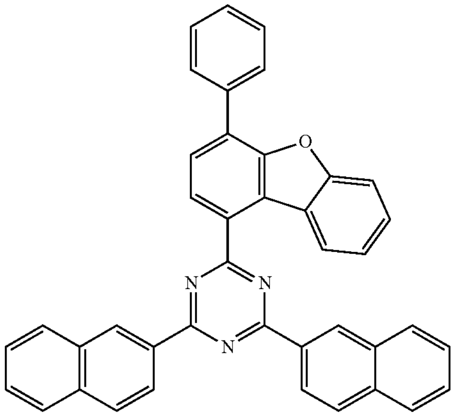
E-153
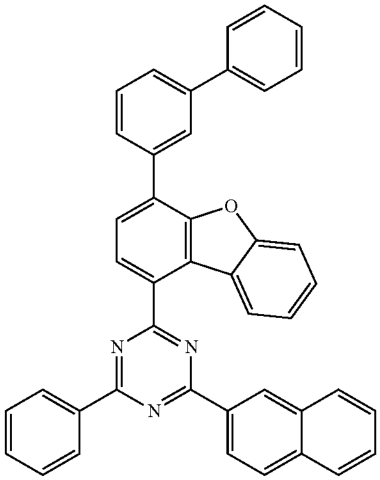
-continued
E-154
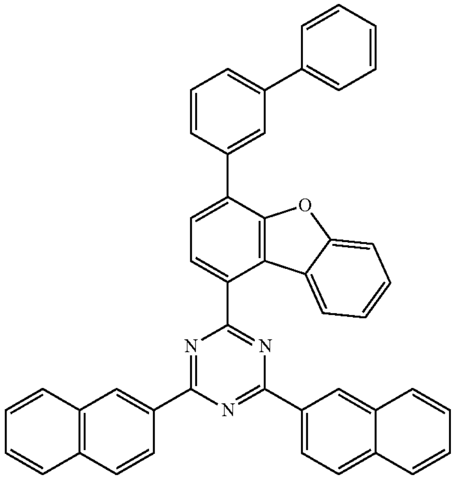
E-155
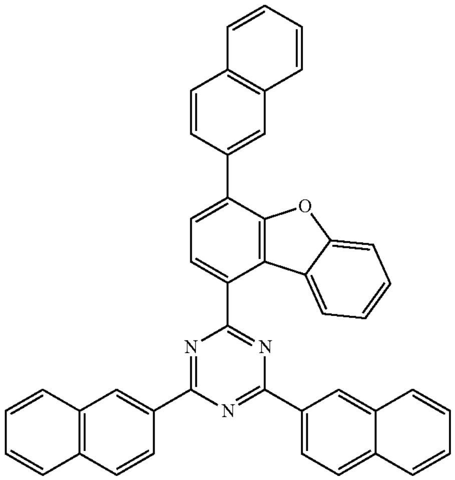
E-156
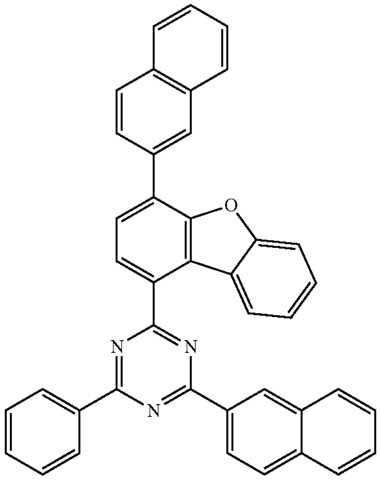

-continued
E-157
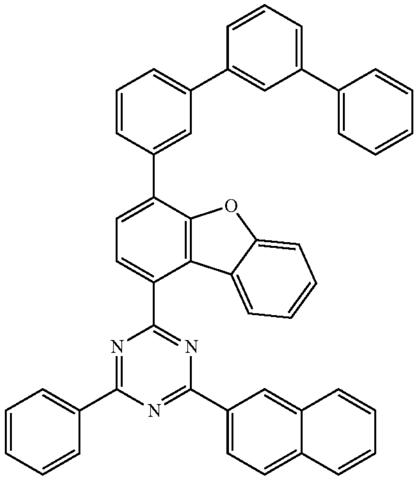
E-158
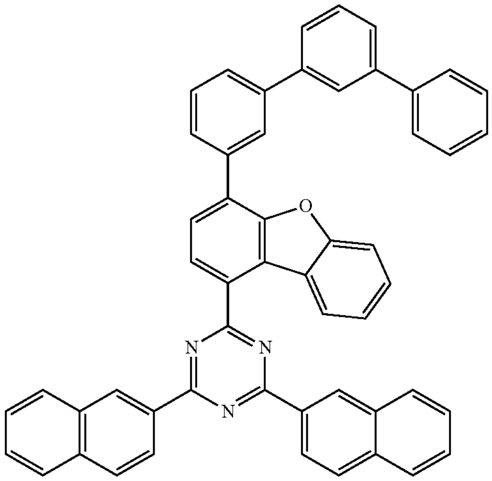
E-159
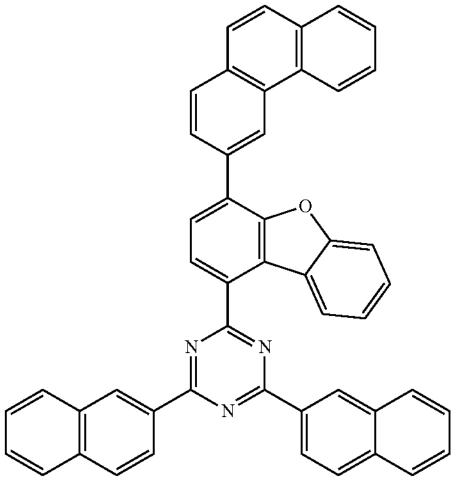
-continued
E-160
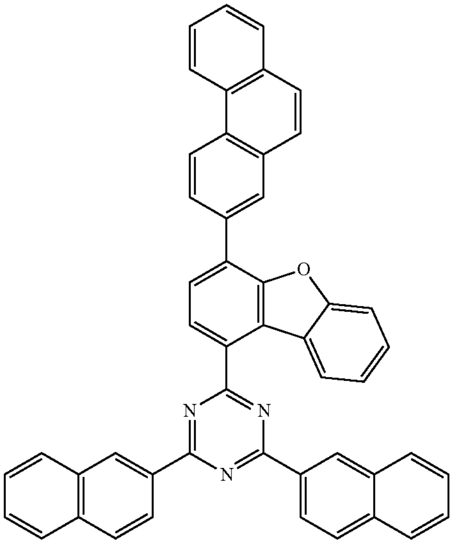
E-161
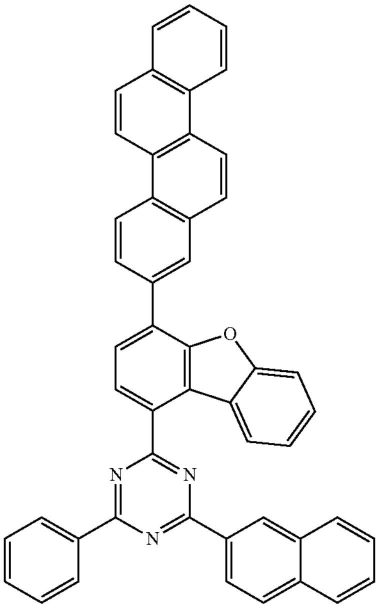
E-162
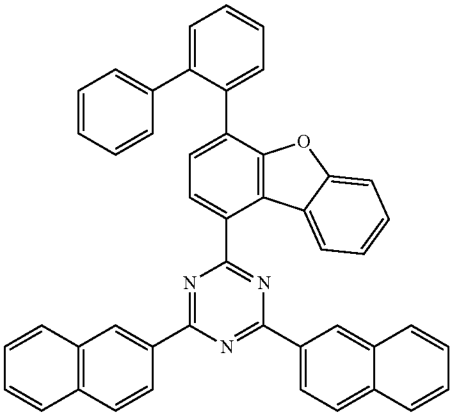

-continued
E-163
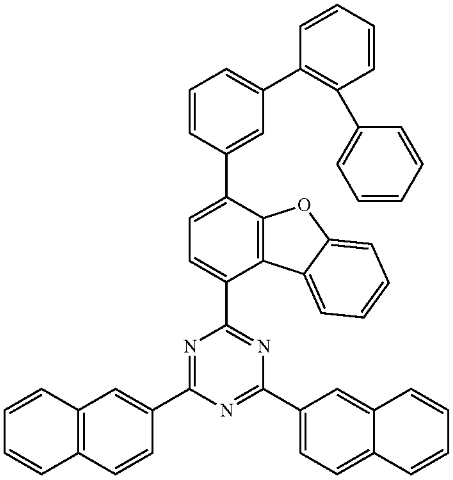
E-164
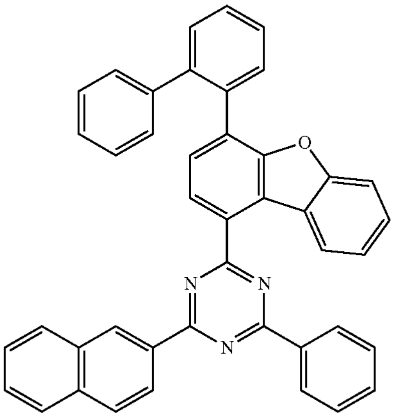
E-165
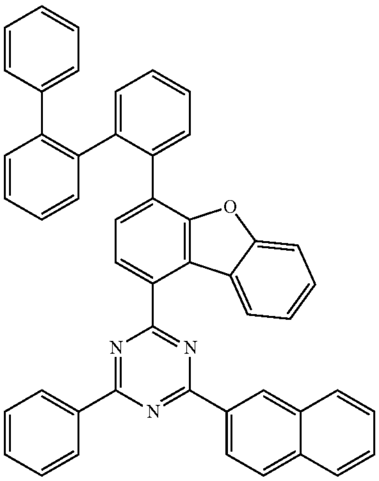
-continued
E-166
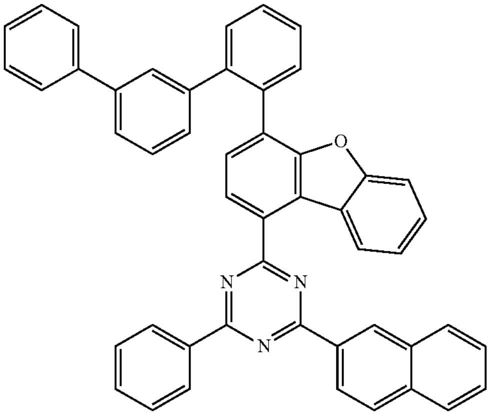
E-167
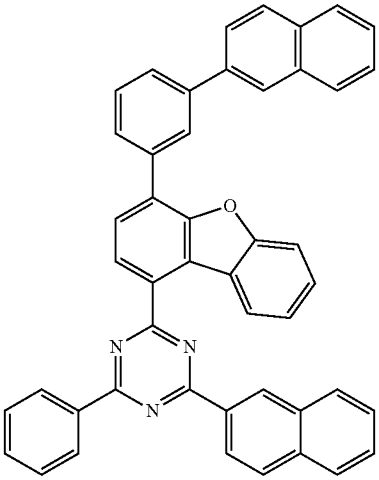
E-168
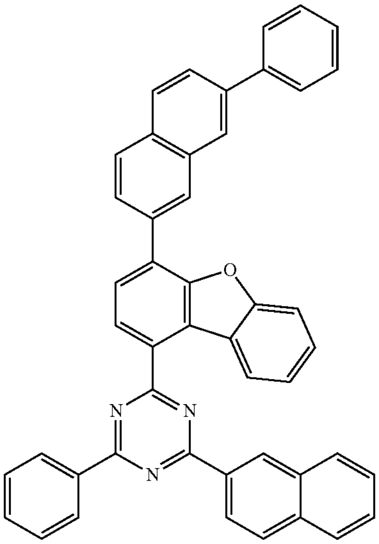

-continued
E-169
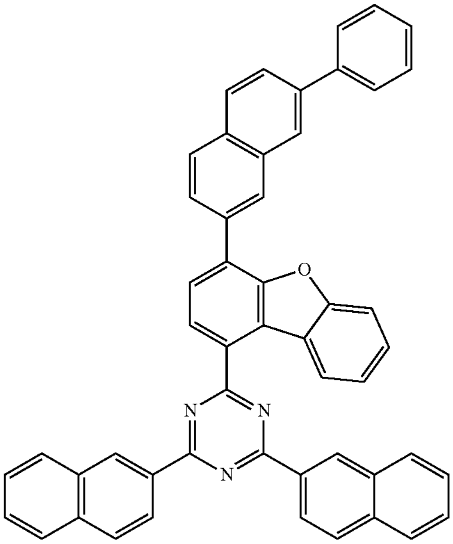
E-170
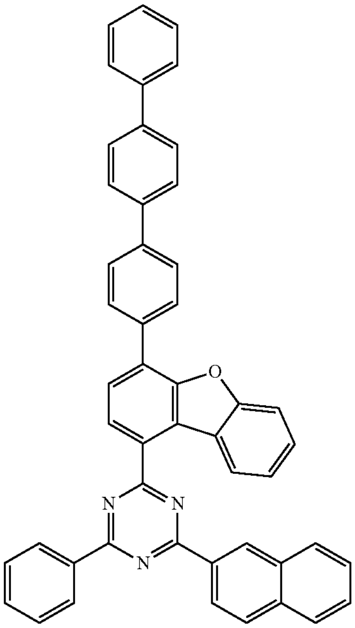
E-171
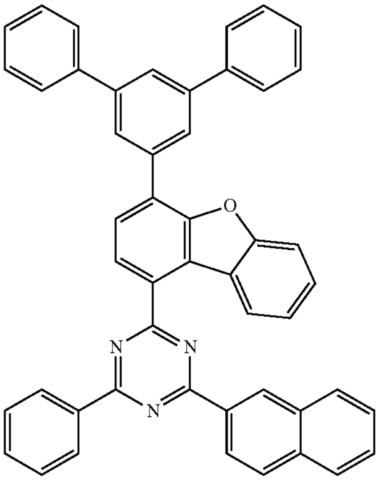
-continued
E-172
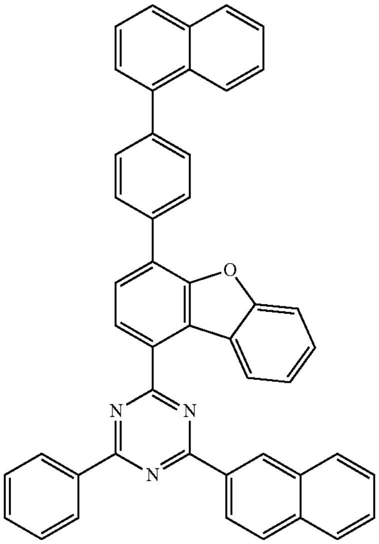
E-173
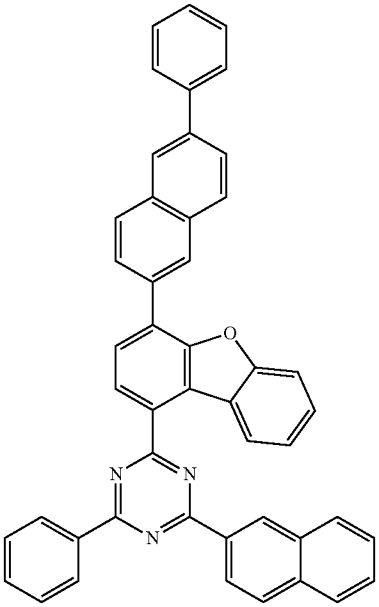

-continued
E-174
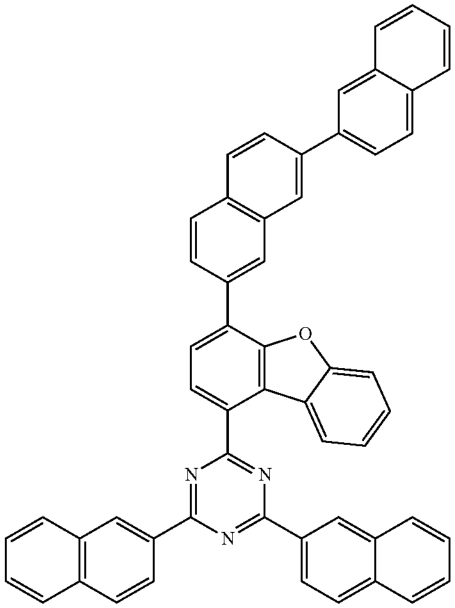
E-175
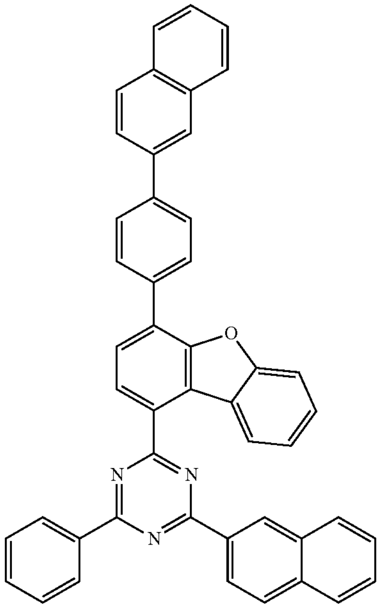
-continued
E-176
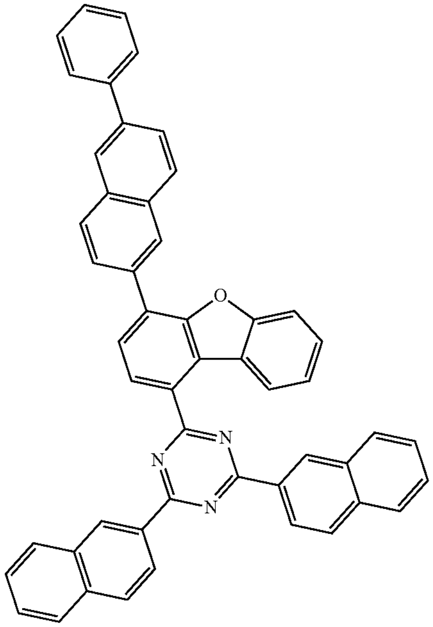
E-177
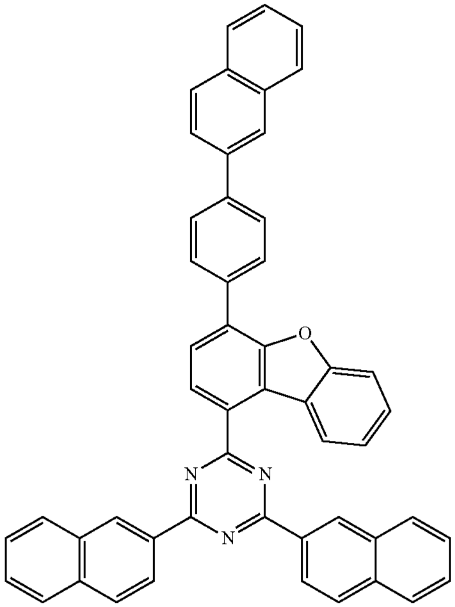

-continued
E-178
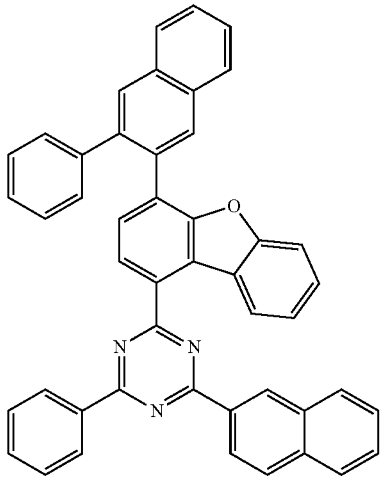
E-179
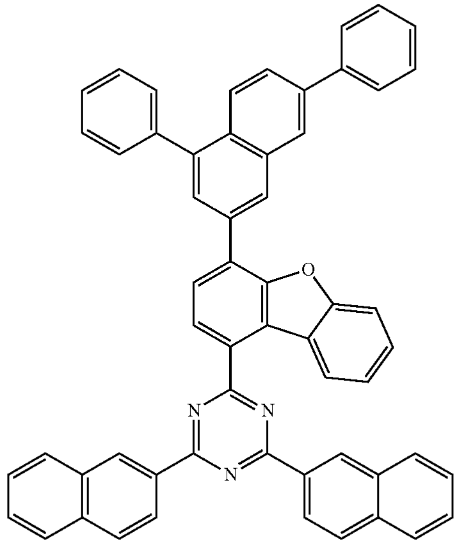
E-180
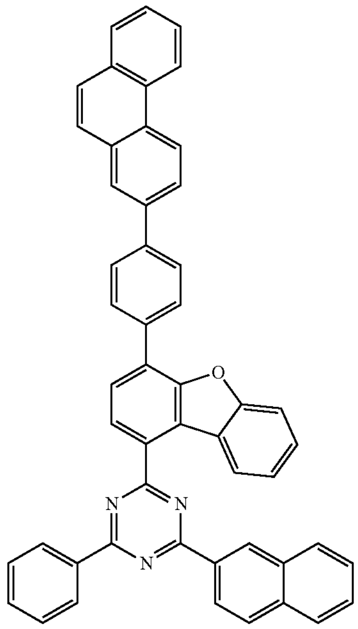
-continued
E-181
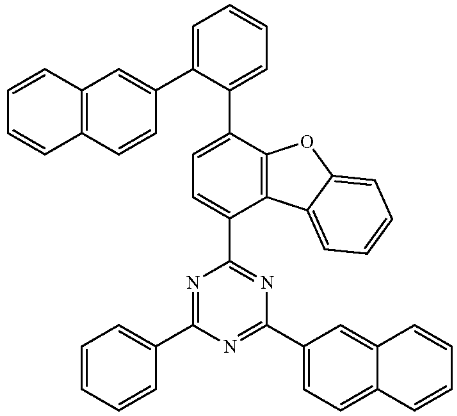
E-182
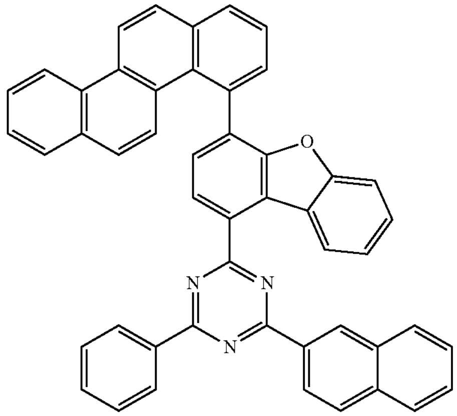
E-183
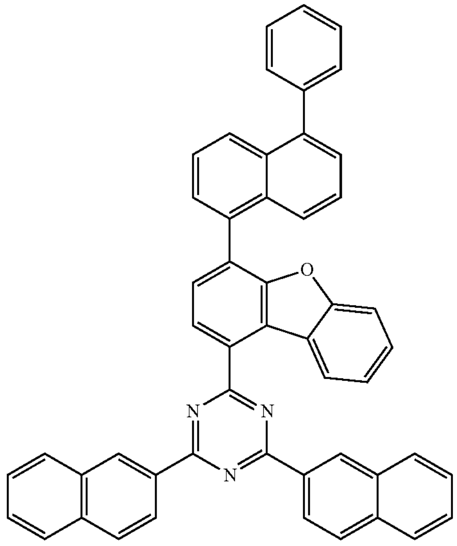

-continued
E-184
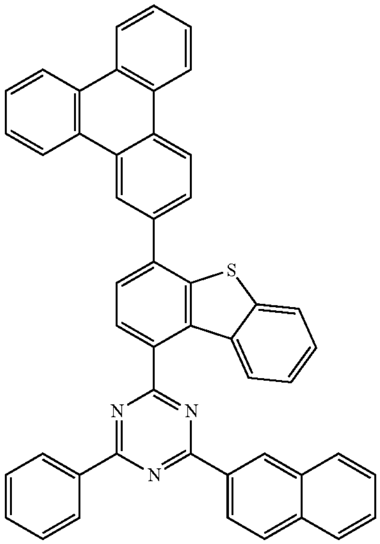
E-185
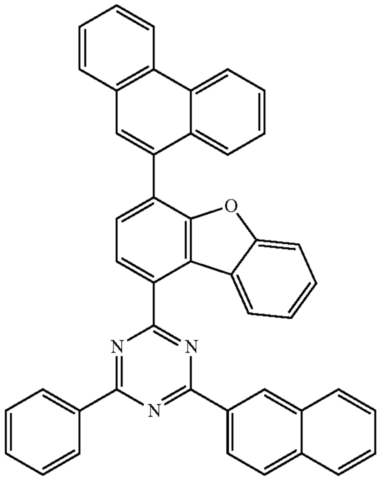
E-186
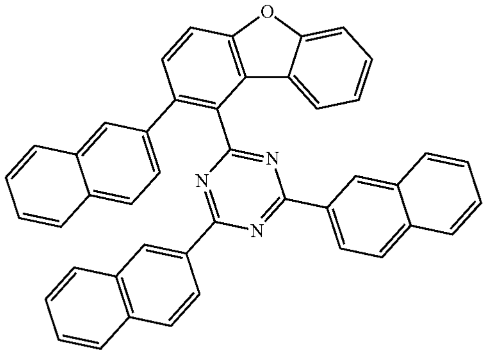
-continued
E-187
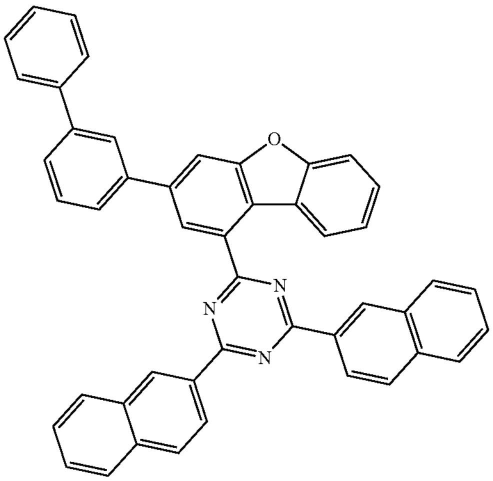
E-188
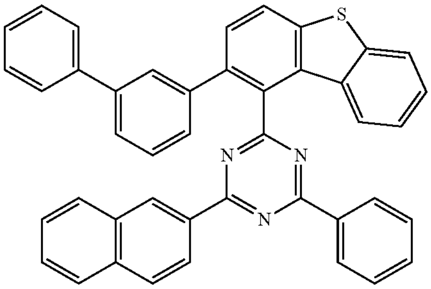
E-189
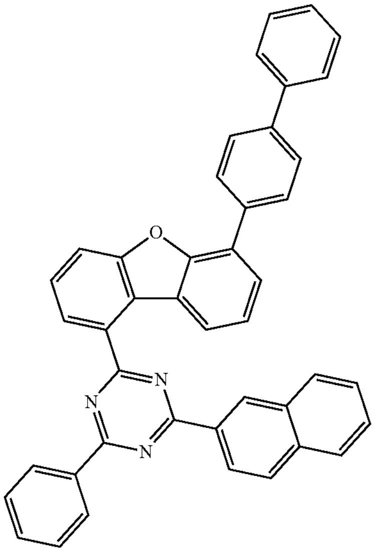

-continued
E-190
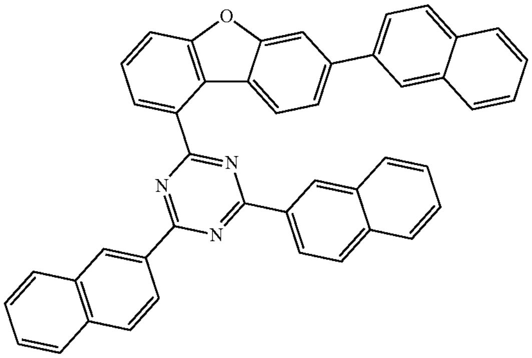
E-191
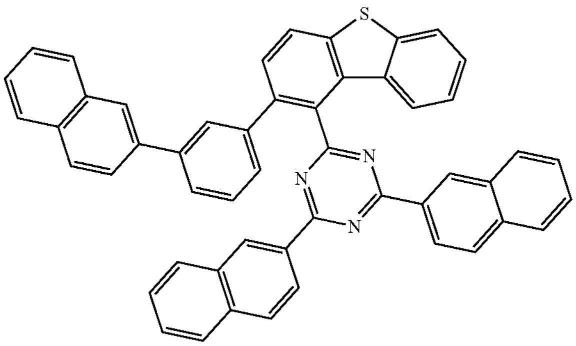
E-192
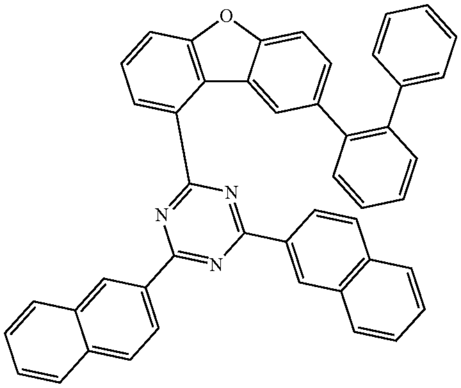
E-193
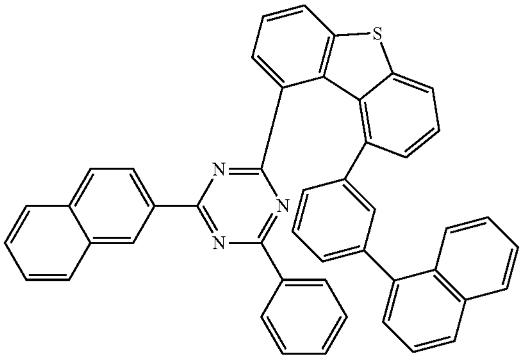
-continued
E-194
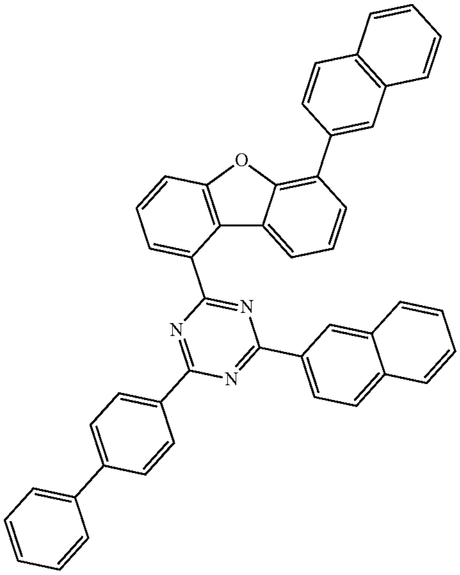
E-195
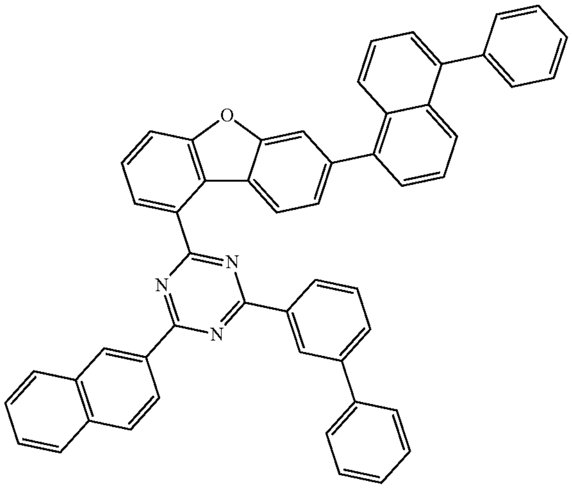
E-196
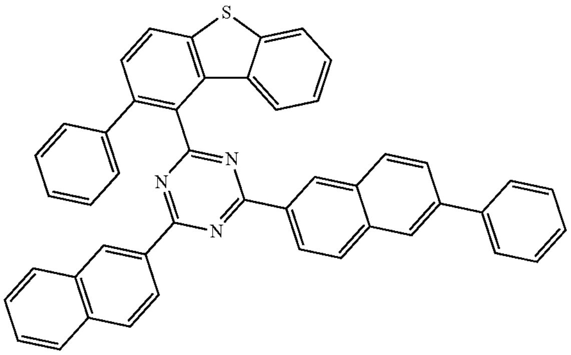
The compound represented by formula 2 may be at least one selected from the following compounds, but is not limited thereto.

-continued
C-1
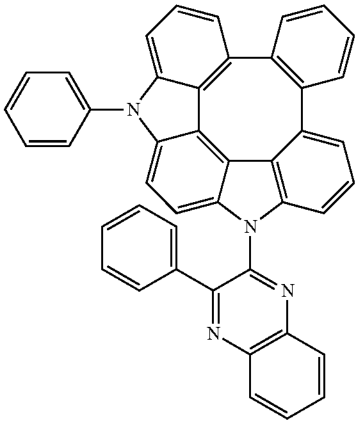
C-4
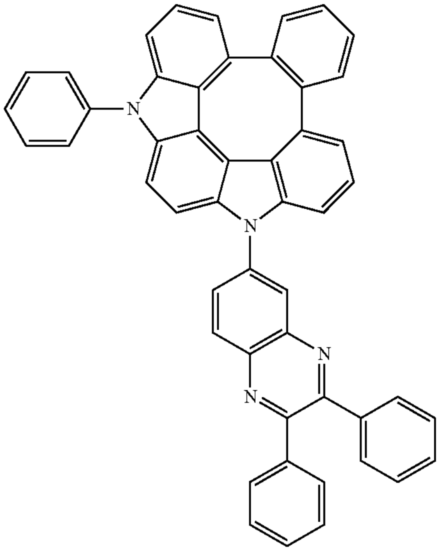
C-2
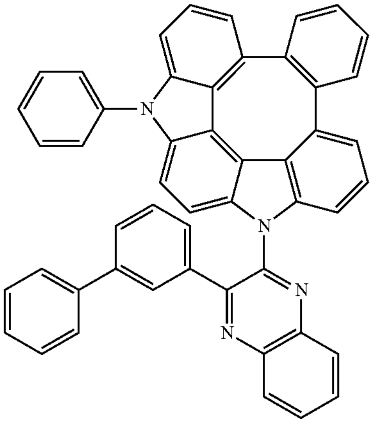
C-5
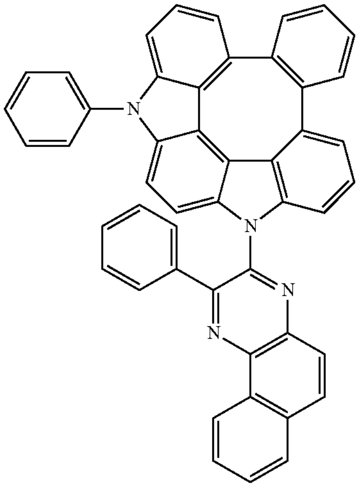
C-3
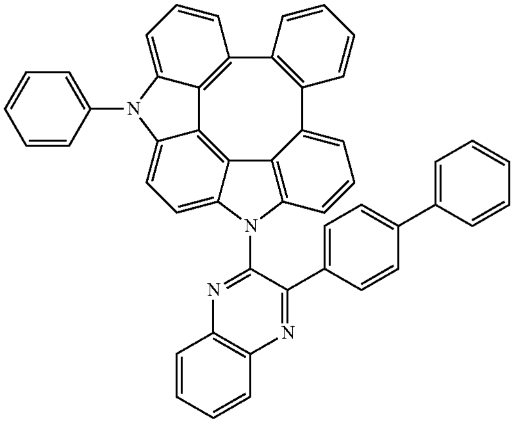
C-6
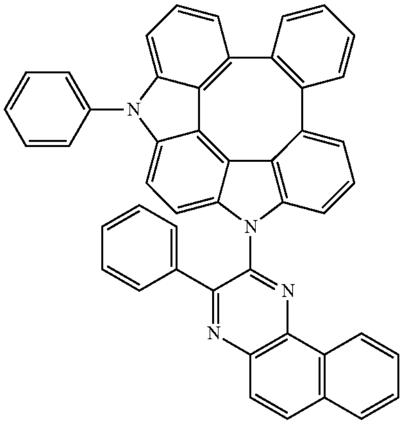

-continued
C-7
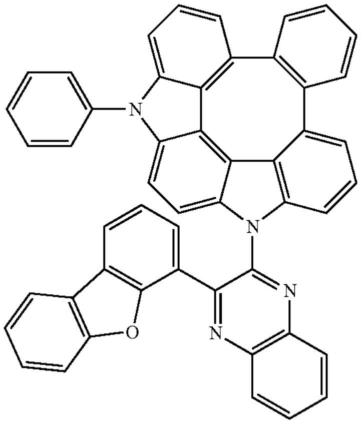
C-8
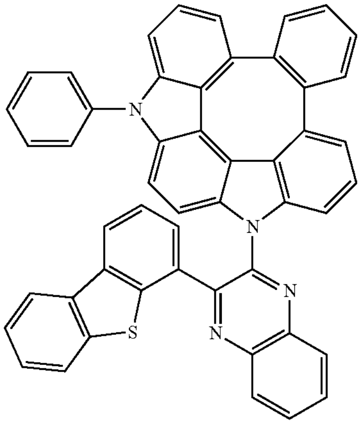
C-9
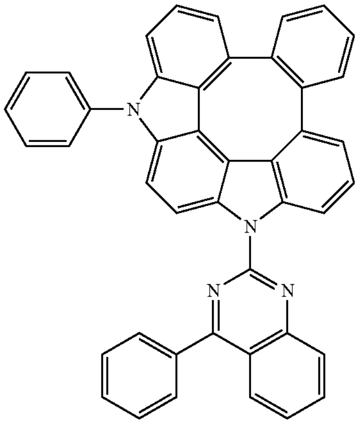
-continued
C-10
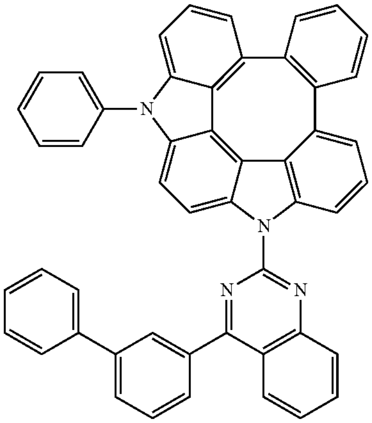
C-11
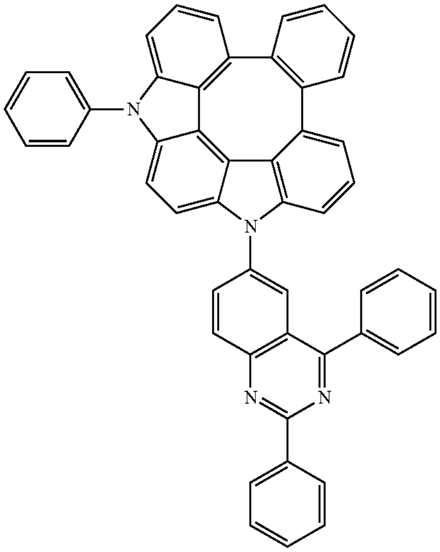
C-12
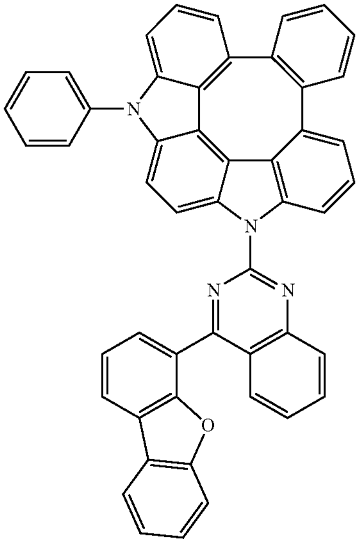

C-13
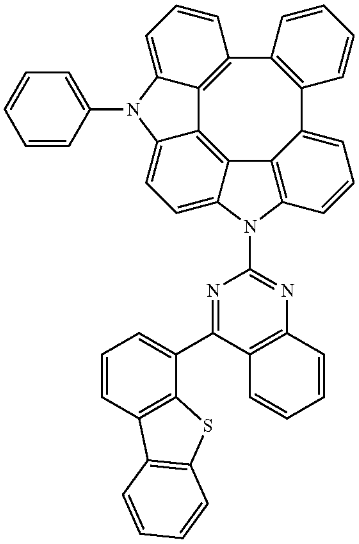
C-14
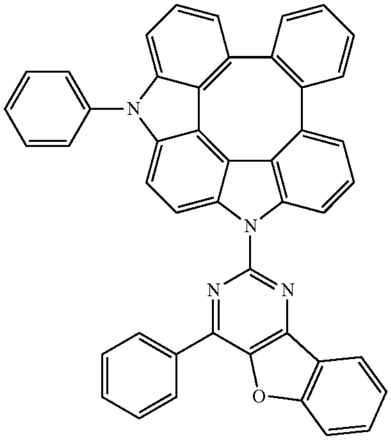
C-15
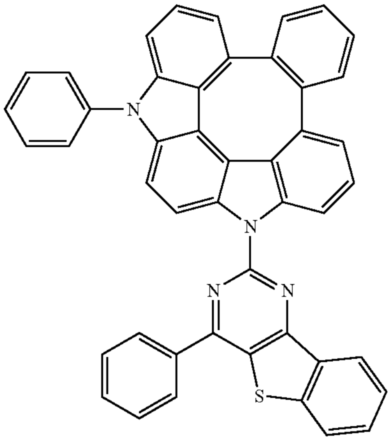
C-16
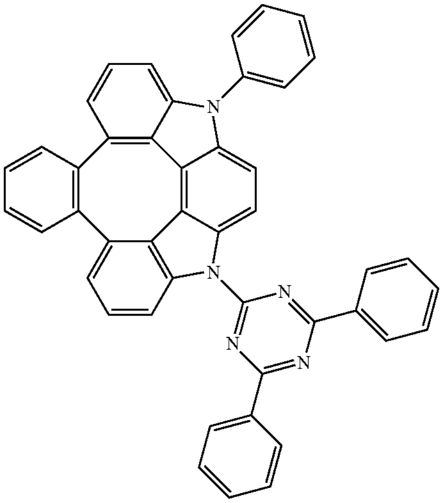
C-17
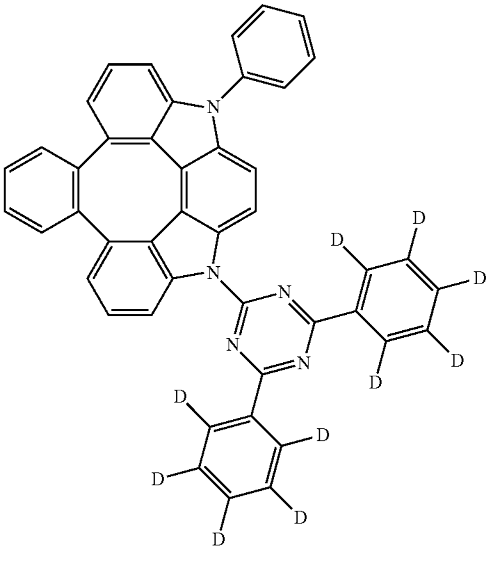

-continued
C-18
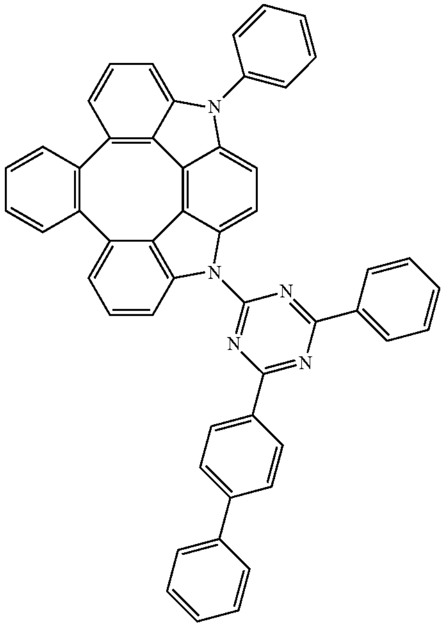
C-19
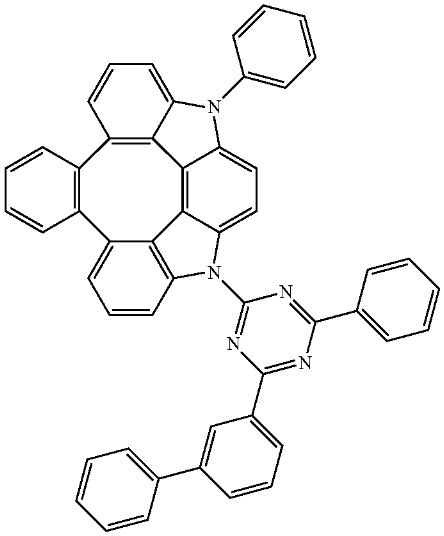
-continued
C-20
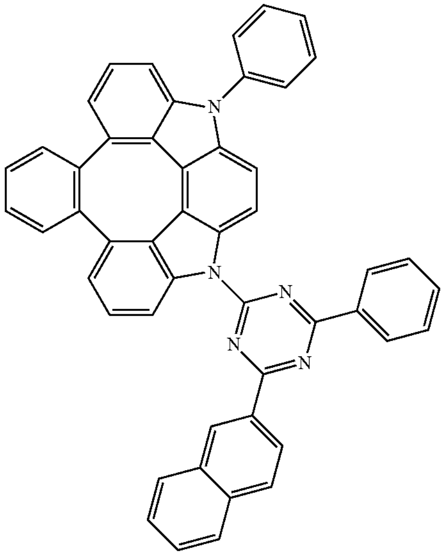
C-21
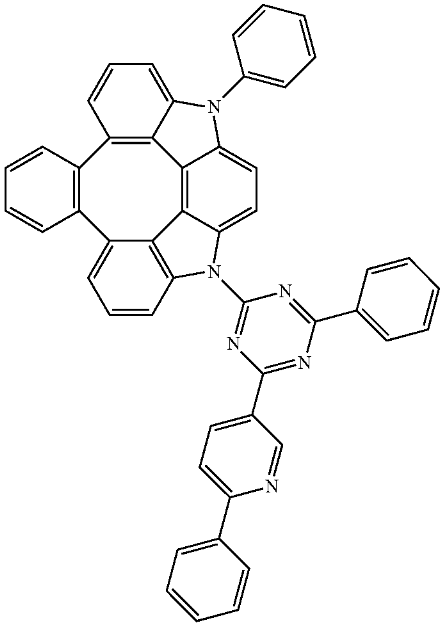

-continued
C-22
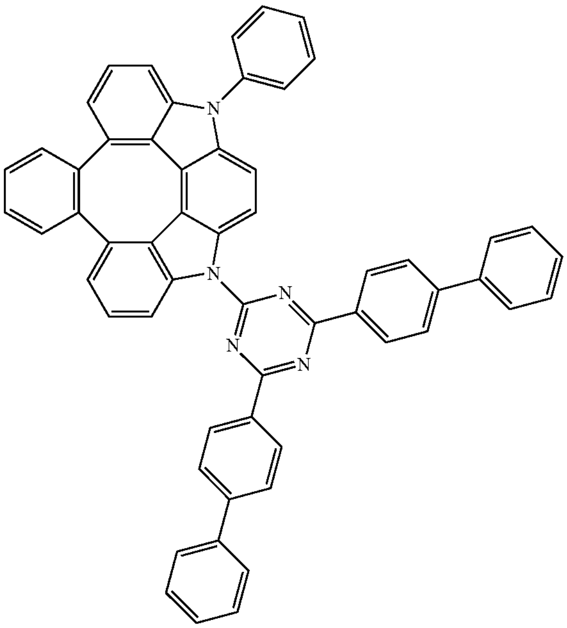
C-23
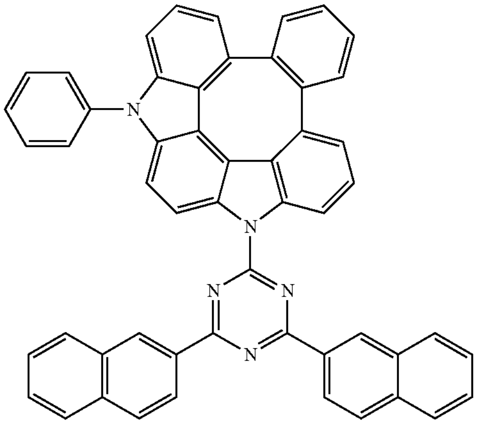
C-24
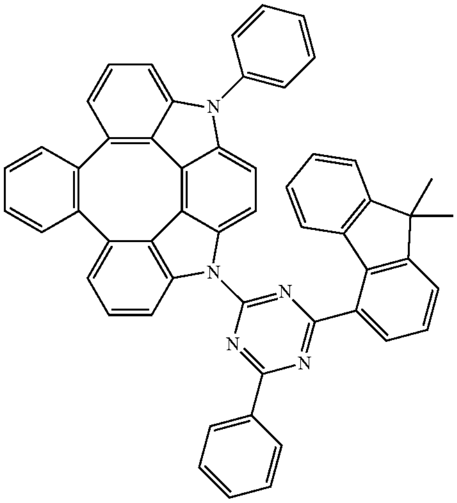
-continued
C-25
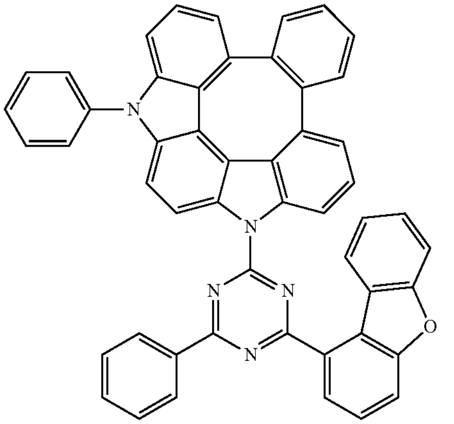
C-26
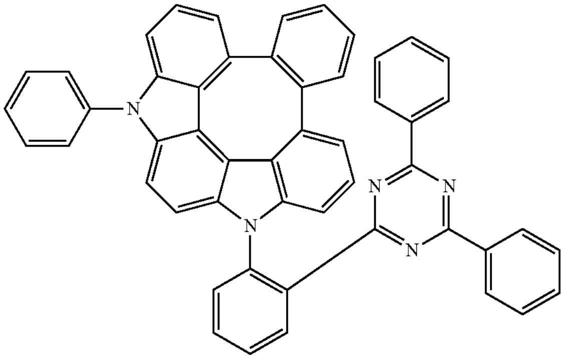
C-27
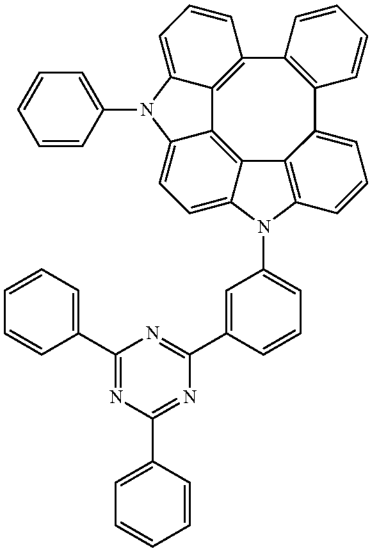

-continued
C-28
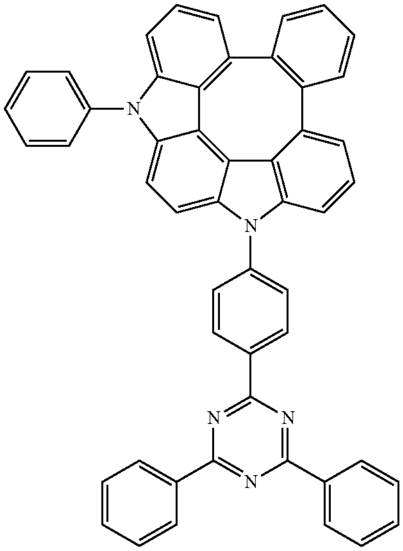
C-29
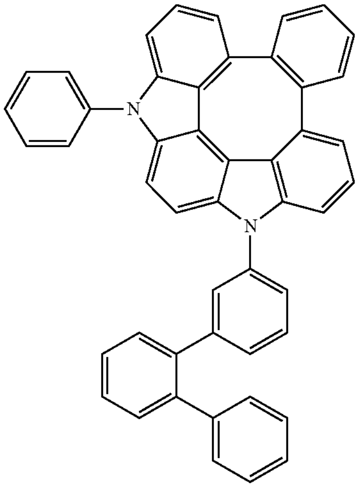
C-30
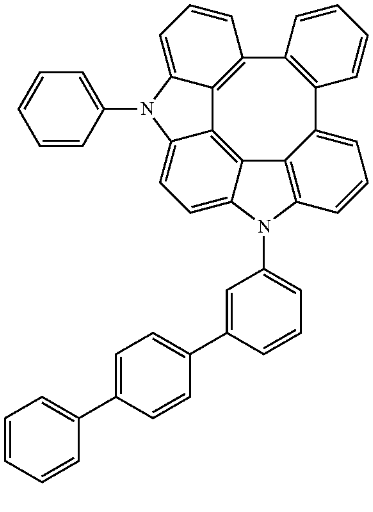
-continued
C-31
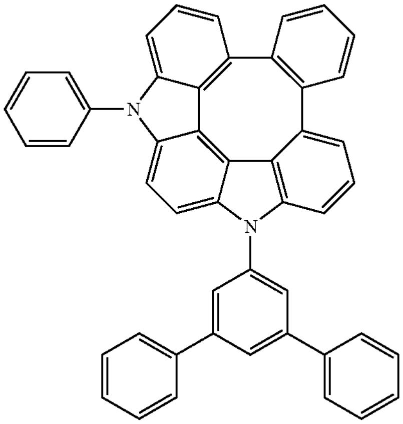
C-32
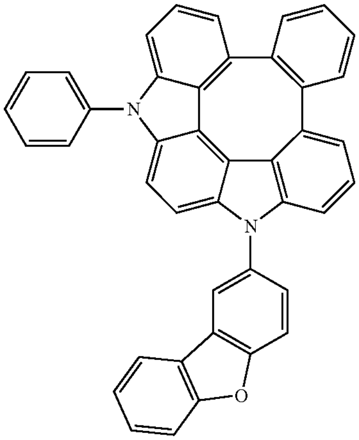
C-33
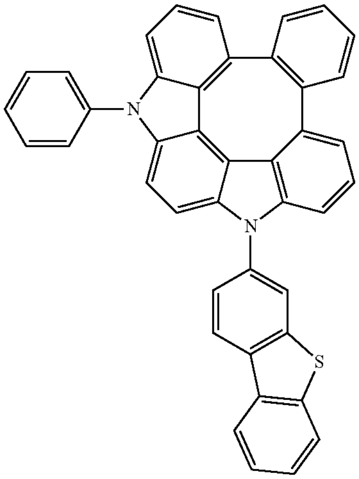

-continued
C-34
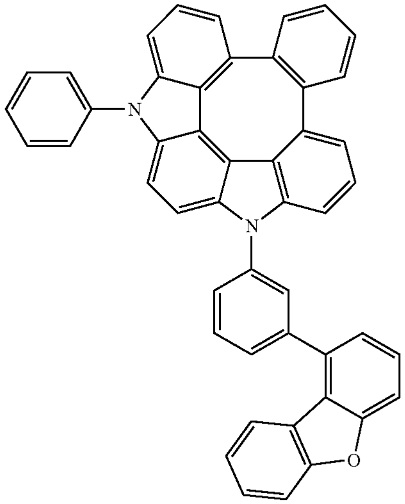
C-35
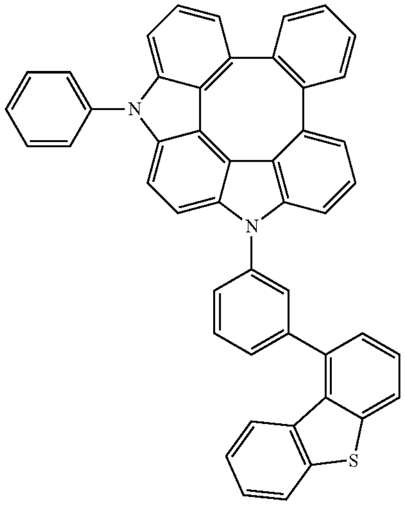
C-36
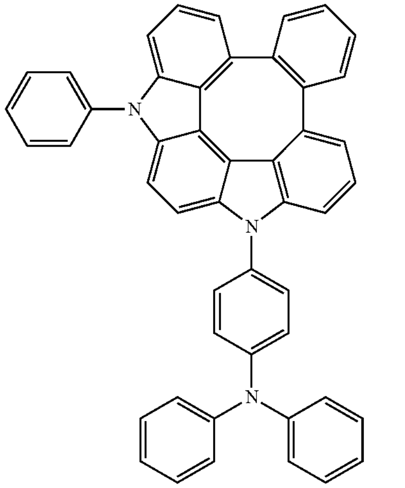
-continued
C-37
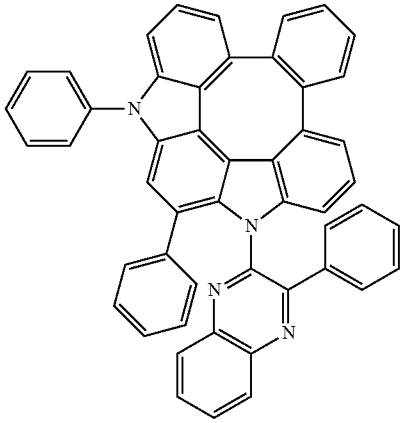
C-38
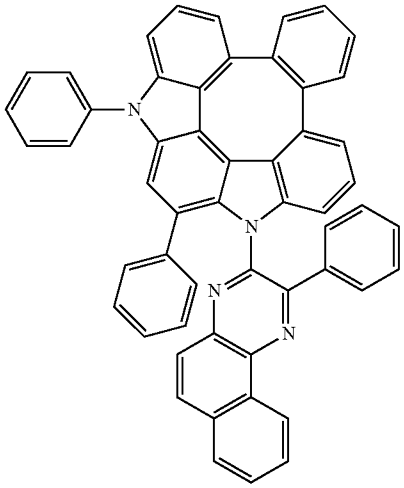
C-39
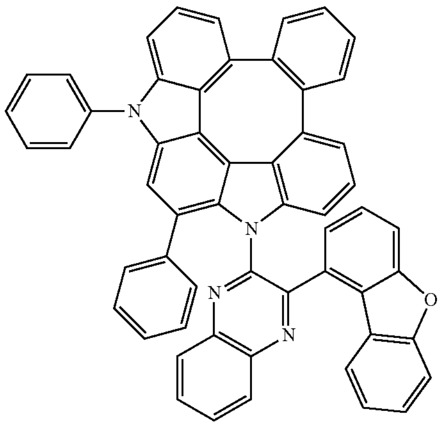

-continued
C-40
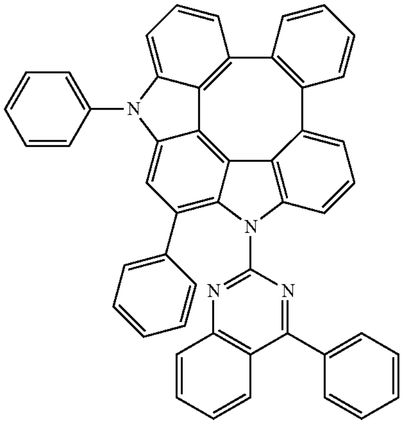
C-41
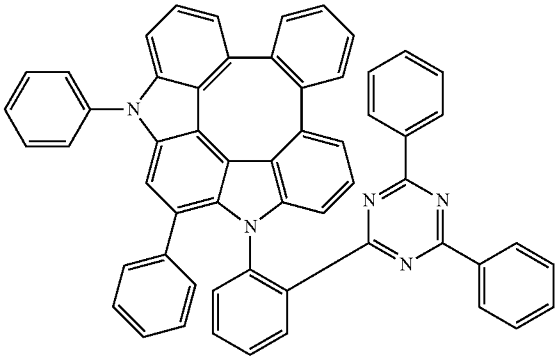
C-42
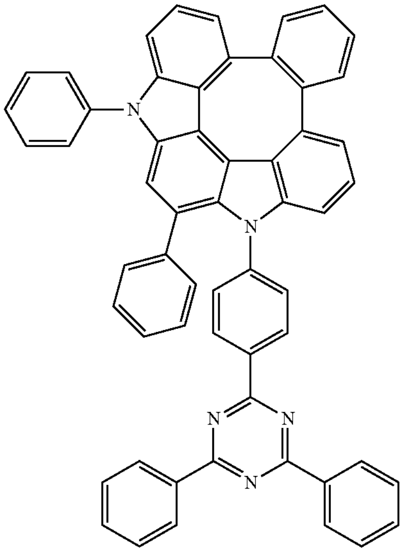
-continued
C-43
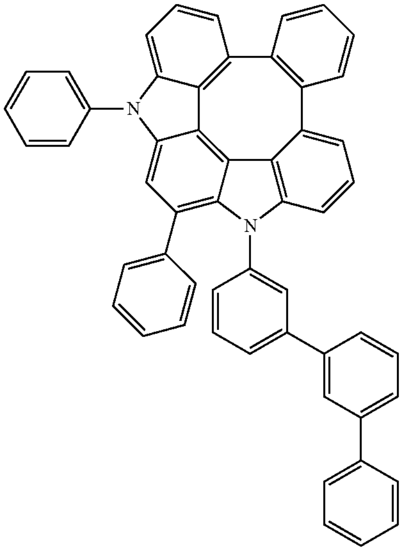
C-44
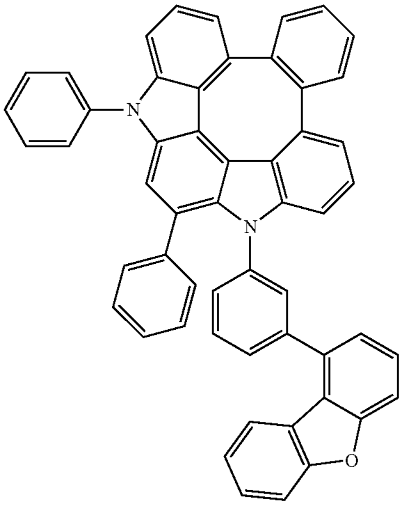
C-45
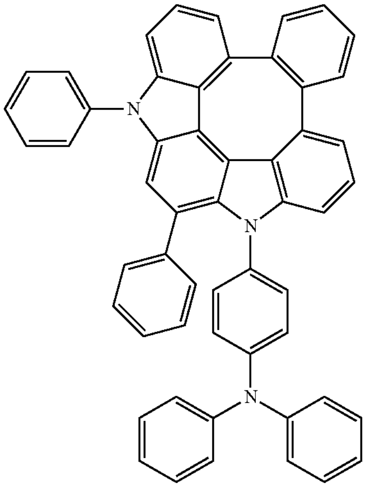

-continued
C-46
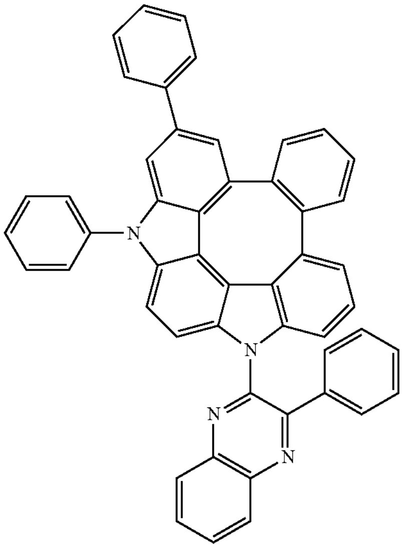
C-47
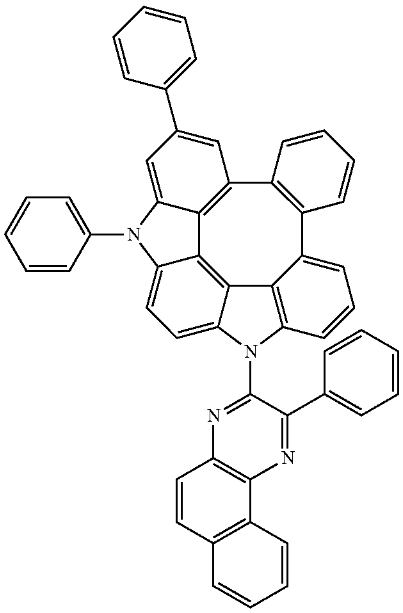
-continued
C-48
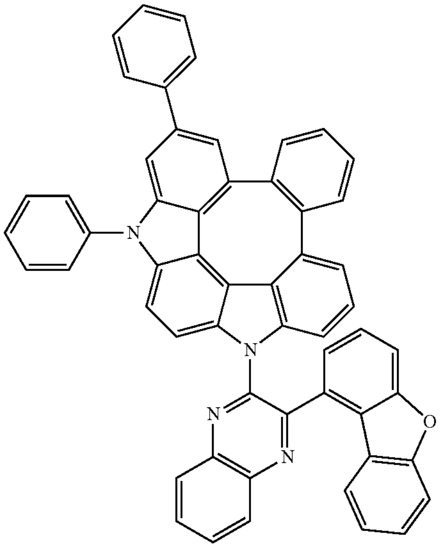
C-49
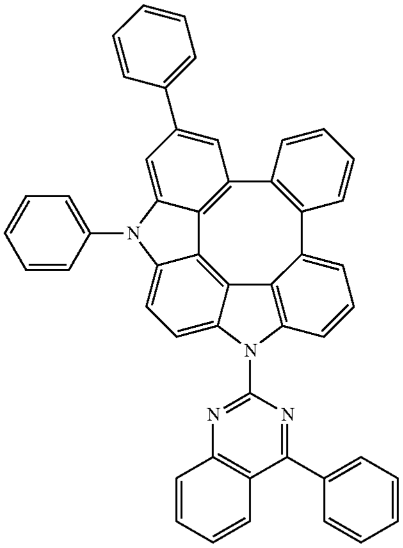
C-50
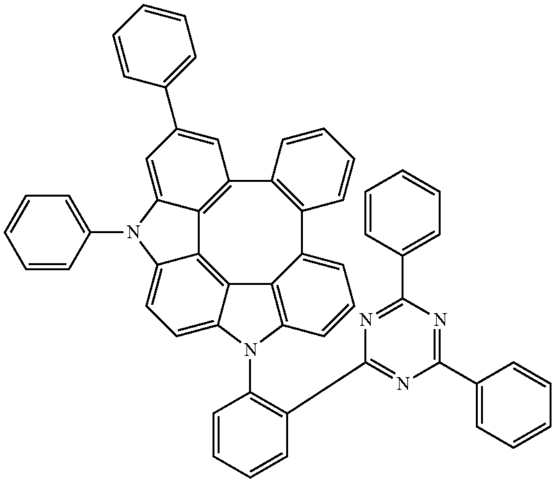

-continued
C-51
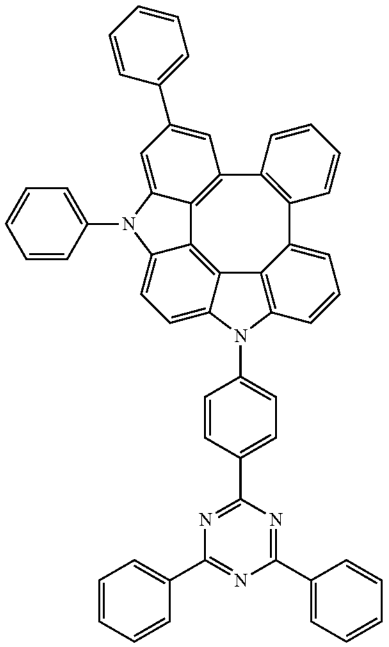
C-52
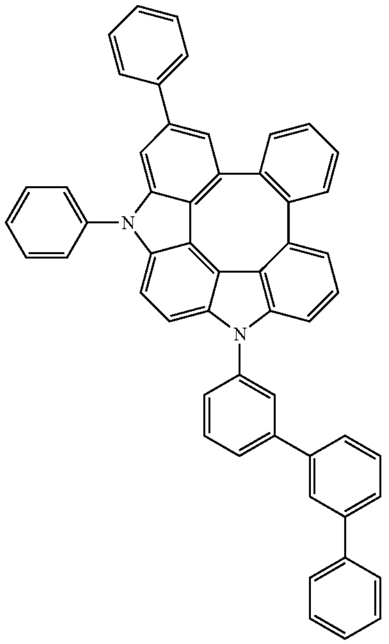
-continued
C-53
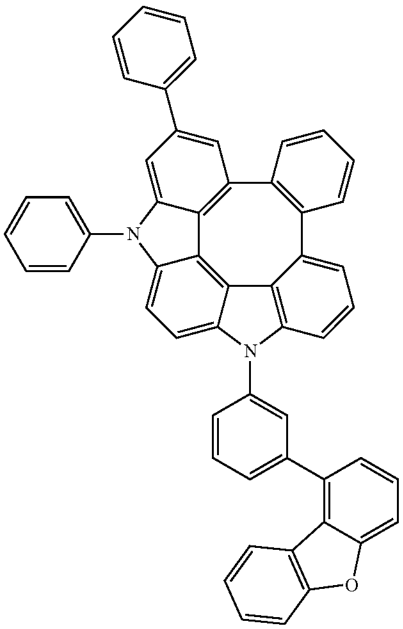
C-54
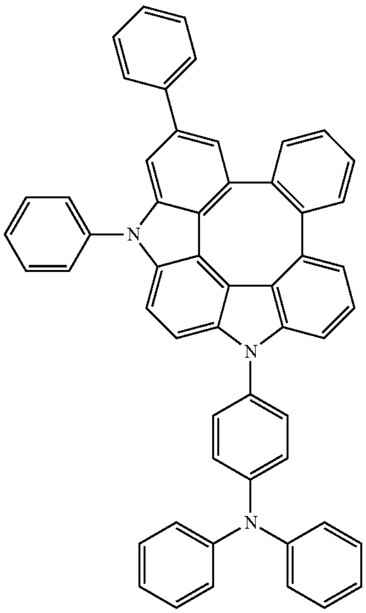

-continued
C-55
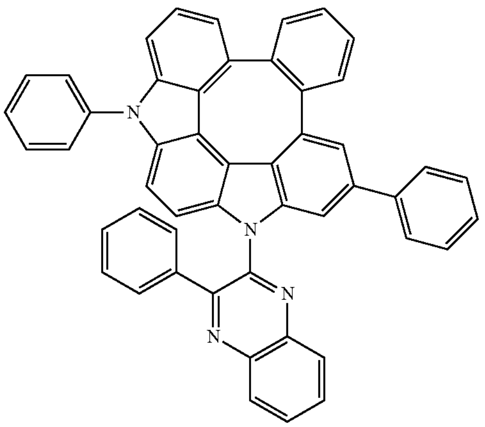
C-56
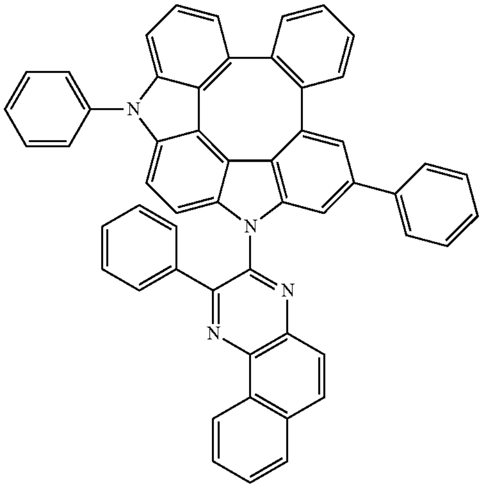
C-57
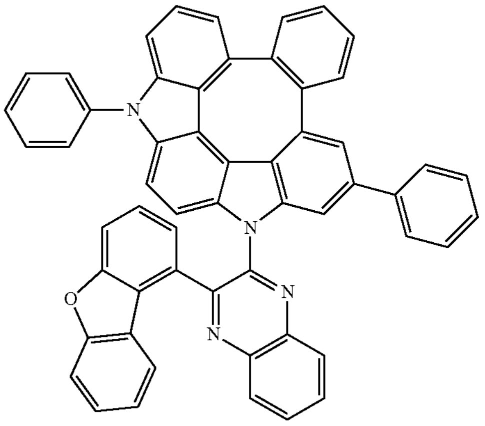
-continued
C-58
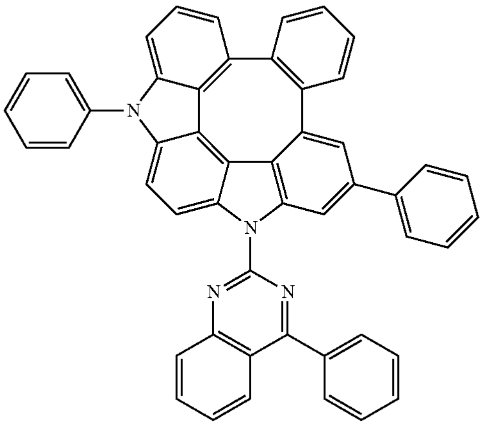
C-59
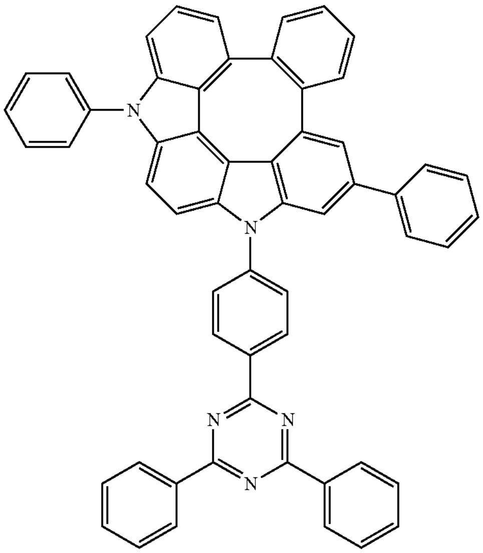
C-60
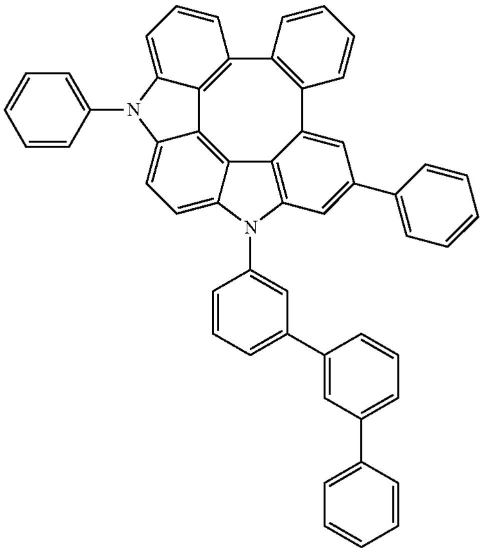

-continued
C-61
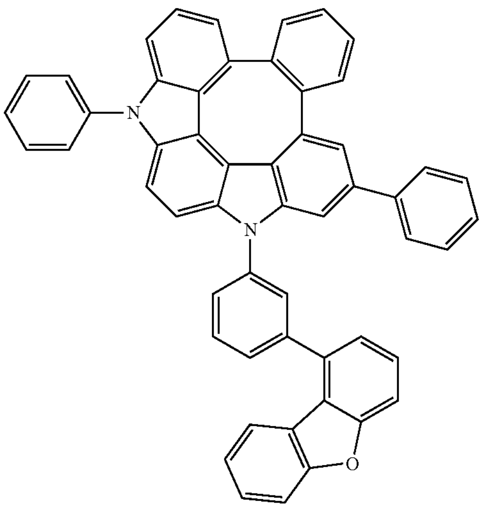
C-62
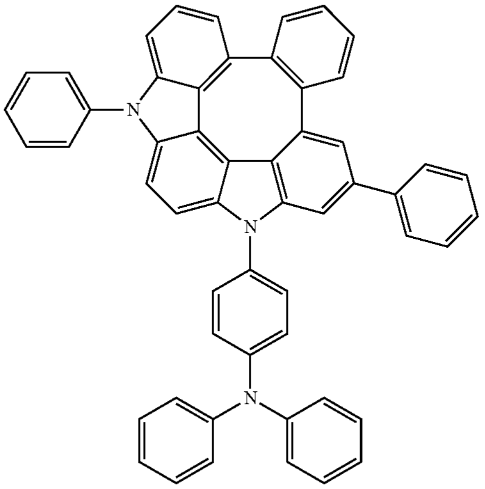
C-63
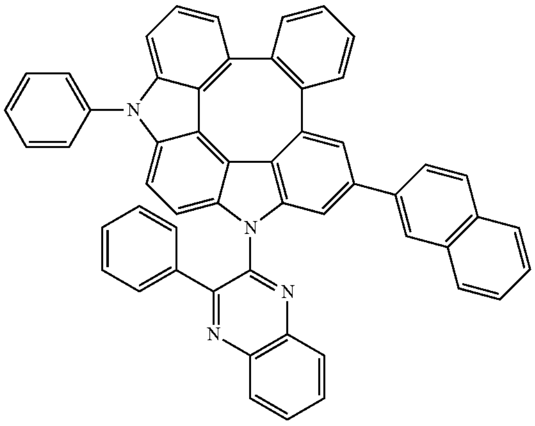
-continued
C-64
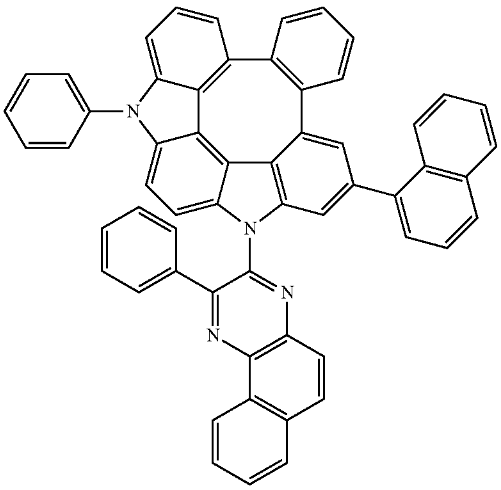
C-65
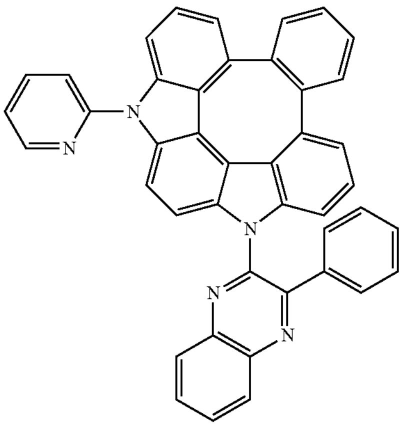
C-66
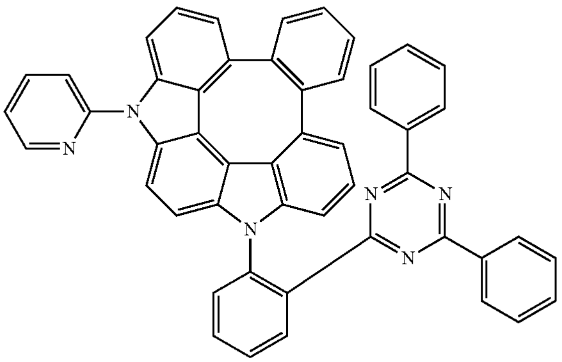

-continued
C-67
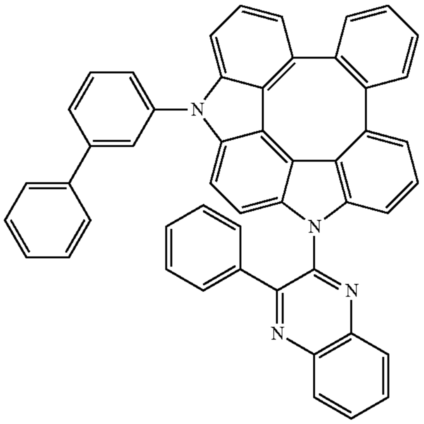
C-68
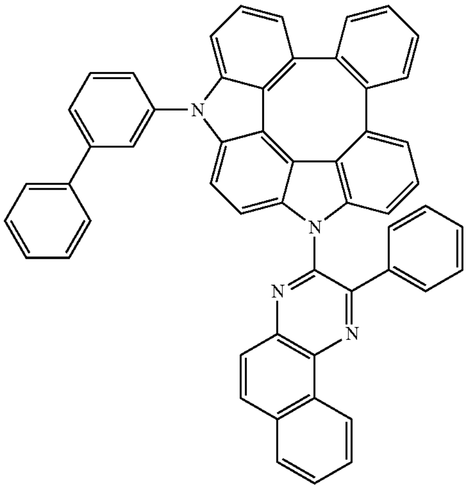
C-69
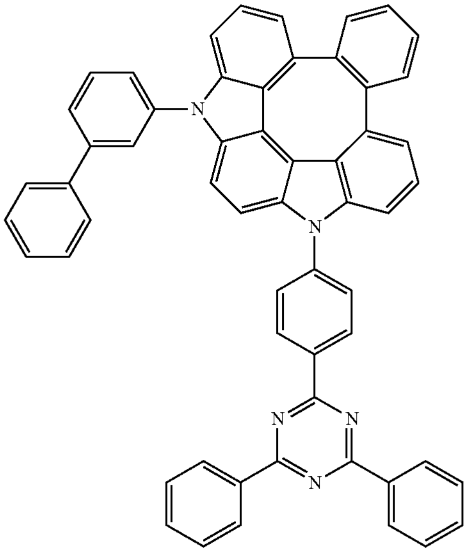
-continued
C-70
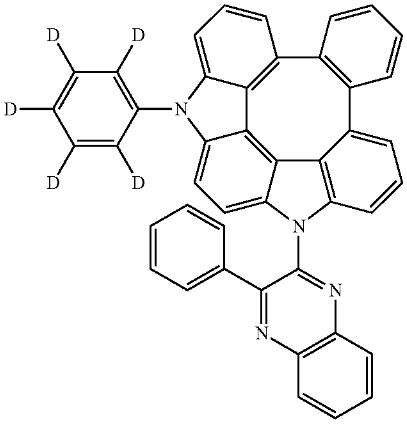
C-71
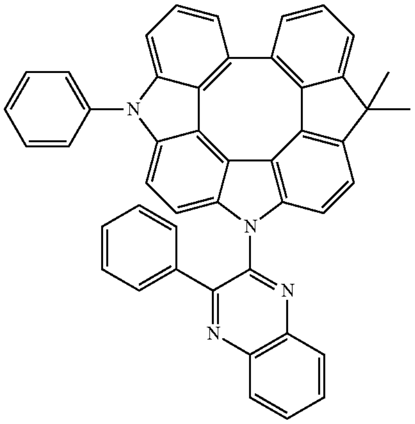
C-72
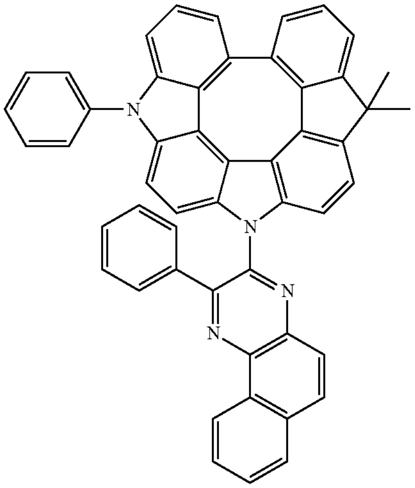

-continued
C-73
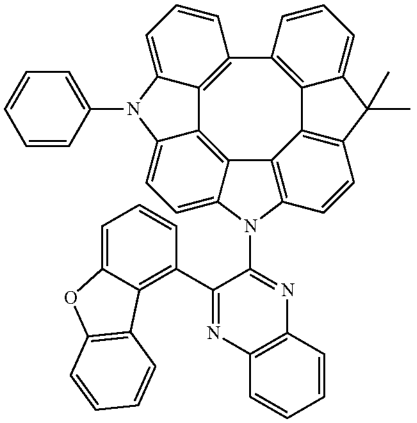
C-74
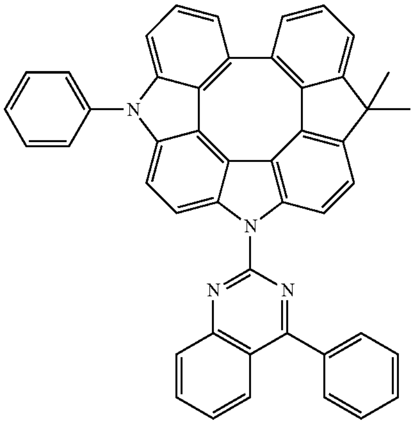
C-75
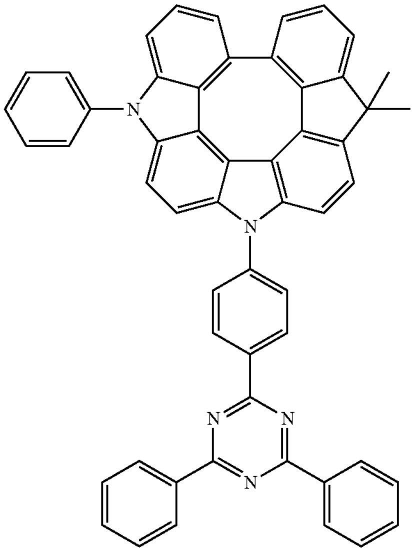
-continued
C-76
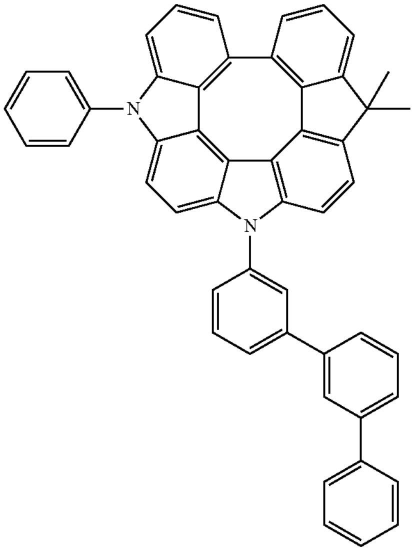
C-77
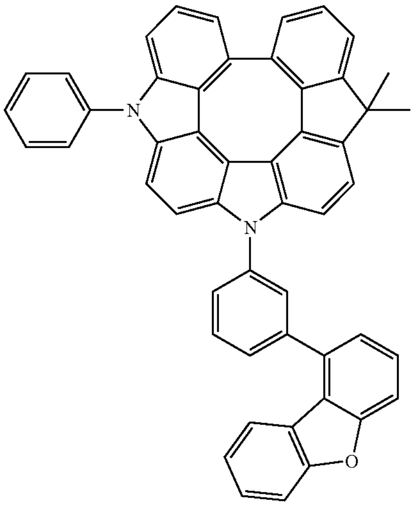
C-78
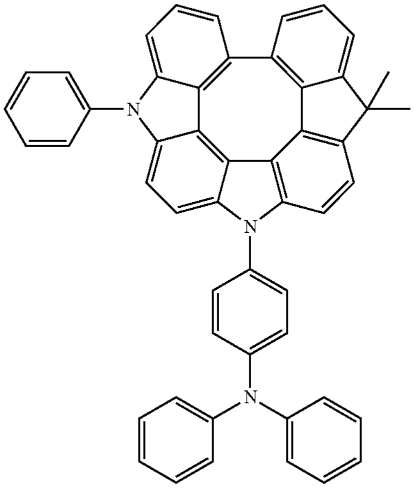

-continued
C-79
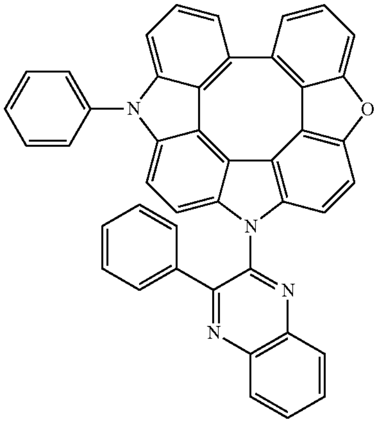
C-80
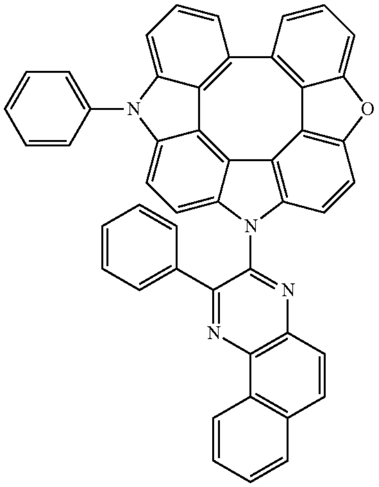
C-81
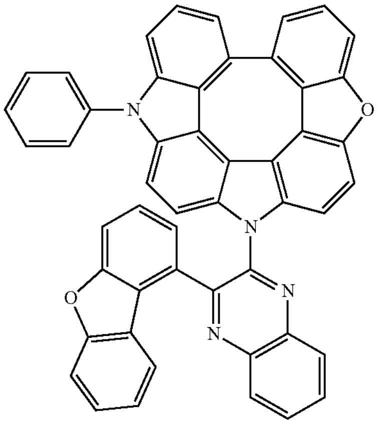
-continued
C-82
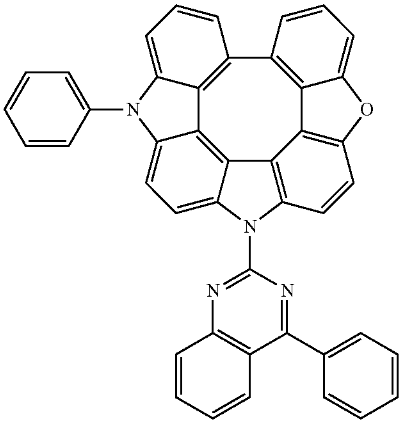
C-83
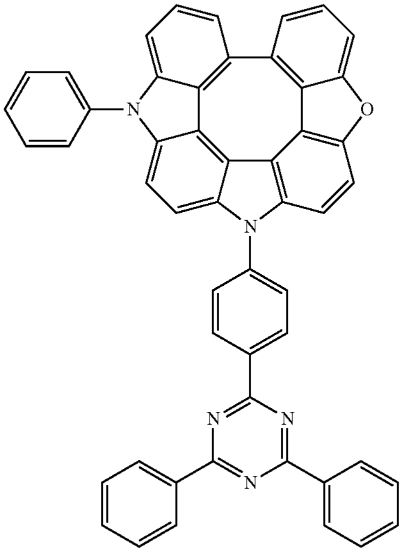
C-84
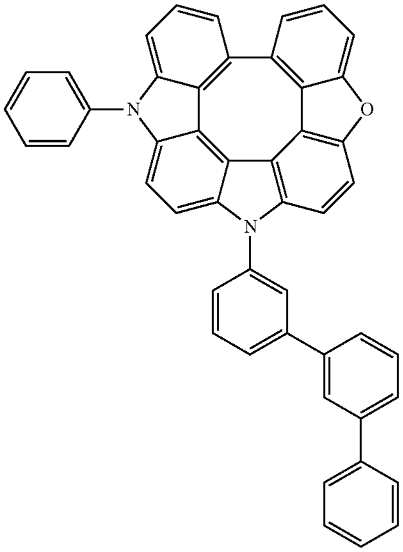

-continued
C-85
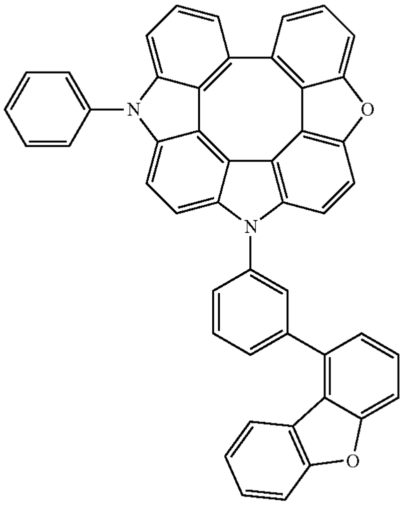
C-86
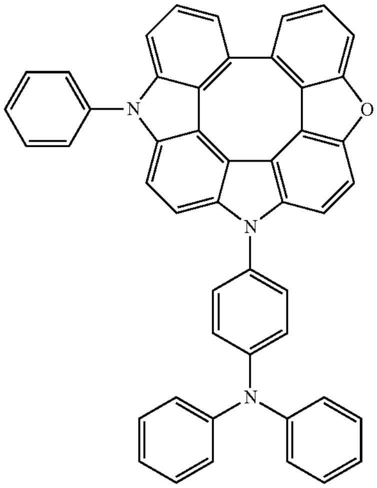
C-87
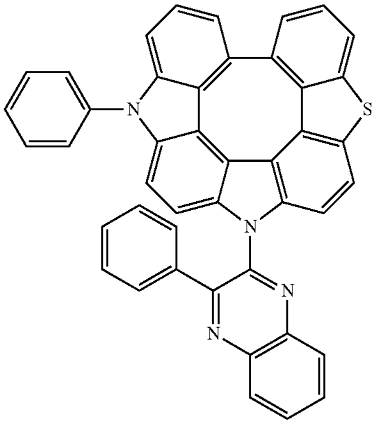
-continued
C-88
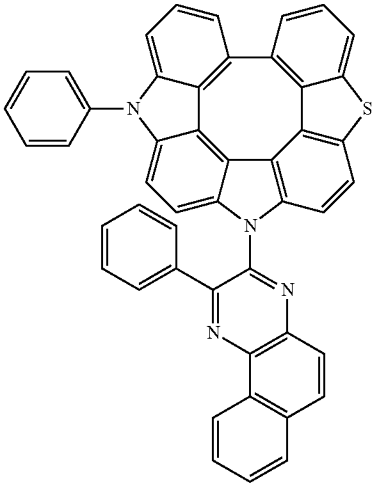
C-89
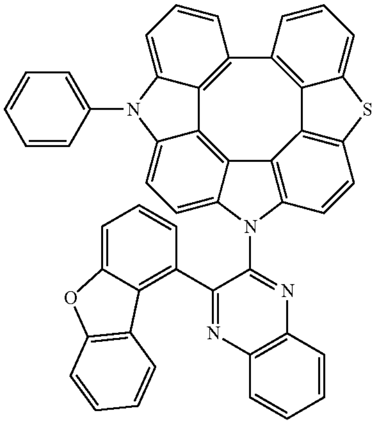
C-90
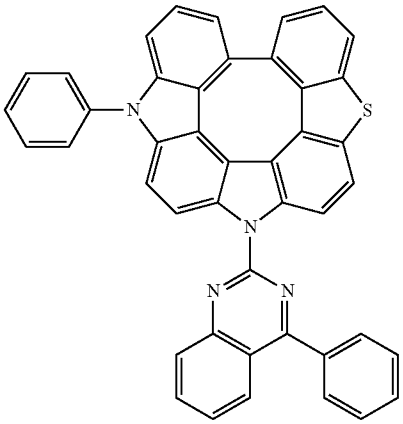

C-91
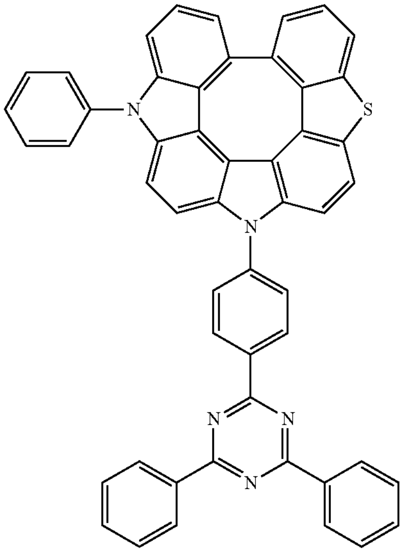
C-92
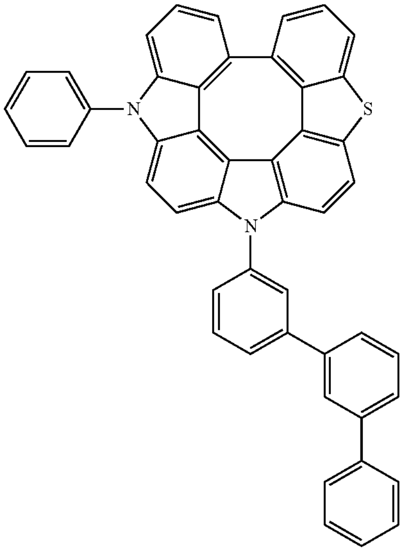
C-93
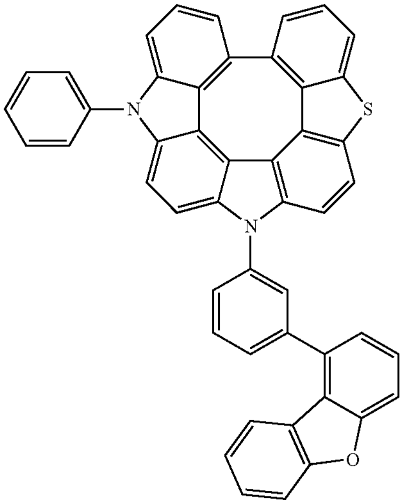
C-94
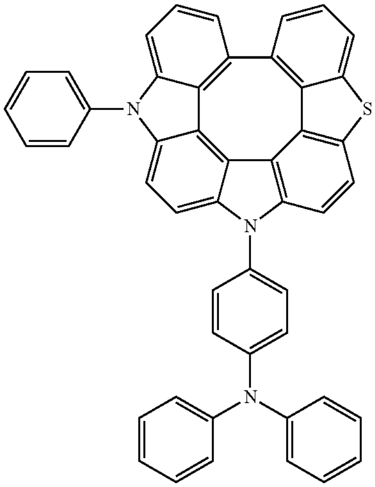
C-95
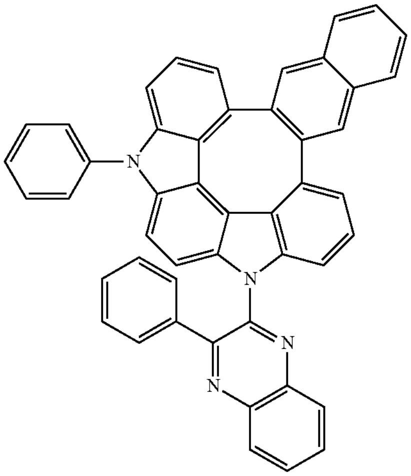
C-96
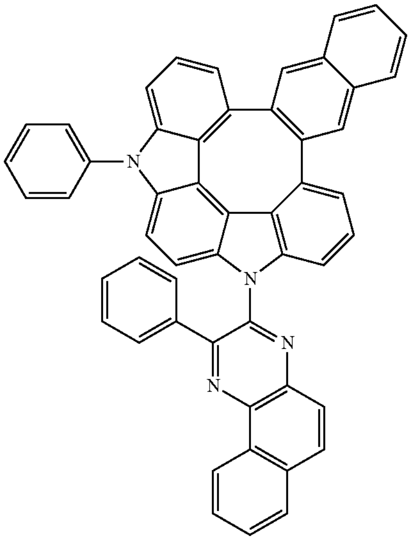

-continued
C-97
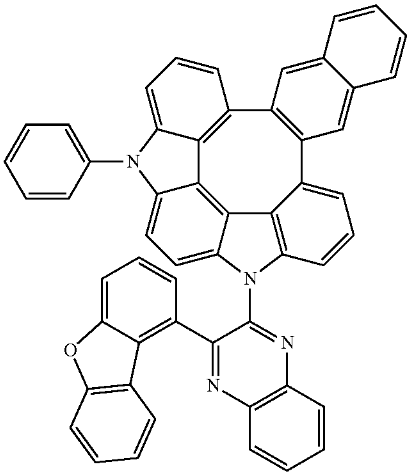
C-98
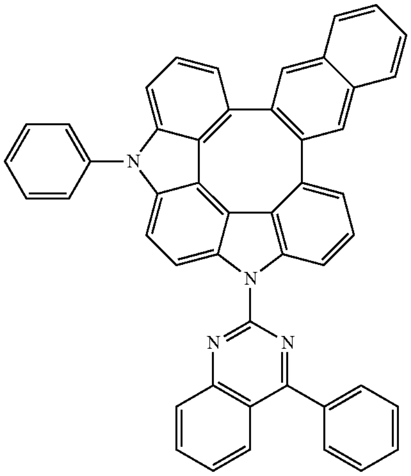
C-99
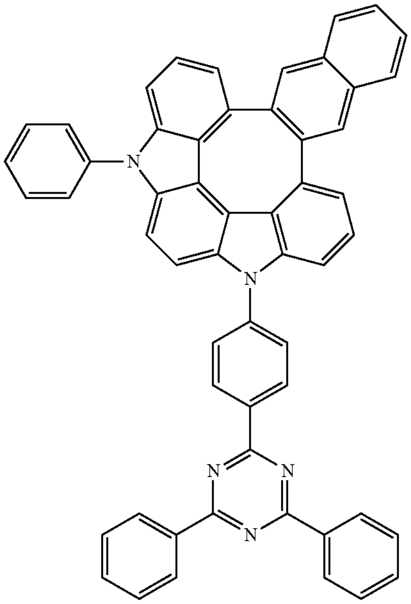
-continued
C-100
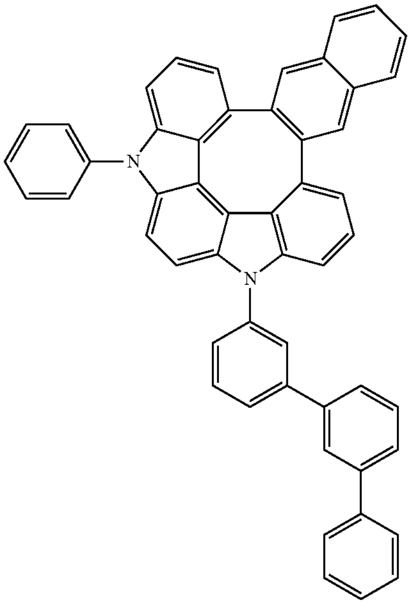
C-101
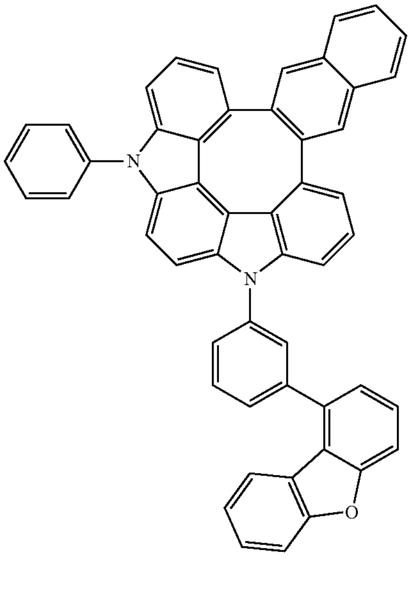

-continued
C-102
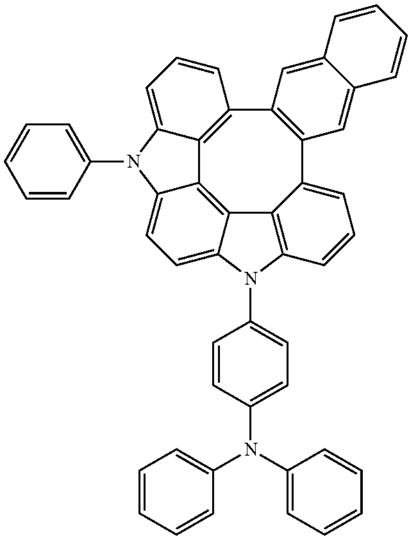
C-103
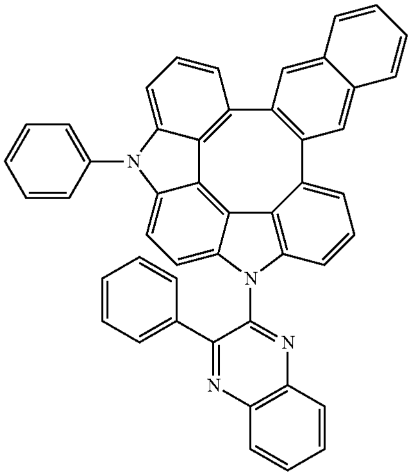
C-104
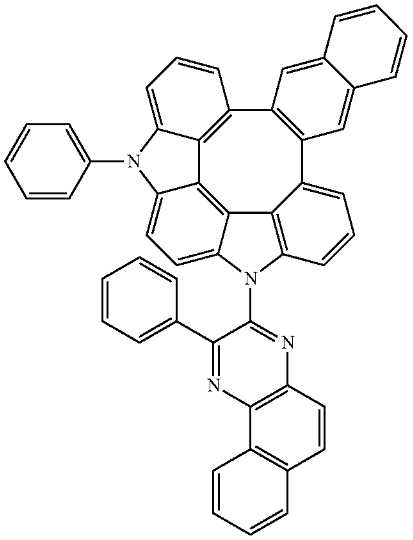
-continued
C-105
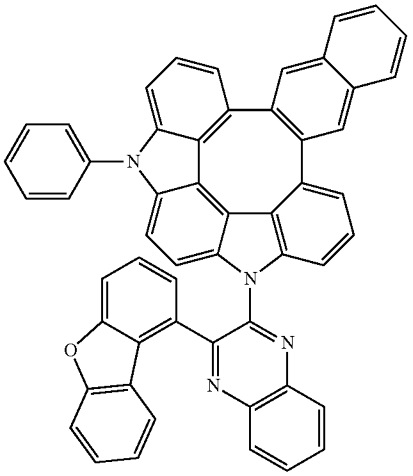
C-106
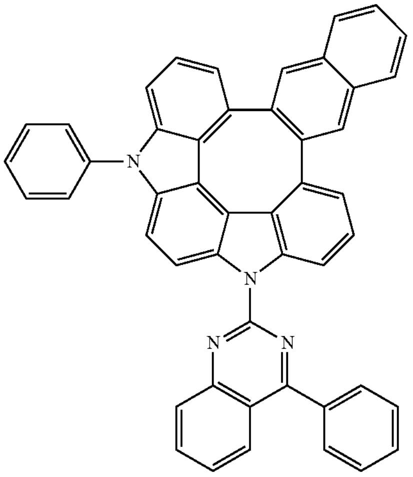
C-107
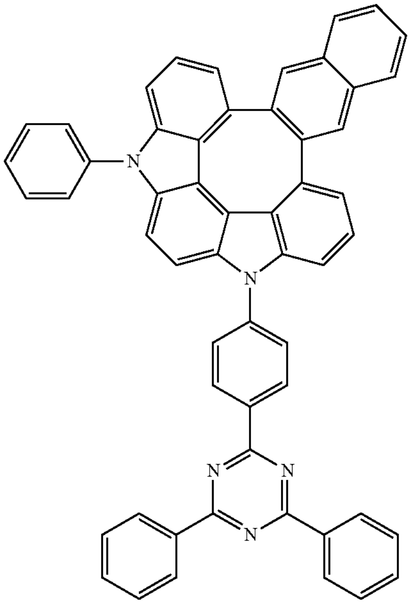

-continued
C-108
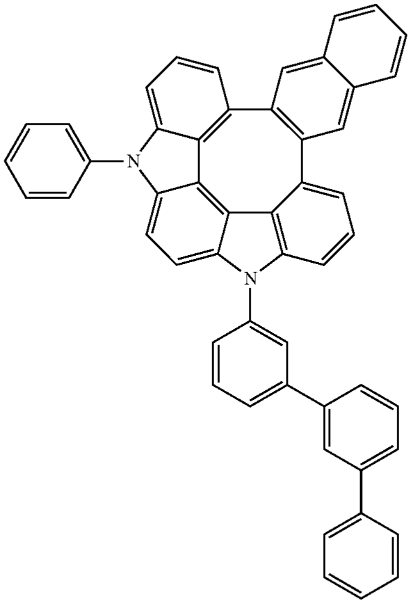
C-109
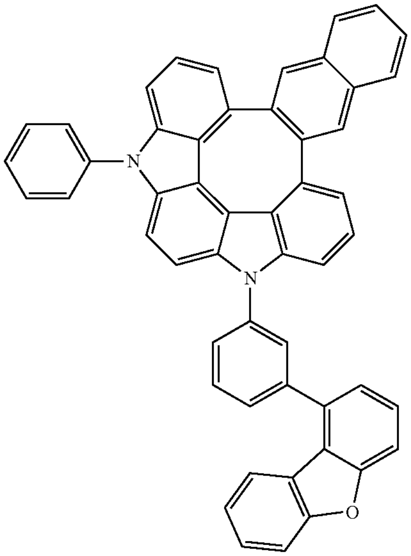
-continued
C-110
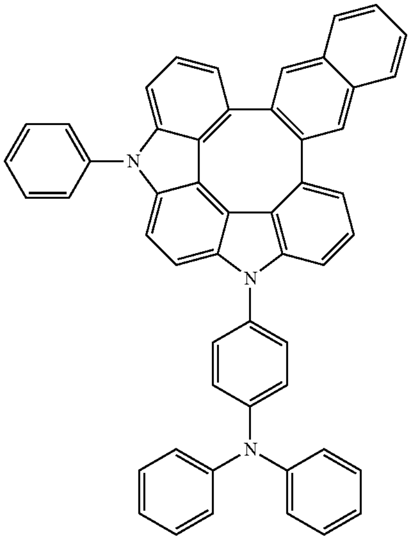
C-111
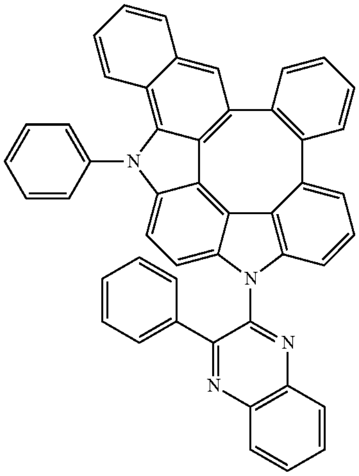
C-112
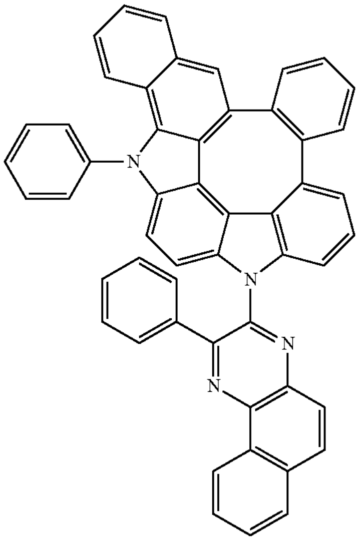

-continued
C-113
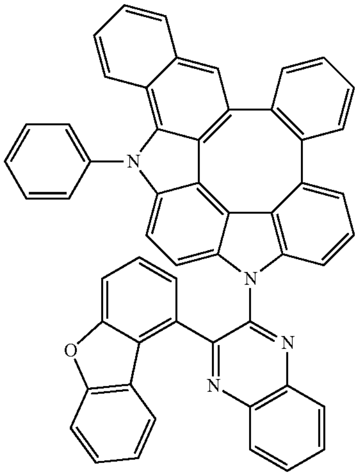
C-114
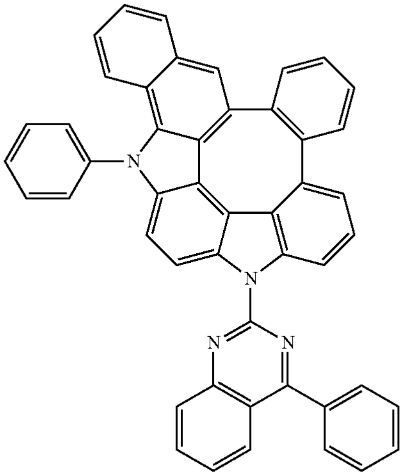
C-115
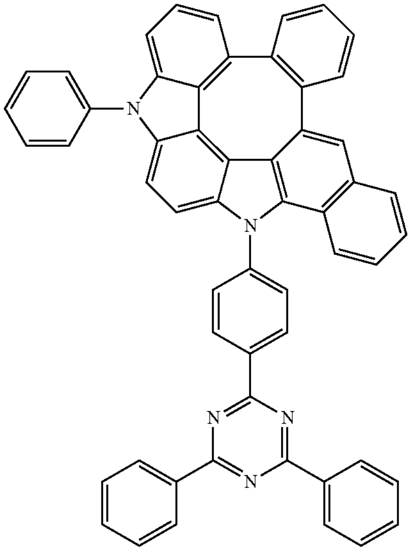
-continued
C-116
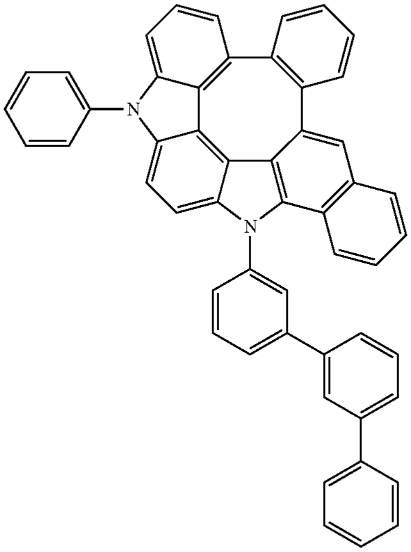
C-117
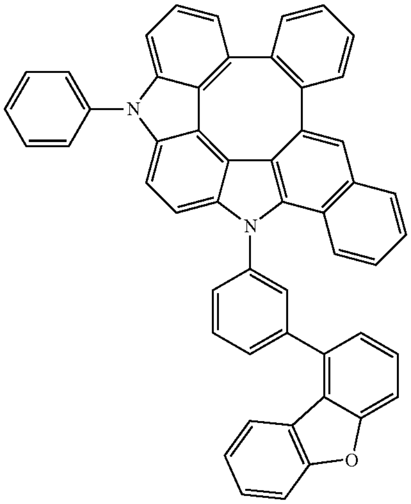
C-118
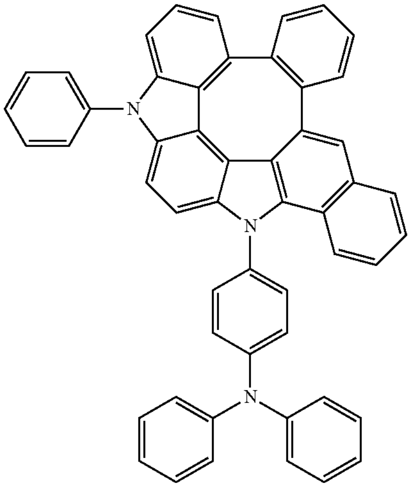

-continued
C-119
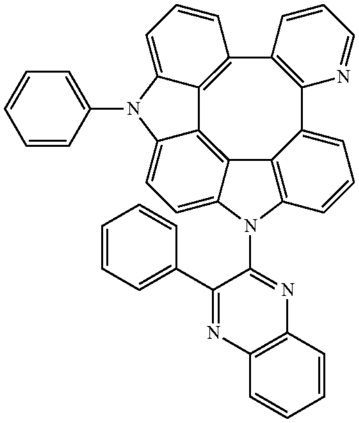
C-120
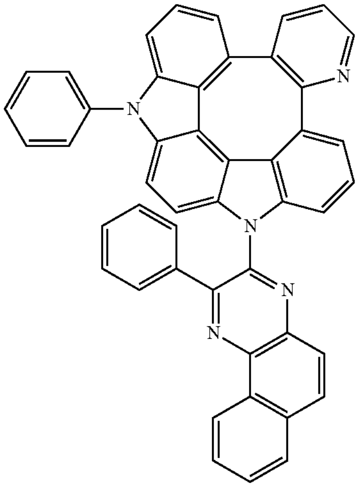
C-121
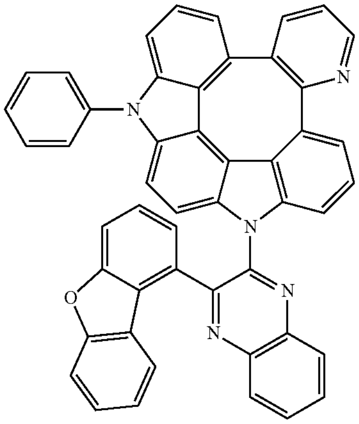
-continued
C-122
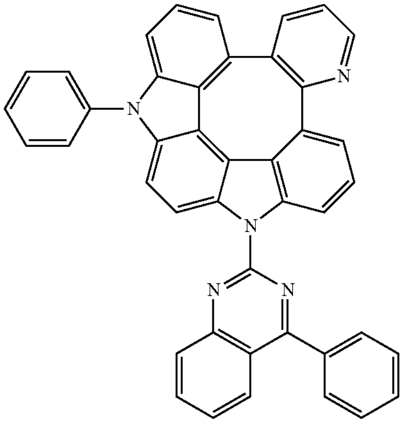
C-123
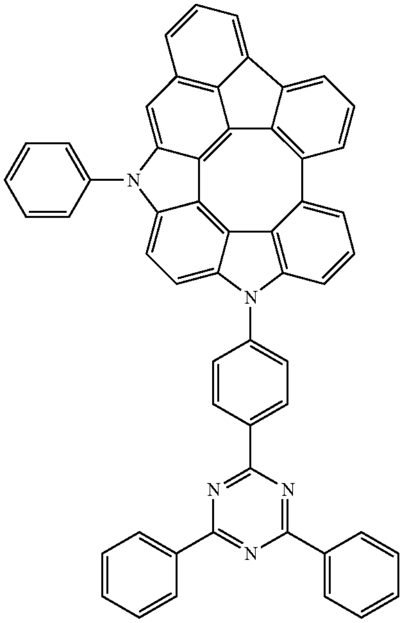
C-124
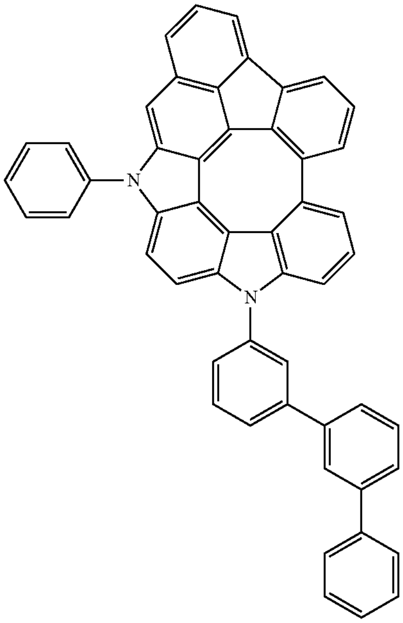

-continued
C-125
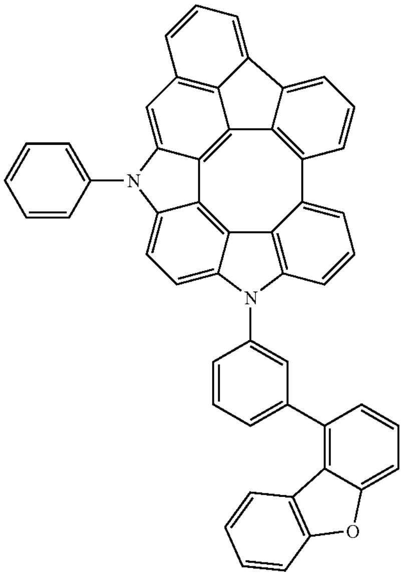
C-126
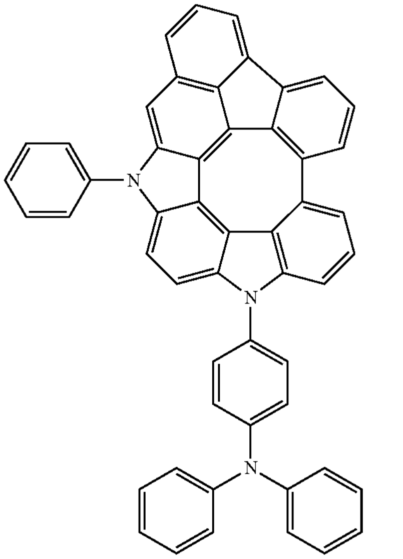
-continued
C-127
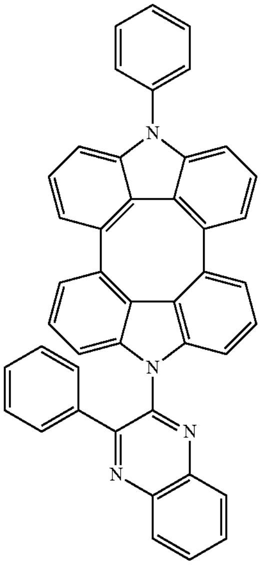
C-128
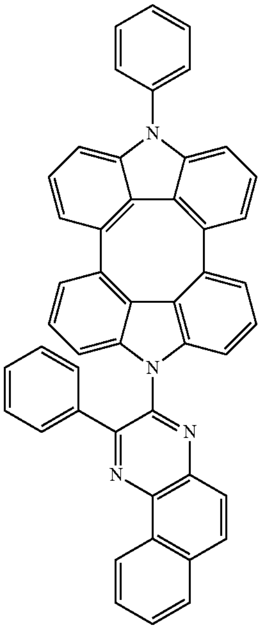

-continued
C-129
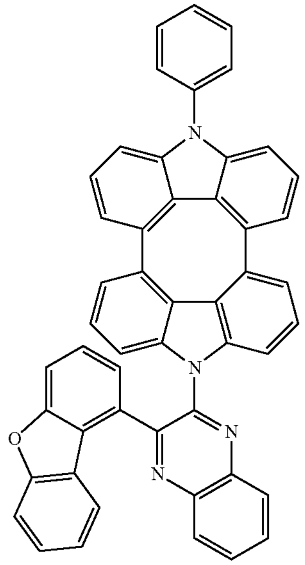
C-130
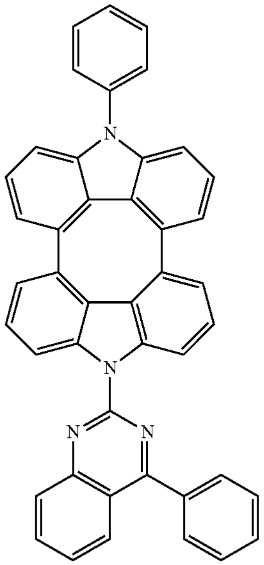
-continued
C-131
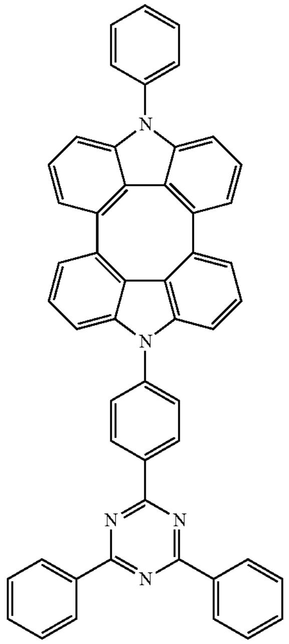
C-132
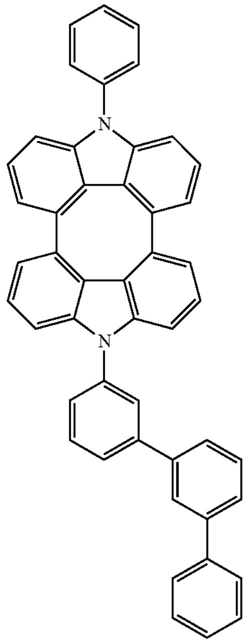

-continued
C-133
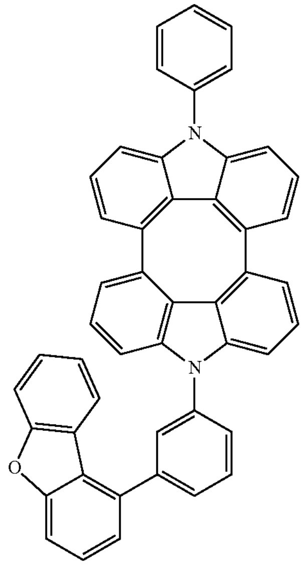
C-134
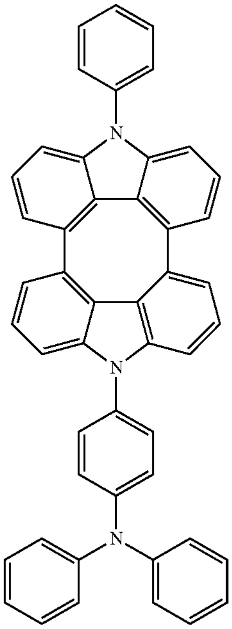
-continued
C-135
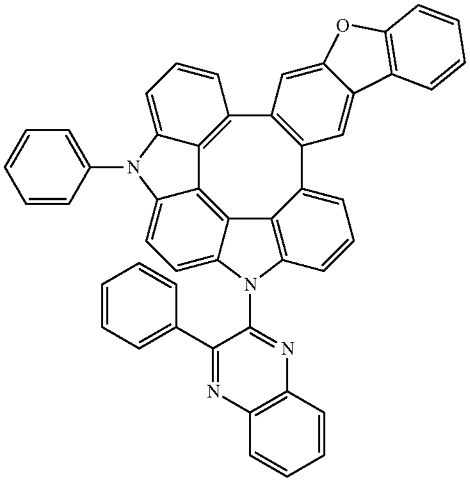
C-136
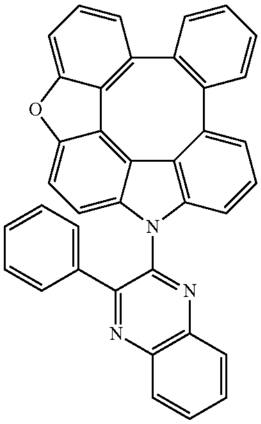
C-137
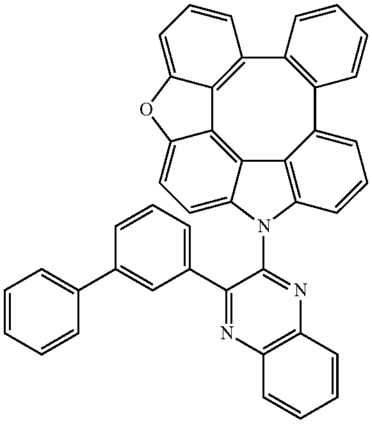

-continued
C-138
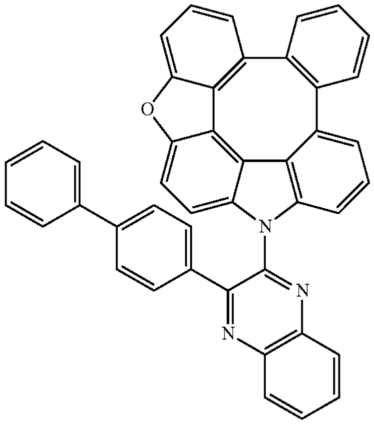
C-139
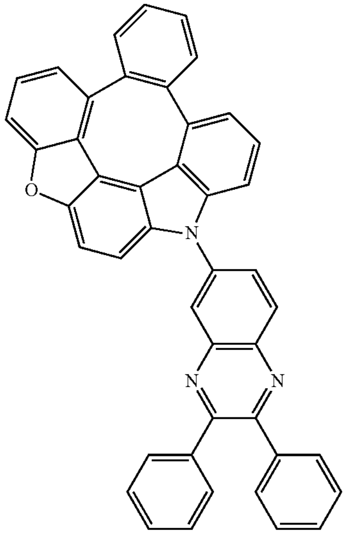
C-140
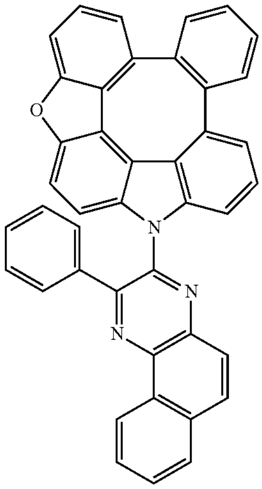
-continued
C-141
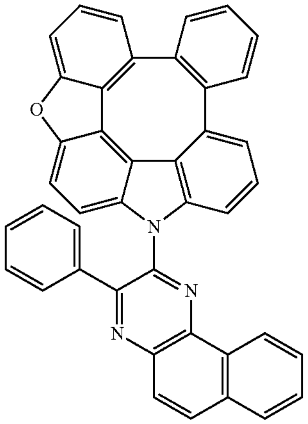
C-142
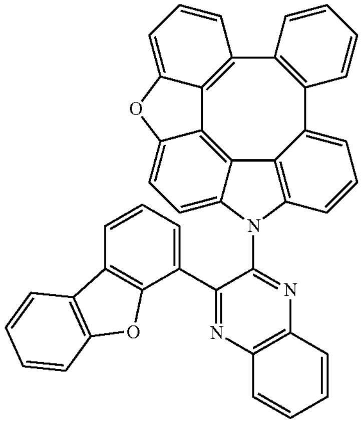
C-143
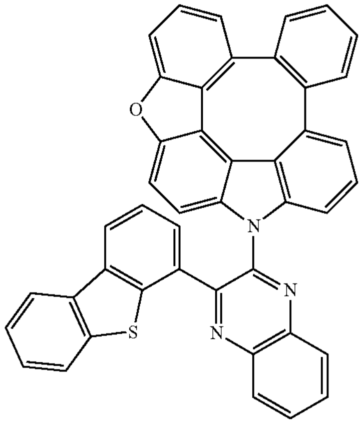

-continued
C-144
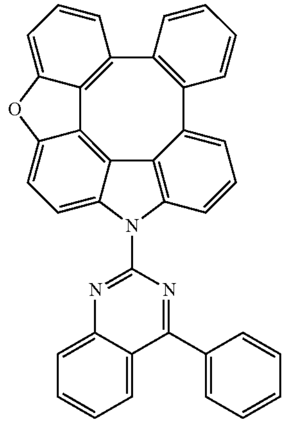
C-145
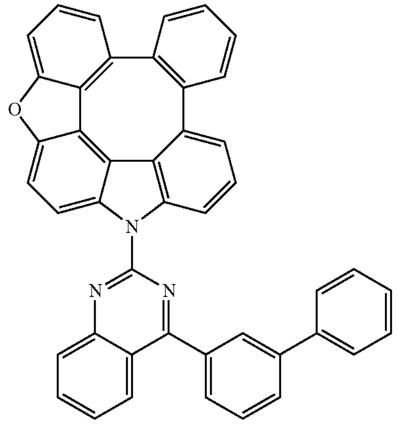
C-146
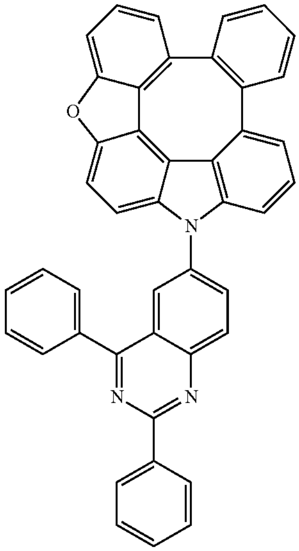
-continued
C-147
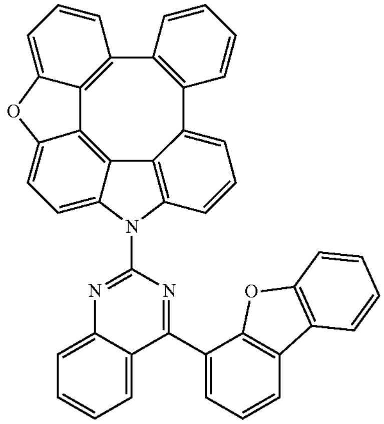
C-148
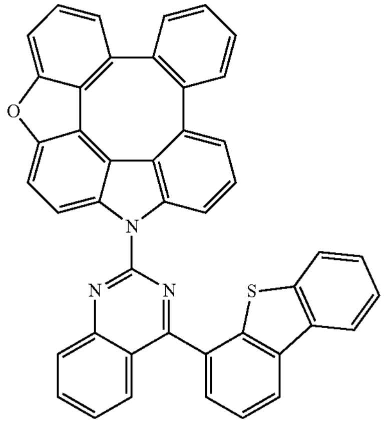
C-149
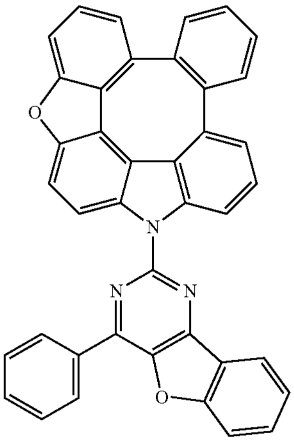

-continued
C-150
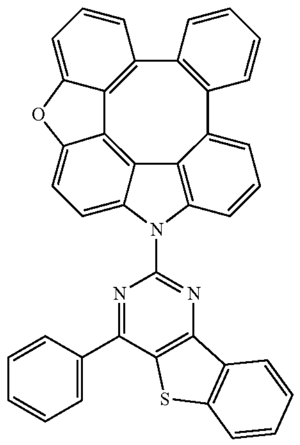
C-151
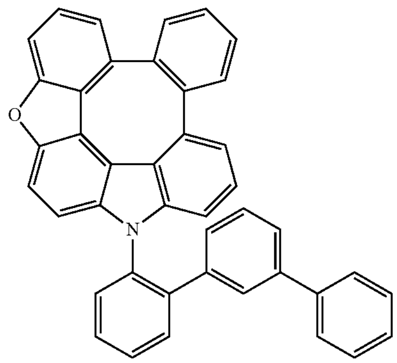
C-152
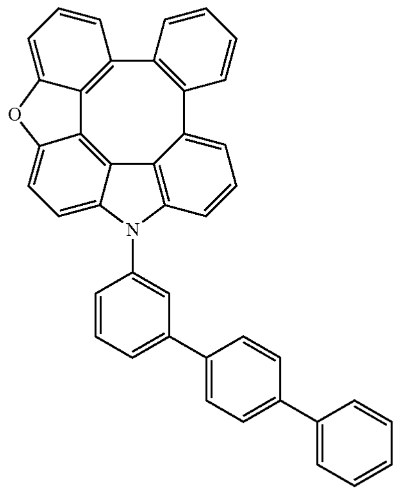
-continued
C-153
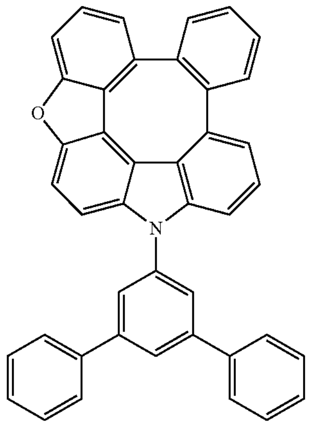
C-154
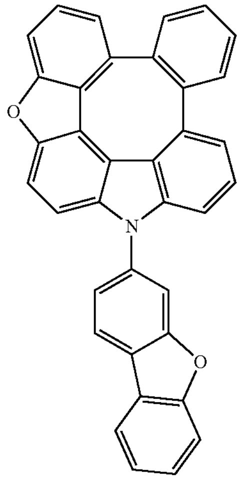
C-155
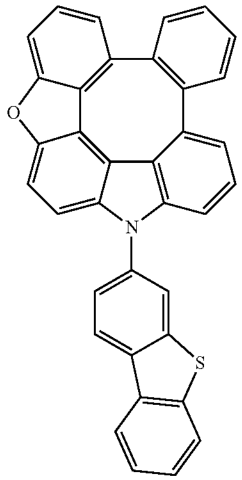

C-156
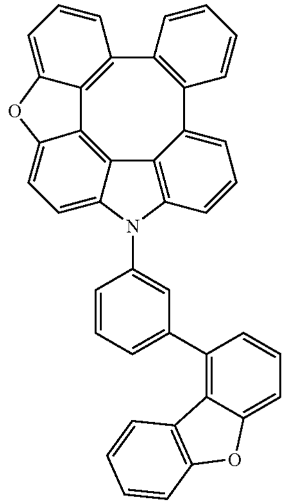
C-157
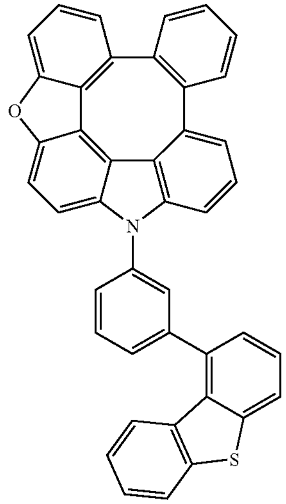
C-158
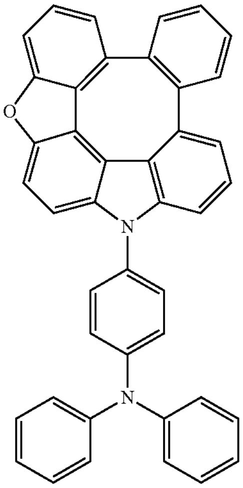
C-159
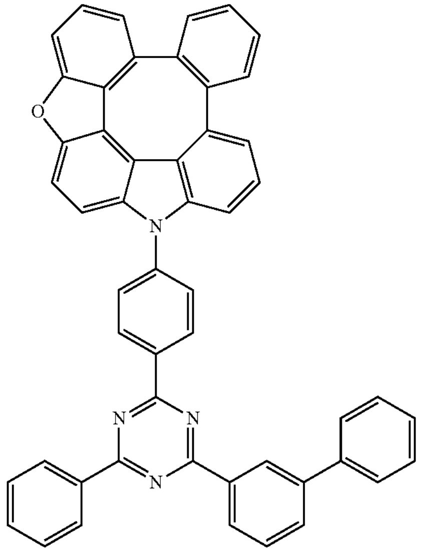
C-160
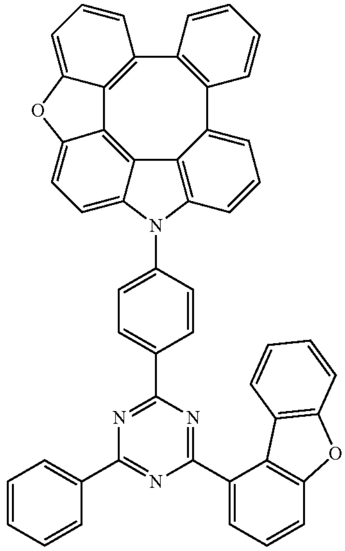
C-161
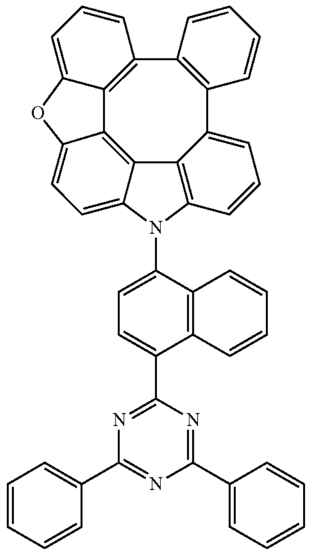

-continued
C-162
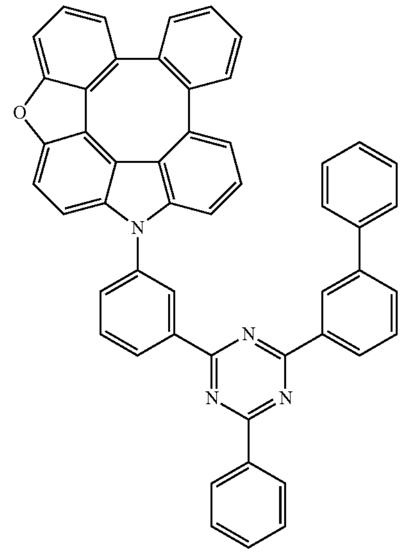
C-163
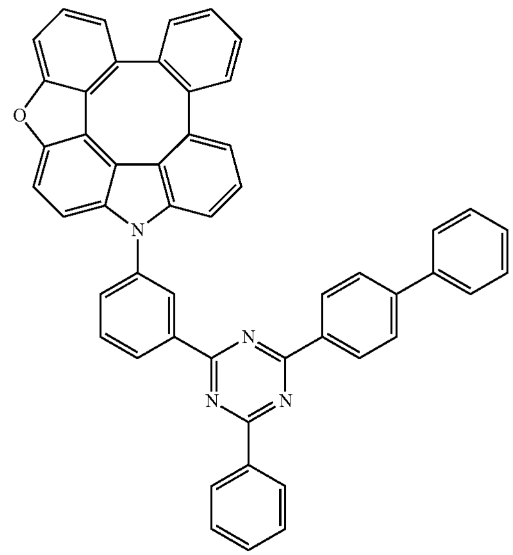
-continued
C-164
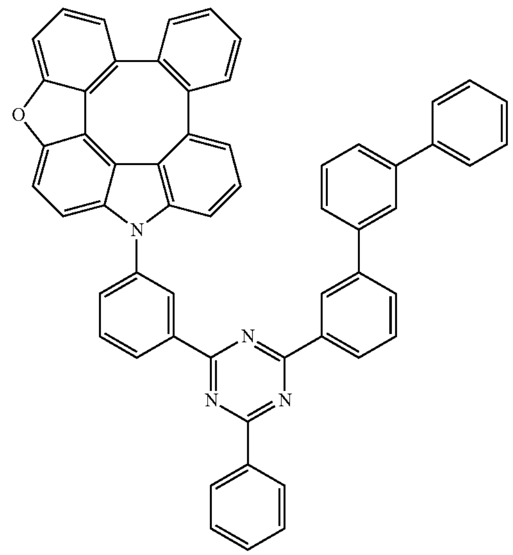
C-165
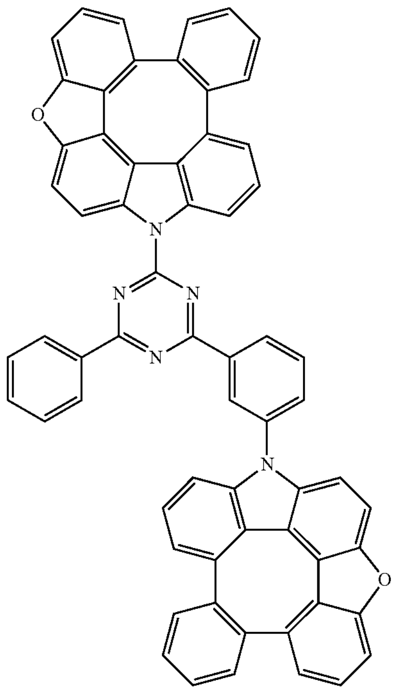

-continued
C-166
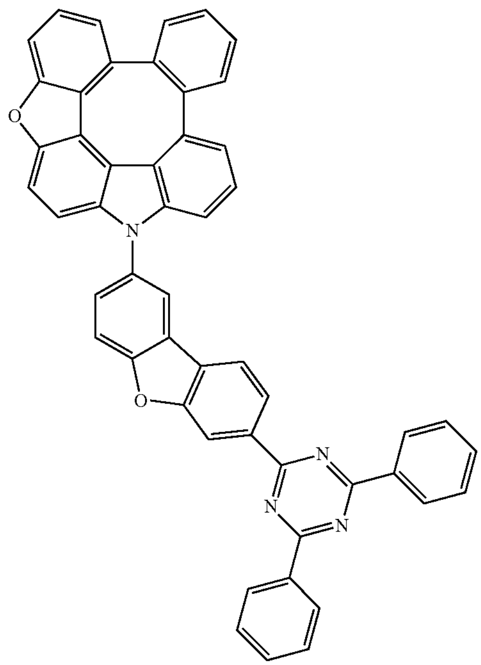
C-167
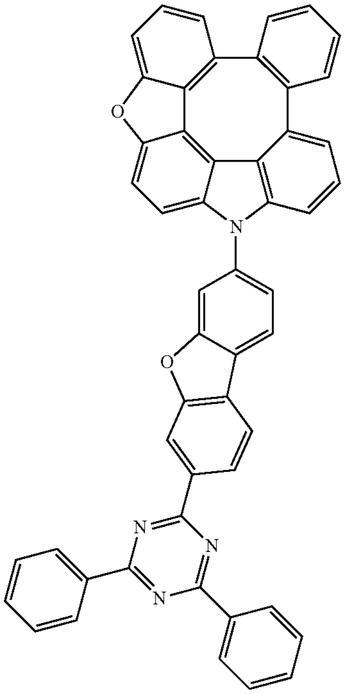
-continued
C-168
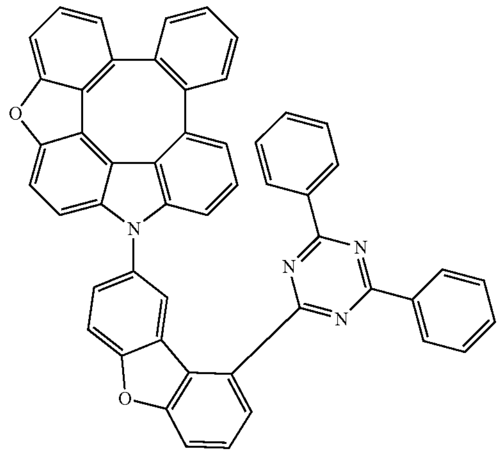
C-169
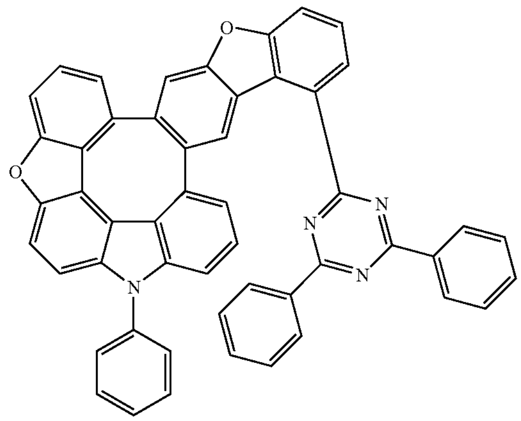
C-170
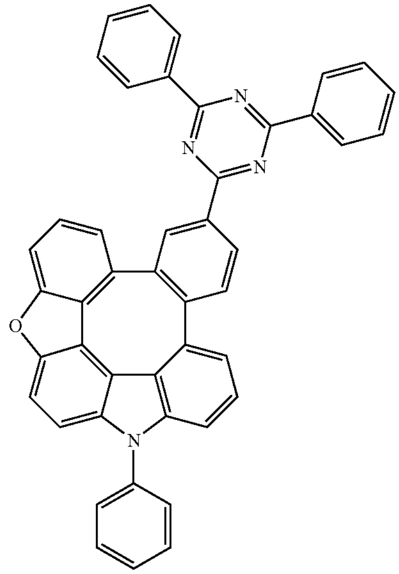

C-171
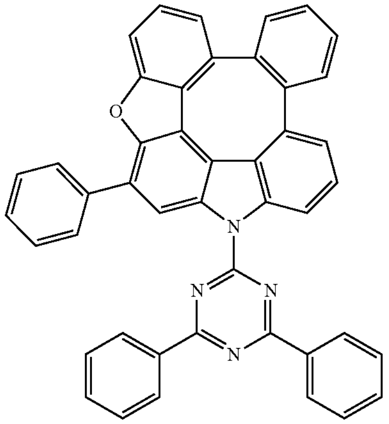
C-172
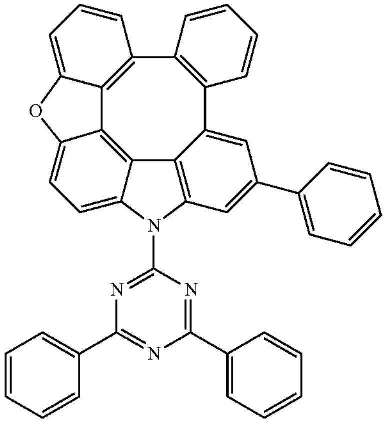
C-173
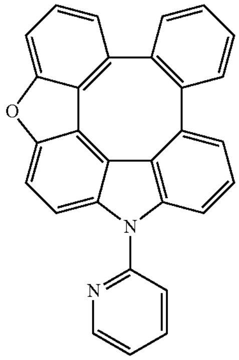
C-174
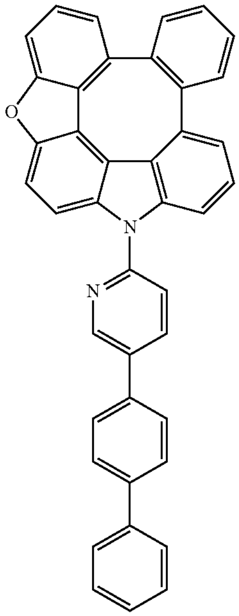
C-175
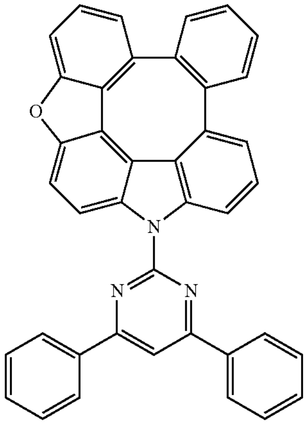
C-176
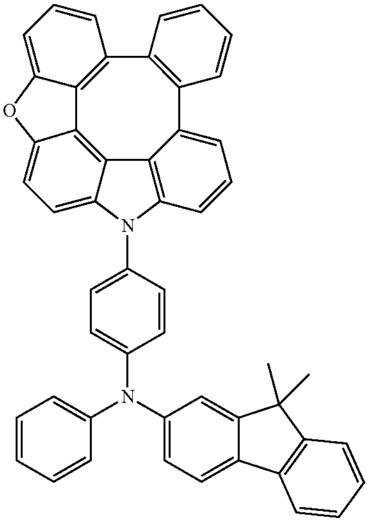

-continued
C-177
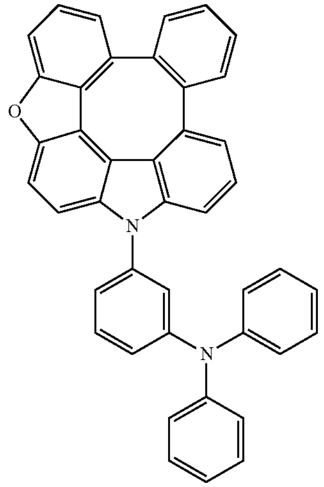
C-178
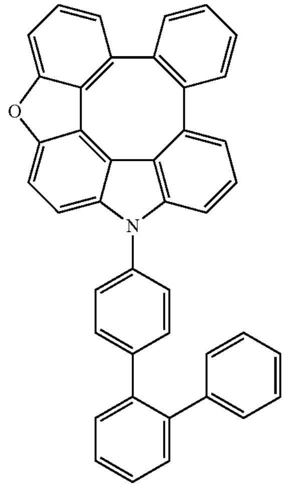
C-179
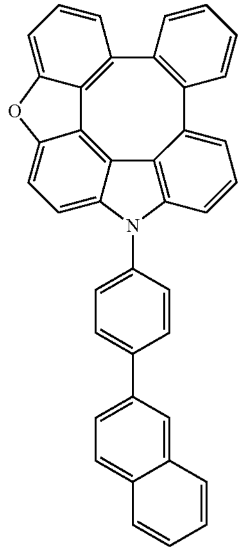
-continued
C-180
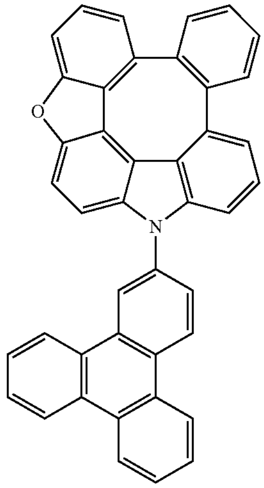
C-181
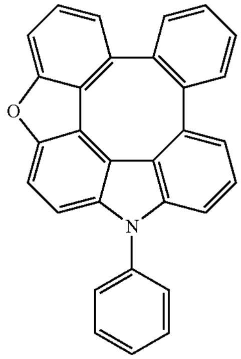
C-182
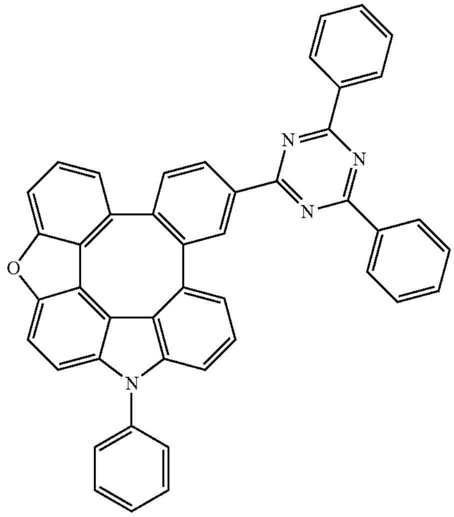

-continued
C-183
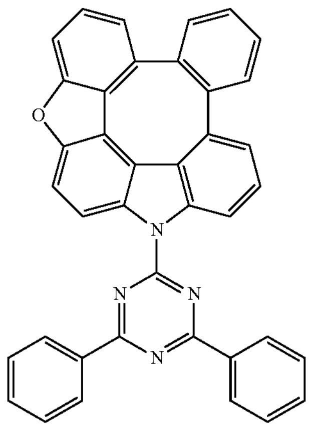
C-184
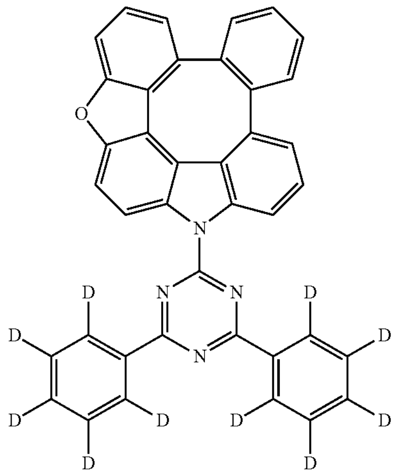
C-185
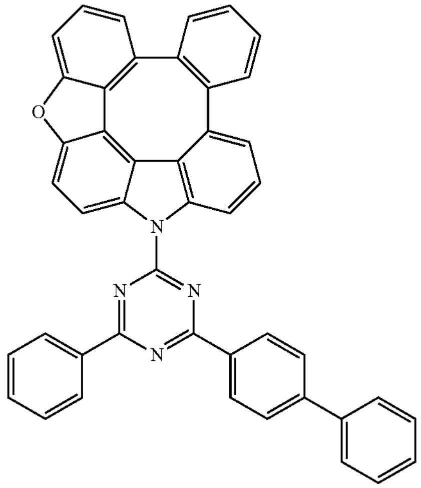
-continued
C-186
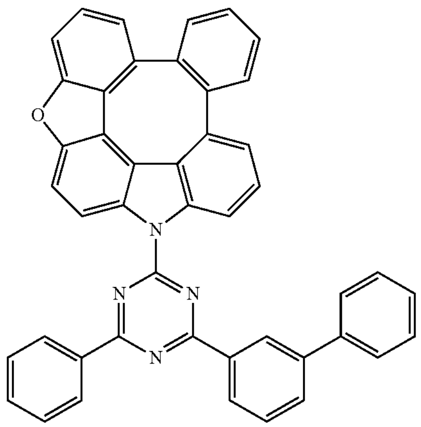
C-187
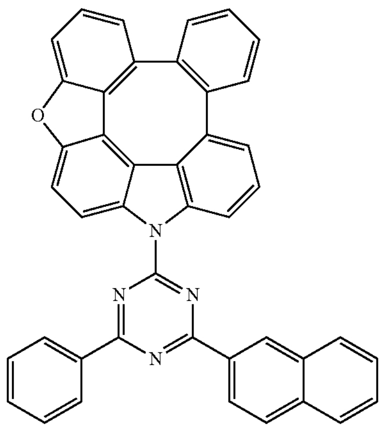
C-188
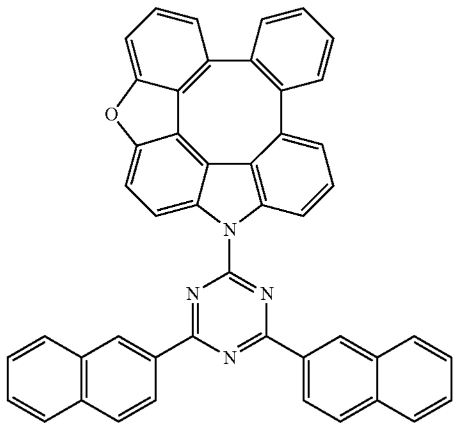

C-189
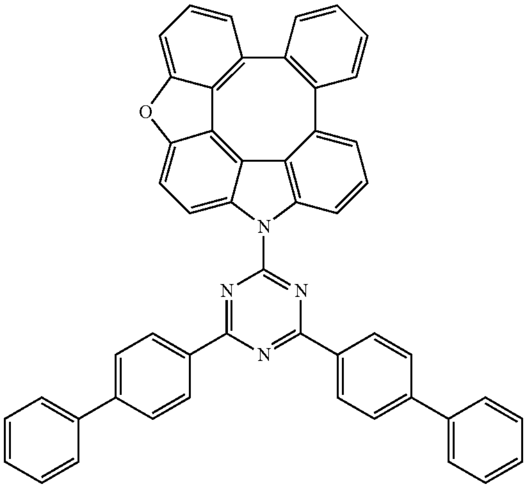
C-190
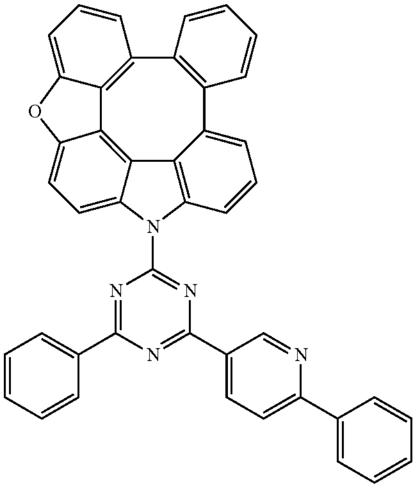
C-191
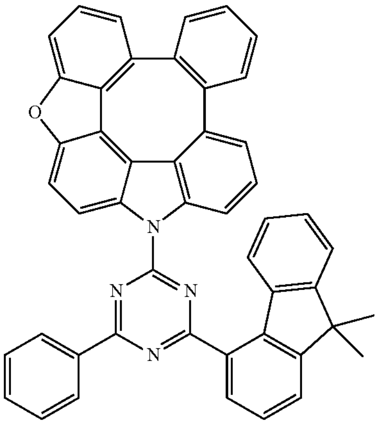
C-192
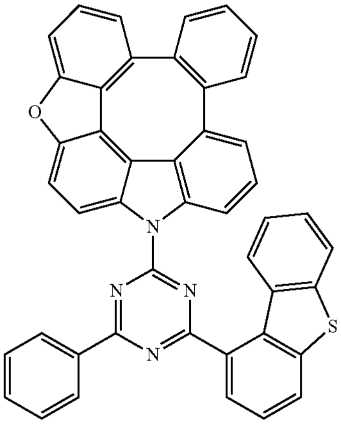
C-193
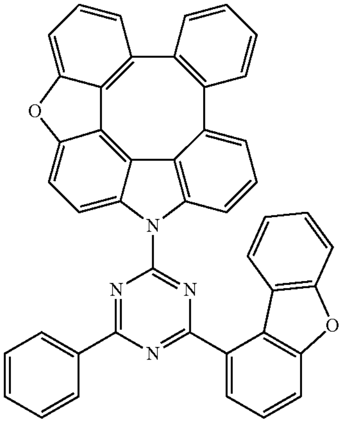
C-194
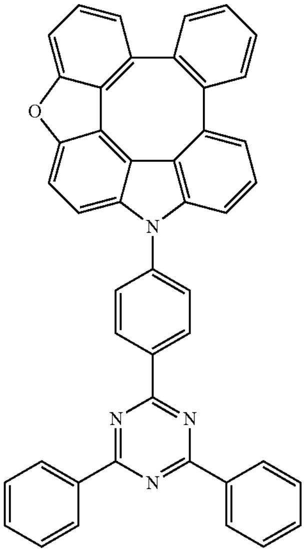

-continued
C-195
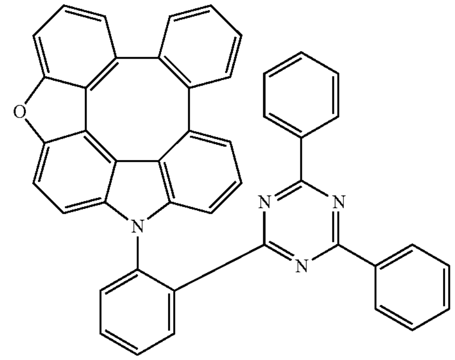
C-196
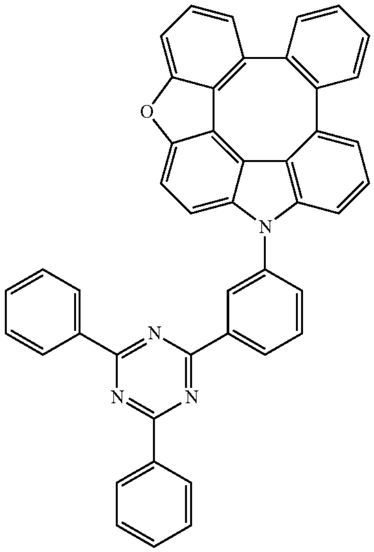
C-197
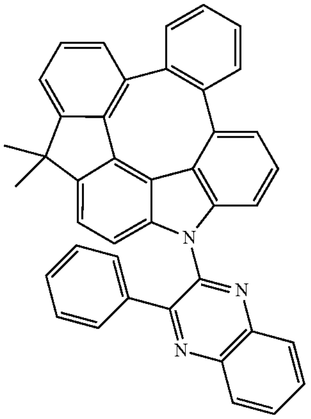
-continued
C-198
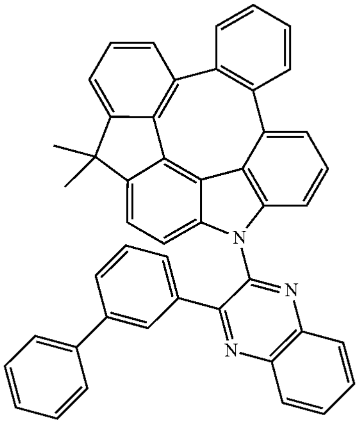
C-199
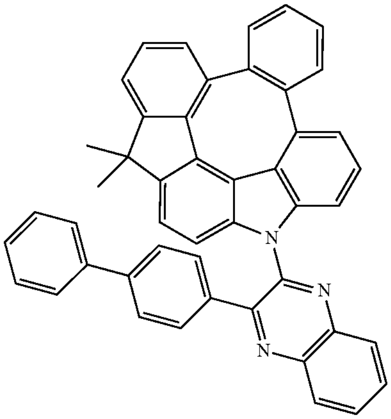
C-200
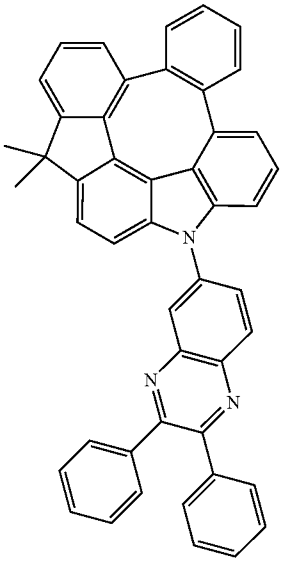

-continued
C-201
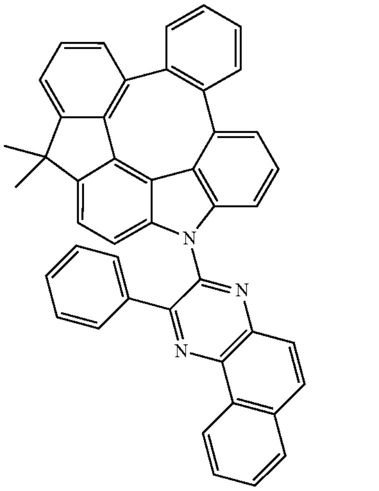
C-202
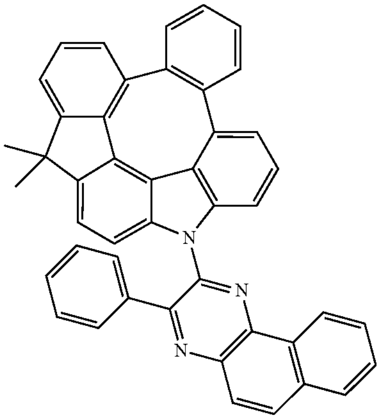
C-203
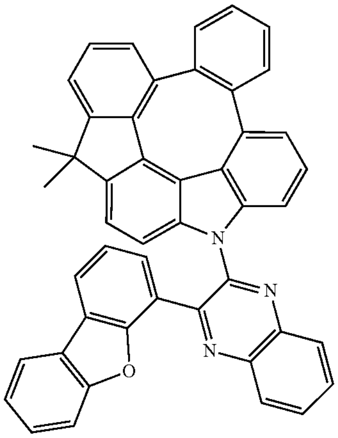
-continued
C-204
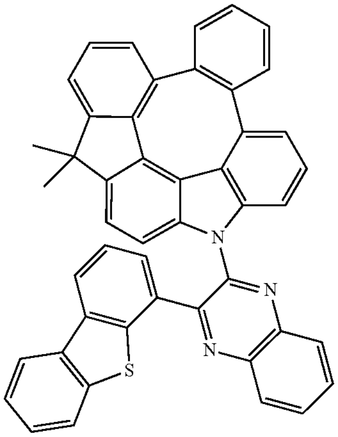
C-205
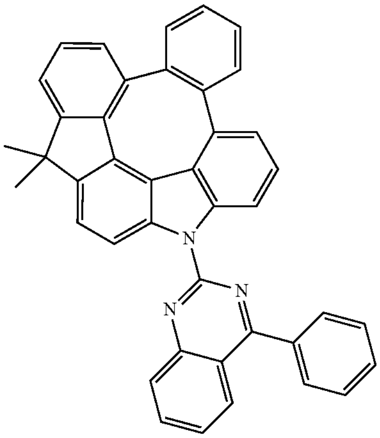
C-206
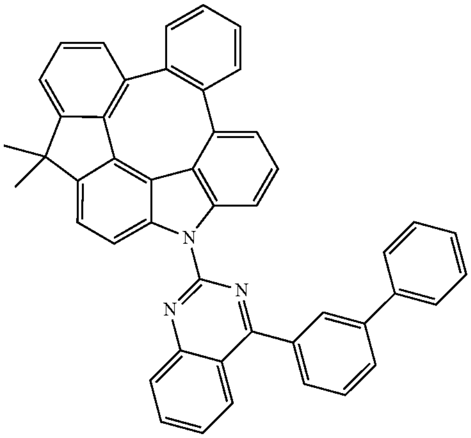

-continued
C-207
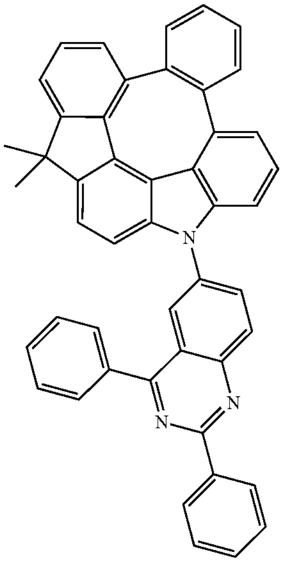
C-208
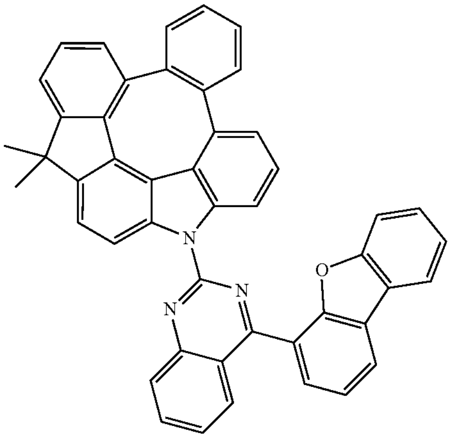
C-209
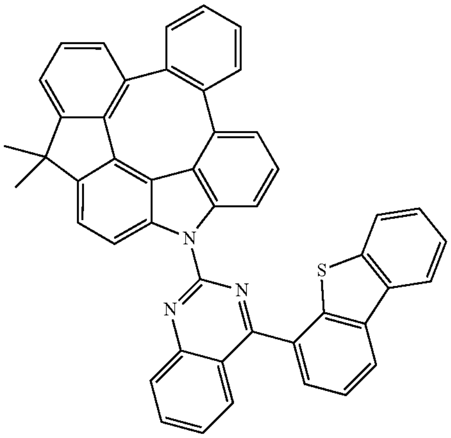
-continued
C-210
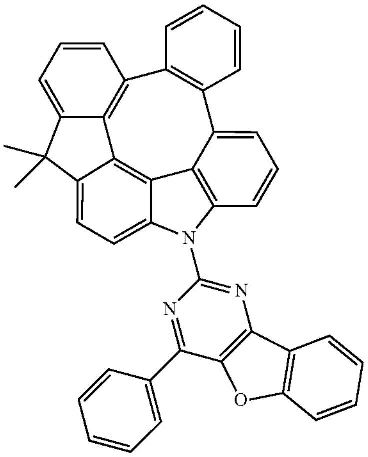
C-211
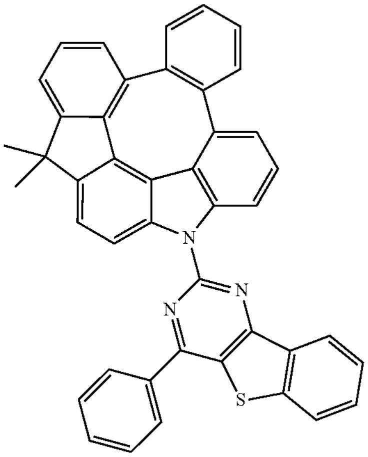
C-212
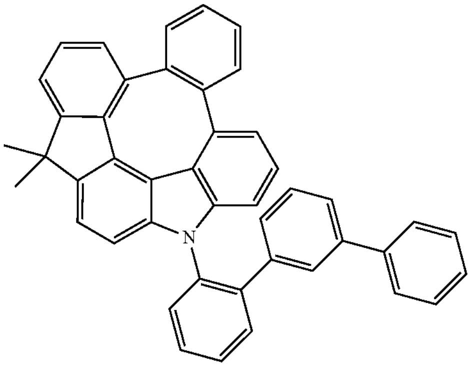

-continued
C-213
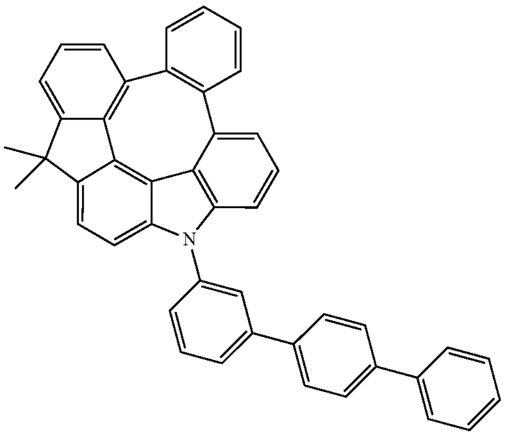
C-214
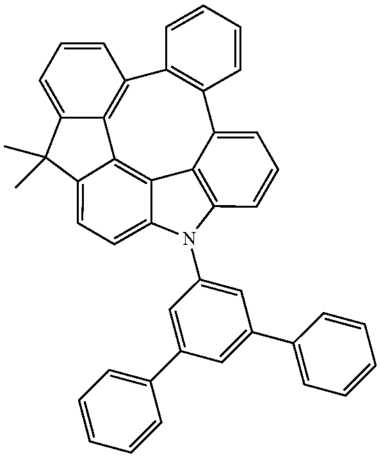
C-215
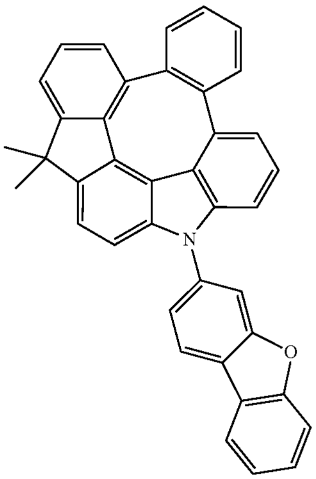
-continued
C-216
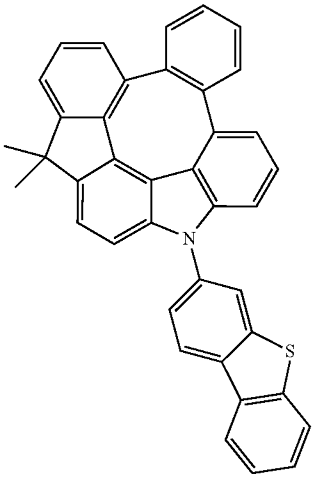
C-217
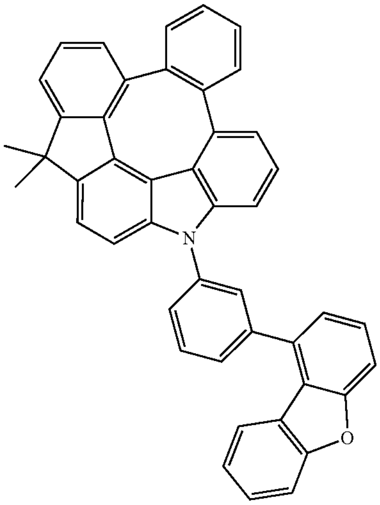
C-218
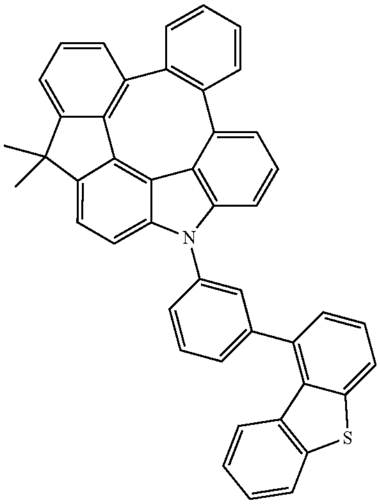

-continued
C-219
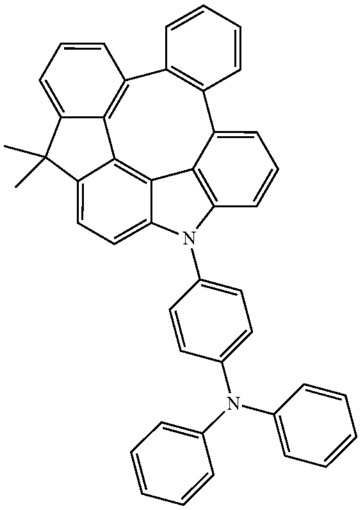
C-220
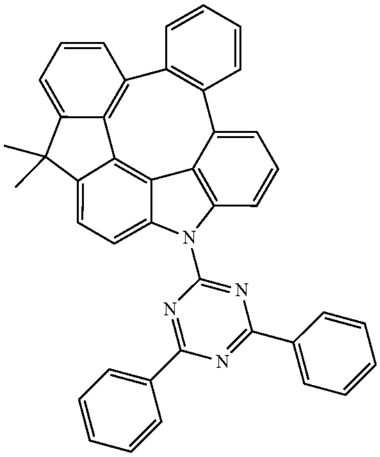
C-221
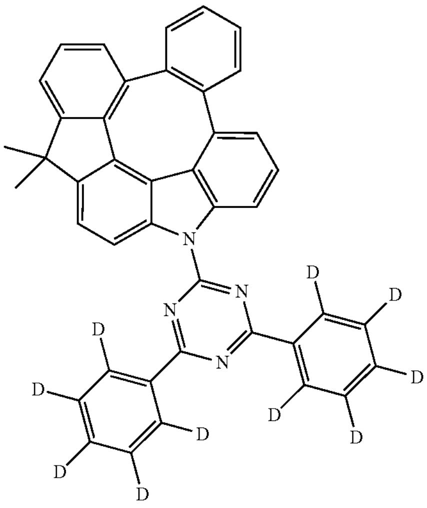
-continued
C-222
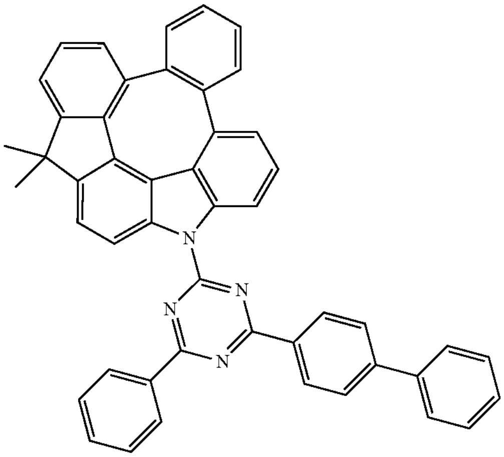
C-223
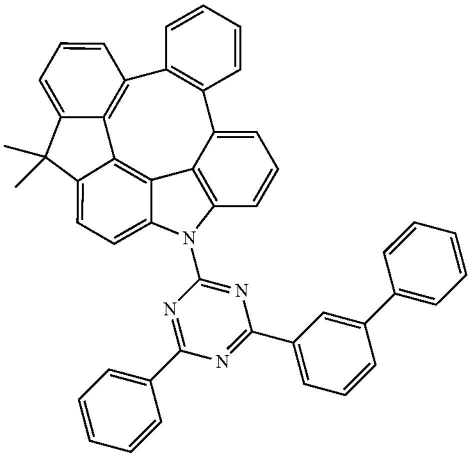
C-224
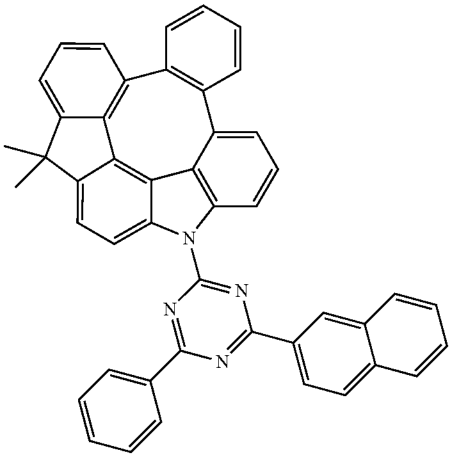

-continued
C-225
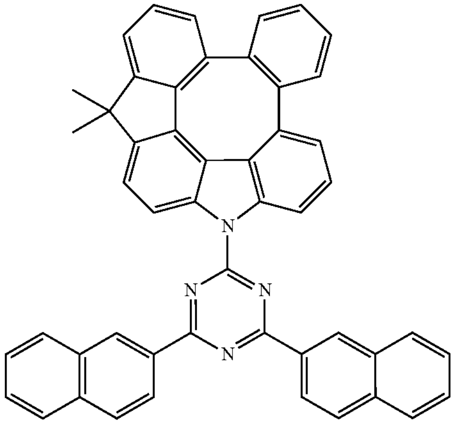
C-226
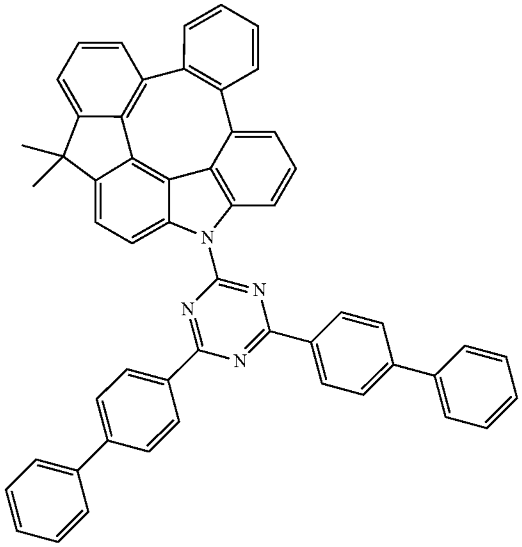
C-227
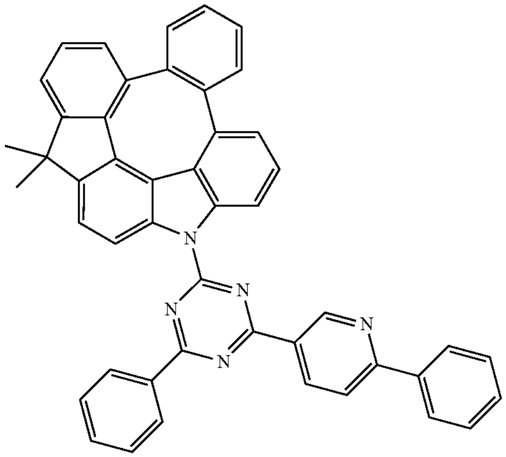
-continued
C-228
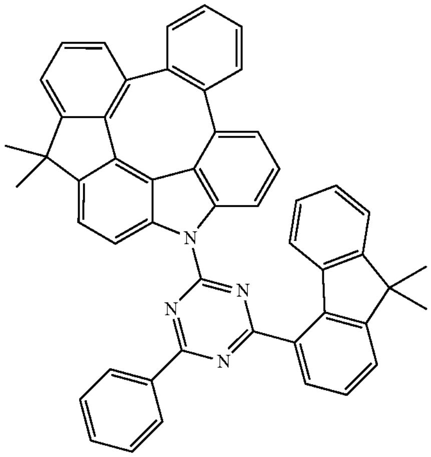
C-229
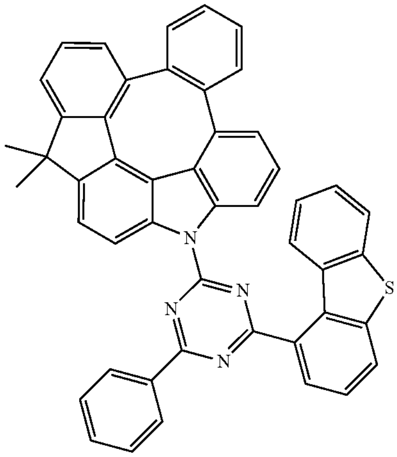
C-230
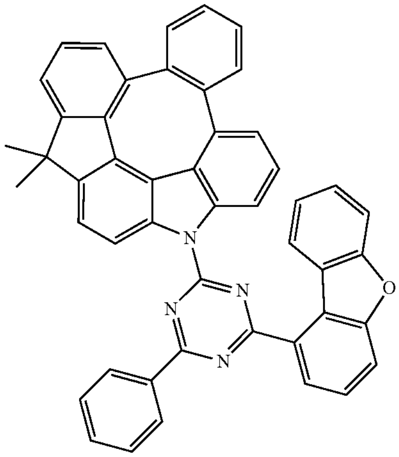

-continued
C-231
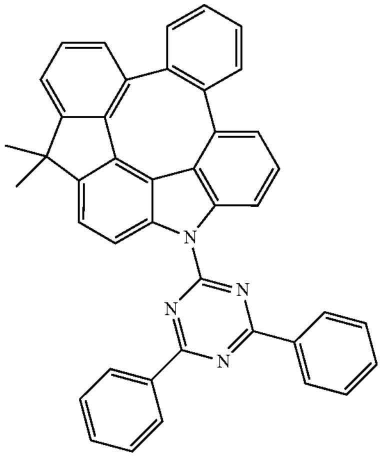
C-232
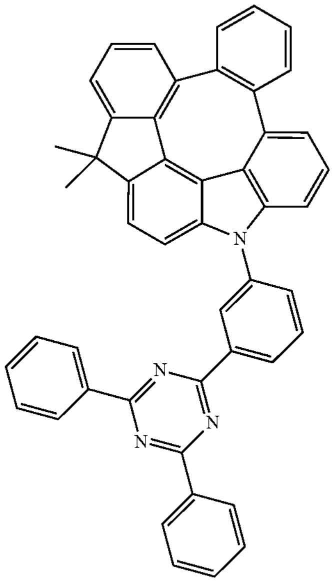
C-233
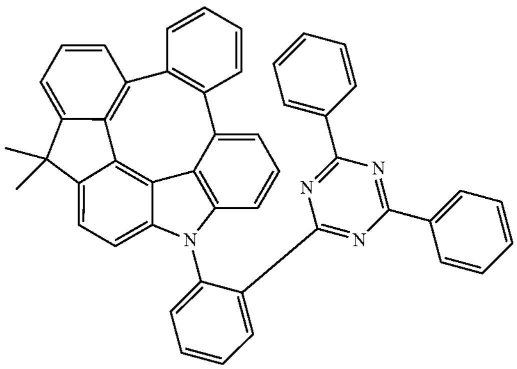
-continued
C-234
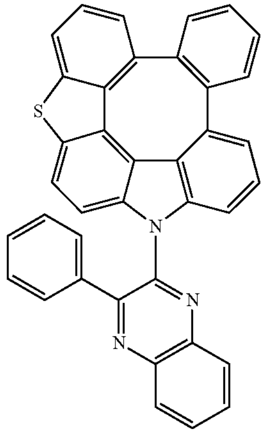
C-235
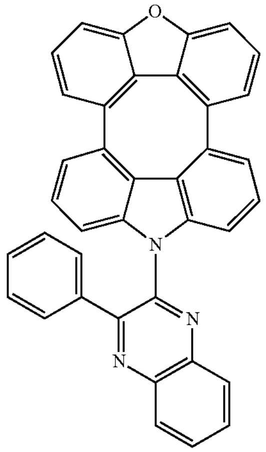
C-236
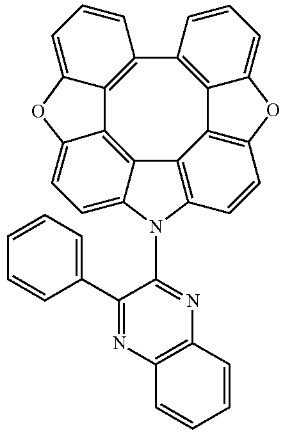

-continued
C-237
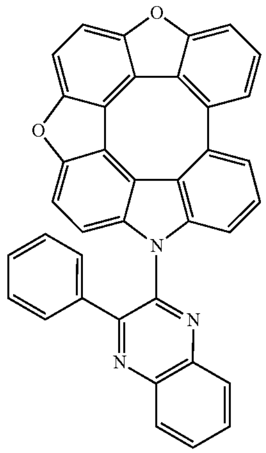
C-238
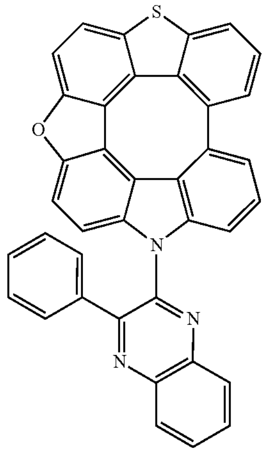
C-239
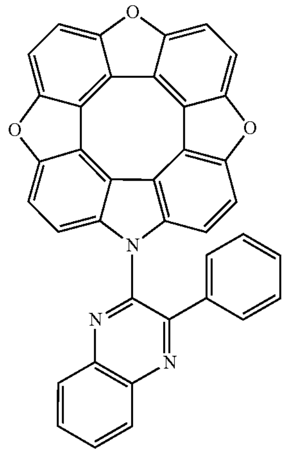
-continued
C-240
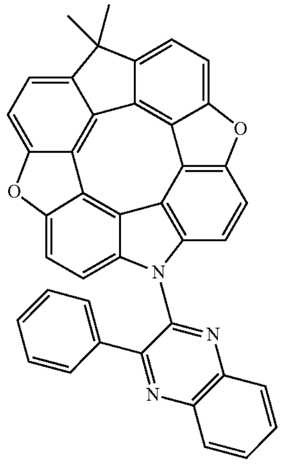
C-241
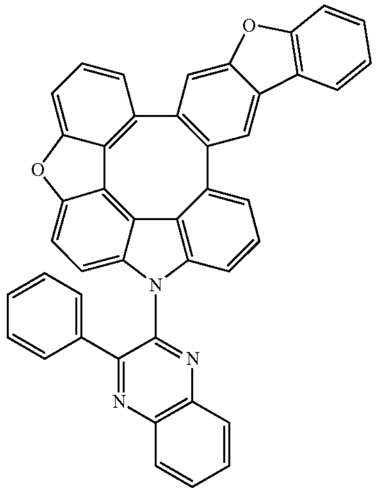
C-242
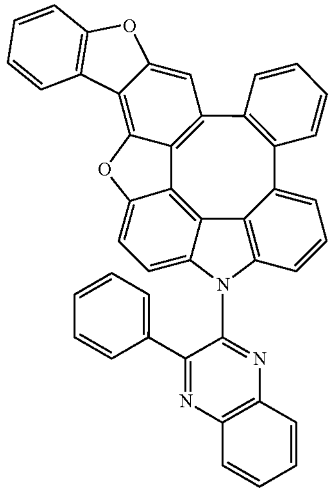

-continued
C-243
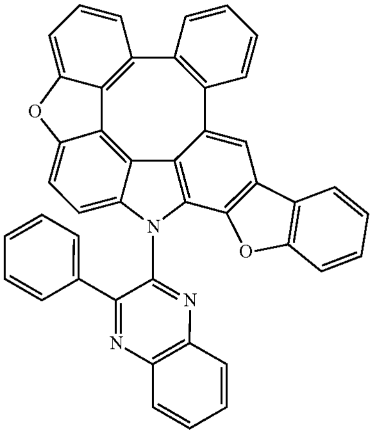
C-244
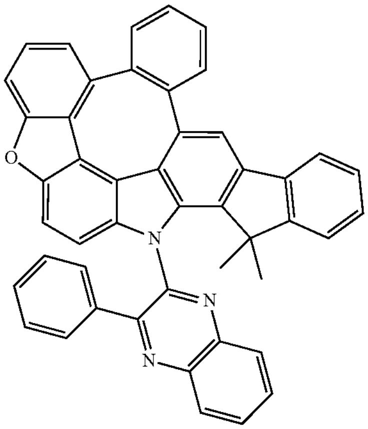
C-245
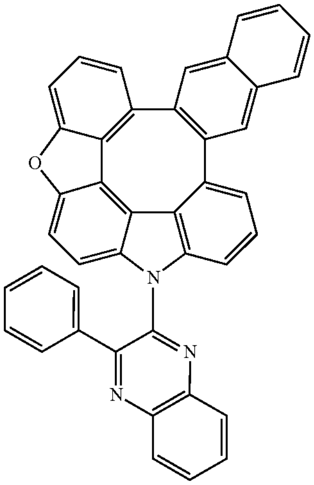
-continued
C-246
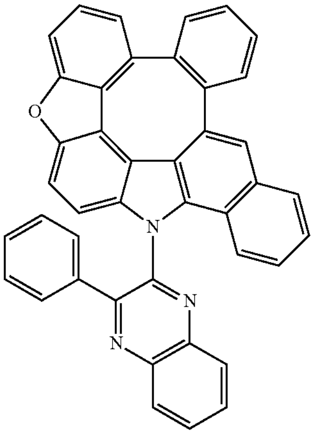
C-247
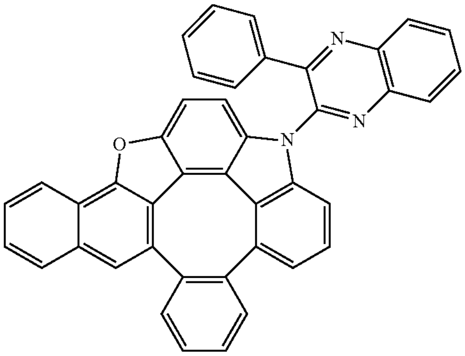
C-248
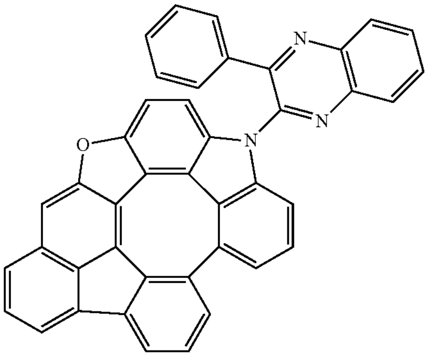
C-249
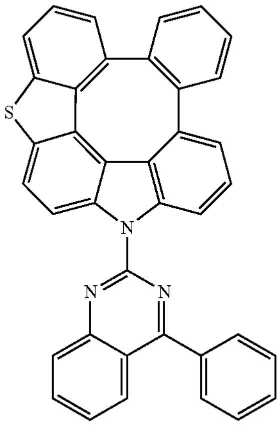

-continued
C-250
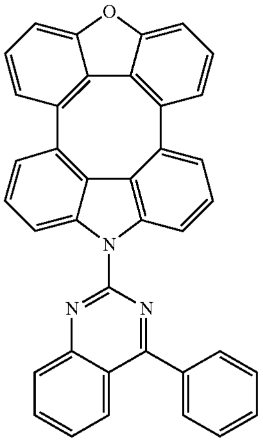
C-251
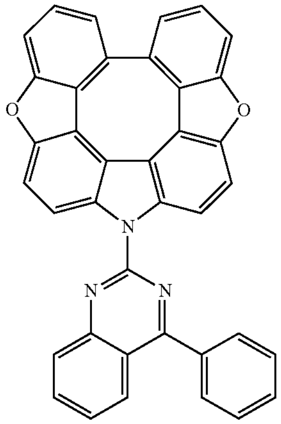
C-252
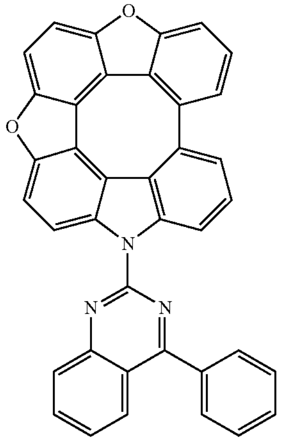
-continued
C-253
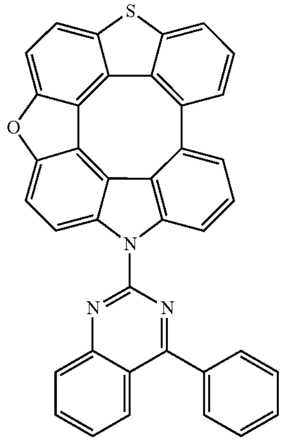
C-254
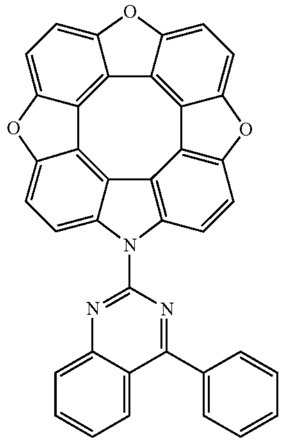
C-255
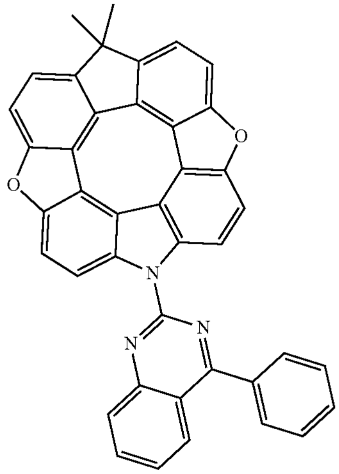

-continued
C-256
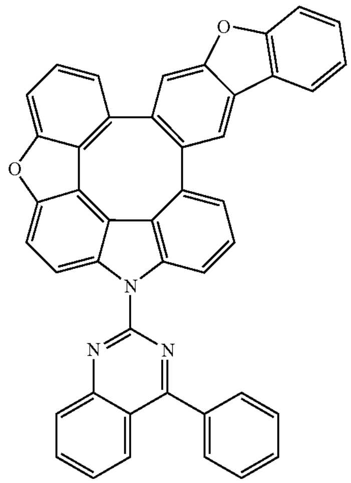
C-257
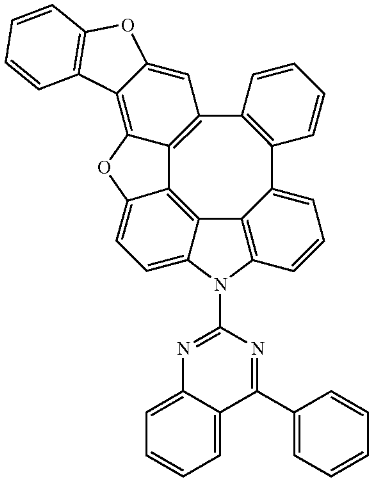
C-258
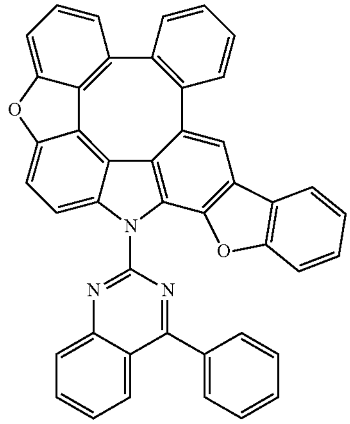
-continued
C-259
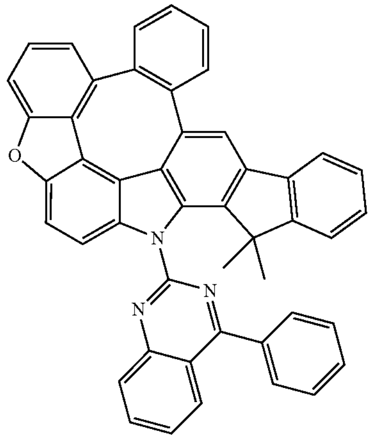
C-260
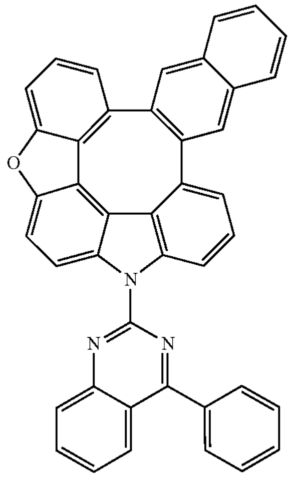
C-261
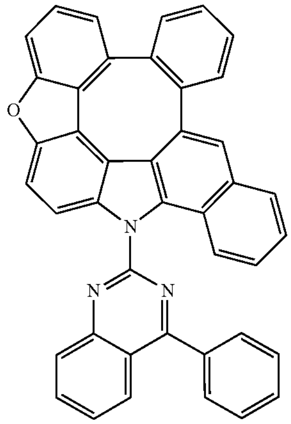

-continued
C-262
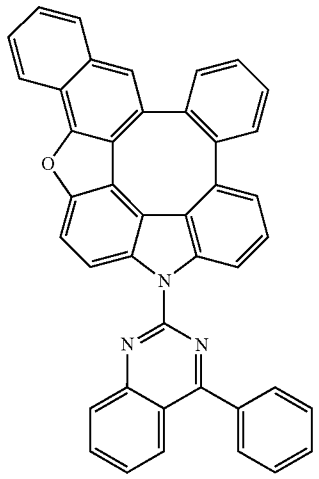
C-263
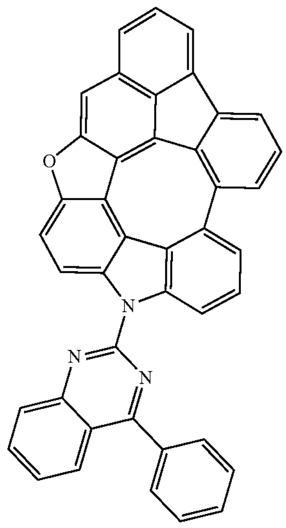
C-264
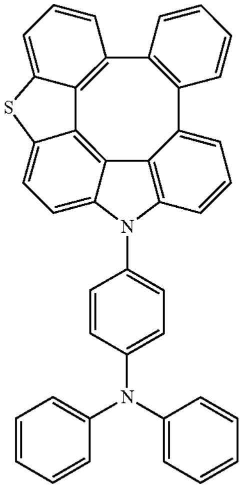
-continued
C-265
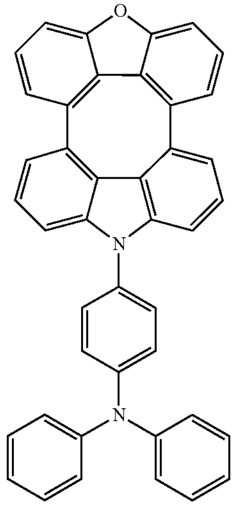
C-266
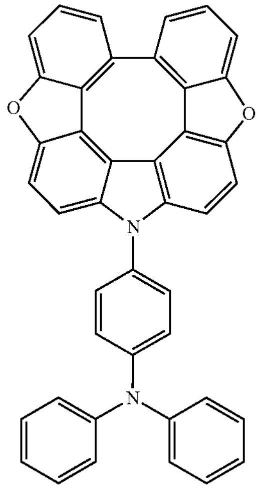
C-267
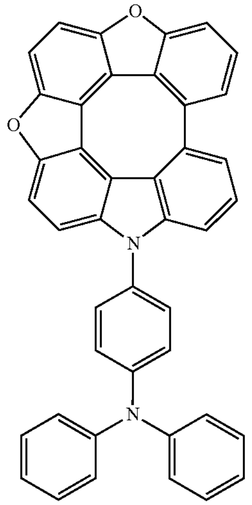

-continued
C-268
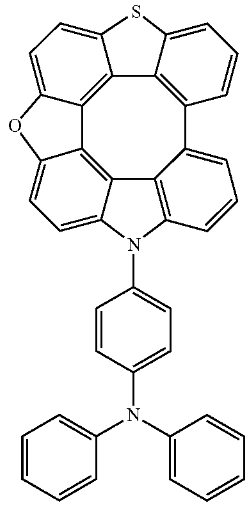
C-269
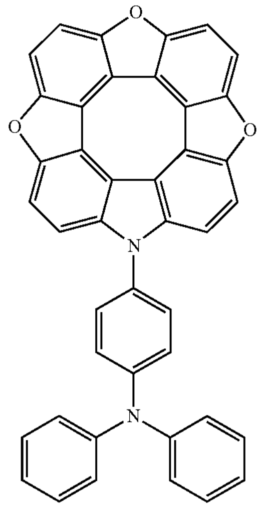
C-270
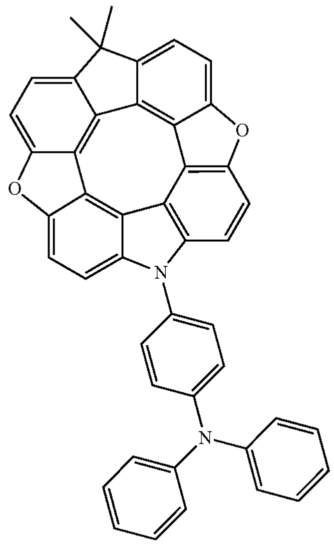
-continued
C-271
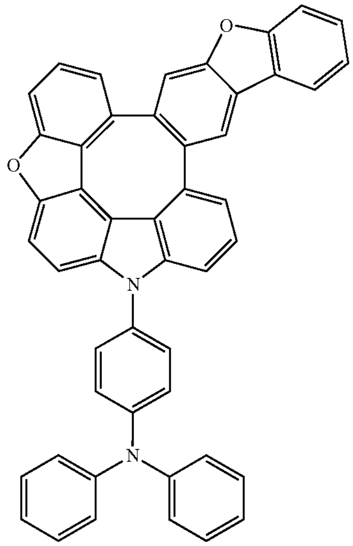
C-272
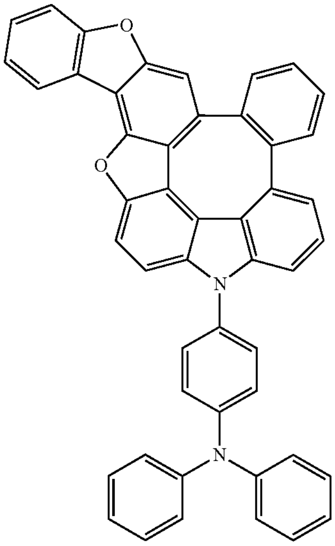
C-273
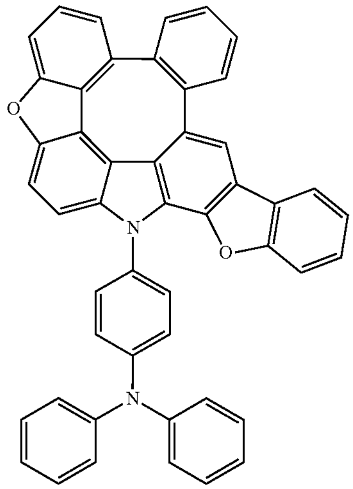

C-274
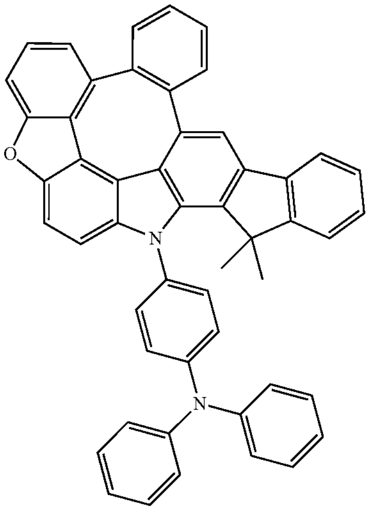
C-275
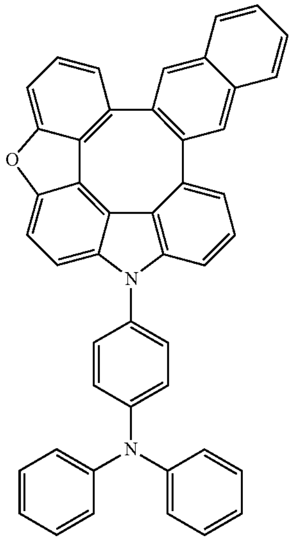
C-276
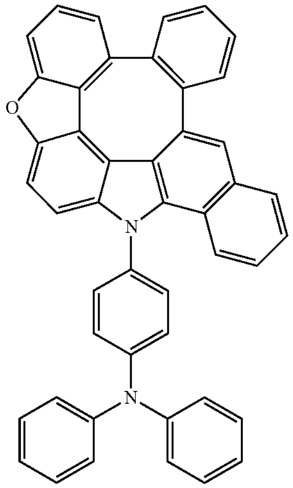
C-277
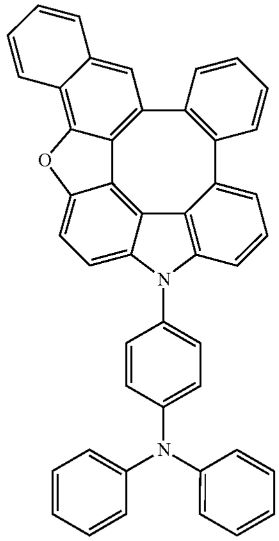
C-278
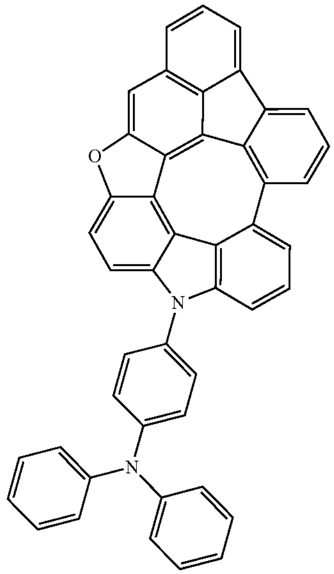
C-279
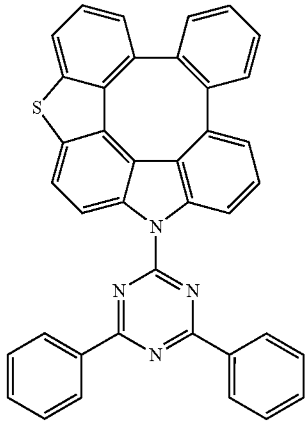

-continued
C-280
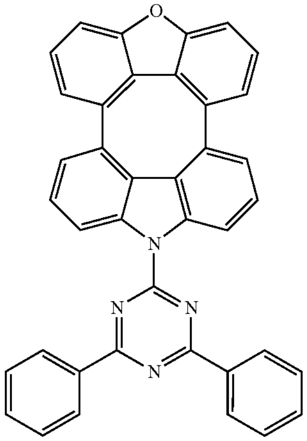
C-281
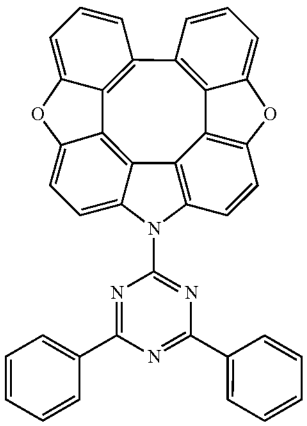
C-282
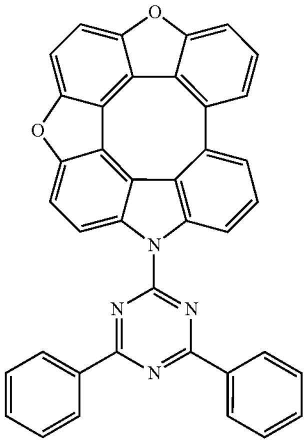
-continued
C-283
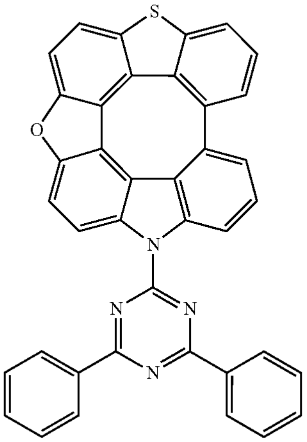
C-284
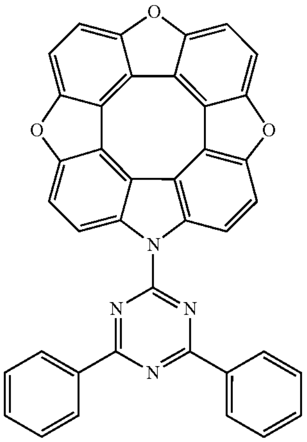
C-285
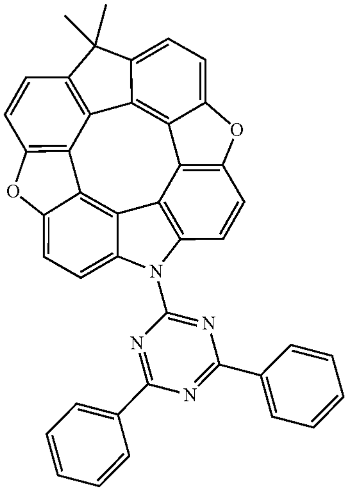

C-286
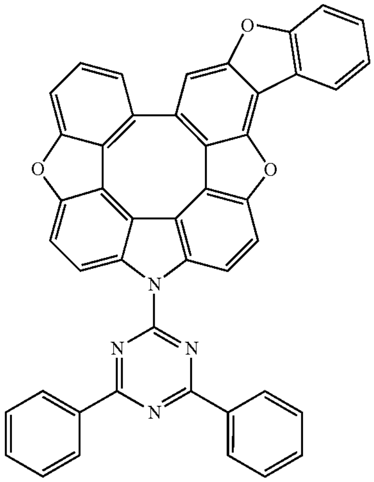
C-287
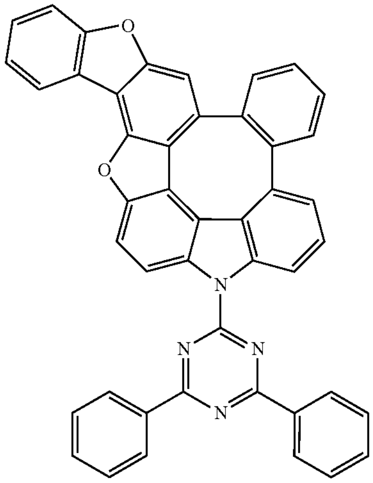
C-288
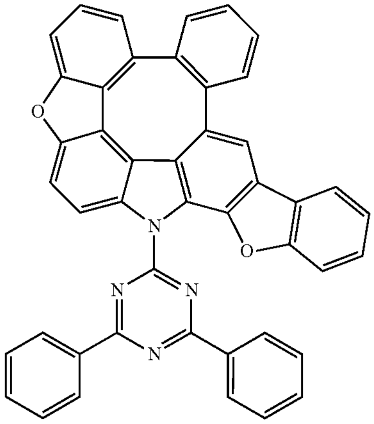
C-289
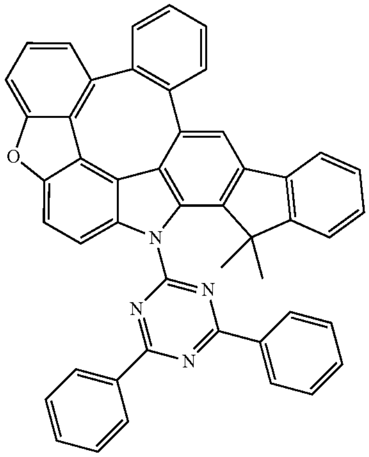
C-290
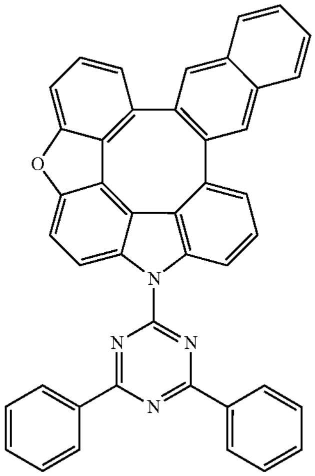
C-291
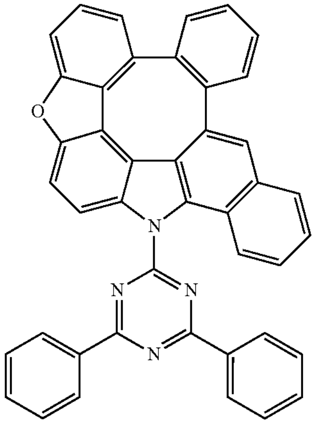

-continued
C-292
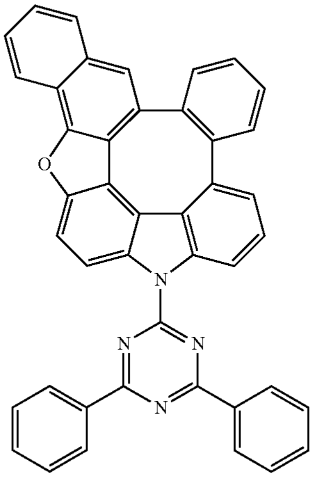
C-293
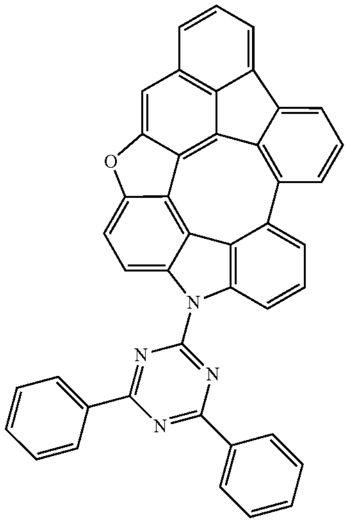
C-294
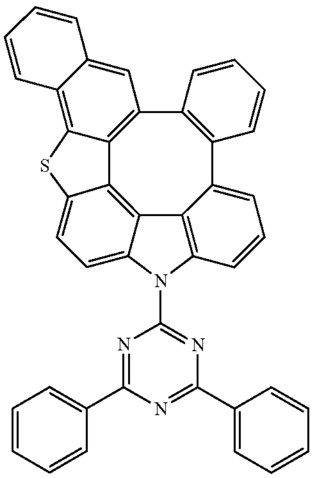
-continued
C-295
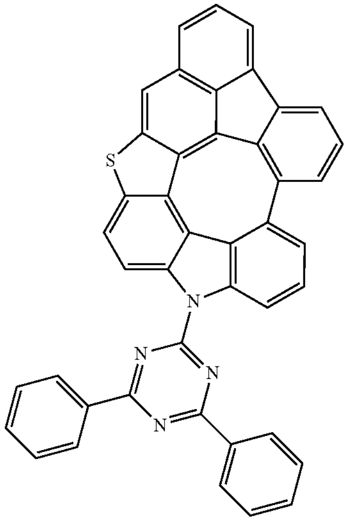
C-296
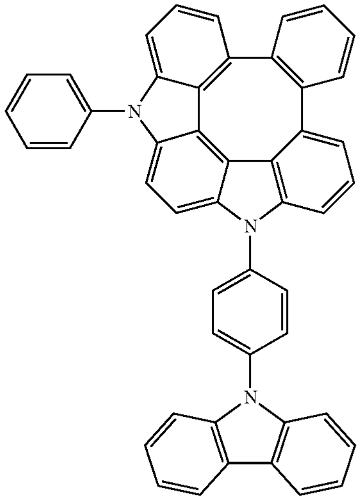
C-297
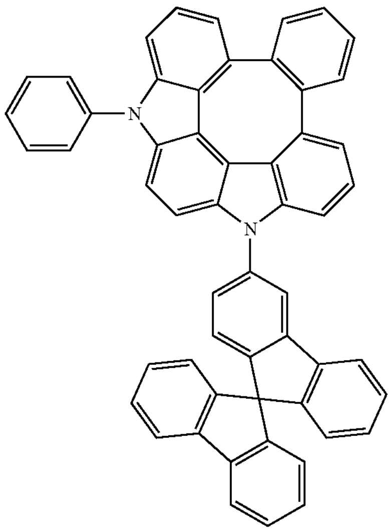

-continued

C-298

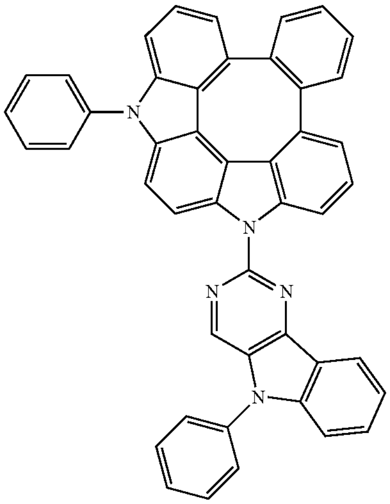

C-299

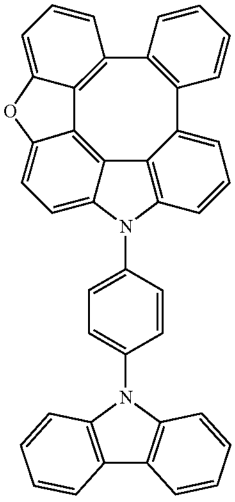

C-300

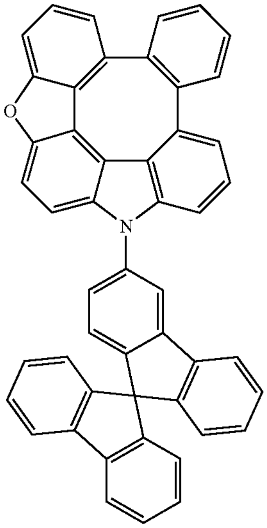

The combination of at least one of compounds E-1 to E-196 and at least one of compounds C-1 to C-300 may be used in an organic electroluminescent device.

According to one embodiment of the present disclosure, the present disclosure may provide the compound represented by formula 1 or the compound represented by formula 2. Specifically, the present disclosure may provide at least one compound of compounds E-1 to E-196 and compounds C-1 to C-300.

Formula 1 of the present disclosure may be represented by the following formula 1-A. In addition, according to one embodiment of the present disclosure, the present disclosure may provide an organic electroluminescent compound represented by the formula 1-A.

(1-A)

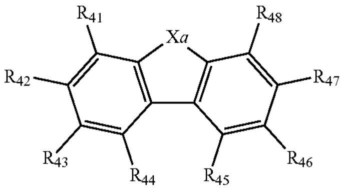

In formula 1-A, $X_a$ represents O or S; and at least one of $R_{41}$ to $R_{48}$ is represented by the following formula A-1, and the others, each independently, represent hydrogen, deuterium, or a (C6-C18)aryl unsubstituted or substituted with at least one of deuterium, a (C1-C6)alkyl(s), and a (C6-C18)aryl(s);

(A-1)

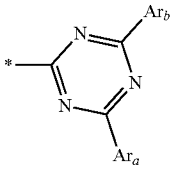

in formula A-1, $Ar_a$ and $Ar_b$, each independently, represent a phenyl unsubstituted or substituted with at least one of deuterium and naphthyl(s), a substituted or unsubstituted naphthyl, a biphenyl unsubstituted or substituted with deuterium, a terphenyl unsubstituted or substituted with deuterium, or a combination thereof, with the proviso that at least one of $Ar_a$ and $Ar_b$ represents a substituted or unsubstituted naphthyl;

with the proviso that in formula 1-A, if $R_{41}$ to $R_{43}$, and $R_{45}$ to $R_{48}$ are all hydrogen, $R_{44}$ is represented by formula A-1, and any one of $Ar_a$ and $Ar_b$ represents an unsubstituted naphthyl, the other of $Ar_a$ and $Ar_b$ represents a phenyl unsubstituted or substituted with at least one of deuterium and naphthyl(s), a substituted naphthyl, a biphenyl substituted with deuterium, or a terphenyl unsubstituted or substituted with deuterium.

The substituent(s) of the substituted naphthyl may be at least one selected from the group consisting of deuterium, a phenyl unsubstituted or substituted with deuterium, and a naphthyl unsubstituted or substituted with deuterium.

According to one embodiment of the present disclosure, the (C6-C18)aryl in $R_{41}$ to $R_{48}$ is preferably a phenyl, a naphthyl, a biphenyl, a terphenyl, a fluorenyl, a chrysenyl, a triphenylenyl, or a phenanthrenyl, more preferably a phenyl, a naphthyl, a biphenyl, a terphenyl, a chrysenyl, a triphenylenyl, or a phenanthrenyl.

According to one embodiment of the present disclosure, $Ar_a$ and $Ar_b$ may be represented by any one of those listed in the following group 4. In group 4, hydrogen, each independent may be replaced with deuterium.
[Group 4]
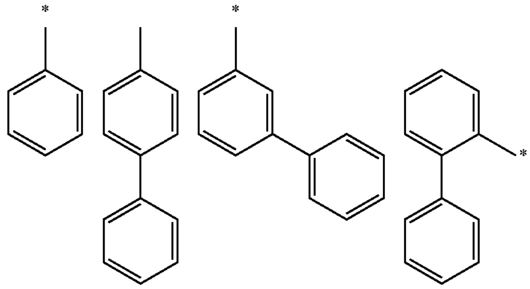
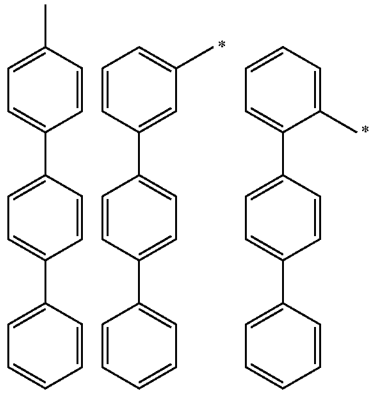
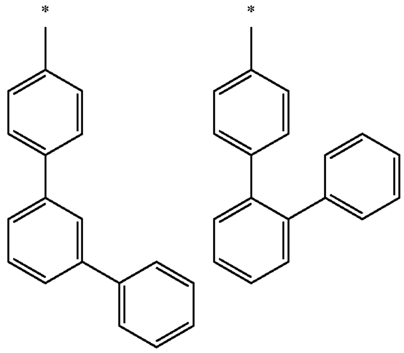
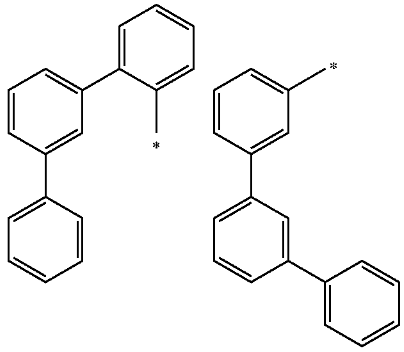
-continued
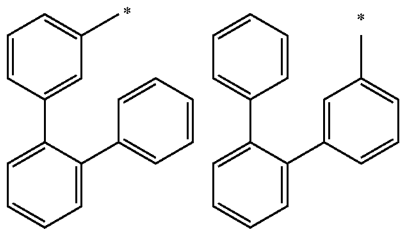
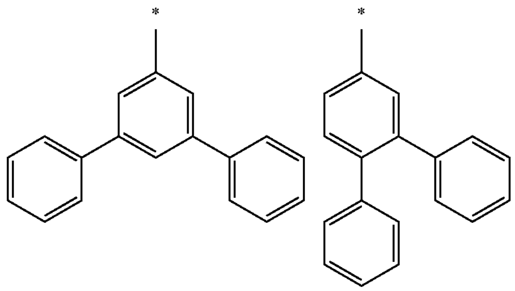
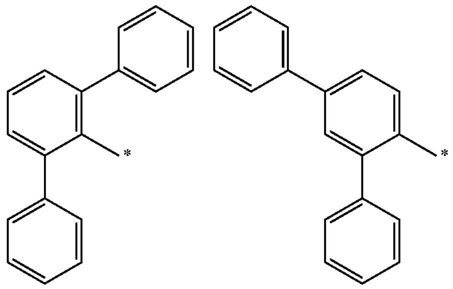
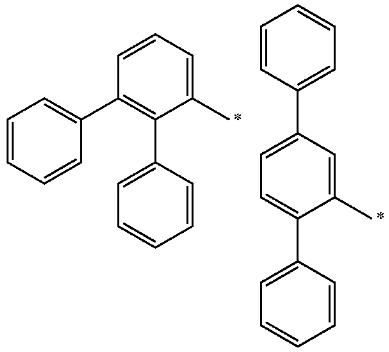
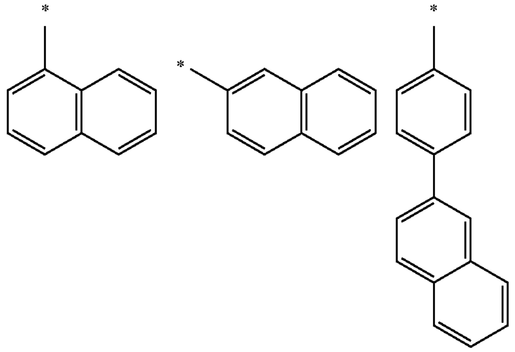

-continued
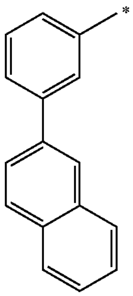
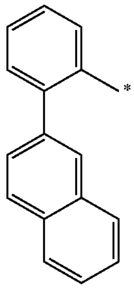
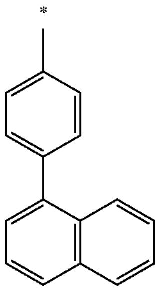
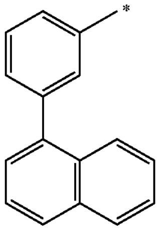
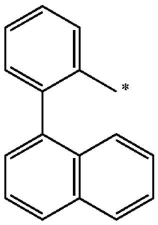
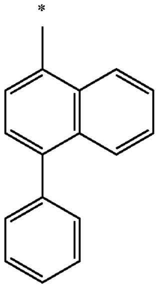
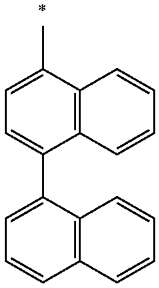
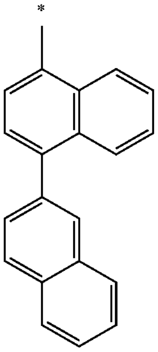
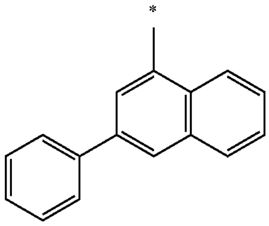
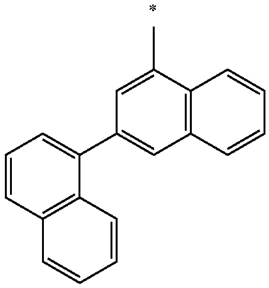
-continued
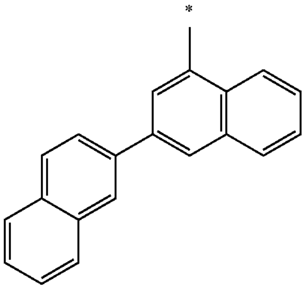
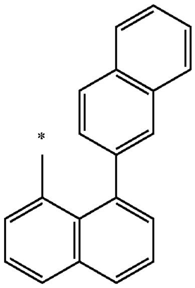
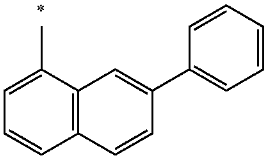
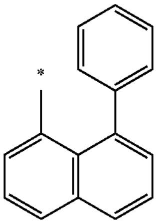
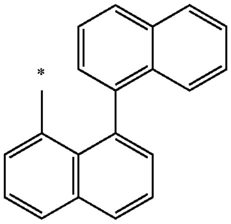
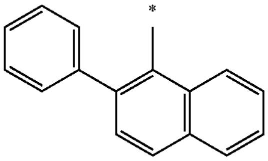
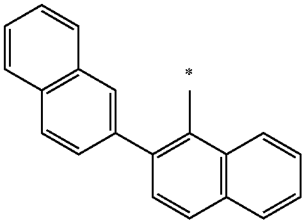
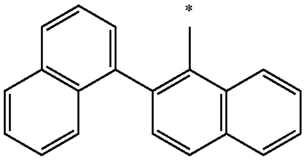
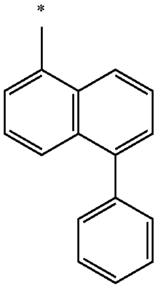
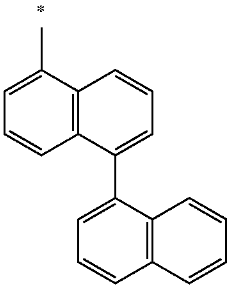
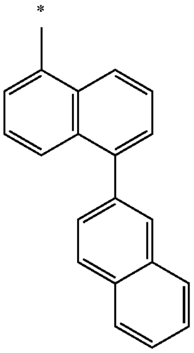

-continued
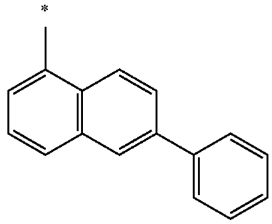
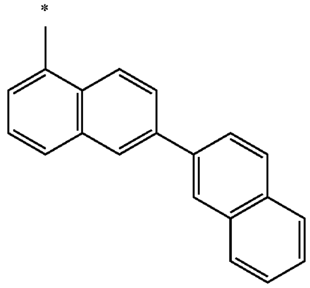
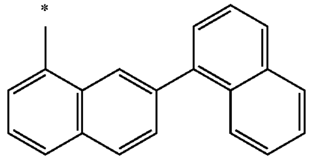
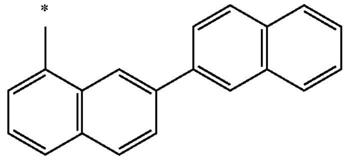
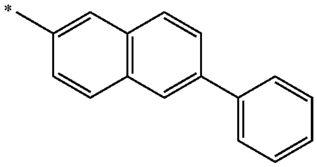
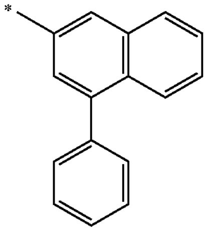
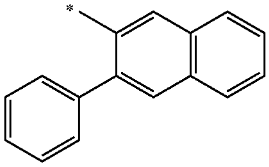
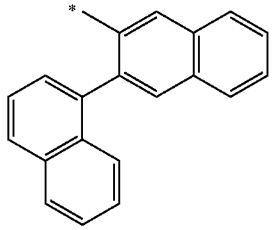
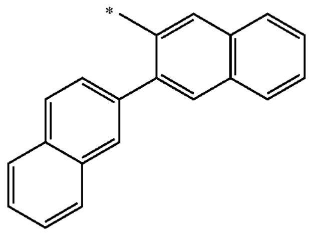
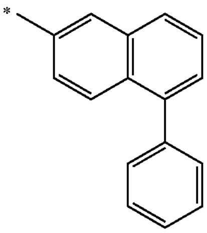
-continued
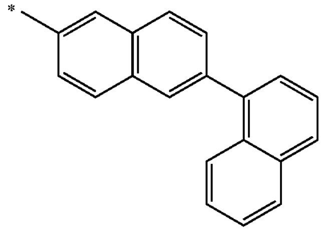
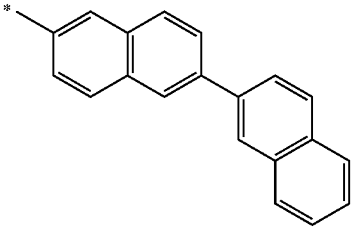
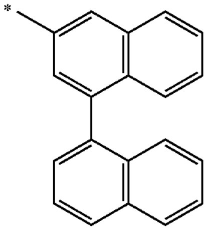
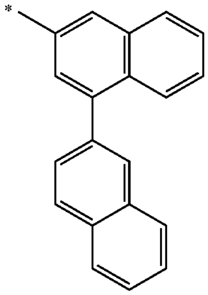
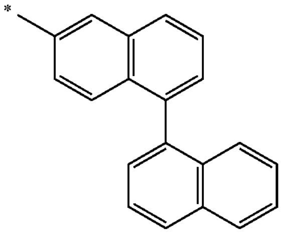
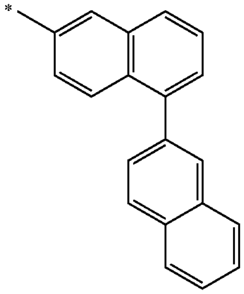
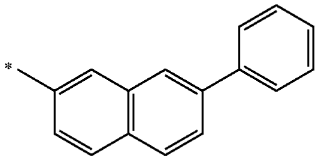
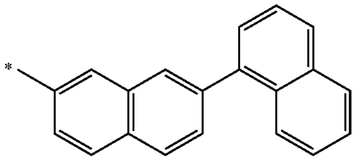
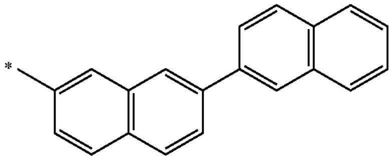

-continued
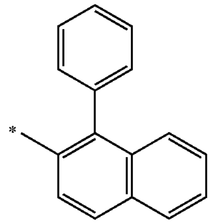
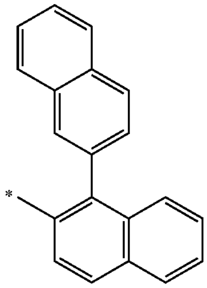
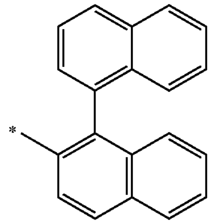
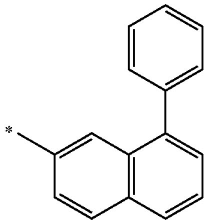
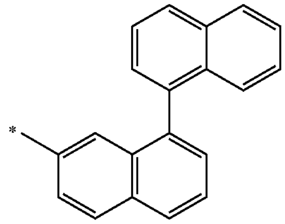
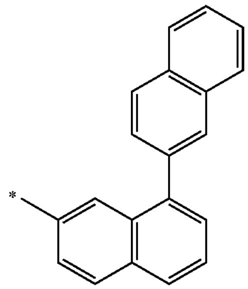
Specifically, the compound represented by formula 1-A may be exemplified as the following compounds, but is not limited thereto.
E-131
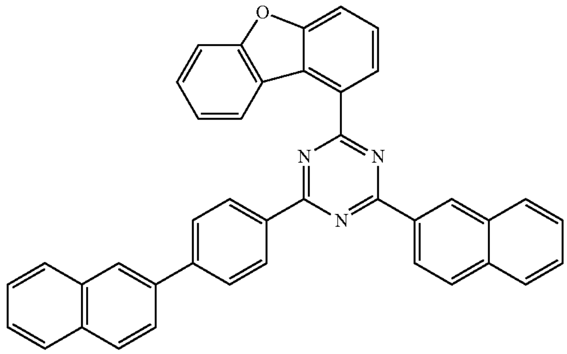
-continued
E-133
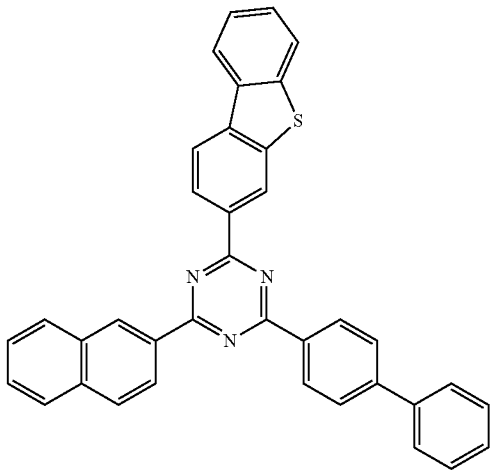
E-135
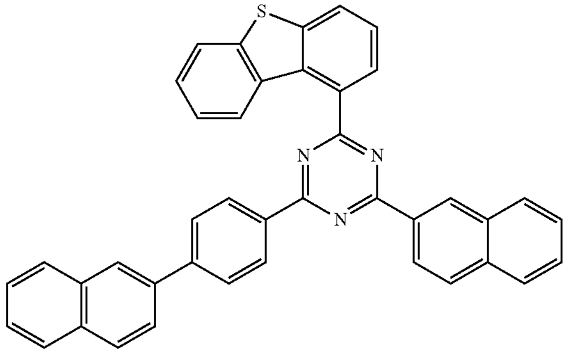
E-138
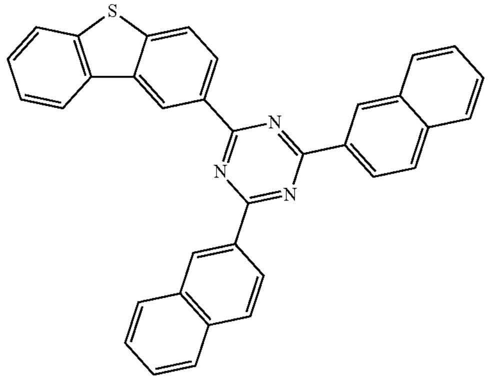

-continued
E-139
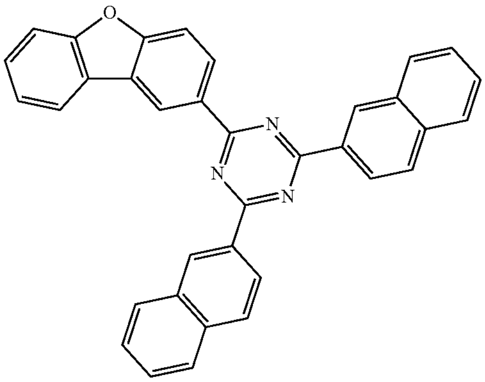
E-140
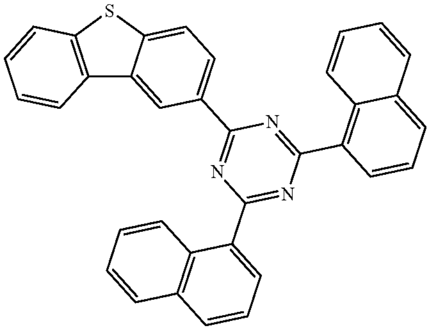
E-141
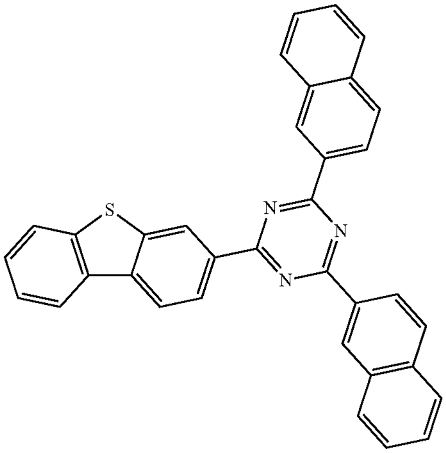
E-142
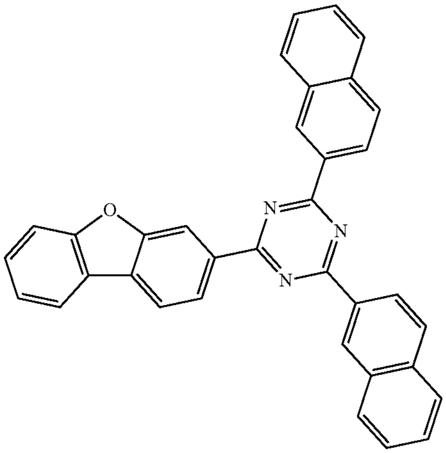
-continued
E-143
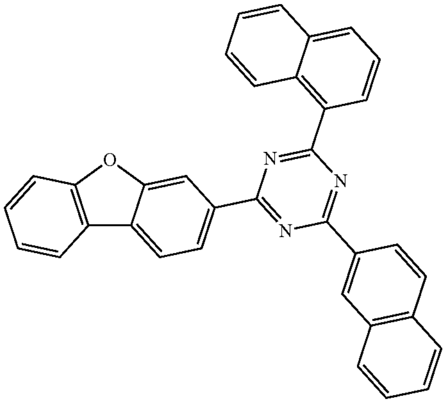
E-144
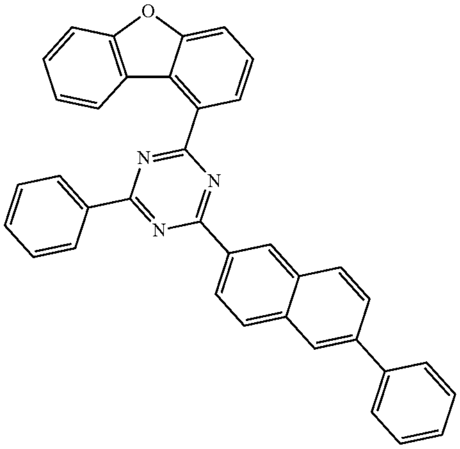
E-145
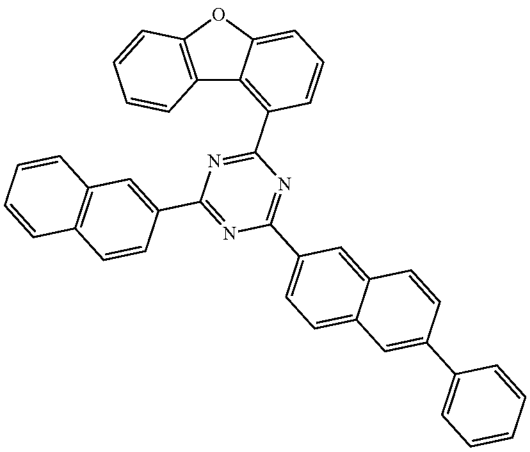

-continued
E-146
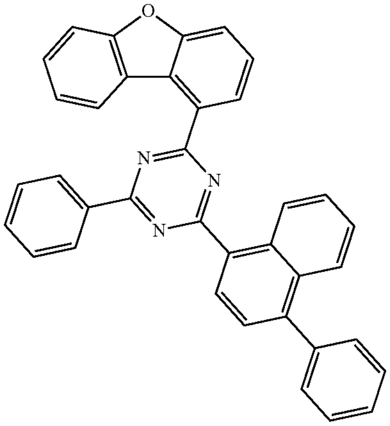
E-147
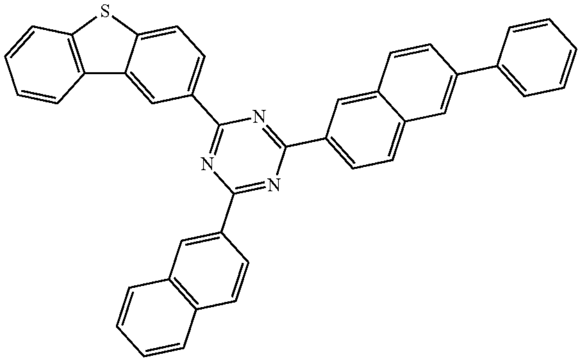
E-148
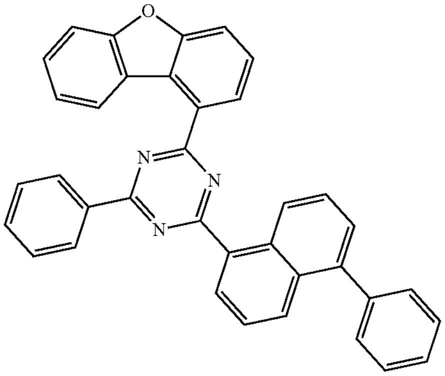
E-149
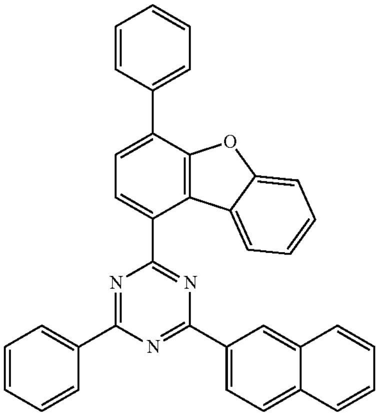
-continued
E-150
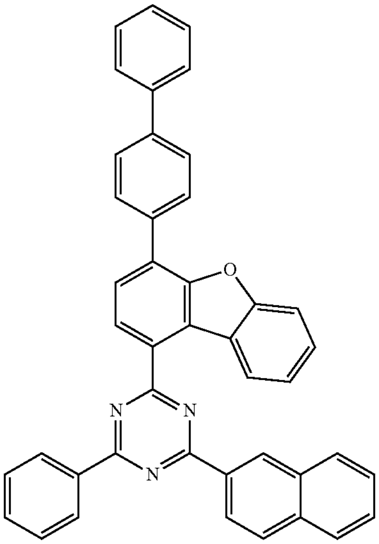
E-151
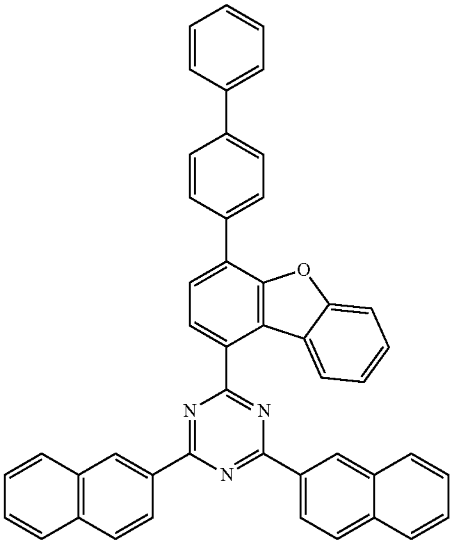
E-152
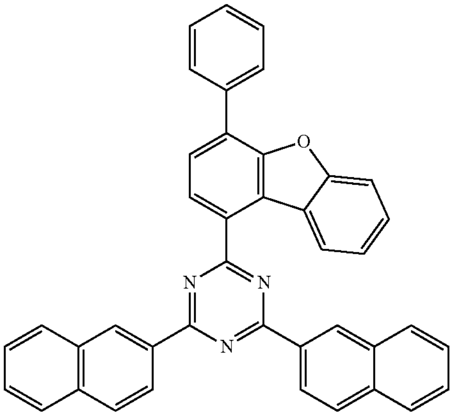

-continued
E-153
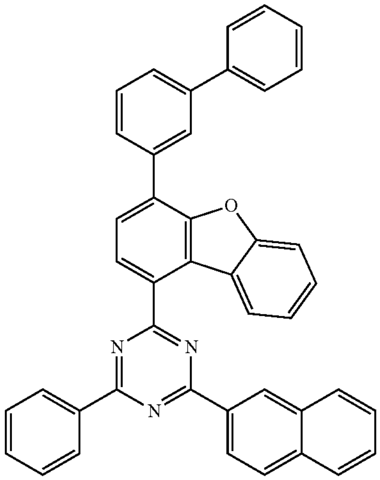
E-154
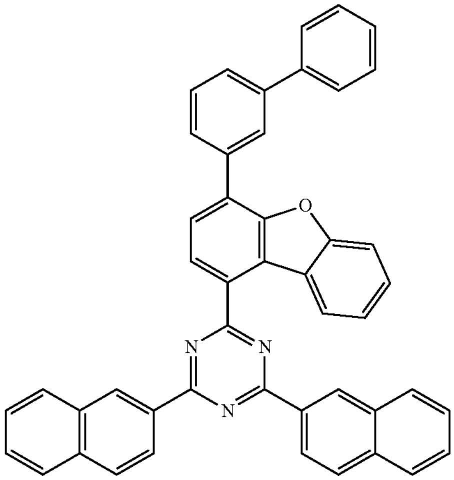
E-155
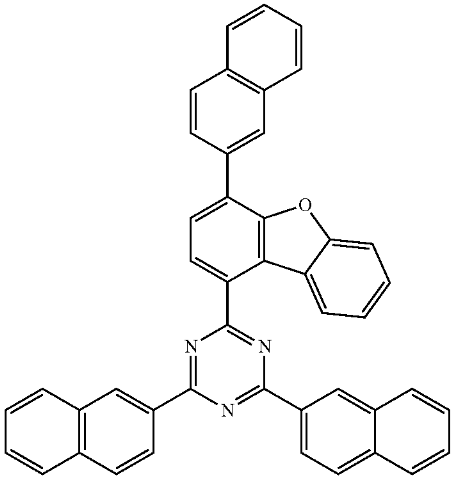
-continued
E-156
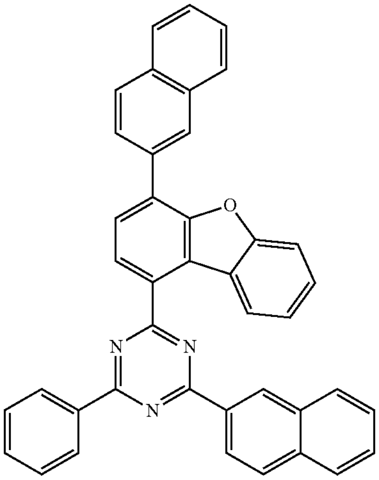
E-157
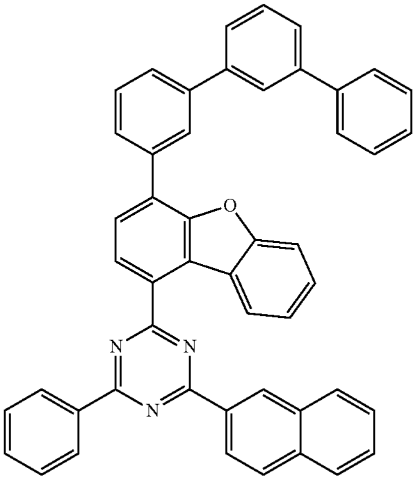
E-158
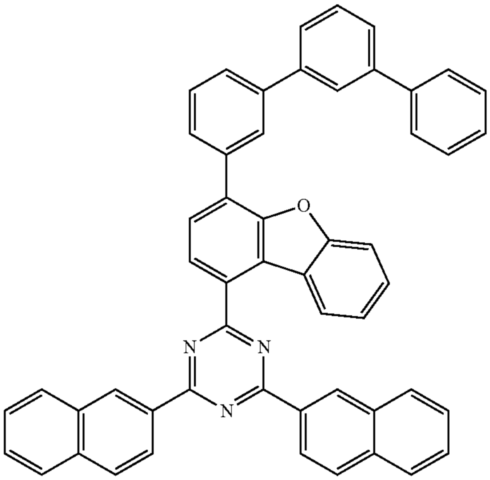

-continued
E-159
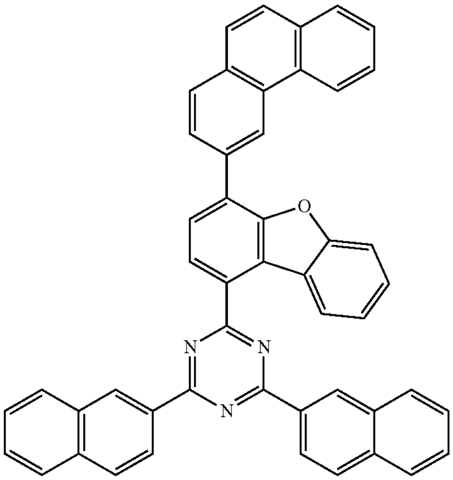
E-160
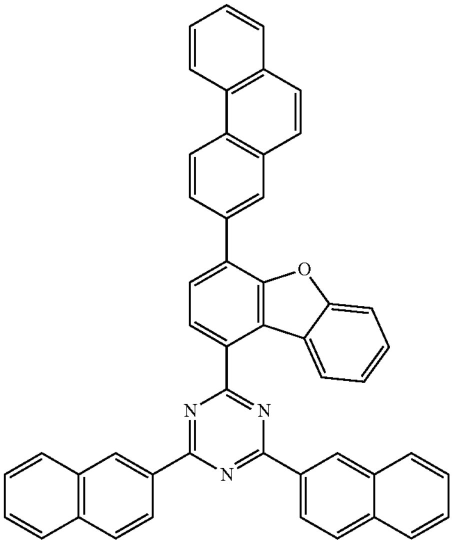
E-161
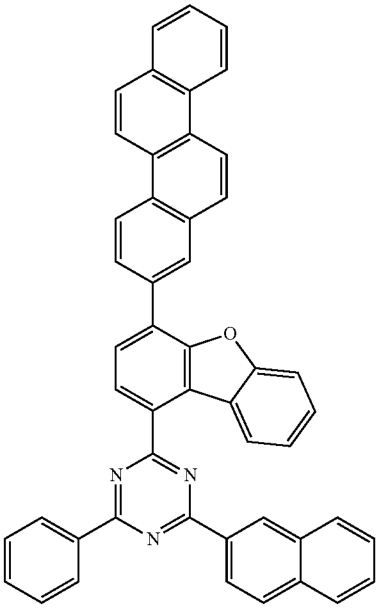
-continued
E-162
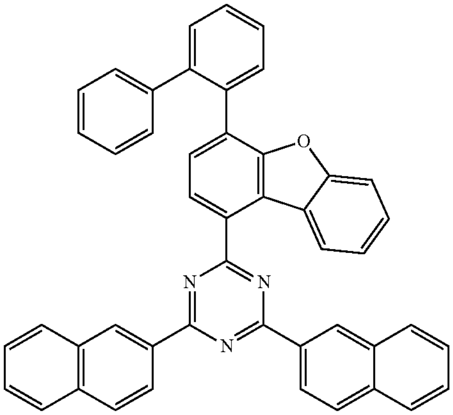
E-163
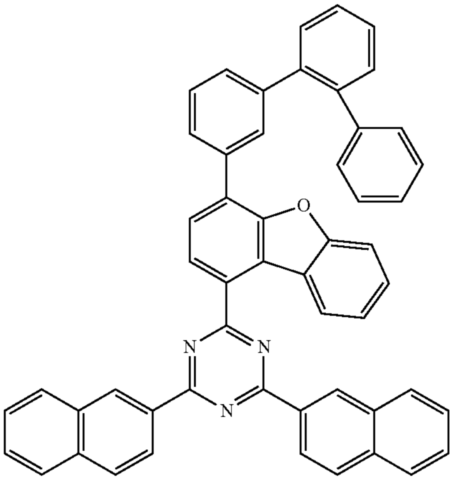
E-164
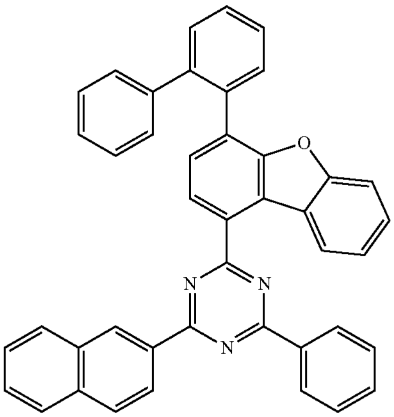

-continued
E-165
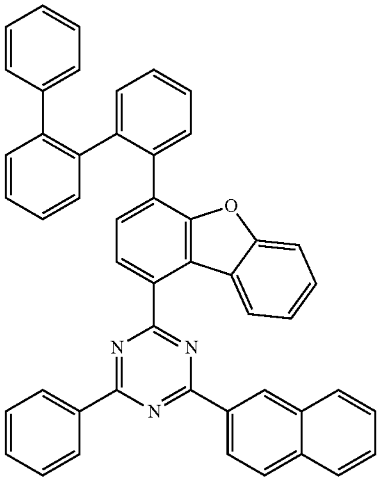
E-166
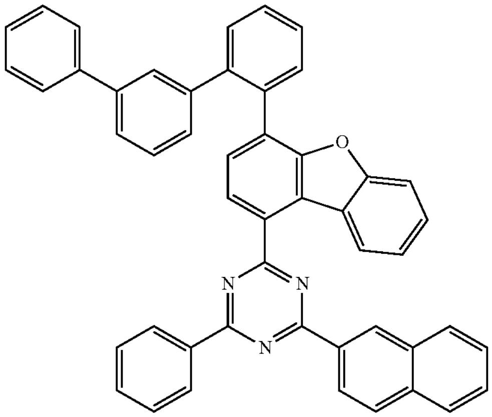
E-167
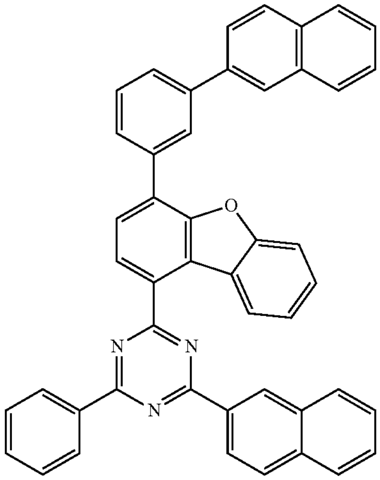
-continued
E-168
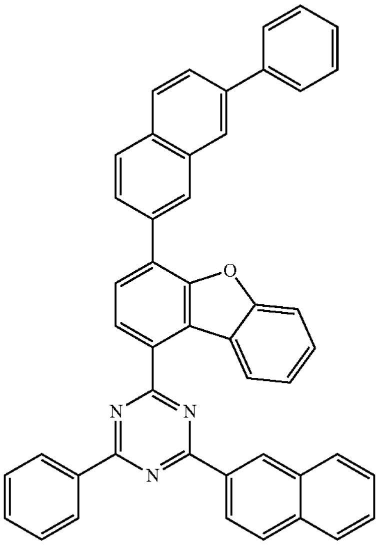
E-169
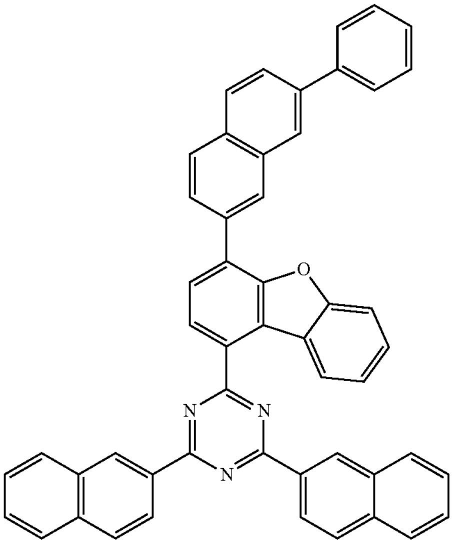

-continued
E-170
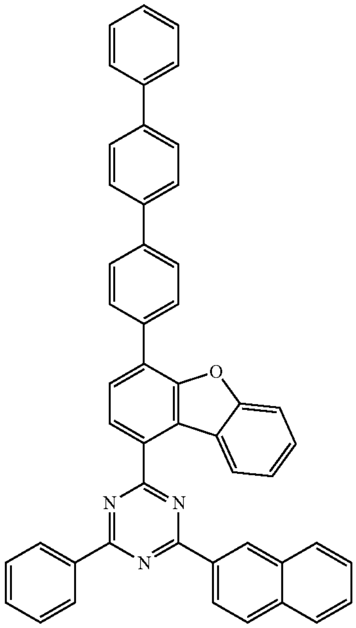
E-171
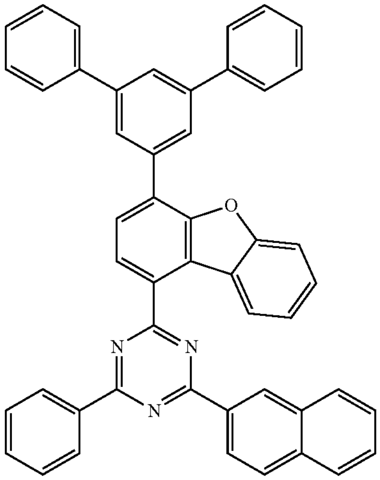
E-172
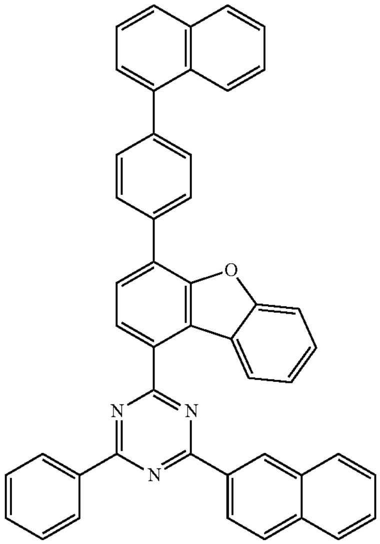
-continued
E-173
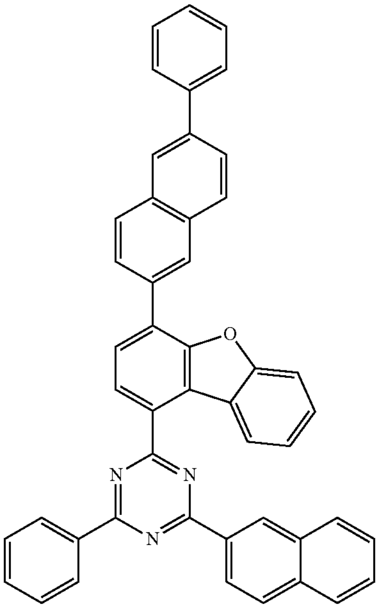
E-174
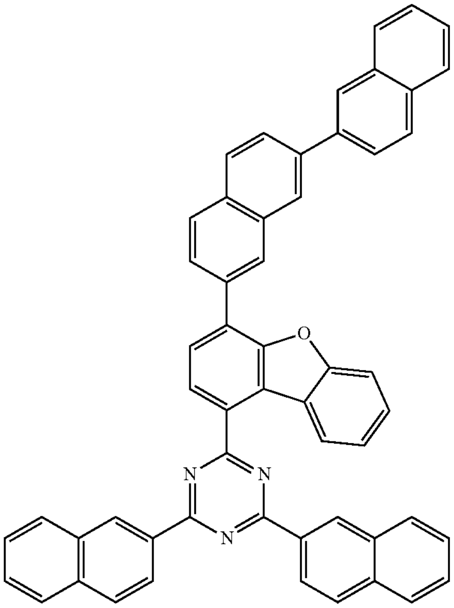

-continued
E-175
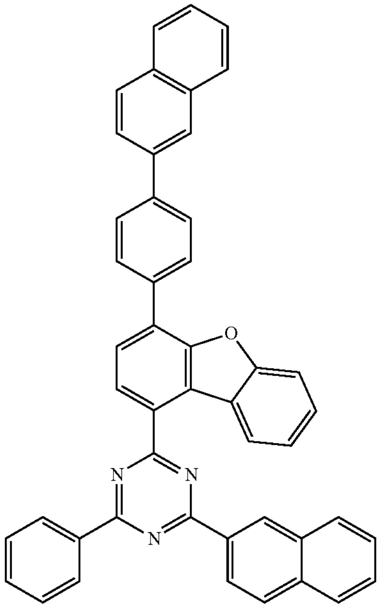
E-176
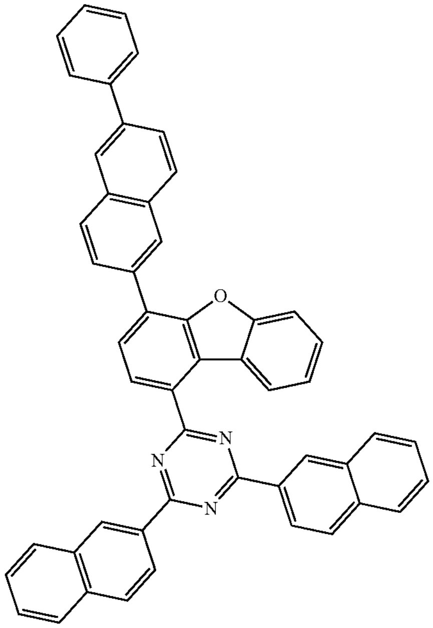
-continued
E-177
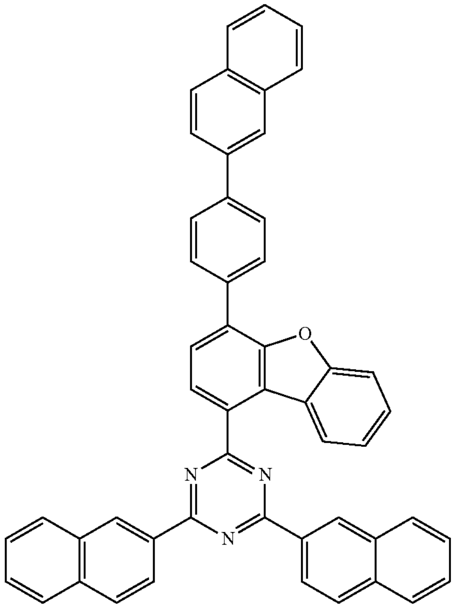
E-178
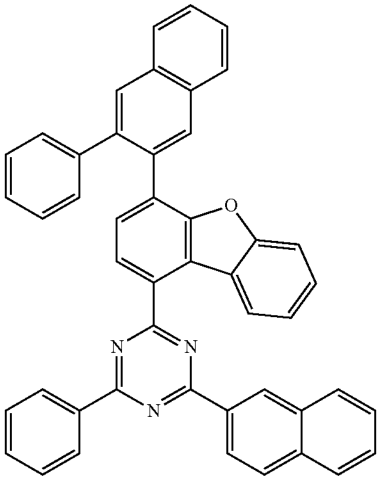
E-179
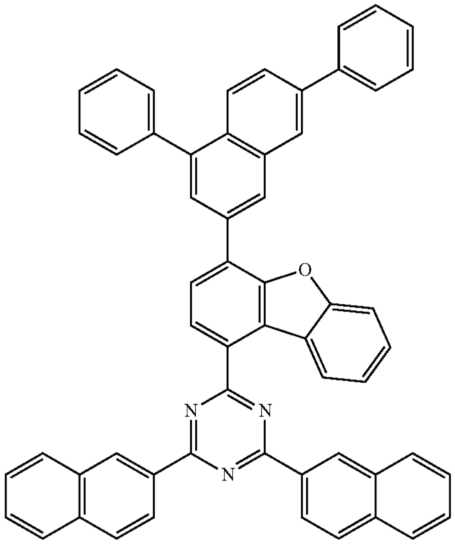

-continued
E-180
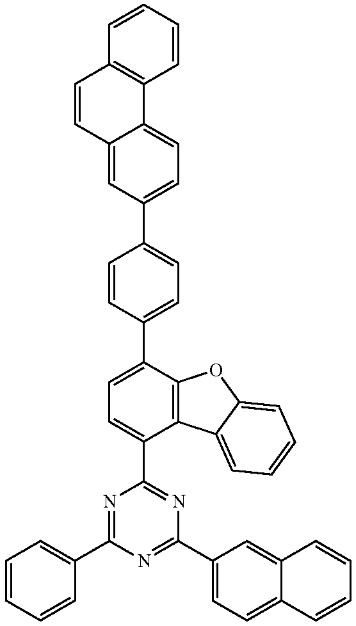
E-181
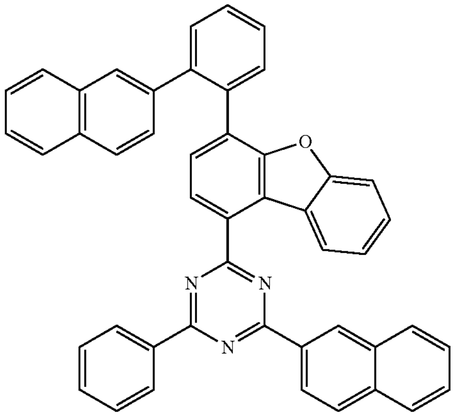
E-182
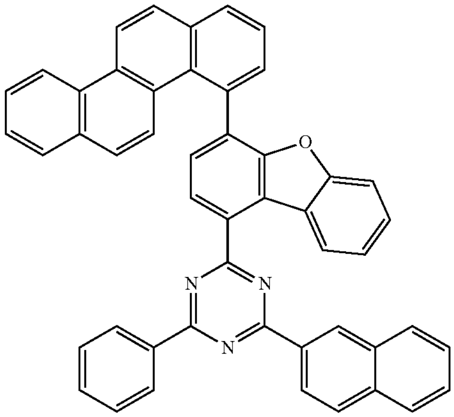
-continued
E-183
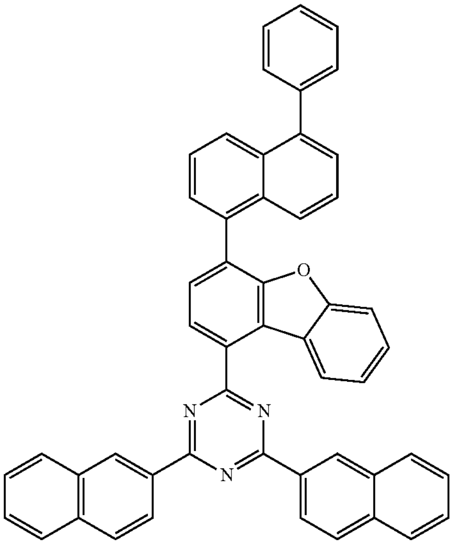
E-184
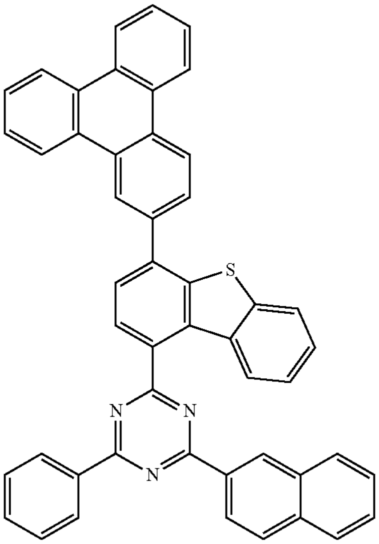
E-185
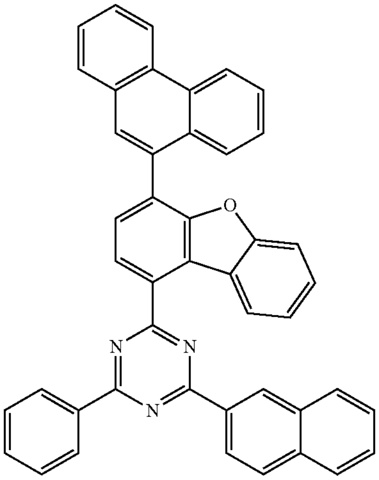

-continued
E-186
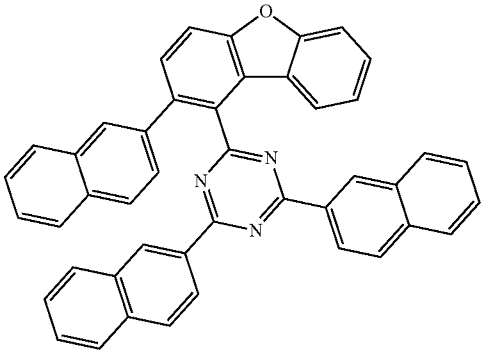
E-187
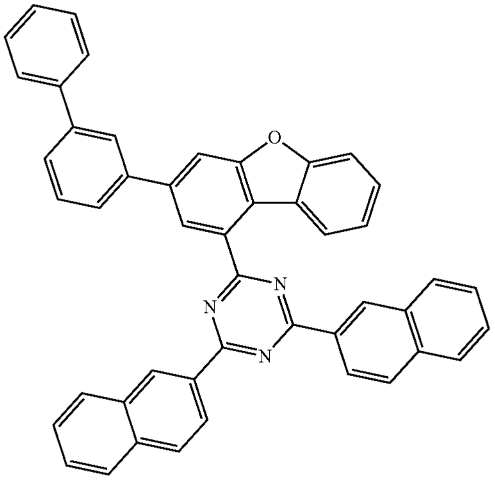
E-188
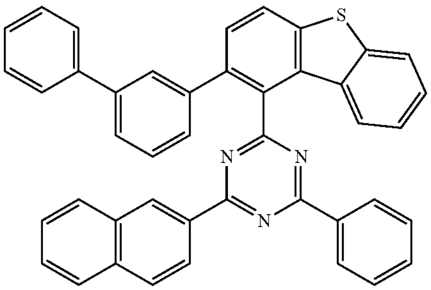
-continued
E-189
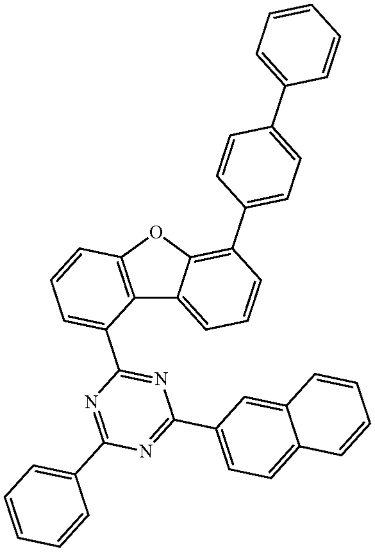
E-190
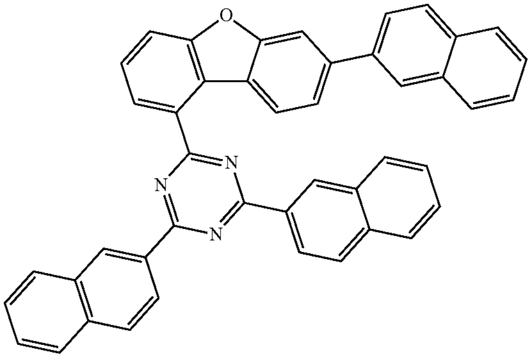
E-191
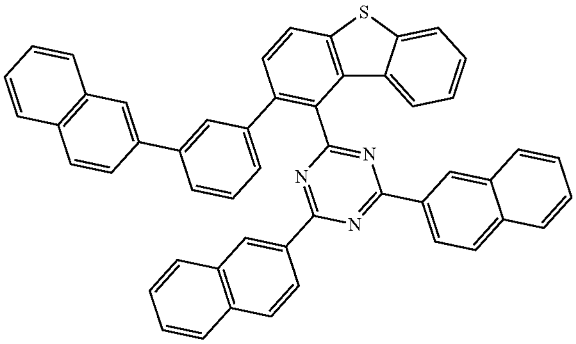

-continued

E-192

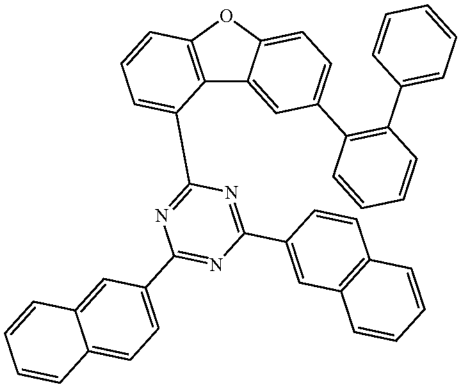

E-193

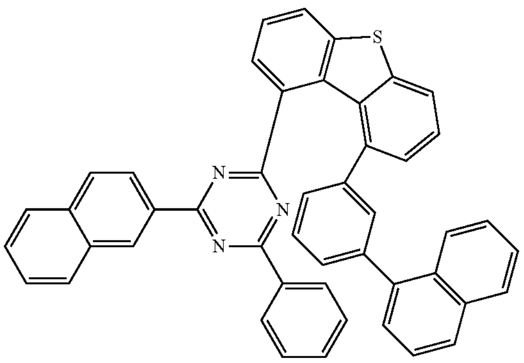

E-194

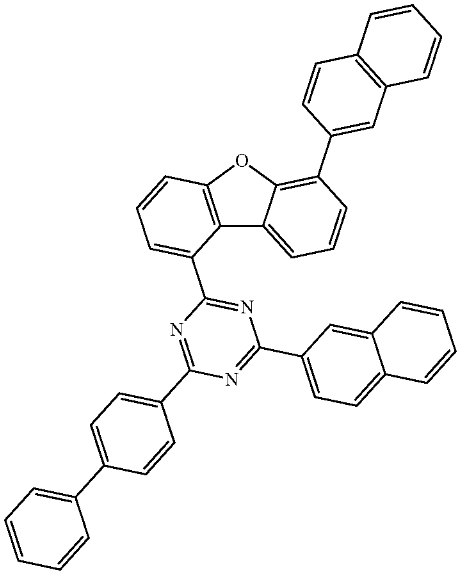

-continued

E-195

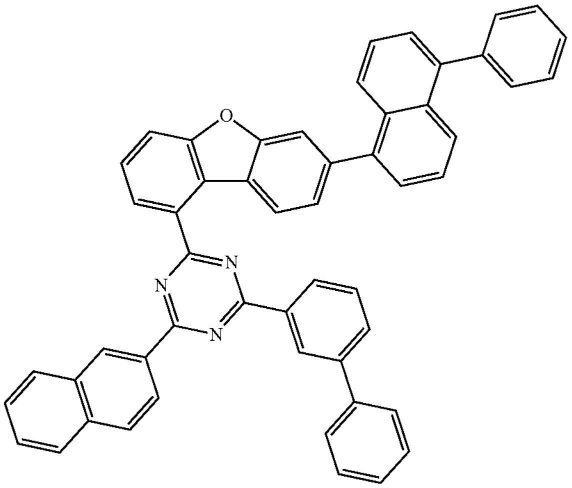

E-196

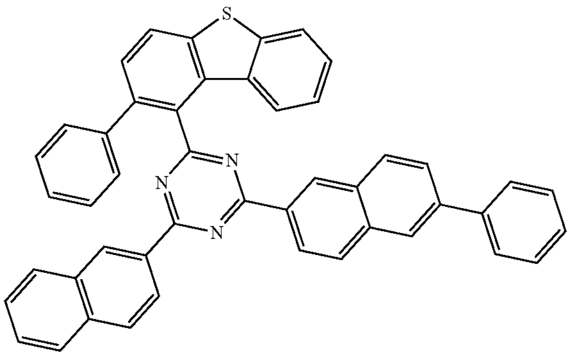

According to one embodiment of the present disclosure, the compound represented by formula 1-A may be used alone or in a combination of two or more in an organic electroluminescent device.

The compound represented by formula 1 and the compound represented by formula 1-A according to the present disclosure may be produced by a synthetic method known to one skilled in the art, and for example, by referring to Korean Patent Application Laying-Open Nos. 2012-0033017 (published on Apr. 6, 2012), 2013-0128322 (published on Nov. 26, 2013), 2016-0038006 (Apr. 6, 2016), and 2016-0049083 (May 9, 2016), US Patent Application Publication No. 2016-0233436 (published on Aug. 11, 2016), International Publication No. 2017/178311 (published on Oct. 19, 2017), etc., or according to the following reaction schemes A and B, but is not limited thereto.

[Reaction Scheme A]

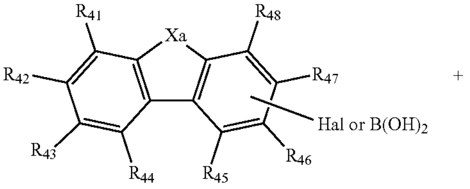

-continued
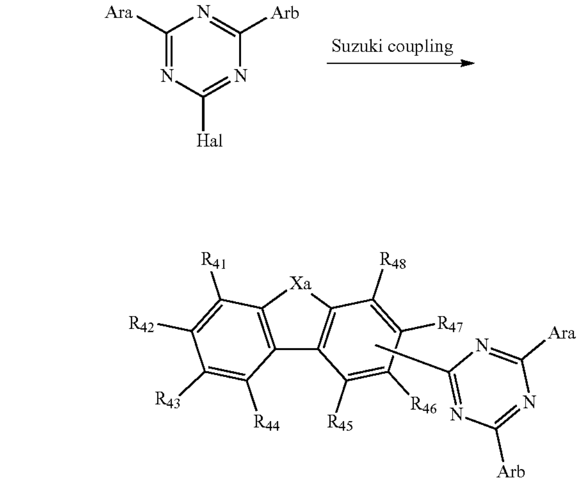
[Reaction Scheme B]
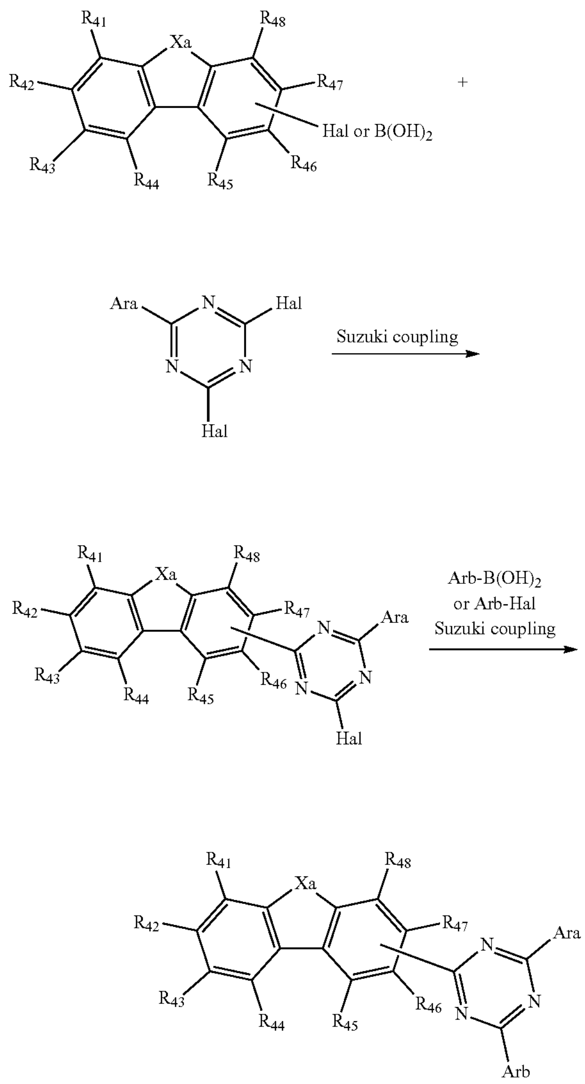
In reaction schemes A and B, Xa, $R_{41}$ to $R_{48}$, $Ar_a$, and $Ar_b$ are as defined in formula 1-A.
The compound represented by formula 2 of the present disclosure may be produced by a synthetic method known to one skilled in the art, and for example, according to the following reaction schemes 1 to 4, but is not limited thereto.
[Reaction Scheme 1]
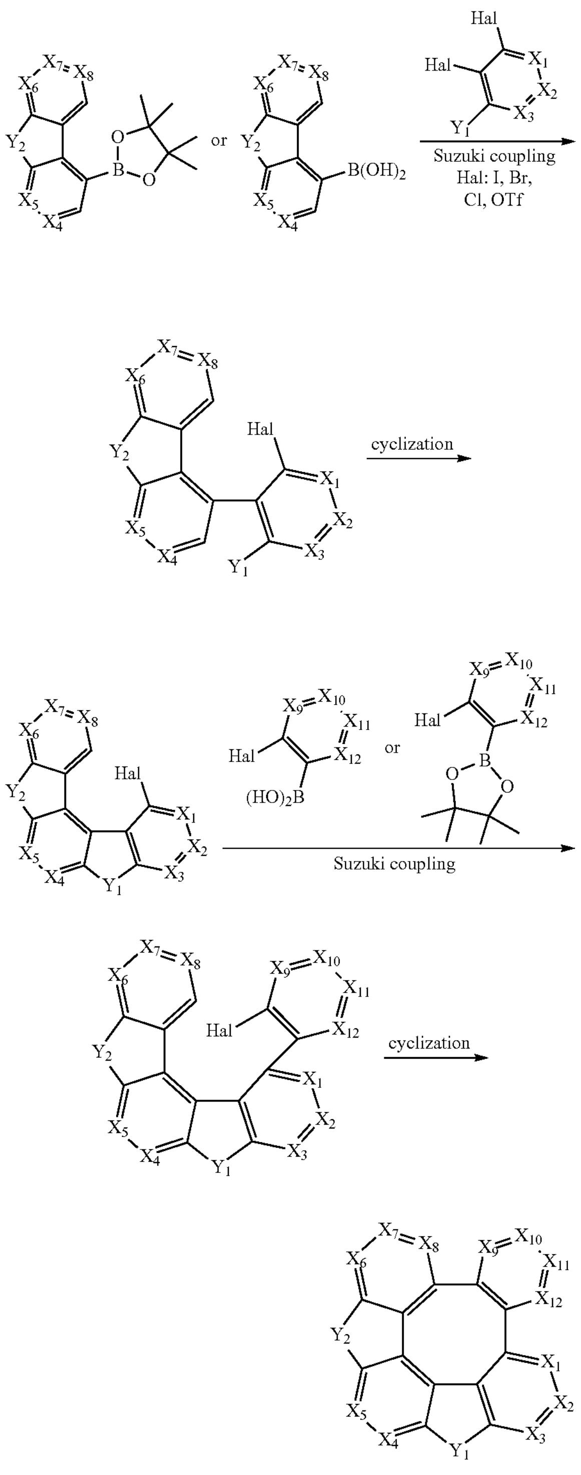

[Reaction Scheme 2]

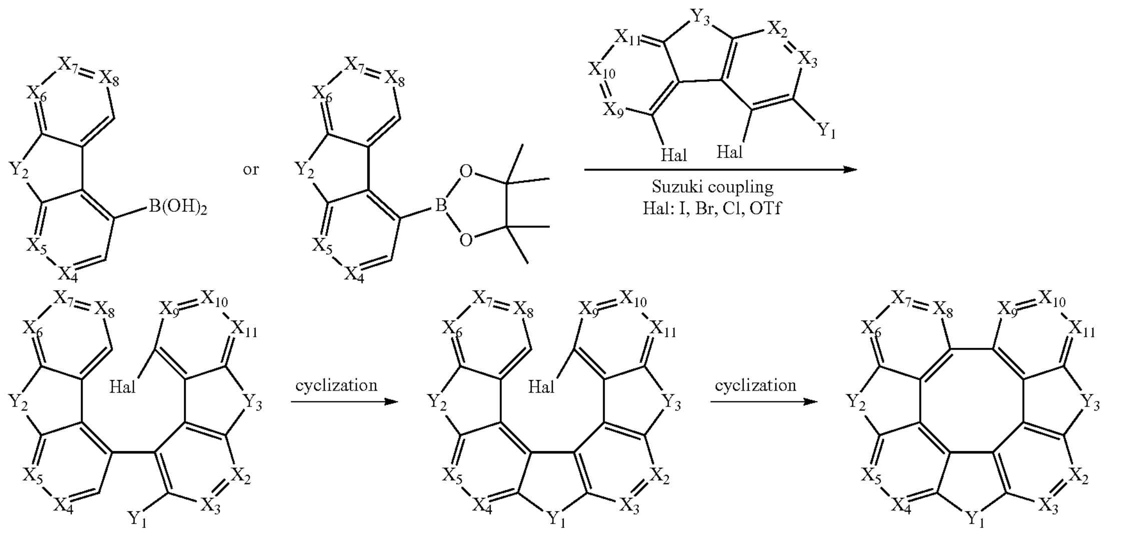

[Reaction Scheme 3]

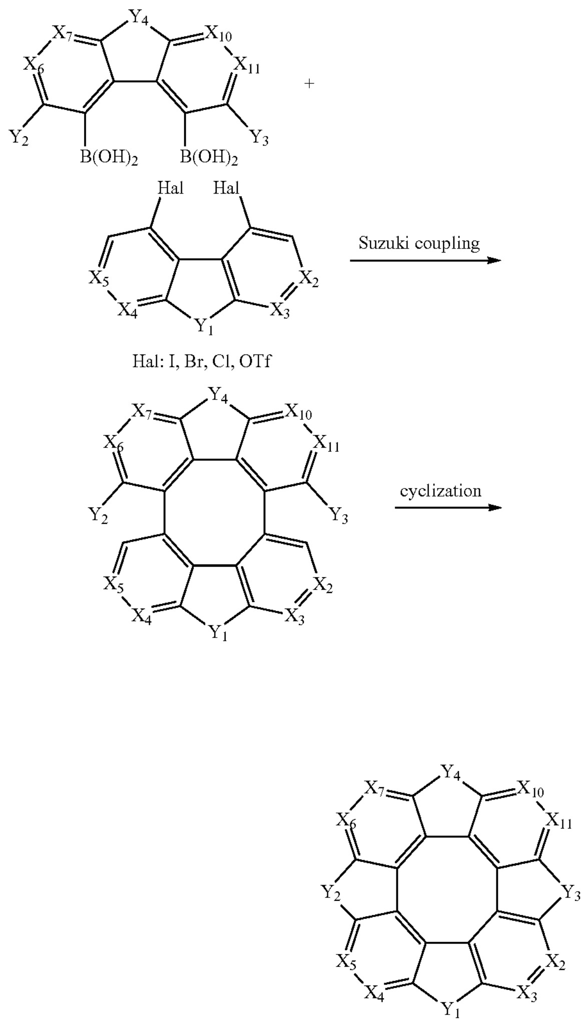

-continued

[Reaction Scheme 4]

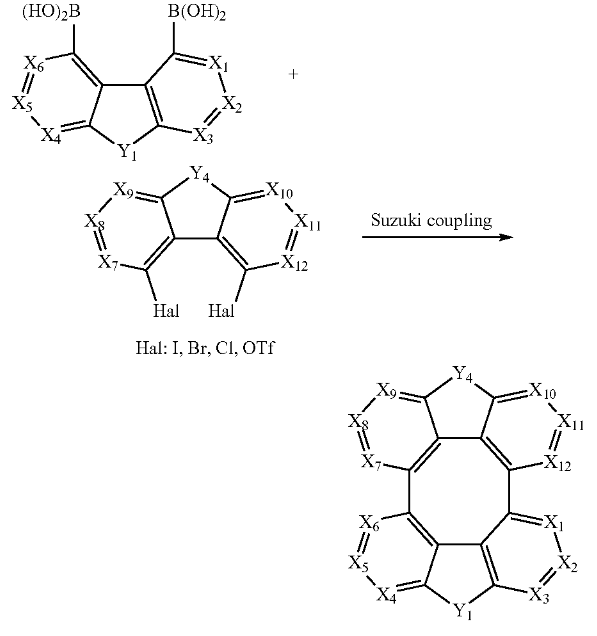

In reaction schemes 1 to 4, $Y_1$ to $Y_4$, and $X_1$ to $X_{12}$ are as defined in formulas 2-1 to 2-4.

Although illustrative synthesis examples of the compound represented by formula 2 of the present disclosure are described above, one skilled in the art will be able to readily understand that all of them are based on a Buchwald-Hartwig cross-coupling reaction, an N-arylation reaction, a H-mont-mediated etherification reaction, a Miyaura borylation reaction, a Suzuki cross-coupling reaction, an Intramolecular acid-induced cyclization reaction, a Pd(II)-catalyzed oxidative cyclization reaction, a Grignard reaction, a Heck reaction, a Cyclic Dehydration reaction, an $SN_1$ substitution reaction, an $SN_2$ substitution reaction, a Phosphine-mediated reductive cyclization reaction, etc., and the reactions above proceed even when substituents which are defined in formula 2 above, but are not specified in the specific synthesis examples, are bonded.

In addition, the present disclosure provides an organic electroluminescent material comprising the compound represented by formula 1-A, and an organic electroluminescent device comprising the material. The material may consist of the organic electroluminescent compound of the present disclosure alone, and may further comprise conventional materials comprised in an organic electroluminescent material.

The organic electroluminescent compound represented by formula 1-A may be comprised in any one layer of a light-emitting layer, a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. Preferably, The organic electroluminescent compound represented by formula 1-A may be comprised in at least one of a light-emitting layer, a hole transport layer, a hole auxiliary layer, a light-emitting auxiliary layer, an electron transport layer, an electron buffer layer, a hole blocking layer, and an electron blocking layer, if necessary. When used in an electron transport layer, the organic electroluminescent compound represented by formula 1-A and conventional materials may be comprised in a weight ratio of about 1:1.

The organic electroluminescent device according to the present disclosure may comprise an anode, a cathode, and at least one organic layer between the anode and cathode, in which the organic layer may comprise a plurality of organic electroluminescent materials, including the compound represented by formula 1 as the first organic electroluminescent material, and the compound represented by formula 2 as the second organic electroluminescent material. According to one embodiment of the present disclosure, the organic electroluminescent device according to the present disclosure may comprise an anode, a cathode, and at least one light-emitting layer between the anode and cathode, in which at least one layer of the light-emitting layers may comprise the compound represented by formula 1 and the compound represented by formula 2, preferably a plurality of host materials of the present disclosure.

Herein, the electrode may be a transflective electrode or a reflective electrode, and may be a top emission type, a bottom emission type, or a both-sides emission type, depending on the materials. In addition, the hole injection layer may be further doped with a p-dopant, and the electron injection layer may be further doped with an n-dopant.

The light-emitting layer includes a host and a dopant, in which the host includes a plurality of host materials and the compound represented by formula 1 may be included as the first host compound of the plurality of host materials, and the compound represented by formula 2 may be included as the second host compound of the plurality of host materials. The weight ratio of the first host compound and the second host compound is about 1:99 to about 99:1, preferably about 10:90 to about 90:10, more preferably about 30:70 to about 70:30, even more preferably about 40:60 to about 60:40, and still more preferably about 50:50. When at least two materials are comprised in one layer, they may be mixture-evaporated to form a layer or may be separately co-evaporated at the same time to form a layer.

In the present disclosure, the light-emitting layer is a layer from which light is emitted, and may be a single layer or a multi-layer of which two or more layers are stacked. All of the first host material and the second host material may be included in one layer, or the first host material and the second host material may be included in respective different light-emitting layers. According to one embodiment of the present disclosure, the doping concentration of the dopant compound with respect to the host compound in the light-emitting layer may be less than 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. According to one embodiment of the present disclosure, the organic electroluminescent device of the present disclosure may further comprise an amine-based compound besides the plurality of host materials of the present disclosure as at least one of a hole injection material, a hole transport material, a hole auxiliary material, a light-emitting material, a light-emitting auxiliary material, and an electron blocking material. Further, according to one embodiment of the present disclosure, the organic electroluminescent device of the present disclosure may further comprise an azine-based compound besides the plurality of host materials of the present disclosure as at least one of an electron transport material, an electron injection material, an electron buffer material, and a hole blocking material.

The dopant comprised in the organic electroluminescent device of the present disclosure may be at least one phosphorescent or fluorescent dopant, and is preferably a phosphorescent dopant. The phosphorescent dopant material applied to the organic electroluminescent device of the present disclosure is not particularly limited, but may be preferably selected from the metallated complex compounds of iridium (Ir), osmium (Os), copper (Cu), and platinum (Pt), more preferably selected from ortho-metallated complex compounds of iridium (Ir), osmium (Os), copper (Cu), and platinum (Pt), and even more preferably ortho-metallated iridium complex compounds.

The dopant comprised in the OLED of the present disclosure may comprise a compound represented by the following formula 101, but is not limited thereto.

(101)

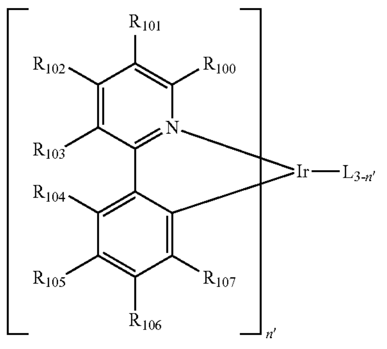

In formula 101, L is selected from the following structures 1 to 3:

[Structure 1]

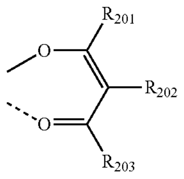

-continued

[Structure 2]

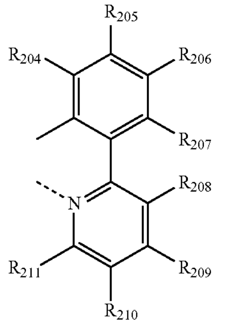

[Structure 3]

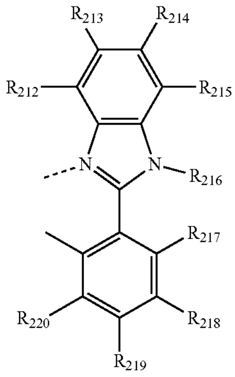

$R_{100}$ to $R_{107}$, each independently, represent hydrogen, deuterium, a halogen, a (C1-C30)alkyl unsubstituted or substituted with deuterium and/or a halogen(s), a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to an adjacent substituent to form a ring(s), for example, $R_{100}$ to $R_{103}$ may be linked to an adjacent substituent to form a substituted or unsubstituted, quinoline, isoquinoline, benzofuropyridine, benzothienopyridine, indenopyridine, benzofuroquinoline, benzothienoquinoline, or indenoquinoline, together with pyridine, and $R_{104}$ to $R_{107}$ may be linked to an adjacent substituent to form a substituted or unsubstituted, naphthalene, fluorene, dibenzothiophene, dibenzofuran, indenopyridine, benzofuropyridine, or benzothienopyridine, together with benzene;

$R_{201}$ to Rao, each independently, represent hydrogen, deuterium, a halogen, a (C1-C30)alkyl unsubstituted or substituted with deuterium and/or a halogen(s), a substituted or unsubstituted (C3-C30)cycloalkyl, or a substituted or unsubstituted (C6-C30)aryl; or may be linked to an adjacent substituent to form a ring(s); and n' represents an integer of 1 to 3.

The specific examples of the dopant compound are as follows, but are not limited thereto.

D-1

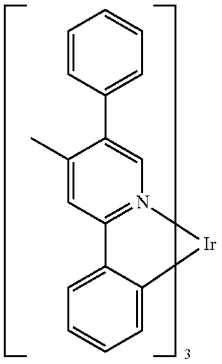

D-2

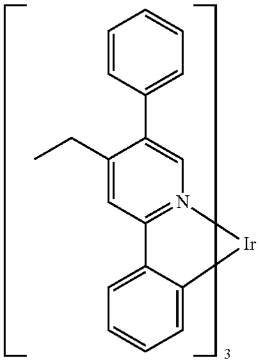

D-3

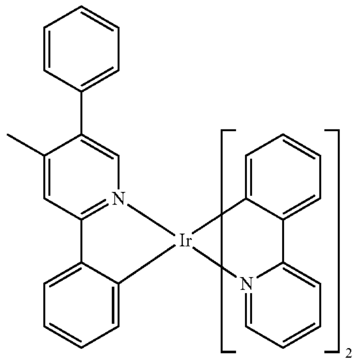

D-4

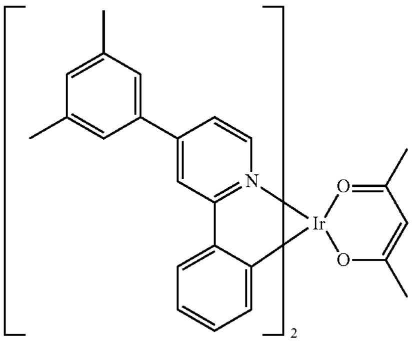

-continued
D-5
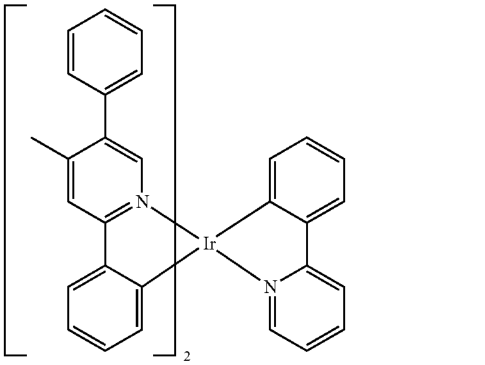
D-6
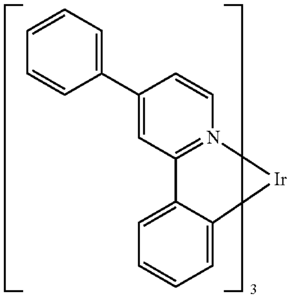
D-7
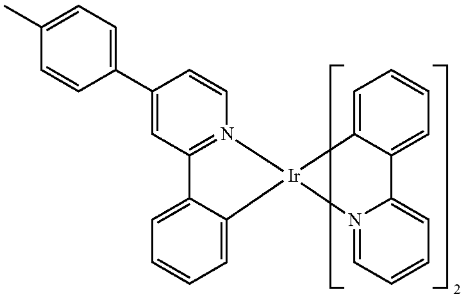
D-8
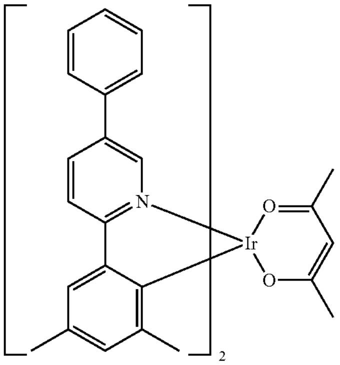
-continued
D-9
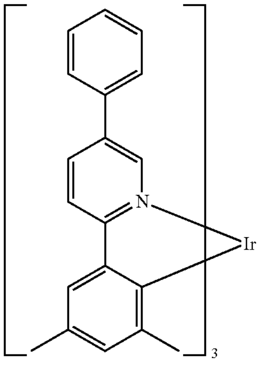
D-10
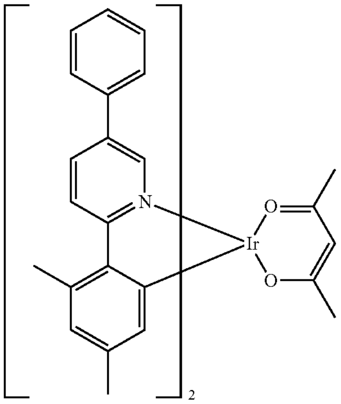
D-11
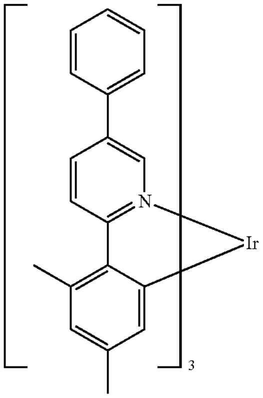
D-12
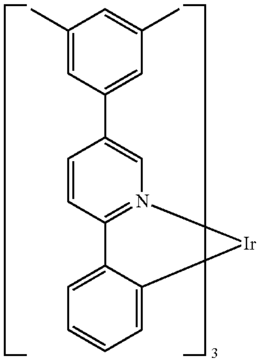

-continued
D-13
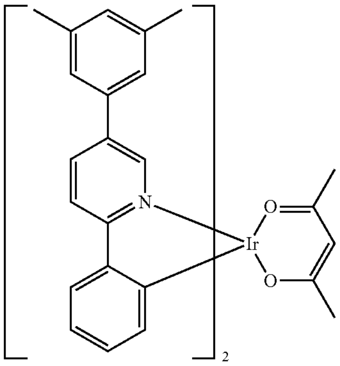
D-14
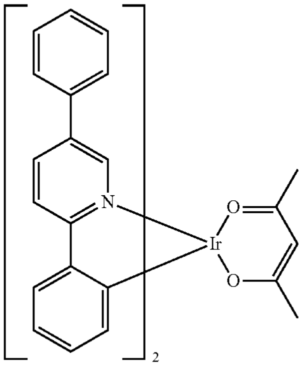
D-15
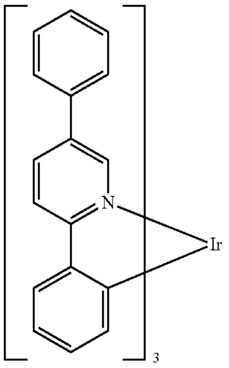
D-16
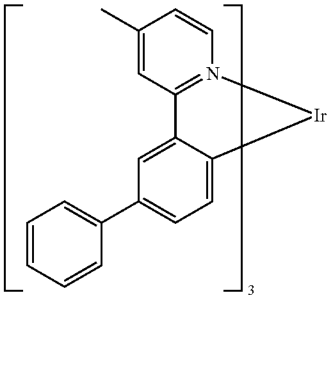
-continued
D-17
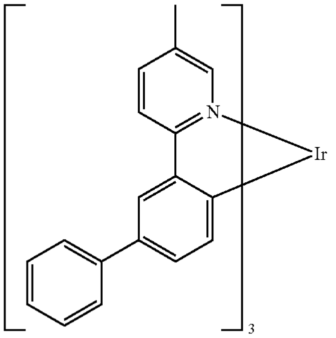
D-18
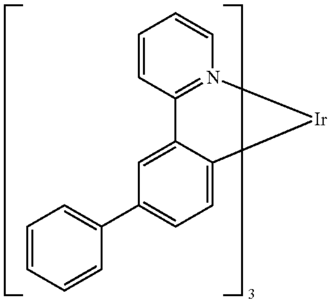
D-19
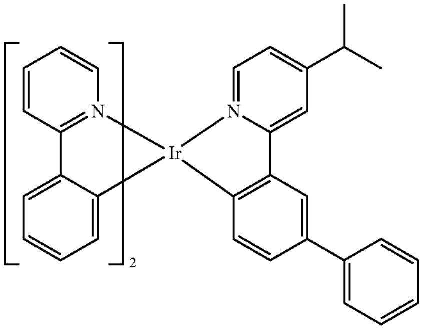
D-20
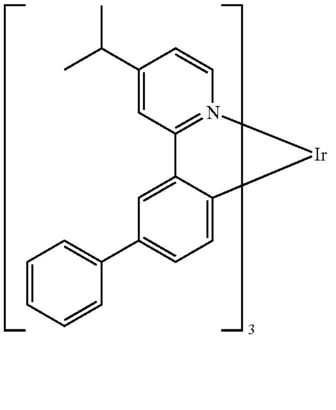

-continued
D-21
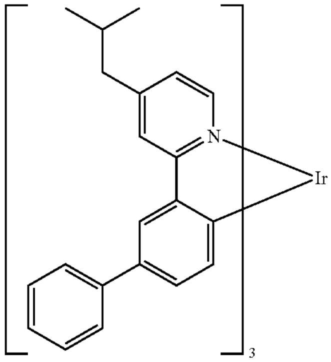
D-22
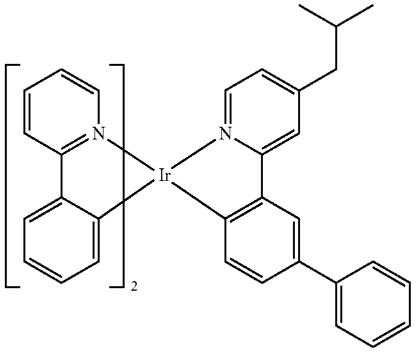
D-23
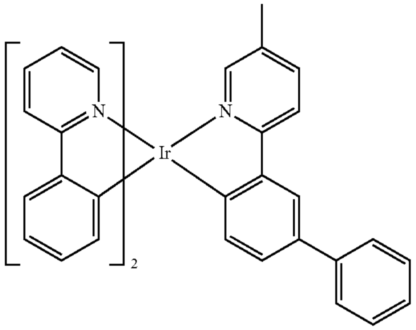
D-24
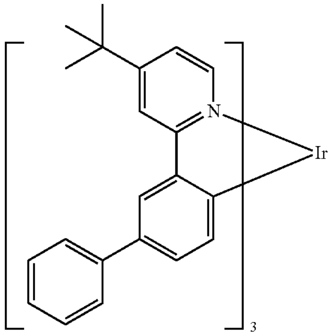
-continued
D-25
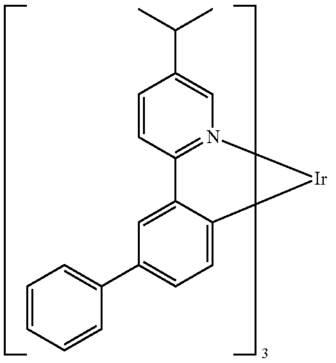
D-26
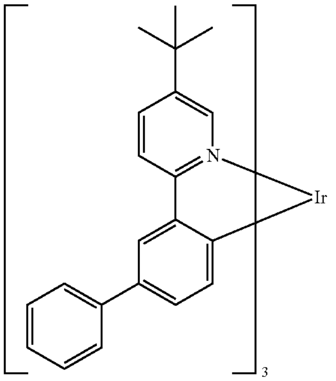
D-27
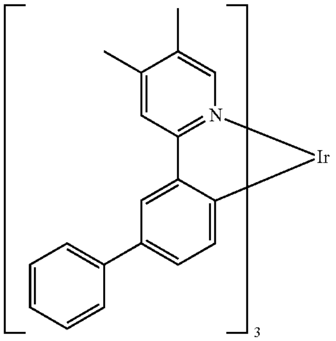
D-28
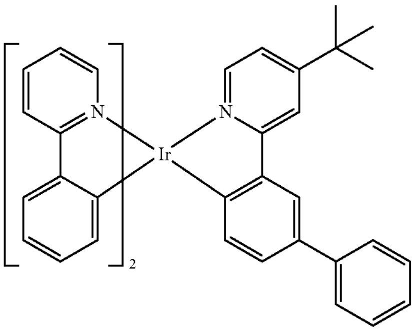

-continued
D-29
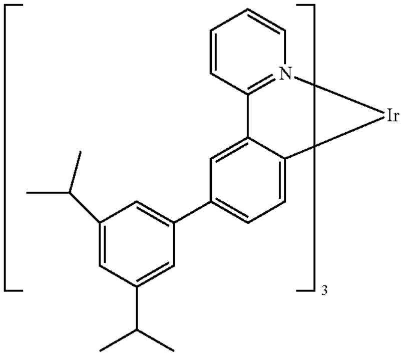
D-30
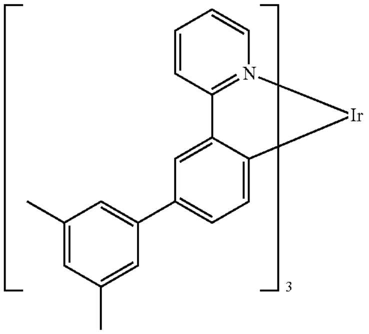
D-31
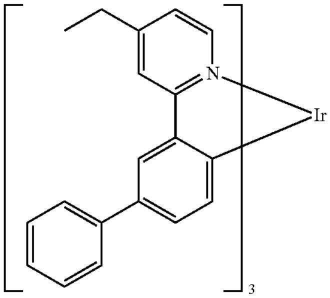
D-32
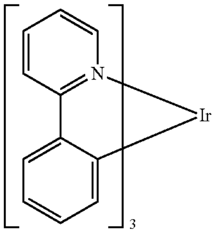
D-33
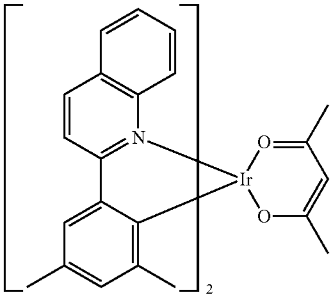
-continued
D-34
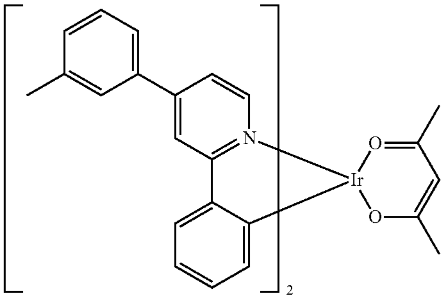
D-35
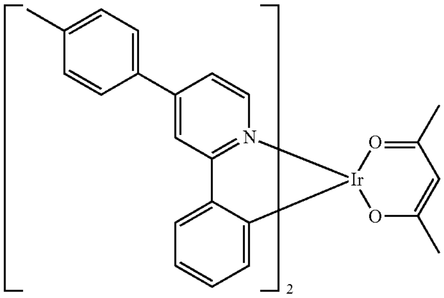
D-36
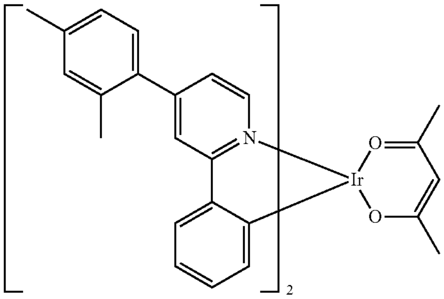
D-37
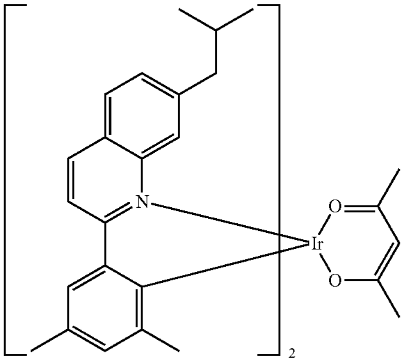
D-38
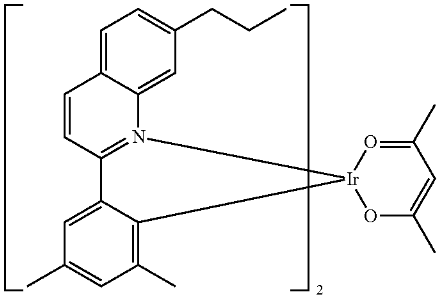

-continued
D-39
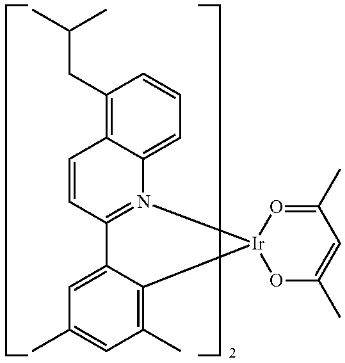
D-40
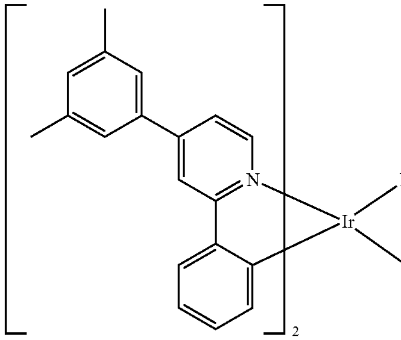
D-41
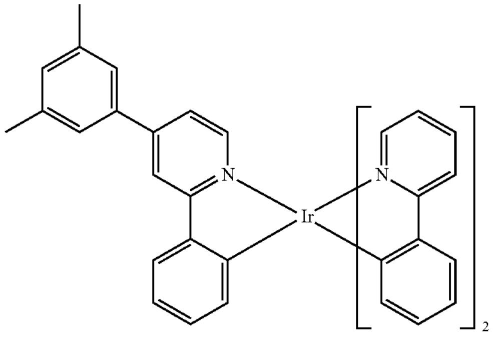
D-42
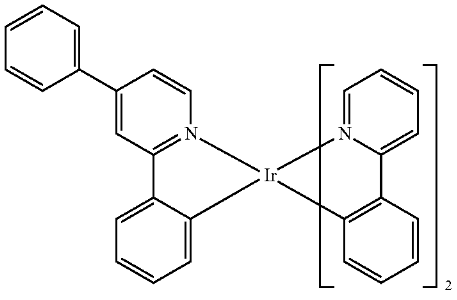
-continued
D-43
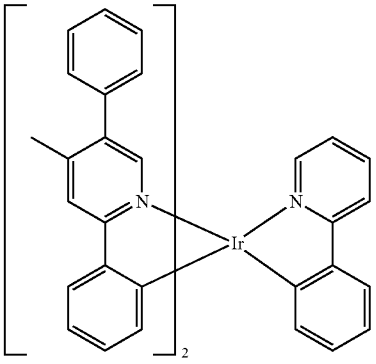
D-44
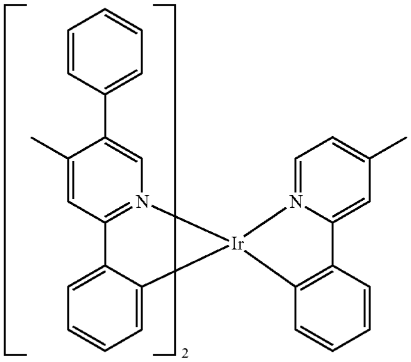
D-45
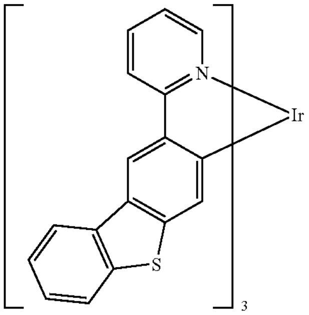
D-46
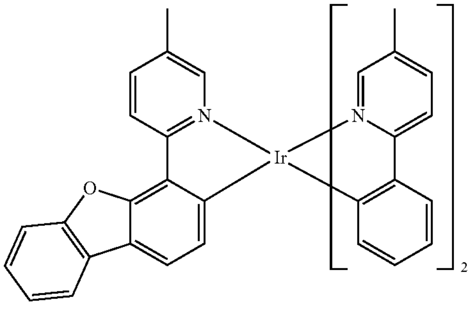

D-47
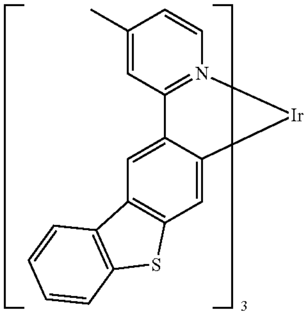
D-48
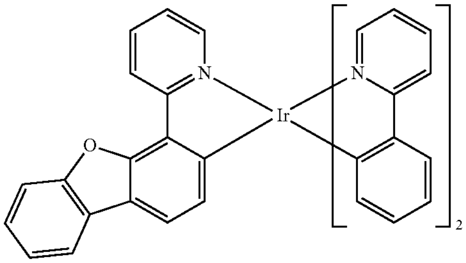
D-49
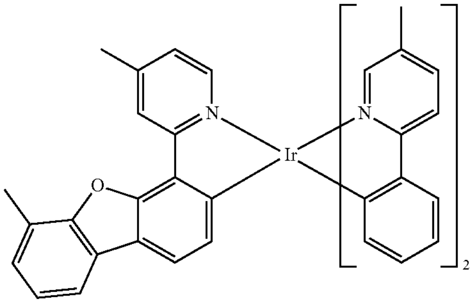
D-50
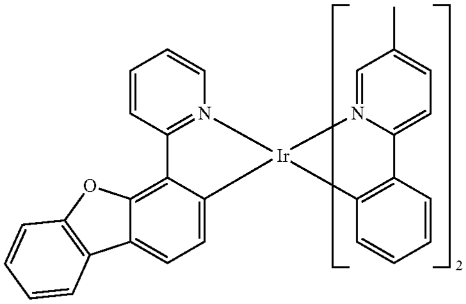
D-51
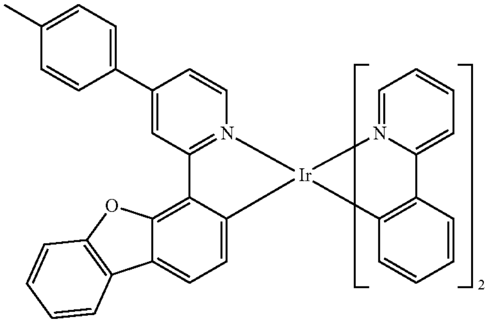
D-52
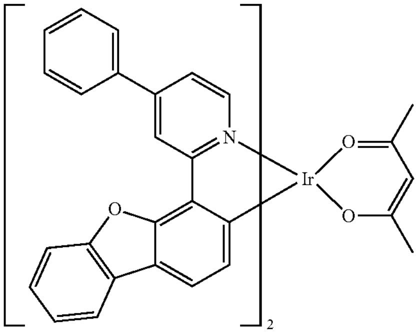
D-53
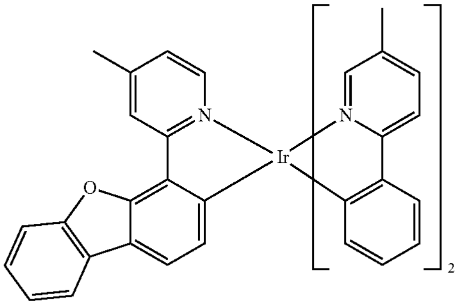
D-54
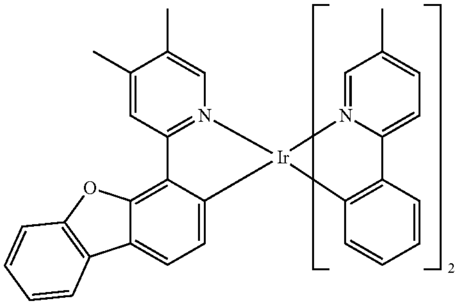
D-55
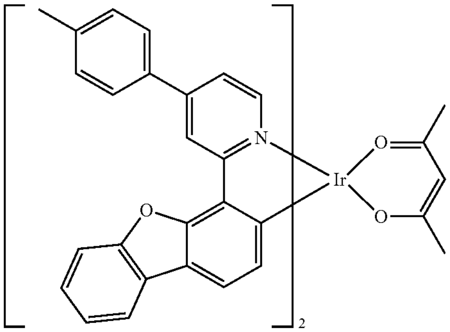
D-56
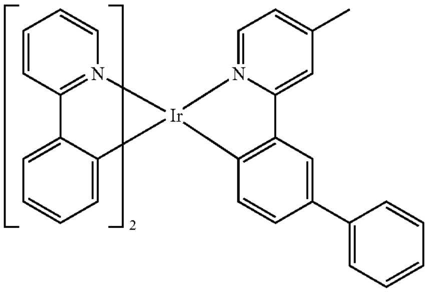

-continued
D-57
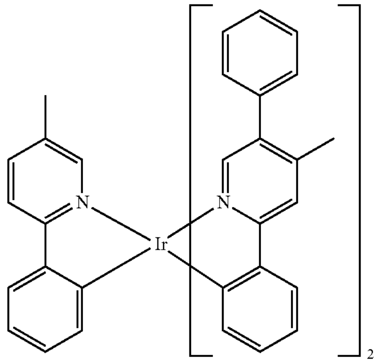
D-58
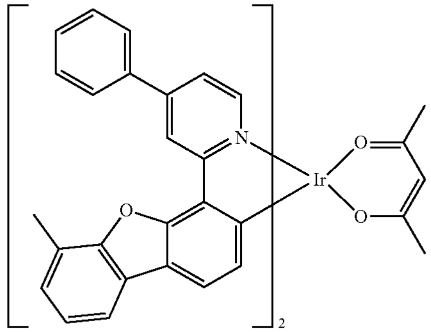
D-59
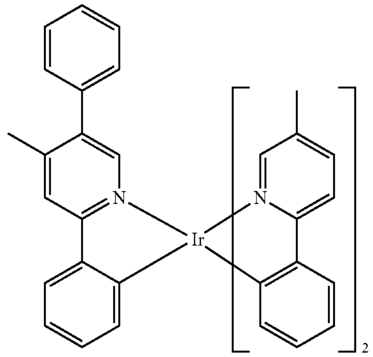
D-60
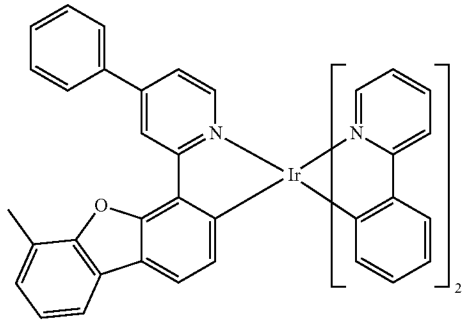
-continued
D-61
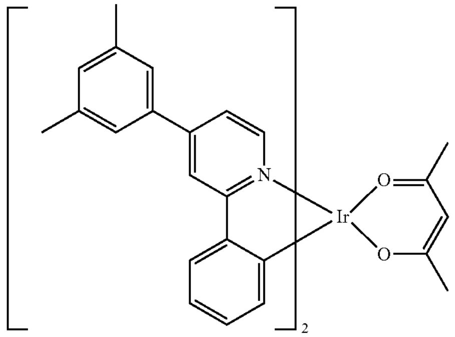
D-62
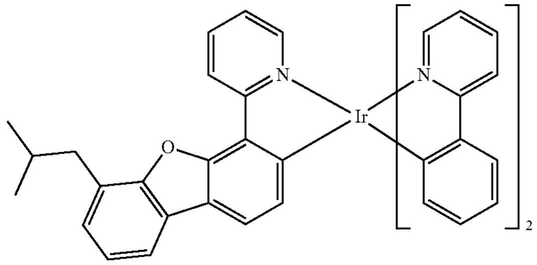
D-63
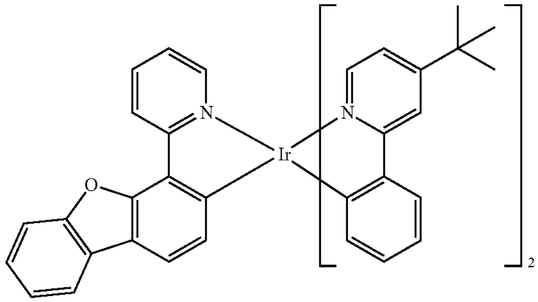
D-64
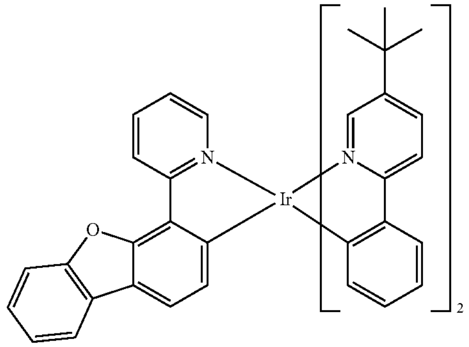

-continued
D-65
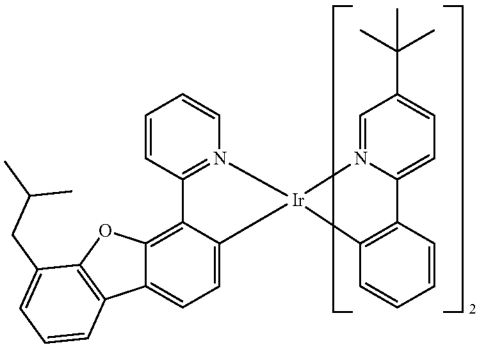
D-66
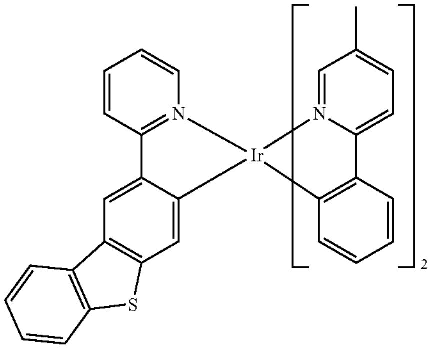
D-67
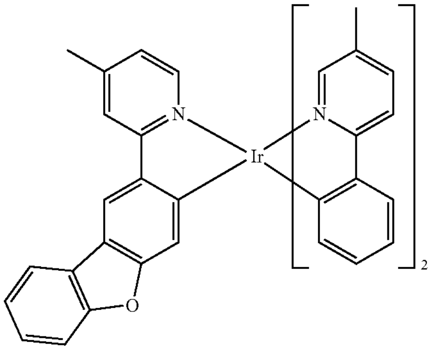
D-68
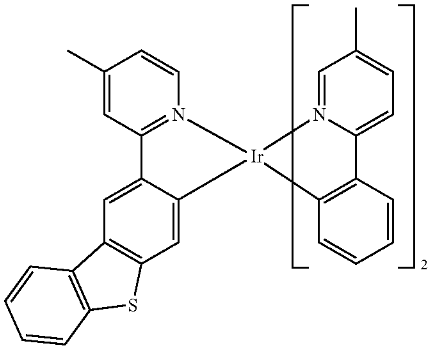
-continued
D-69
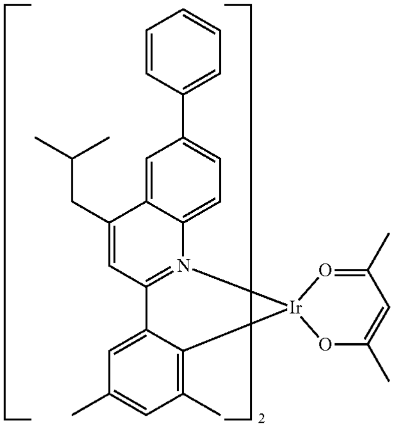
D-70
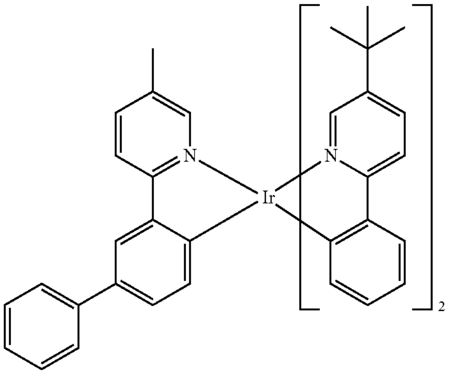
D-71
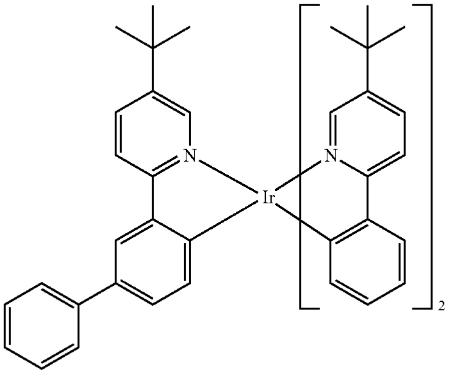
D-72
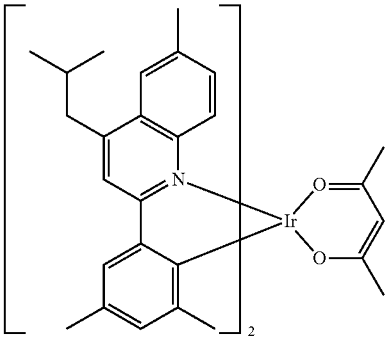

-continued
D-73
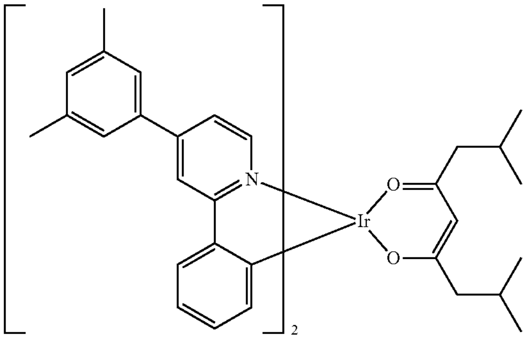
D-74
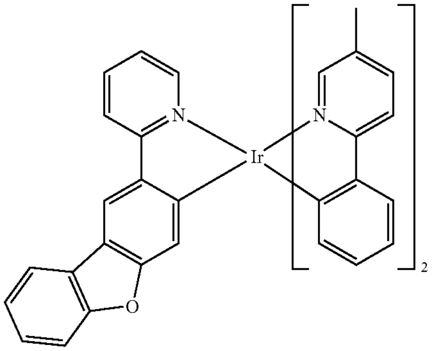
D-75
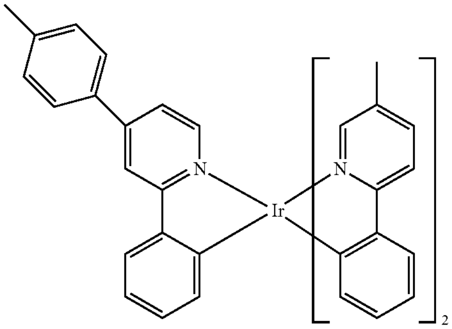
D-76
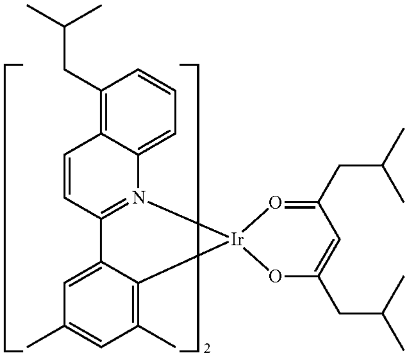
-continued
D-77
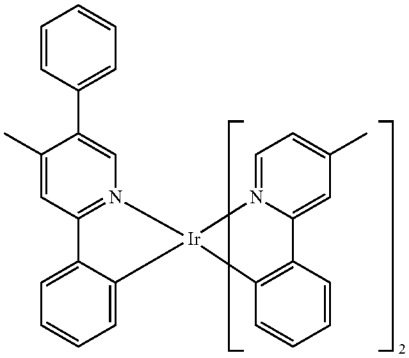
D-78
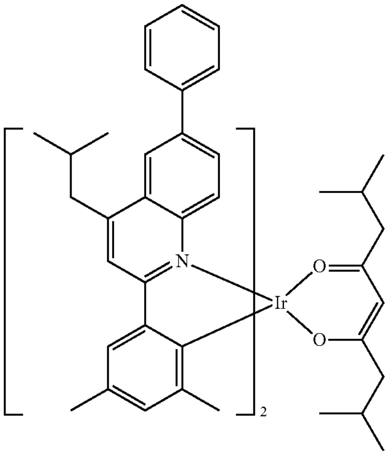
D-79
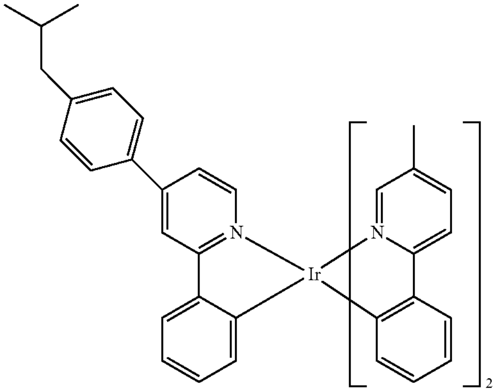
D-80
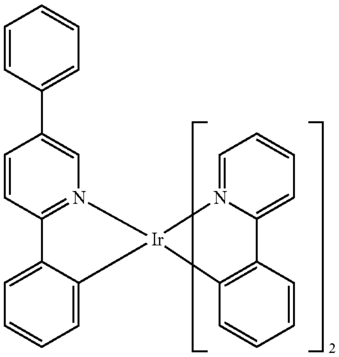

-continued
D-81
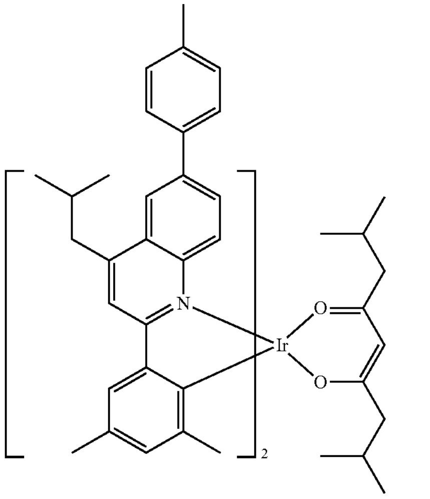
D-82
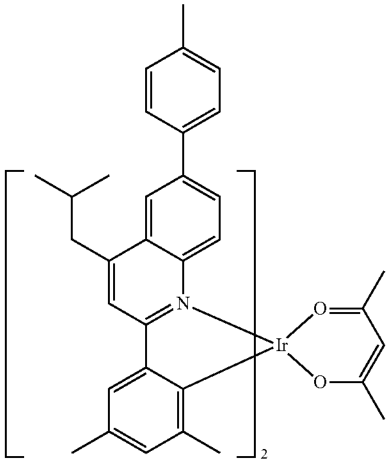
D-83
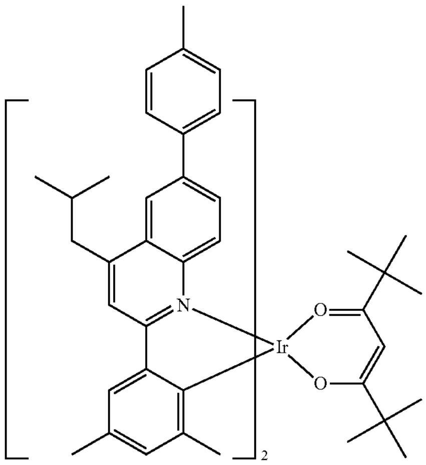
-continued
D-84
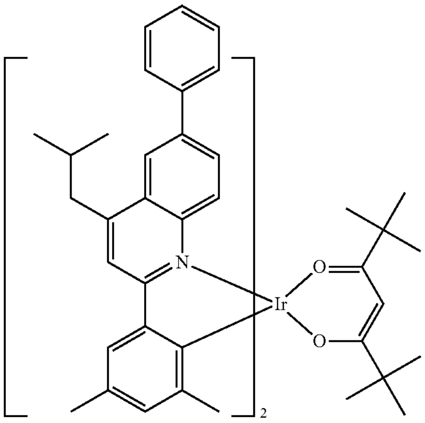
D-85
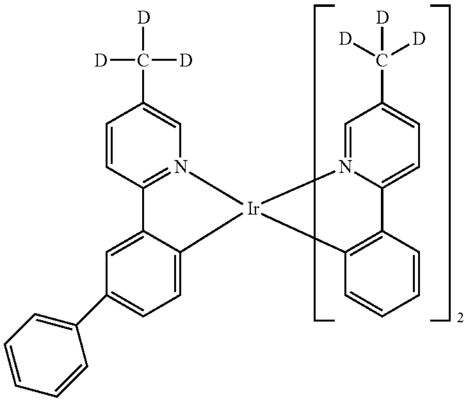
D-86
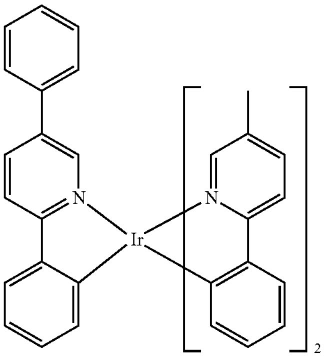
D-87
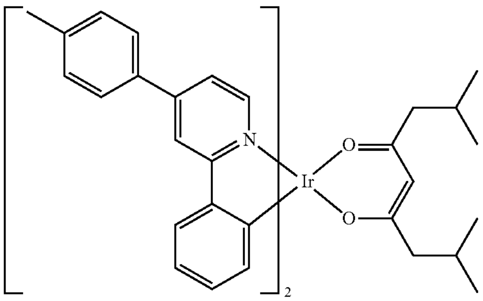

D-88
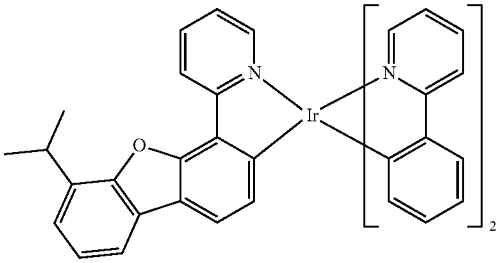
D-89
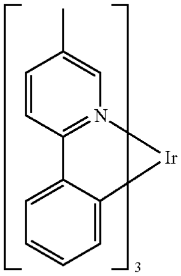
D-90
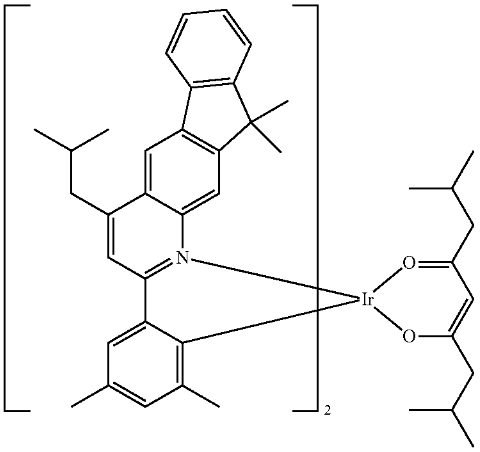
D-91
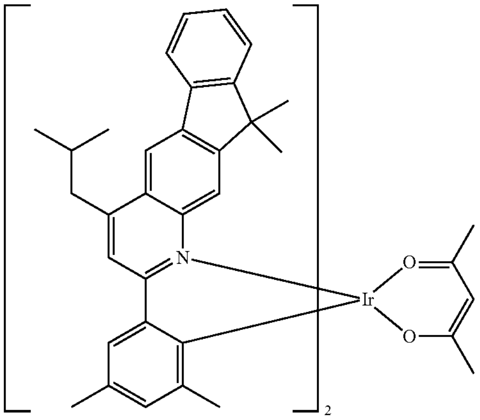
D-92
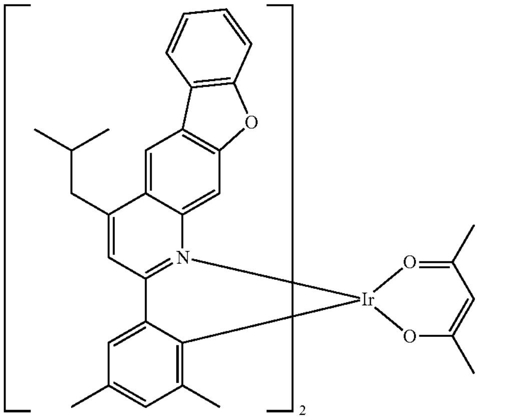
D-93
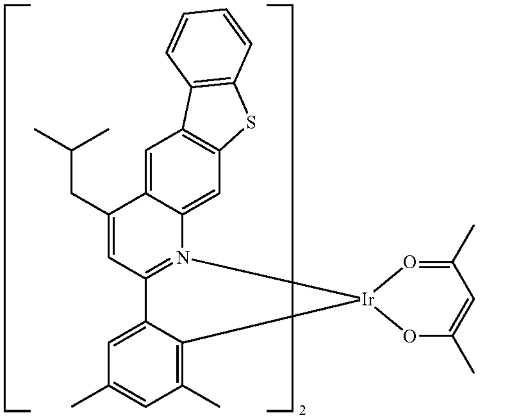
D-94
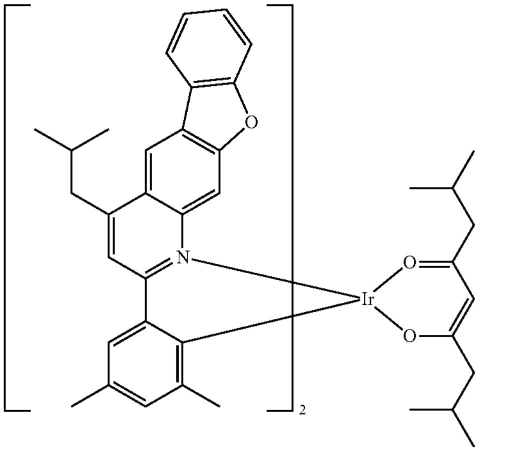

-continued
D-95
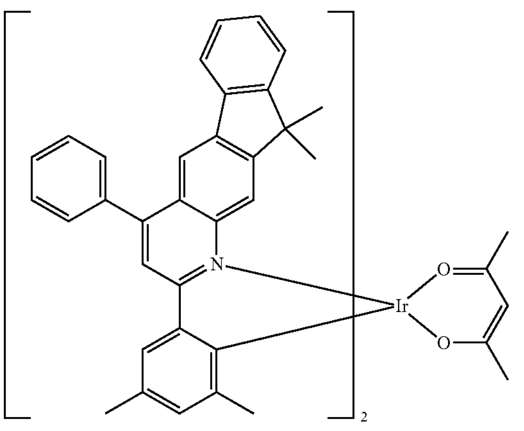
D-96
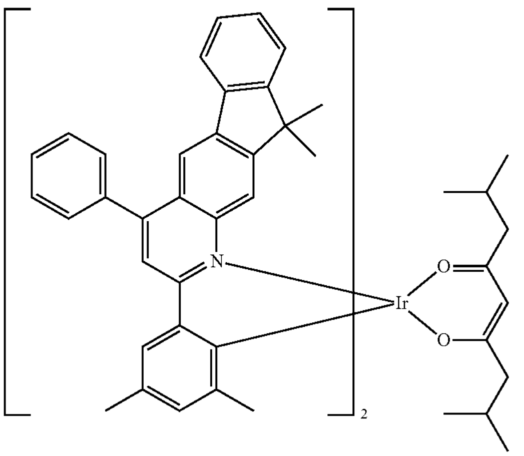
D-97
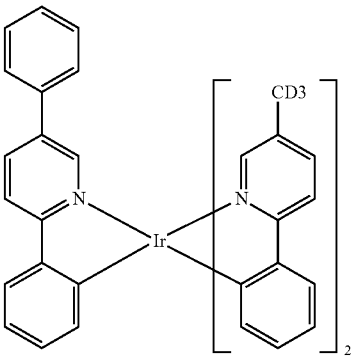
D-98
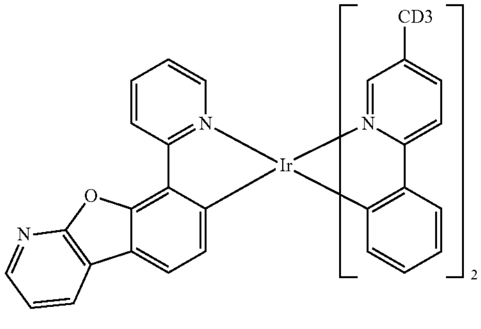
-continued
D-99
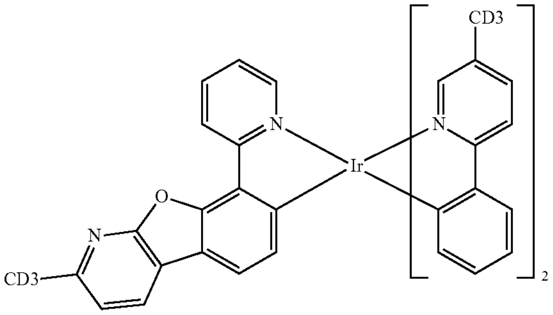
D-100
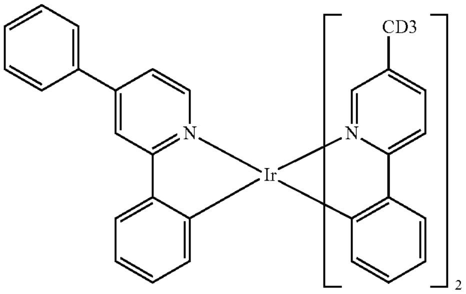
D-101
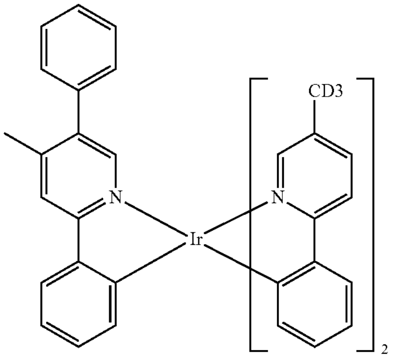
D-102
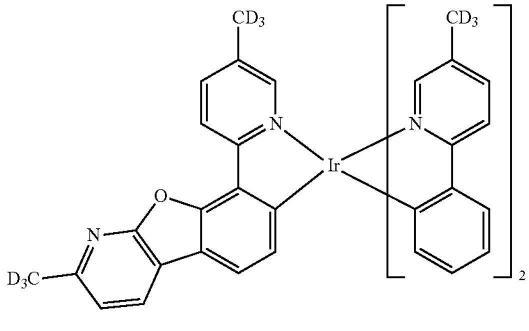

-continued
D-103
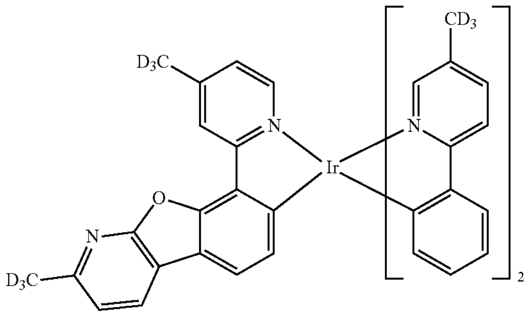
D-104
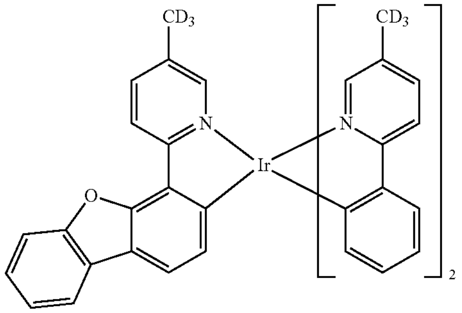
D-105
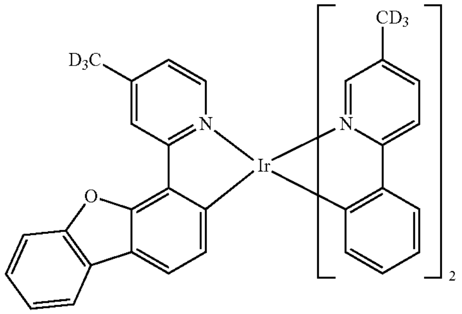
D-106
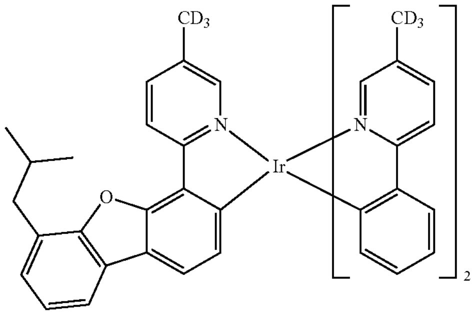
D-107
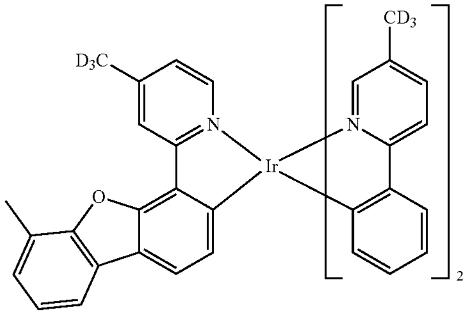
-continued
D-108
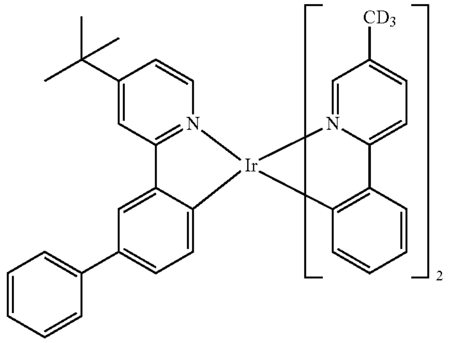
D-109
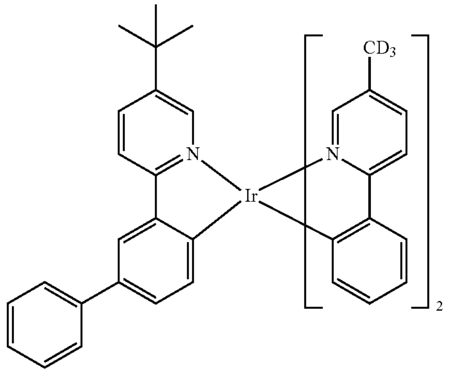
D-110
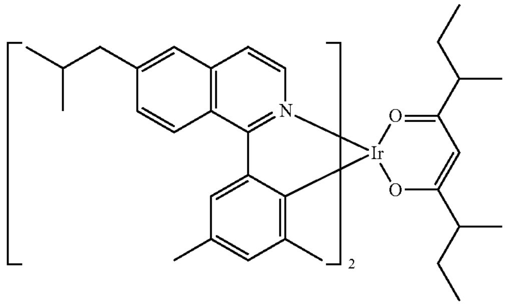
D-111
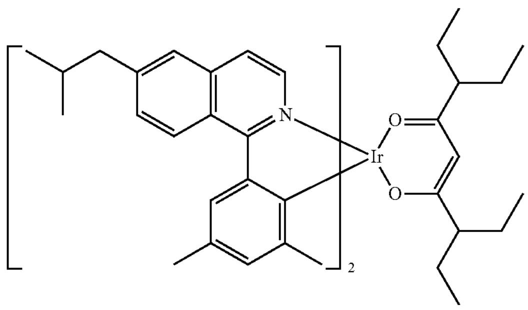

D-112
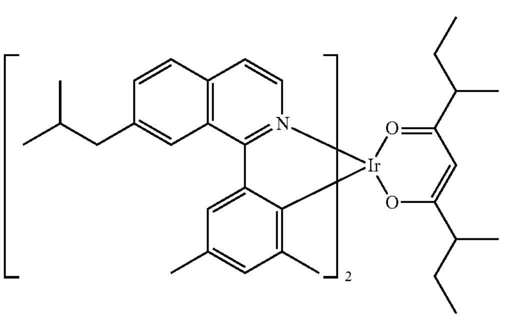
D-113
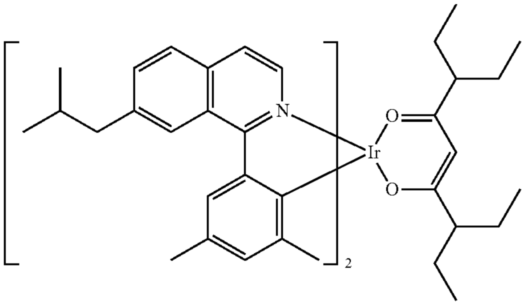
D-114
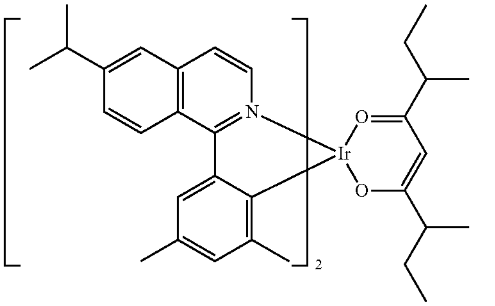
D-115
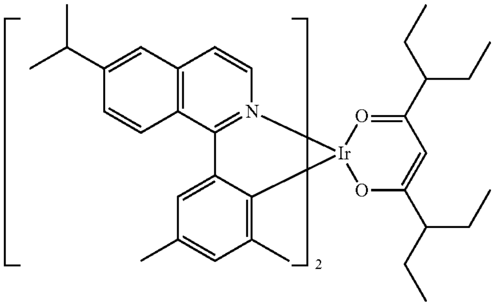
D-116
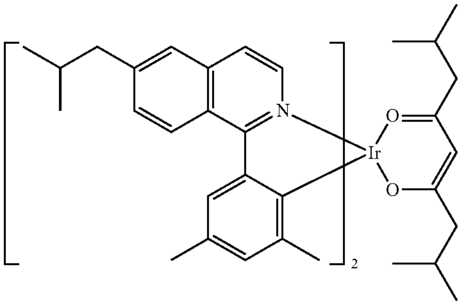
D-117
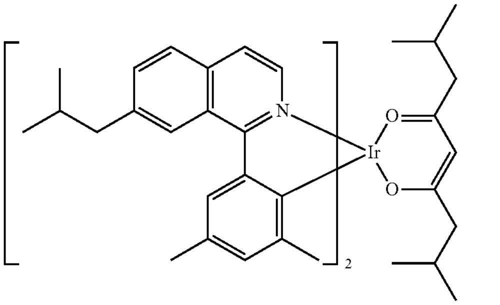
D-118
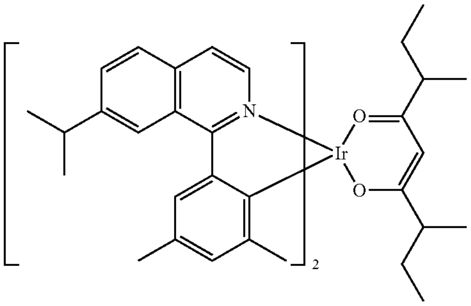
D-119
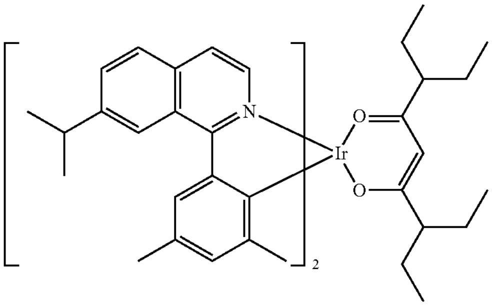
D-120
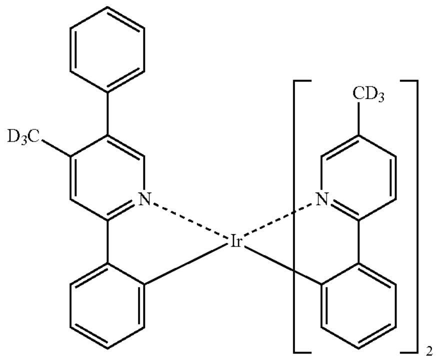

-continued
D-121
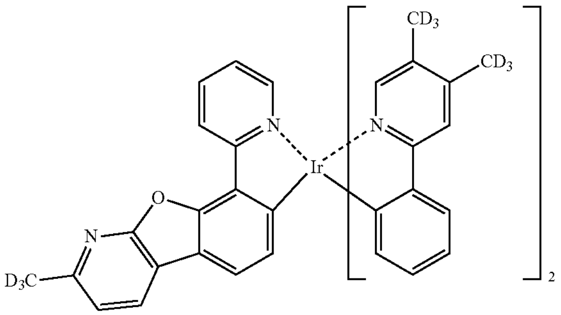
D-122
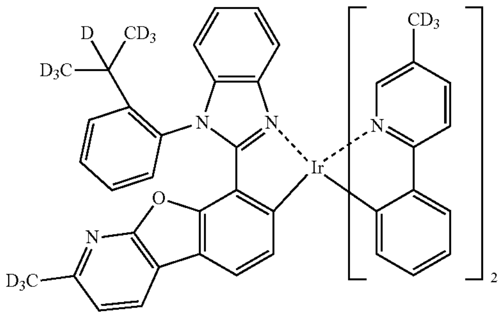
D-123
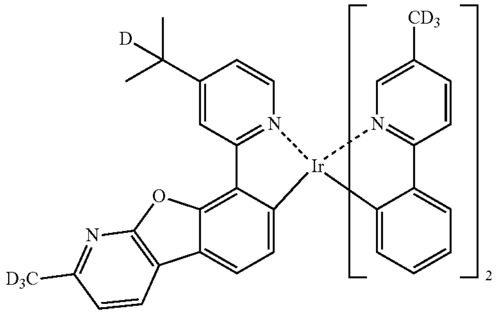
D-124
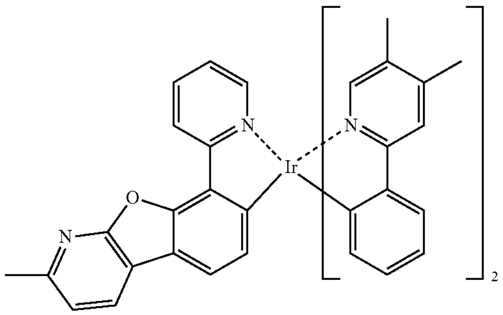
D-125
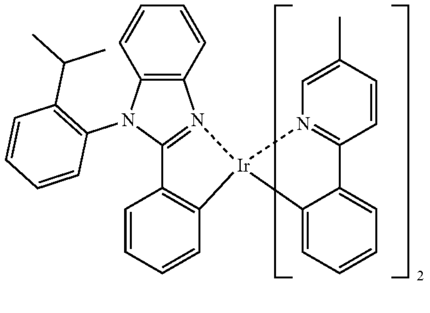
-continued
D-126
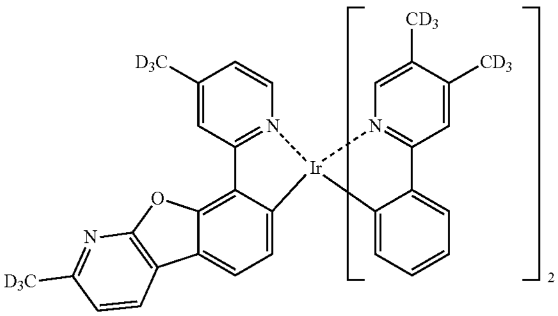
D-127
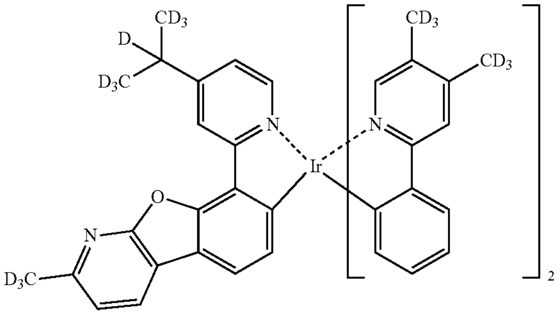
D-128
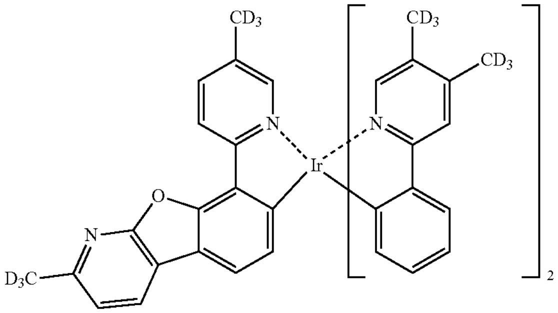
D-129
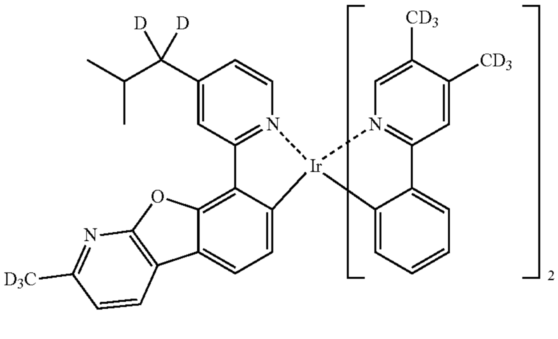

-continued
D-130
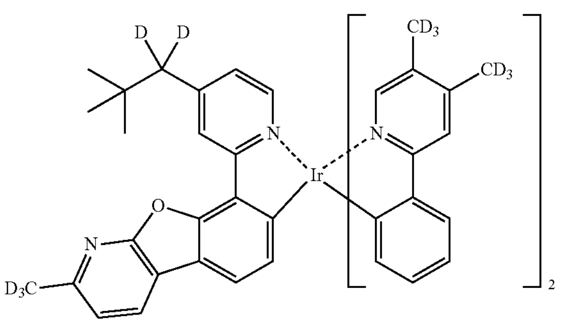
D-131
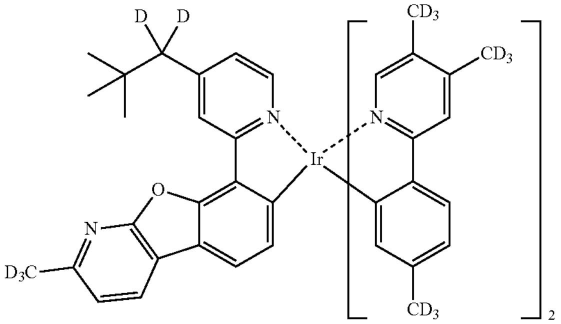
D-132
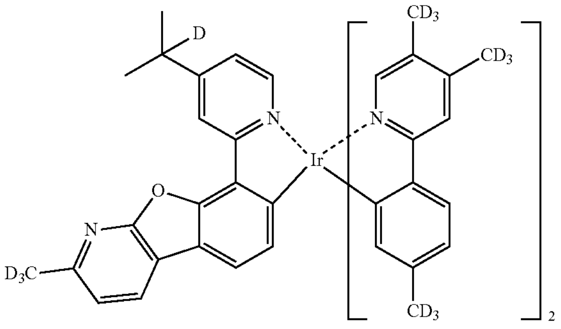
D-133
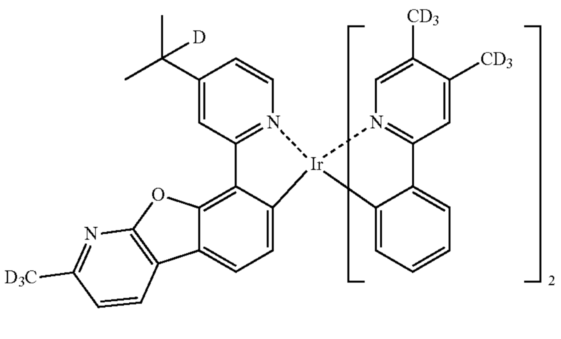
-continued
D-134
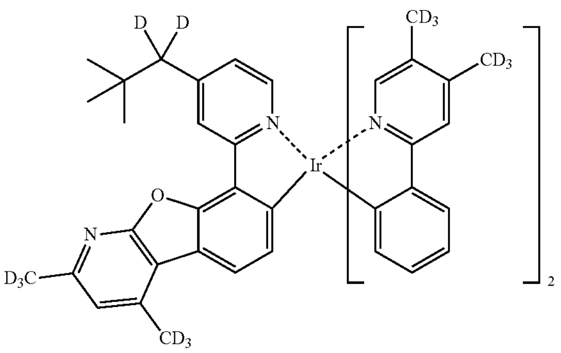
D-135
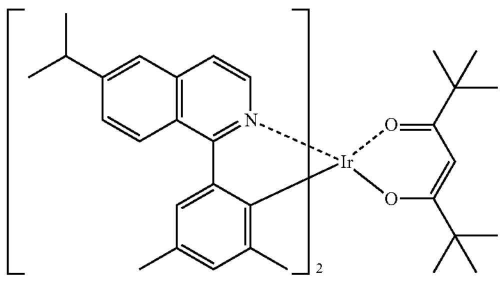
D-136
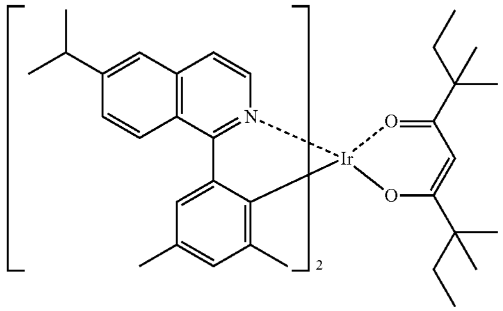
D-137
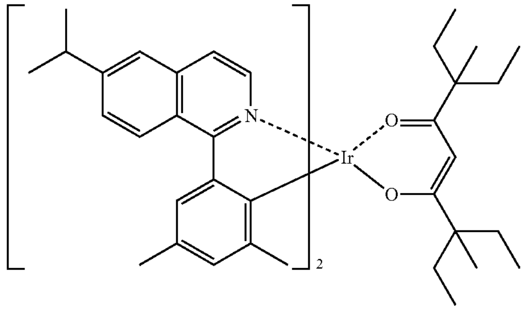

-continued
D-138
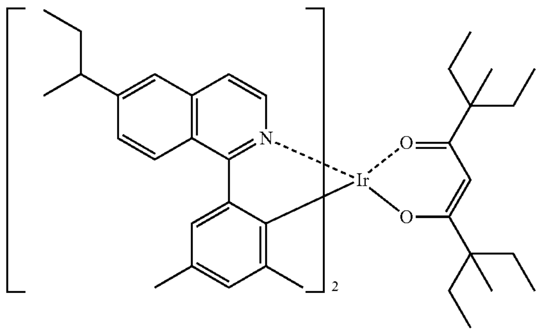
D-139
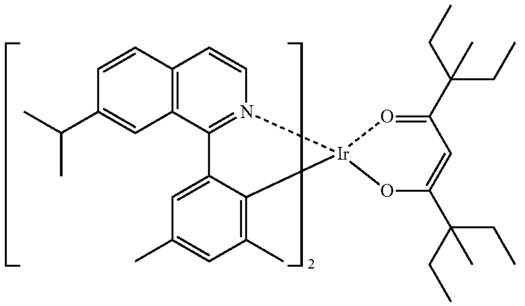
D-140
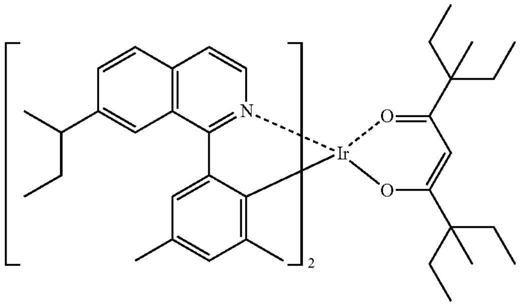
D-141
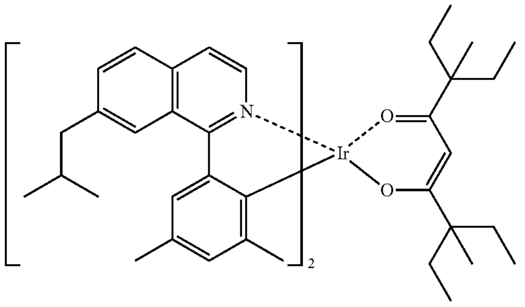
-continued
D-142
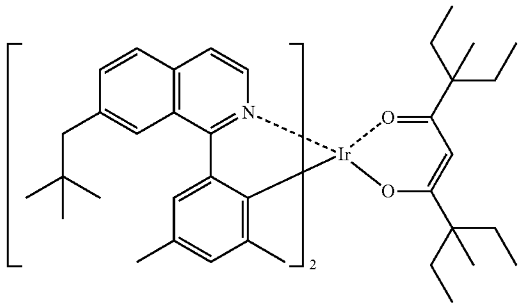
D-143
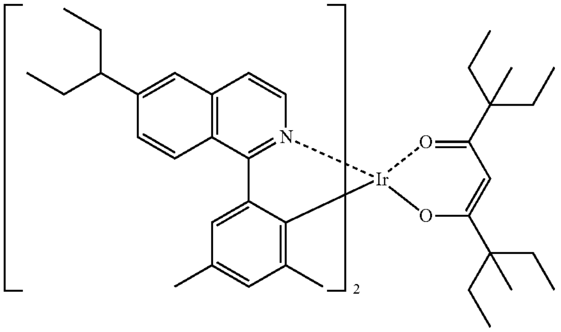
D-144
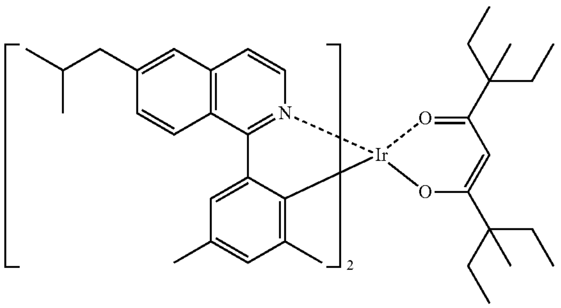
D-145
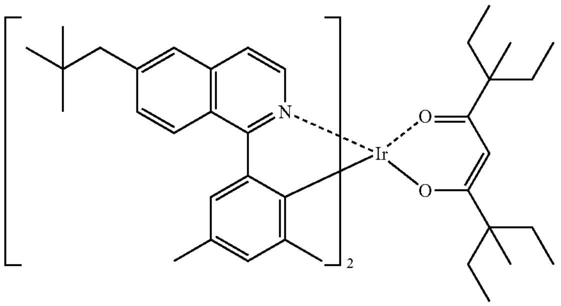

-continued

D-146

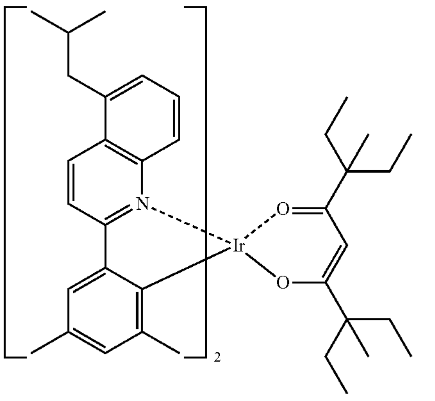

D-147

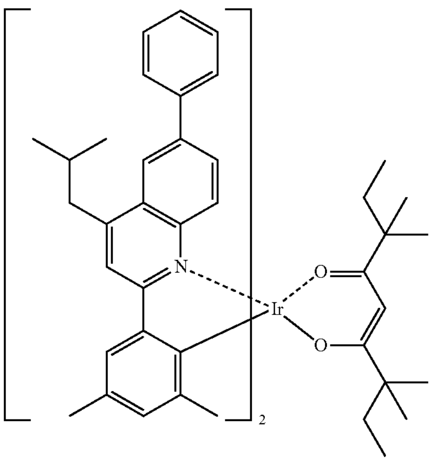

D-148

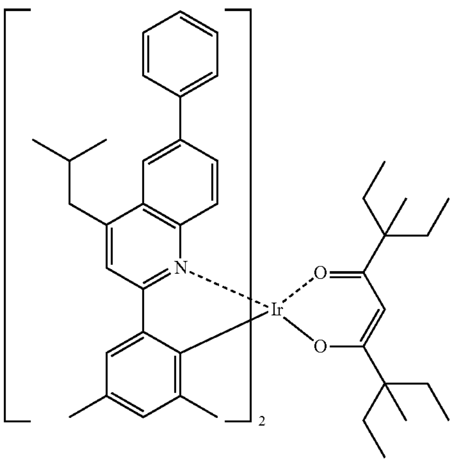

-continued

D-149

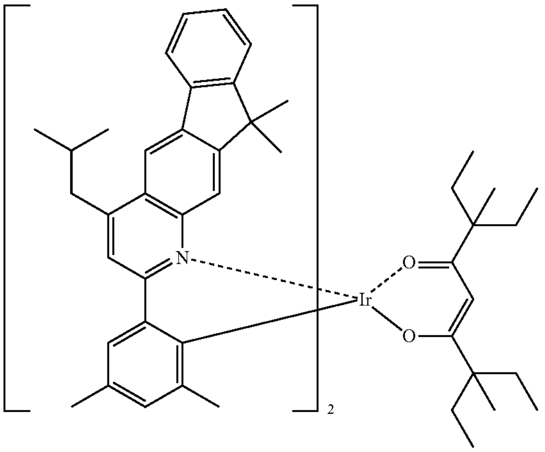

According to one embodiment of the present disclosure, the organic electroluminescent device according to the present disclosure may comprise an anode, a cathode, and at least one light-emitting layer between the anode and cathode, in which at least one layer of the light-emitting layers may comprise the plurality of host materials of the present disclosure and a compound represented by the following formula 3.

(3)

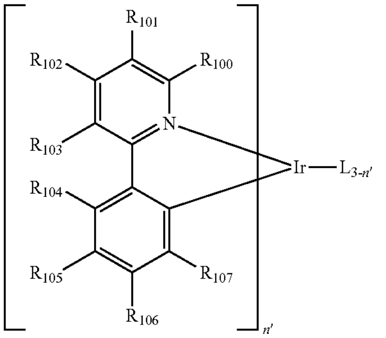

In formula 3, $R_{11}$ to $R_{13}$, each independently, represent a substituted or unsubstituted (C1-C5)alkyl, and $R_{14}$ represents a substituted or unsubstituted (C1-C5)alkyl, or a phenyl unsubstituted or substituted with a (C1-C5)alkyl(s).

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slat coating, spin coating, dip coating, flow coating methods, etc., can be used.

When using a wet film-forming method, a thin film can be formed by dissolving or diffusing materials forming each layer into any suitable solvent such as ethanol, chloroform, tetrahydrofuran, dioxane, etc. The solvent can be any one where the materials forming each layer can be dissolved or diffused, and where there are no problems in film-formation capability.

In addition, the compound represented by formula 1 and the compound represented by formula 2 may be film-formed by the above-listed methods, commonly by a co-evaporation process or a mixture-evaporation process. The co-evaporation is a mixed deposition method in which two or more materials are placed in a respective individual crucible source and a current is applied to both cells at the same time to evaporate the materials. The mixture-evaporation is a mixed deposition method in which two or more materials are mixed in one crucible source before evaporating them, and a current is applied to the cell to evaporate the materials.

The organic electroluminescent material according to the present disclosure may be used as a light-emitting material for a white organic light-emitting device. The white organic light-emitting device has been suggested to have various structures such as a parallel arrangement (side-by-side) method, a stacking method, or color conversion material (CCM) method, etc., according to the arrangement of R (red), G (green) or YG (yellowish green). B (blue) light-emitting units. The present disclosure may also be applied to the white organic light-emitting device. In addition, the organic electroluminescent material according to the present disclosure may also be used in an organic electroluminescent device comprising a quantum dot (QD).

The present disclosure may provide a display system comprising the plurality of host materials of the present disclosure. In addition, by using the organic electroluminescent device of the present disclosure, it is possible to manufacture a display system or a lighting system. Specifically, by using the organic electroluminescent device of the present disclosure, a display system, for example, a display system for smart phones, tablets, notebooks, PCs, TVs, or cars; or a lighting system, for example an outdoor or indoor lighting system, can be produced.

Hereinafter, the preparation method of the compounds according to the present disclosure and the properties thereof will be explained in detail with reference to the representative compounds of the present disclosure. However, the present disclosure is not limited by the following examples.

Example 1: Preparation of Compound C-1

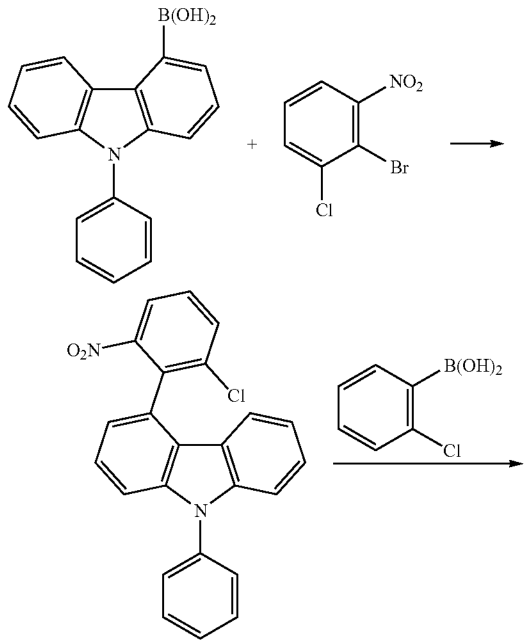

1-1

-continued

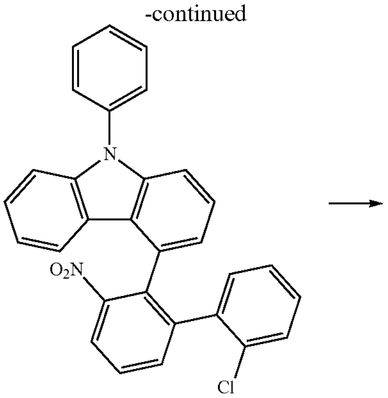

1-2

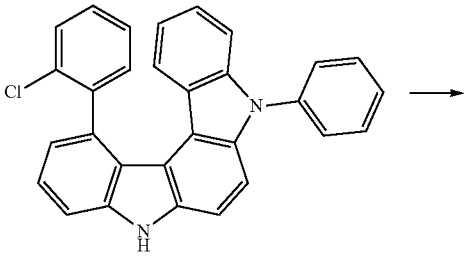

1-3

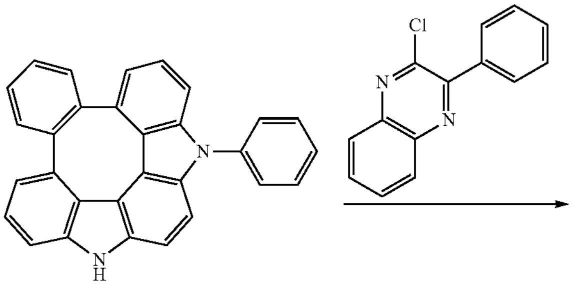

1-4

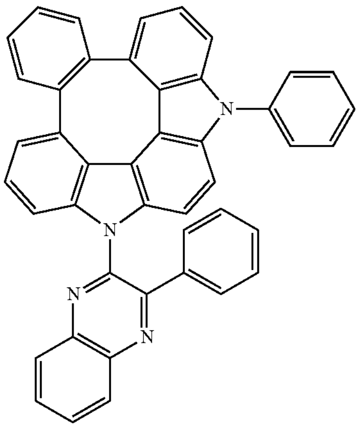

C-1

Synthesis of Compound 1-1

In a flask, (9-phenyl-9H-carbazol-4-yl)boronic acid (96 g, 334.3 mmol), 2-bromo-1-chloro-3-nitrobenzene (71.8 g, 304 mmol), $Pd_2(dba)_3$ (15 g, 16.71 mmol), S-Phos (10.9 g, 26.76 mmol), and $K_3PO_4$ (315 g, 1.64 mol) were dissolved in 1500 mL of toluene, and the mixture was stirred at 130° C. for 4 hours. After completion of the reaction, an organic layer was extracted with ethyl acetate, and the residual moisture was removed using magnesium sulfate. The residue was dried, and separated by column chromatography to obtain compound 1-1 (67 g, yield: 56.6%).

Synthesis of Compound 1-2

In a flask, compound 1-1 (23.5 g, 58.9 mmol), (2-chlorophenyl)boronic acid (18.4 g, 117.8 mmol), $Pd_2(dba)_3$ (2.7 g, 2.95 mmol), S-Phos (2.4 g, 5.89 mmol), and $K_3PO_4$ (63 g, 294.5 mmol) were dissolved in 300 mL of toluene, and the mixture was stirred at 130° C. for 12 hours. After completion of the reaction, an organic layer was extracted with ethyl acetate, and the residual moisture was removed using magnesium sulfate. The residue was dried, and separated by column chromatography to obtain compound 1-2 (14 g, yield: 50%).

Synthesis of Compound 1-3

In a flask, compound 1-2 (13 g, 27.4 mmol), and triphenylphosphine (21.5 g, 82.1 mmol) were dissolved in 140 mL of o-DCB, and the mixture was stirred at 220° C. for 7 hours. After completion of the reaction, the reaction mixture was distilled, and separated by column chromatography to obtain compound 1-3 (4 g, yield: 32%).

Synthesis of Compound 1-4

In a flask, compound 1-3 (10 g, 22.5 mmol), $Pd(OAc)_2$ (505 mg, 2.25 mmol). $PCy_3$-$HBF_4$ (1.63 g, 4.5 mmol), and $Cs_2CO_3$ (22 g, 67.5 mmol) were dissolved in 113 mL of o-xylene, and the mixture was stirred at 160° C. for 4 hours. After completion of the reaction, an organic layer was extracted with ethyl acetate, and the residual moisture was removed using magnesium sulfate. The residue was dried, and separated by column chromatography to obtain compound 1-4 (1 g, yield: 11%).

Synthesis of Compound C-1

In a flask, compound 1-4 (4.5 g, 11.06 mmol), 2-chloro-3-phenylquinoxaline (4 g, 16.6 mmol), 4-dimethylaminopyridine (DMAP) (67 mg, 0.553 mmol), and $Cs_2CO_3$ (10.8 g, 331.8 mmol) were dissolved in 60 mL of dimethylsulfoxide (DMSO), and the mixture was refluxed at 140° C. for 4 hours. After completion of the reaction, an organic layer was extracted with ethyl acetate, and the residual moisture was removed using magnesium sulfate. The residue was dried, and separated by column chromatography to obtain compound C-1 (2.5 g, yield: 37%)

| Compound | MW | M.P. |
|---|---|---|
| C-1 | 610.22 | 246° C. |

Example 2: Preparation of Compound C-29

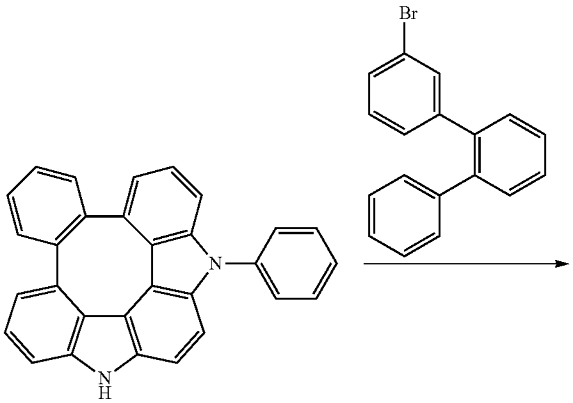

1-4

-continued

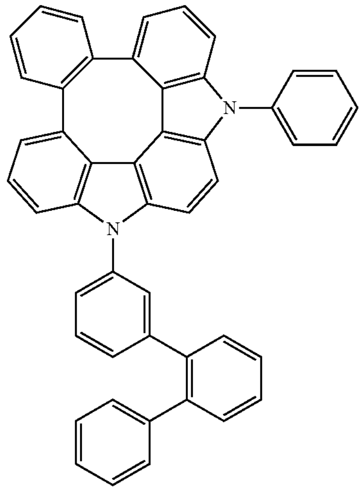

C-29

In a flask, compound 1-4 (4 g, 9.84 mmol), 3-bromo-1,1':2',1"-terphenyl (3.65 g, 11.8 mmol), $Pd_2(dba)_3$ (448 mg, 0.492 mmol), S-Phos (448 mg, 0.984 mmol), and NaOtBu (2.84 g, 29.52 mmol) were dissolved in 50 mL of o-xylene, and the mixture was stirred at 170° C. for 4 hours. After completion of the reaction, an organic layer was extracted with ethyl acetate, and the residual moisture was removed using magnesium sulfate. The residue was dried, and separated by column chromatography to obtain compound C-29 (1.5 g, yield: 24%).

| Compound | MW | M.P. |
|---|---|---|
| C-29 | 643.78 | 282° C. |

Example 3: Preparation of Compound C-196

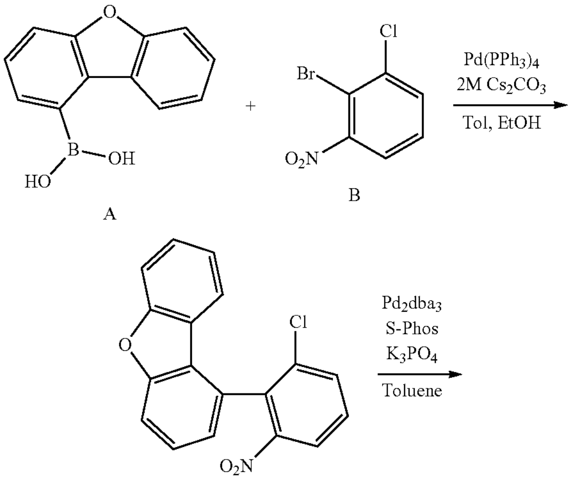

3-1

-continued

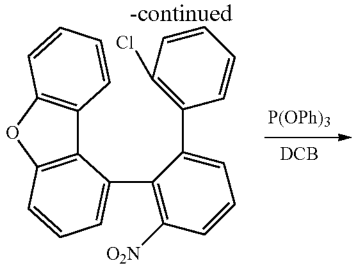

3-2

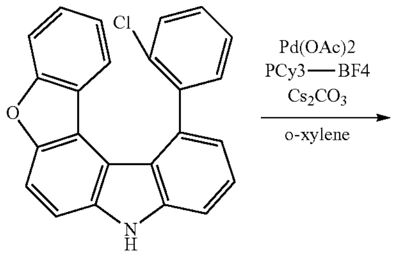

3-3

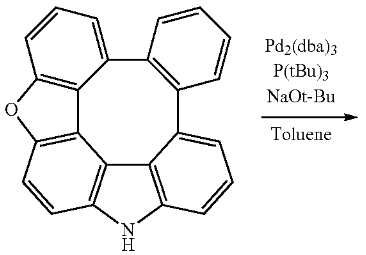

3-4

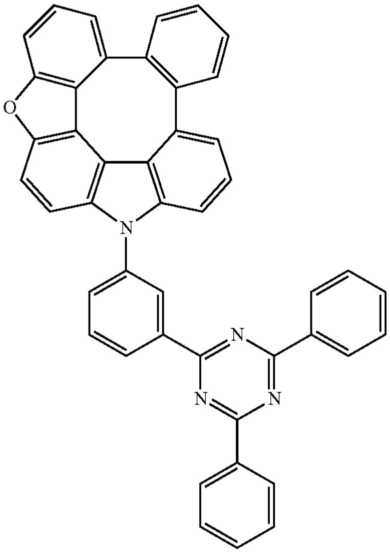

C-196

Synthesis of Compound 3-1

Compound A (60 g, 283 mmol), Compound B (100 g, 424 mmol), tetrakis(triphenylphosphine)palladium (16.3 g, 14.1 mmol), cesium carbonate (276 g, 849 mmol), 1400 mL of toluene, 350 mL of ethanol, and 350 mL of distilled water were added to a reaction vessel, and the mixture was stirred at 130° C. for 12 hours. After completion of the reaction, the reaction mixture was cooled to room temperature, and extracted with ethyl acetate. The extracted organic layer was dried with magnesium sulfate, and then the solvent was removed by a rotary evaporator. The residue was separated by column chromatography to obtain compound 3-1 (38 g, yield: 41%).

Synthesis of Compound 3-2

Compound 3-1 (38 g, 117 mmol), phenylboronic acid (35 g, 234 mmol), tris(dibenzylindeneacetone)dipalladium (5.3 g, 5.86 mmol), S-Phos (4.8 g, 11.7 mmol), tripotassium phosphate (62 g, 293 mmol), and 600 mL of toluene were added to a reaction vessel, and the mixture was stirred under reflux for 2 hours. After completion of the reaction, the reaction mixture was washed with distilled water, and extracted with ethyl acetate. The organic layer was dried with magnesium sulfate, and then the solvent was removed by a rotary evaporator. The residue was separated by column chromatography to obtain compound 3-2 (31 g, yield: 67%).

Synthesis of Compound 3-3

Compound 3-2 (21 g, 53.7 mmol), triphenylphosphite (70 mL, 268 mmol), and 180 mL of dichlorobenzene (DCB) were added to a reaction vessel, and the mixture was stirred at 200° C. for 12 hours. After completion of the reaction, the reaction mixture was distilled under reduced pressure to remove DCB, washed with distilled water, and extracted with ethyl acetate. The organic layer was dried with magnesium sulfate, and then the solvent was removed by a rotary evaporator. The residue was separated by column chromatography to obtain compound 3-3 (10 g, yield: 55%).

Synthesis of Compound 3-4

Compound 3-3 (6.6 g, 17.9 mmol), palladium (11) acetate (0.2 g, 0.89 mmol), $PCy_3$-$BF_4$ (1.3 g, 3.58 mmol), cesium carbonate (17 g, 53.7 mmol), and 90 mL of o-xylene were added to a reaction vessel, and the mixture was stirred under reflux at 160° C. for 4 hours. After completion of the reaction, the reaction mixture was washed with distilled water, and extracted with ethyl acetate. The organic layer was dried with magnesium sulfate, and then the solvent was removed by a rotary evaporator. The residue was separated by column chromatography to obtain compound 3-4 (1.8 g, yield: 32%).

Synthesis of Compound C-196

Compound 3-4 (1.8 g, 5.43 mmol), 2-(3-bromophenyl)-4,6-diphenyl-1,3,5-triazine (2.3 g, 5.97 mmol), tris(dibenzylindeneacetone)dipalladium (0.2 g, 0.27 mmol), tri-tert-butylphosphine (0.3 mL, 0.54 mmol), sodium tert-butoxide (1.3 g, 13.5 mmol), and 30 mL of toluene were added to a reaction vessel, and the mixture was stirred under reflux for 3 hours. After completion of the reaction, the reaction mixture was washed with distilled water, and extracted with ethyl acetate. The organic layer was dried with magnesium sulfate, and then the solvent was removed by a rotary evaporator. The residue was separated by column chromatography to obtain compound C-196 (3.3 g, yield: 95%).

| Compound | MW | UV | PL | M.P. |
|---|---|---|---|---|
| C-196 | 638.21 | 410 nm | 522 nm | 240° C. |

Example 4: Preparation of Compound C-36

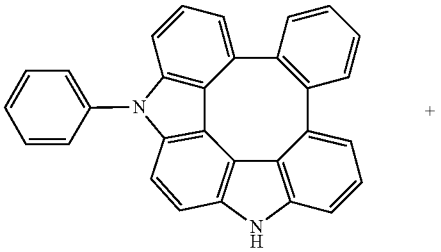

1-4

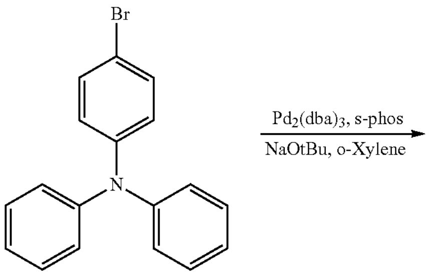

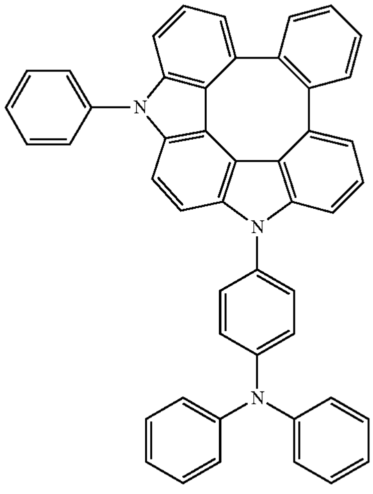

C-36

In a flask, compound 14 (4.0 g, 9.84 mmol), 4-bromo-N, N-diphenylaniline (3.2 g, 9.84 mmol). $Pd_2(dba)_3$ (0.45 g, 0.5 mmol), s-phos (0.4 g, 0.98 mmol), and NaOtBu (1.9 g, 19.7 mmol) were dissolved in 50 mL of o-xylene, and the mixture was stirred under reflux for 5 hours. After completion of the reaction, an organic layer was extracted with ethyl acetate, and separated by column chromatography to obtain compound C-36 (2.67 g, yield: 42%).

| Compound | MW | M.P. |
|---|---|---|
| C-36 | 649.78 | 312° C. |

Example 5: Preparation of Compound C-32

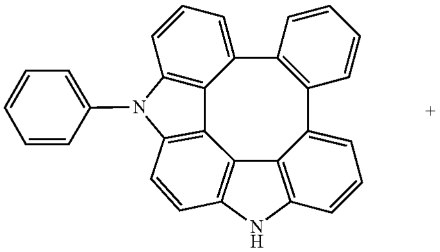

1-4

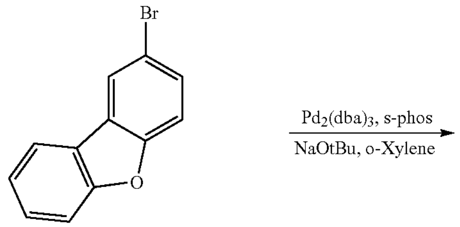

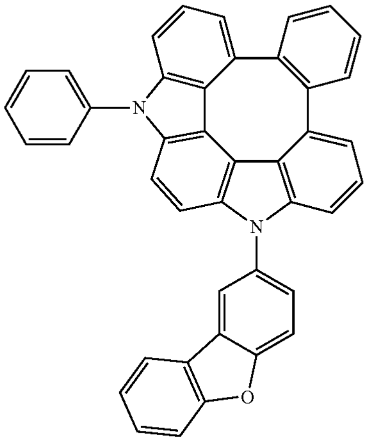

C-32

In a flask, compound 4-1 (4.0 g, 9.84 mmol), 2-bromodibenzo[b,d]furan (1.7 g, 9.84 mmol), $Pd_2(dba)_3$ (0.45 g, 0.5 mmol), s-phos (0.4 g, 0.98 mmol), and NaOtBu (1.9 g, 19.7 mmol) were dissolved in 50 mL of o-xylene, and the mixture was stirred under reflux for 5 hours. After completion of the reaction, an organic layer was extracted with ethyl acetate, and separated by column chromatography to obtain compound C-32 (1.68 g, yield: 30%).

| Compound | MW | M.P. |
|---|---|---|
| C-32 | 572.65 | 291° C. |

Example 6: Preparation of Compound E-112

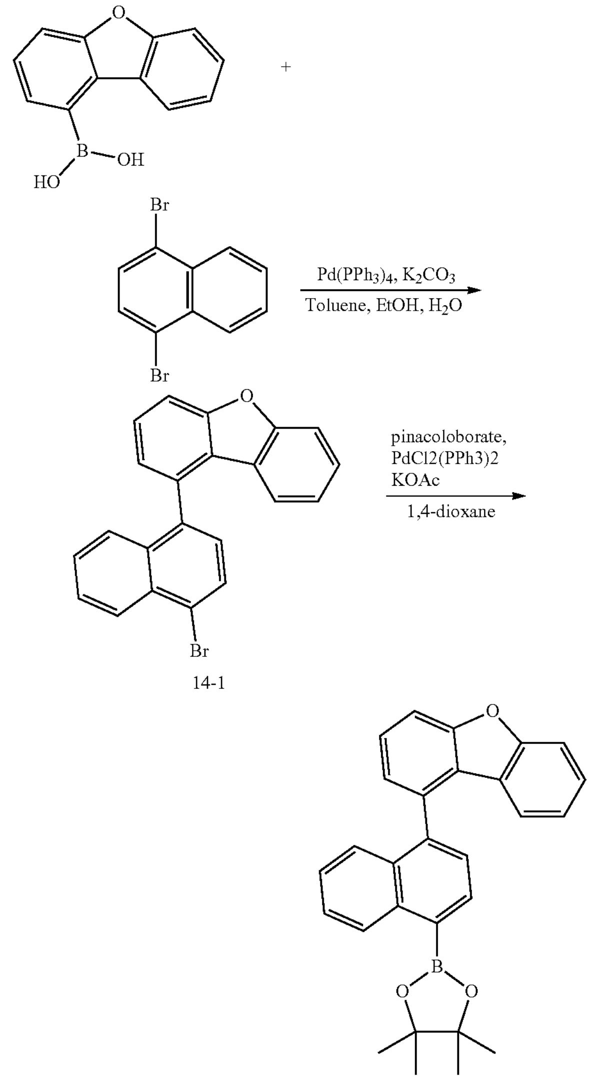

14-1

14-2

Synthesis of Compound 14-1

In a flask, dibenzo[b,d]furan-1-yl boronic acid (20 g, 94.3 mmol), 1,4-dibromonaphthalene (53.9 g, 188.67 mmol), $K_2CO_3$ (32.6 g, 235.75 mmol), and $Pd(PPh_3)_4$ (5.4 g, 4.7 mmol) were dissolved in 470 mL of toluene, 235 mL of ethanol, and 235 mL of water, and the mixture was refluxed at 140° C. for 4 hours. After completion of the reaction, an organic layer was extracted with ethyl acetate, and the residual moisture was removed using magnesium sulfate. The residue was dried, and separated by column chromatography to obtain compound 14-1 (20 g. yield: 56.8%).

Synthesis of Compound 14-2

In a flask, compound 14-1 (20 g, 53.6 mmol), 4,4,4',4',5,5,5',5'-octamethyl-2,2'-bi(1,3,2-dioxaborolene) (16.3 g, 64.3 mmol), $PdCl_2(PPh_3)_2$ (3.76 g, 5.36 mmol), and KOAc (10.5 g, 107.2 mmol) were dissolved in 270 mL of 1,4-dioxane, and the mixture was refluxed at 150° C. for 4 hours. After completion of the reaction, an organic layer was extracted with ethyl acetate, and the residual moisture was removed using magnesium sulfate. The residue was dried, and separated by column chromatography to obtain compound 14-2 (23 g. yield: 100%).

Synthesis of Compound E-112

In a flask, compound 14-2 (7 g, 16.6 mmol), 2-chloro-4,6-di(naphthalen-2-yl)-1,3,5-triazine (7.35 g, 19.9 mmol). $Cs_2CO_3$ (13.5 g, 41.5 mmol) and $Pd(PPh_3)_4$ (959 mg, 0.83 mmol) were dissolved in 83 mL of toluene, and the mixture was refluxed at 130° C. for 18 hours. After completion of the reaction, an organic layer was extracted with ethyl acetate, and the residual moisture was removed using magnesium sulfate. The residue was dried, and separated by column chromatography to obtain compound E-112 (2 g, yield: 19.2%).

Example 7: Preparation of Compound E-117

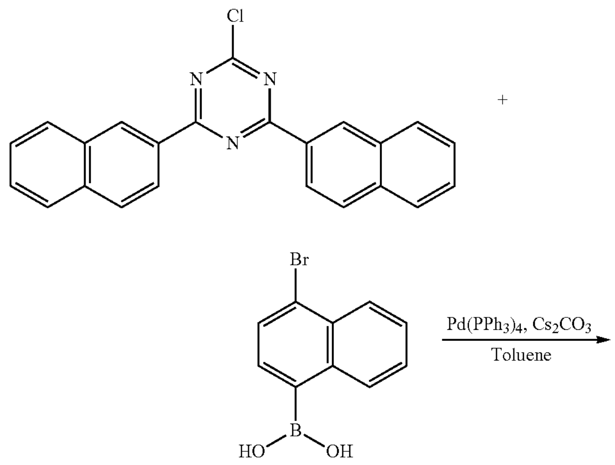

-continued

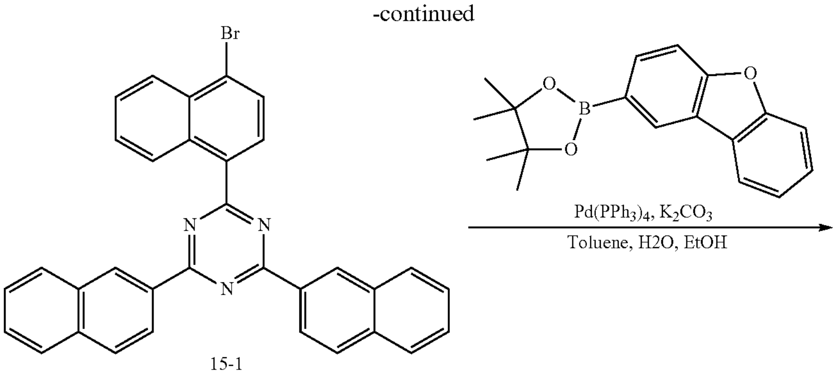

15-1

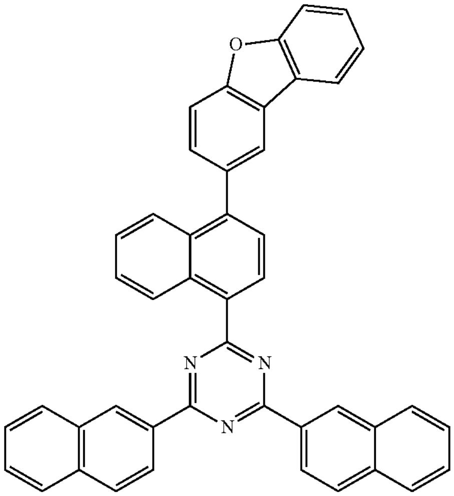

E-117

Synthesis of Compound 15-1

In a flask, 2-chloro-4,6-di(naphthalen-2-yl)-1,3,5-triazine (32.2 g, 87.7 mmol), (4-bromonaphthalen-1-yl) boronic acid (20 g, 79.7 mmol), $Cs_2CO_3$ (65 g, 199.25 mmol), and $Pd(PPh_3)_4$ (4.6 g, 3.985 mmol) were dissolved in 400 mL of toluene, and the mixture was refluxed at 140° C. for 4 hours. After completion of the reaction, an organic layer was extracted with ethyl acetate, and the residual moisture was removed using magnesium sulfate. The residue was dried, and separated by column chromatography to obtain compound 15-1 (20 g. yield: 46.6%).

Synthesis of Compound E-117

In a flask, compound 15-1 (7 g, 13 mmol), 2-(dibenzo[b, d]furan-2-yl)-4,4,5,5-tetramethyl-1,3,2-dioxaborolane (4.6 g, 15.6 mmol), $K_2CO_3$ (4.5 g, 32.5 mmol), and $Pd(PPh_3)_4$ (0.75 g, 0.65 mmol) were dissolved in 65 mL of toluene, 32.5 mL of ethanol, and 32.5 mL of $H_2O$, and the mixture was refluxed at 130° C. for 3 hours. After completion of the reaction, an organic layer was extracted with ethyl acetate, and the residual moisture was removed using magnesium sulfate. The residue was dried, and separated by column chromatography to obtain compound E-117 (3.4 g, yield: 41%).

Example 8: Preparation of Compound E-129

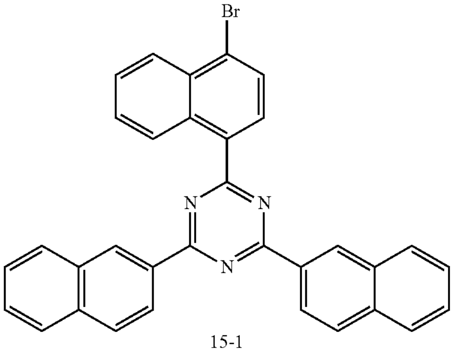

15-1

+

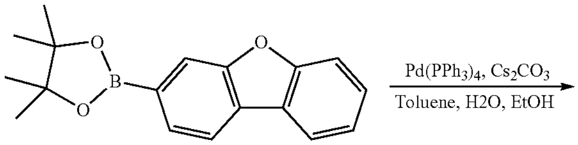

-continued

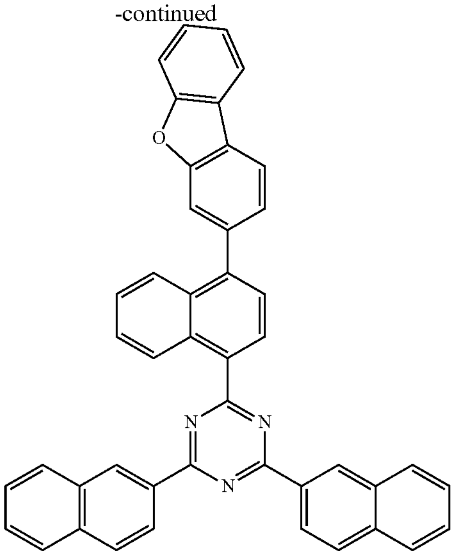

E-129

In a flask, compound 15-1 (4.4 g, 12.3 mmol), 2-(dibenzo[b,d]furan-3-yl)-4,4,5,5-tetramethyl-1,3,2-dioxaborolane (5 g, 13.5 mmol), $Cs_2CO_3$ (4.5 g, 32.5 mmol), and $Pd(PPh_3)_4$ (0.75 g, 0.65 mmol) were dissolved in 60 mL of toluene, 30 mL of ethanol, and 30 mL of $H_2O$, and the mixture was refluxed at 130° C. for 3 hours. After completion of the reaction, an organic layer was extracted with ethyl acetate, and the residual moisture was removed using magnesium sulfate. The residue was dried, and separated by column chromatography to obtain compound E-129 (4 g, yield: 49%).

Example 9: Preparation of Compound E-111

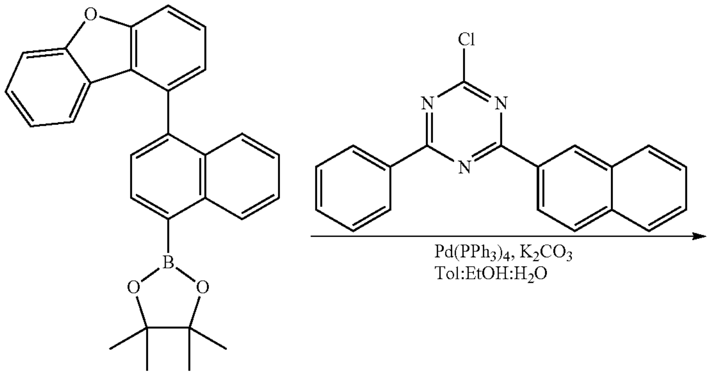

14-2

-continued

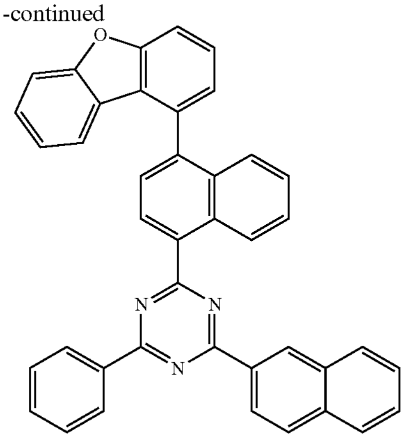

E-111

In a flask, 64 mL of toluene, 16 mL of EtOH, and 16 mL of distilled water were added to compound 14-2 (6 g, 14.16 mmol), 2-chloro-4-(naphthalen-2-yl)-6-phenyl-1,3,5-triazine (5 g, 15.73 mmol), $Pd(PPh_3)_4$ (0.9 g, 0.786 mmol), and $K_2CO_3$ (4.3 g, 31.47 mmol), and the mixture was stirred under reflux for 2 hours. After completion of the reaction, the reaction mixture was cooled to room temperature, and extracted with distilled water and ethyl acetate (EA). The organic layer was distilled under reduced pressure, and separated by column chromatography with MC/Hex to obtain compound E-111 (4 g, yield: 44%).

$^1$H NMR (DMSO-$d_6$) δ: 9.42 (d, J=1.3 Hz, 1H), 9.29-9.24 (m, 1H), 8.83 (td, J=8.6, 1.5 Hz, 3H), 8.72 (d, J=7.3 Hz, 1H), 8.30 (d, J=8.0 Hz, 1H), 8.22 (d, J=8.7 Hz, 1H), 8.12-8.07 (m, 1H), 7.92 (dd, J=8.3, 0.8 Hz, 1H), 7.89 (d, J=7.3 Hz, 1H), 7.81-7.72 (m, 6H), 7.72-7.65 (m, 2H), 7.65-7.60 (m, 1H), 7.54-7.41 (m, 3H), 7.04 (ddd, J=8.1, 7.3, 0.9 Hz, 1H), 6.53 (dt, J=8.0, 0.9 Hz, 1H)

| Compound | MW | M.P. |
|---|---|---|
| E-111 | 575.6 | 131.3° C. |

Example 10: Preparation of Compound E-90

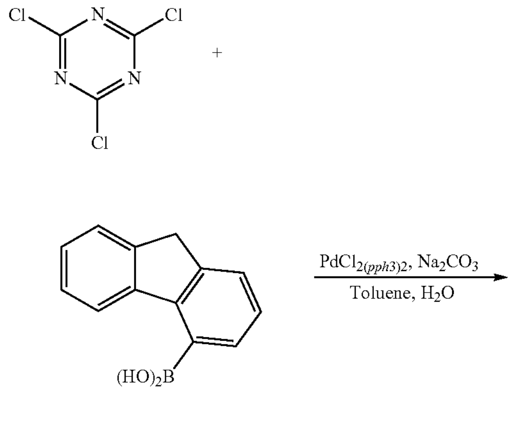

-continued

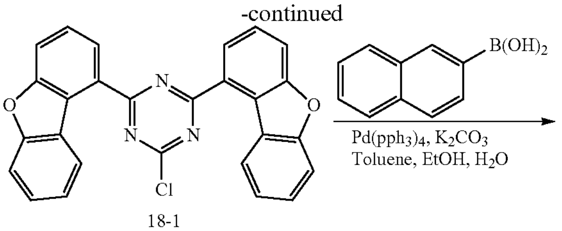

18-1

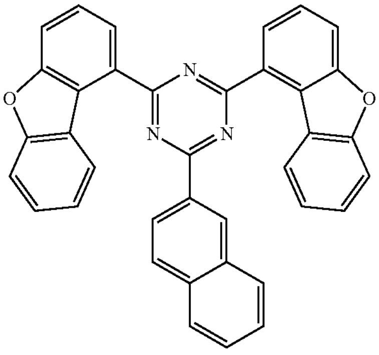

18-1

Synthesis of Compound 18-1

In a flask, 150 mL of toluene and 30 mL of distilled water were added to 2,4,6-trichloro-1,3,5-triazine (10 g, 54.22 mmol), dibenzo[b,d]furan-1-yl boronic acid (20.7 g, 97.60 mmol), $PdCl_2(PPh_3)_2$ (0.76 g, 1.084 mmol), and $Na_2CO_3$ (5.7 g, 54.22 mmol), and the mixture was stirred for two days. After completion of the reaction, the reaction mixture was cooled to room temperature, and extracted with distilled water and MeOH to obtain compound 18-1 (3.4 g, yield: 14%).

Synthesis of Compound E-90

In a flask, 32 mL of toluene, 8 mL of EtOH, and 8 mL of distilled water were added to compound 18-1 (3.4 g, 7.592 mmol), naphthalen-2-yl boronic acid (1.5 g, 9.111 mmol), $Pd(PPh_3)_4$ (0.4 g, 0.379 mmol), and $K_2CO_3$ (2 g, 15.18 mmol), and the mixture was stirred under reflux at 140° C. for 1 hour. After completion of the reaction, the reaction mixture was concentrated under reduced pressure, and extracted with MC. The organic layer was concentrated, and separated by column chromatography with MC/Hex to obtain compound E-90 (0.88 g, yield: 21%).

$^1$H NMR (DMSO-$d_6$) δ: 9.35 (d, J=1.6 Hz, 1H), 8.74 (dd, J=8.6, 1.7 Hz, 1H), 8.71 (dd, J=7.7, 1.2 Hz, 2H), 8.51 (dd,

J=7.7, 1.0 Hz, 2H), 8.20 (d, J=8.7 Hz, 1H), 8.13-8.07 (m, 4H), 7.86-7.80 (m, 4H), 7.75-7.70 (m, 1H), 7.66 (dd. J=8.5, 7.0 Hz, 1H), 7.59 (ddd, J=8.4, 7.2, 1.3 Hz, 2H), 7.18 (ddd, J=8.1, 7.1, 1.0 Hz, 2H)

| Compound | MW | M.P. |
|---|---|---|
| E-90 | 539.5 | 282.1° C. |

Example 11: Preparation of Compound E-125

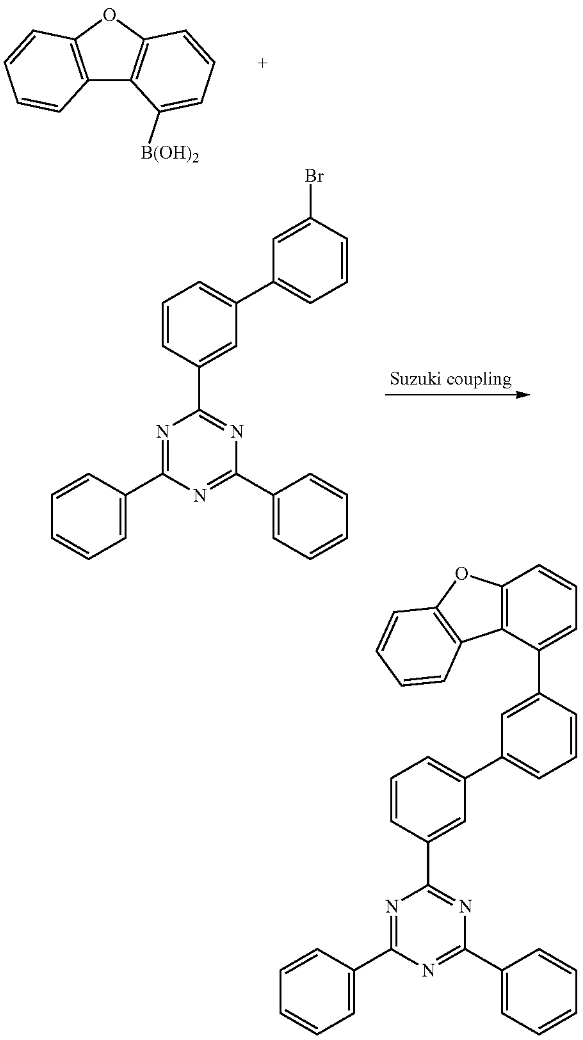

E-125

In a flask, dibenzo[b,d]furan-1-yl boronic acid (3.0 g, 14.2 mmol), 2-(3'-bromo-[1,1'-biphenyl]-3-yl)-4,6-diphenyl-1,3,5-triazine (7.3 g, 15.6 mmol), tetrakis(triphenylphosphine) palladium (0) (0.8 g, 0.71 mmol), and sodium carbonate (3.9 g, 28.4 mmol) were dissolved in 30 mL of toluene, 8 mL of ethanol, and 15 mL of water, and the mixture was fluxed for 2 hours. After completion of the reaction, an organic layer was extracted with ethyl acetate, and the residual moisture was removed using magnesium sulfate. The residue was dried, and separated by column chromatography to obtain compound E-125 (2.7 g, yield: 35%).

| Compound | MW | M.P. |
|---|---|---|
| E-125 | 551.6 | 233° C. |

Example 12: Preparation of Compound E-106

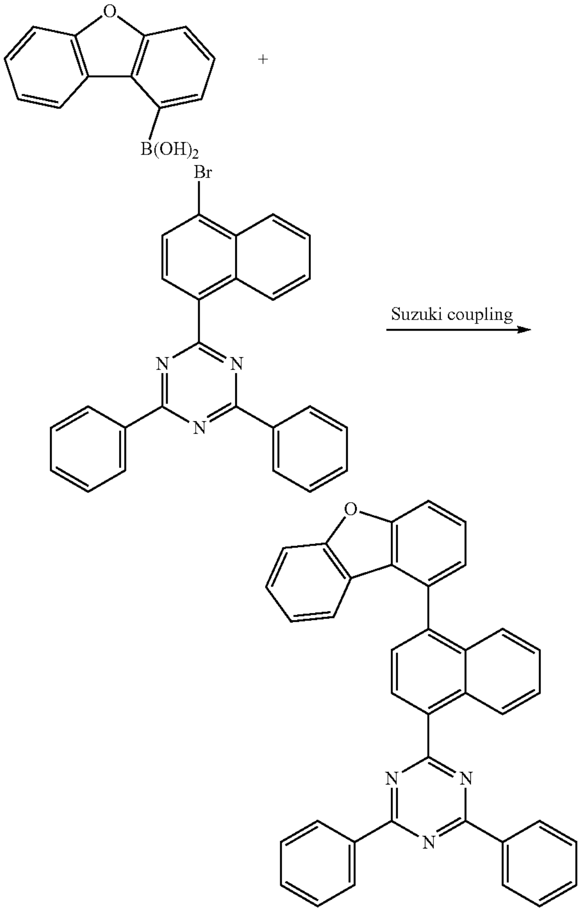

E-106

In a flask, dibenzo[b,d]furan-1-yl boronic acid (3.0 g, 14.2 mmol), 2-(4-bromonaphthalen-1-yl)-4,6-diphenyl-1,3,5-triazine (6.3 g, 14.2 mmol), tetrakis(triphenylphosphine)palladium (0) (0.82 g, 0.71 mmol), and sodium carbonate (3.9 g, 28.4 mmol) were dissolved in 30 mL of toluene, 8 mL of ethanol, and 15 mL of water, and the mixture was fluxed for 2 hours. After completion of the reaction, an organic layer was extracted with ethyl acetate, and the residual moisture was removed using magnesium sulfate. The residue was dried, and separated by column chromatography to obtain compound E-106 (1.9 g, yield: 26%).

| Compound | MW | M.P. |
|---|---|---|
| E-106 | 525.6 | 203° C. |

Example 13: Preparation of Compound E-91

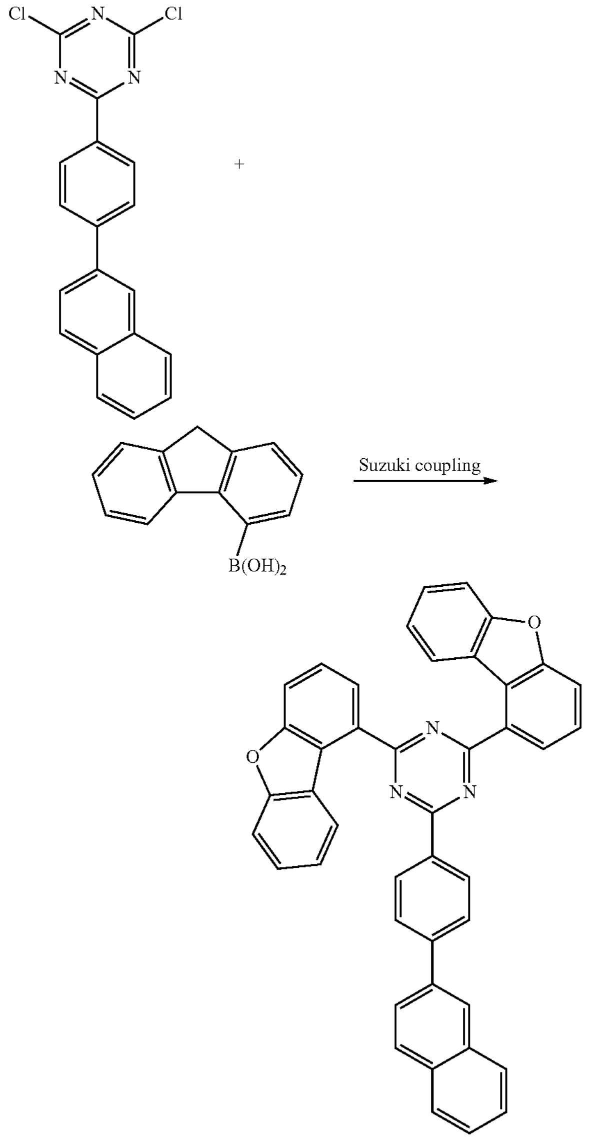

E-91

In a flask, 2,4-dichloro-6-(4-(naphthalen-2-yl)phenyl)-1,3,5-triazine (1.6 g, 4.54 mmol), dibenzo[b,d]furan-1-yl boronic acid (2.12 g, 10 mmol), tetrakis(triphenylphosphine) palladium (0) (0.26 g, 0.23 mmol), and sodium carbonate (1.3 g, 9.0 mmol) were dissolved in 16 mL of toluene, 1 mL of ethanol, and 4 mL of water, and the mixture was fluxed for 3 hours. After completion of the reaction, an organic layer was extracted with ethyl acetate, and the residual moisture was removed using magnesium sulfate. The residue was dried, and separated by column chromatography to obtain compound E-91 (1.0 g, yield: 36%).

| Compound | MW | M.P. |
|---|---|---|
| E-91 | 615.7 | 304° C. |

Example 14: Preparation of Compound E-110

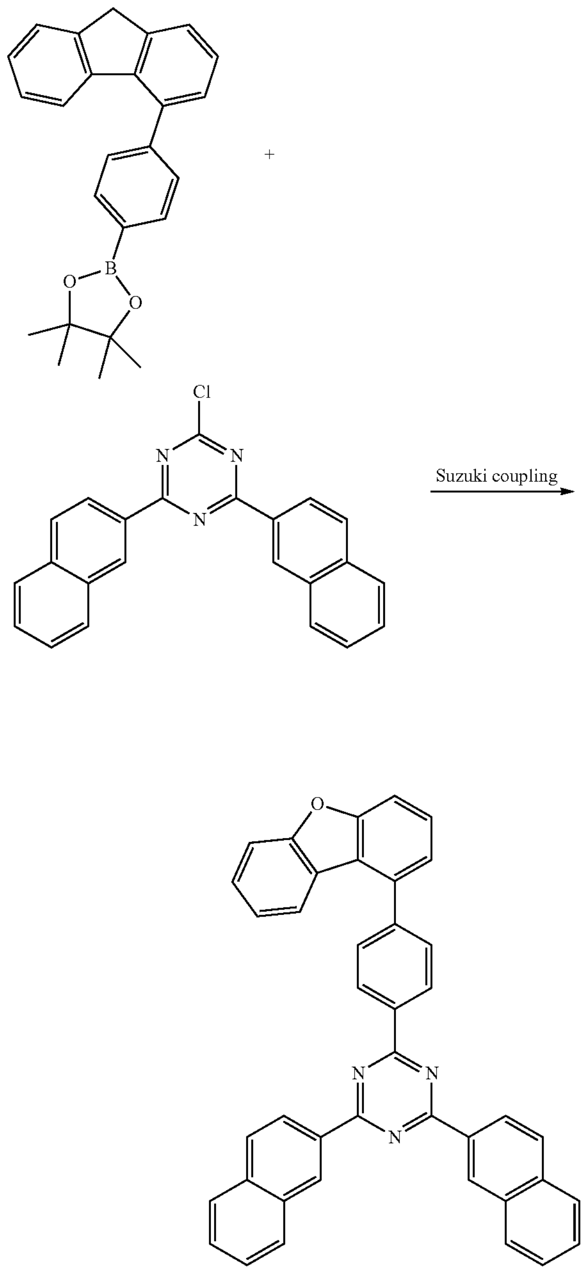

E-110

In a flask, 2-(4-(dibenzo[b,d]furan-1-yl)phenyl)-4,4,5,5-tetramethyl-1,3,2-dioxaborolane (4.0 g, 10.8 mmol), 2-chloro-4,6-di(naphthalen-2-yl)-1,3,5-triazine (4.4 g, 11.9 mmol), tetrakis(triphenylphosphine)palladium (0) (0.6 g, 0.54 mmol), and sodium carbonate (3.0 g, 21.6 mmol) were dissolved in 30 mL of toluene, 7 mL of ethanol, 10 mL of water, and the mixture was fluxed for 7 hours. After completion of the reaction, an organic layer was extracted with ethyl acetate, and the residual moisture was removed using magnesium sulfate. The residue was dried, and separated by column chromatography to obtain compound E-110 (4.0 g, yield: 65%).

| Compound | MW | M.P. |
|---|---|---|
| E-110 | 575.2 | 261° C. |

Example 15: Preparation of Compound E-130

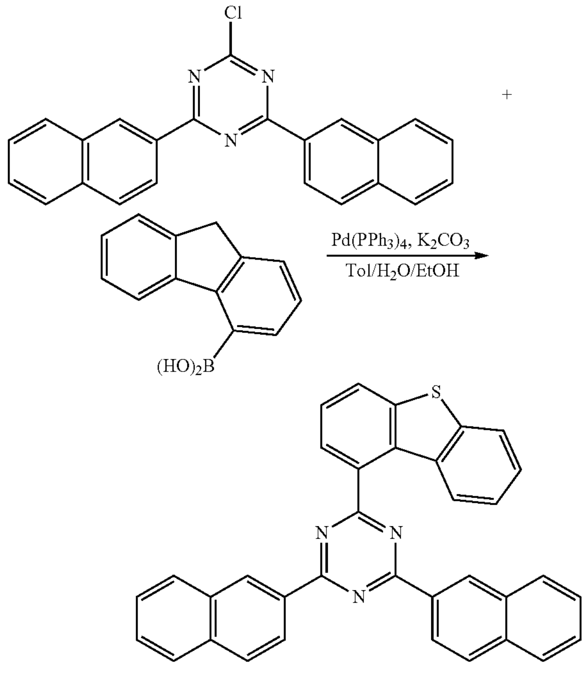

E-130

In a flask, 2-chloro-2,4-dinaphthalenyl-1,3,5-triazine (6.7 g, 18.3 mmol), dibenzo[b,d]thiophen-1-yl boronic acid (5 g, 21.92 mmol), $Pd(PPh_3)_4$ (1.05 g, 0.915 mmol), and $K_2CO_3$ (6.3 g, 45.75 mmol) were dissolved in 90 mL of toluene, 22.5 mL of ethanol, and 22.5 mL of water, and the mixture was fluxed at 130° C. for 4 hours. After completion of the reaction, an organic layer was extracted with ethyl acetate, and the residual moisture was removed using magnesium sulfate. The residue was dried, and separated by column chromatography to obtain compound E-130 (7.9 g, yield: 83.7%).

| Compound | MW | M.P. |
|---|---|---|
| E-130 | 515.15 | 282.4° C. |

Example 16: Preparation of Compound E-132

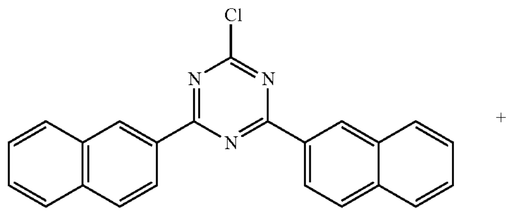

-continued

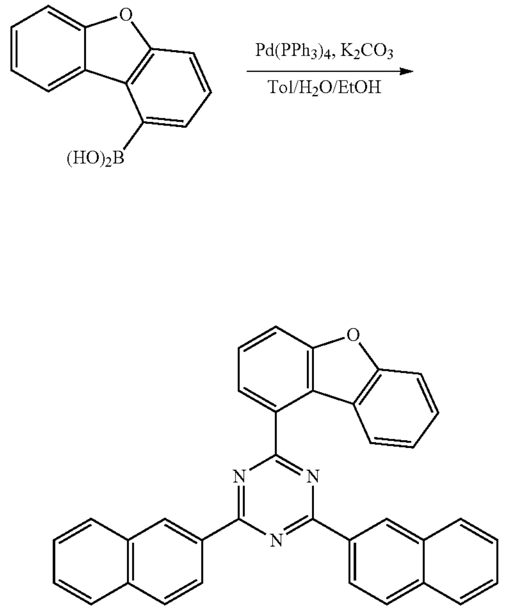

E-132

In a flask, 2-chloro-2,4-dinaphthalenyl-1,3,5-triazine (8.6 g, 23.58 mmol), dibenzo[b,d]furan-1-yl boronic acid (6 g, 28.3 mmol), $Pd(PPh_3)_4$ (1.4 g, 1.179 mmol), and $K_2CO_3$ (8.1 g, 58.95 mmol) were dissolved in 117 mL of toluene, 27 mL of ethanol, and 39 mL of water, and the mixture was fluxed at 130° C. for 4 hours. After completion of the reaction, an organic layer was extracted with ethyl acetate, and the residual moisture was removed using magnesium sulfate. The residue was dried, and separated by column chromatography to obtain compound E-132 (7.0 g, yield: 59.47%).

| Compound | MW | M.P. |
|---|---|---|
| E-132 | 499.17 | 255.5° C. |

Example 17: Preparation of Compound E-131

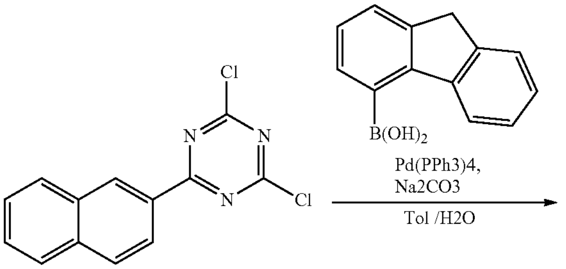

-continued

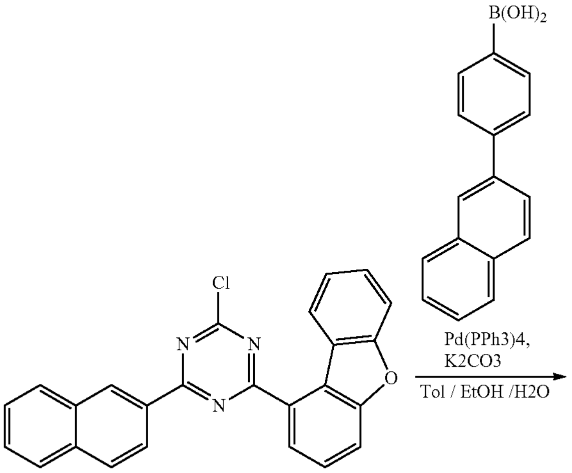

19-1

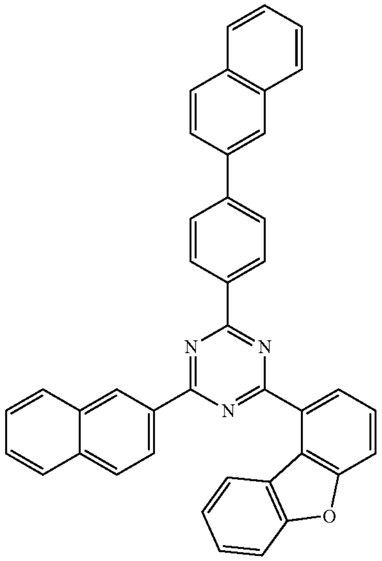

E-131

Synthesis of Compound 19-1

In a flask, 2,4-dichloro-6-(naphthalen-2-yl)-1,3,5-triazine (58 g, 212 mmol), dibenzo[b,d]furan-1-yl boronic acid (30 g, 141 mmol), $Na_2CO_3$ (45 g, 424 mmol), and $Pd(PPh_3)_4$ (4.9 g, 7.05 mmol) were dissolved in 1.4 L of toluene and 352 mL of $H_2O$, and the mixture was fluxed at 100° C. for 18 hours. After completion of the reaction, an organic layer was extracted with ethyl acetate, and the residual moisture was removed using magnesium sulfate. The residue was dried, and separated by column chromatography to obtain compound 19-1 (30 g, yield: 52%).

Synthesis of Compound E-131

In a flask, compound 19-1 (6 g, 14.7 mmol), 4-(naphthalen-2-yl)-phenylboronic acid (5.8 g, 17.64 mmol), $K_2CO_3$ (5.0 g, 36.75 mmol), and $Pd(PPh_3)_4$ (0.85 mg, 0.73 mmol) were dissolved in 70 mL of toluene, 35 mL of EtOH, and 35 mL of $H_2O$, and the mixture was fluxed at 130° C. for 4 hours. After completion of the reaction, an organic layer was extracted with ethyl acetate, and the residual moisture was removed using magnesium sulfate. The residue was dried, and separated by column chromatography to obtain compound E-131 (4.9 g, yield: 58%).

| Compound | MW | M.P. |
|---|---|---|
| E-131 | 575.20 | 192.9° C. |

Example 18: Preparation of Compound E-145

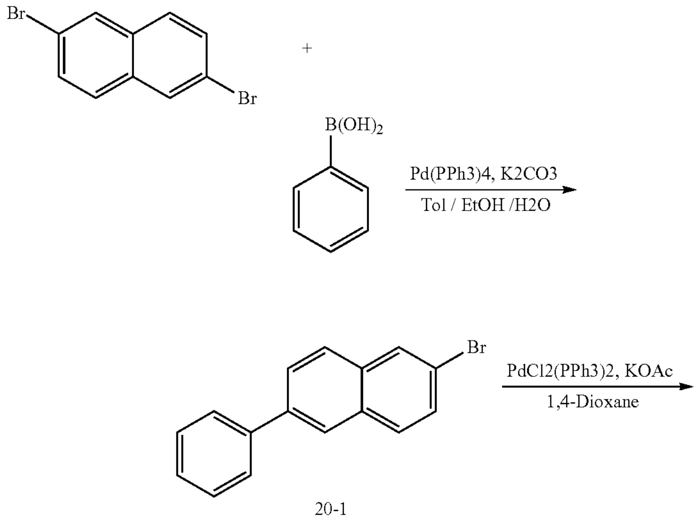

20-1

-continued

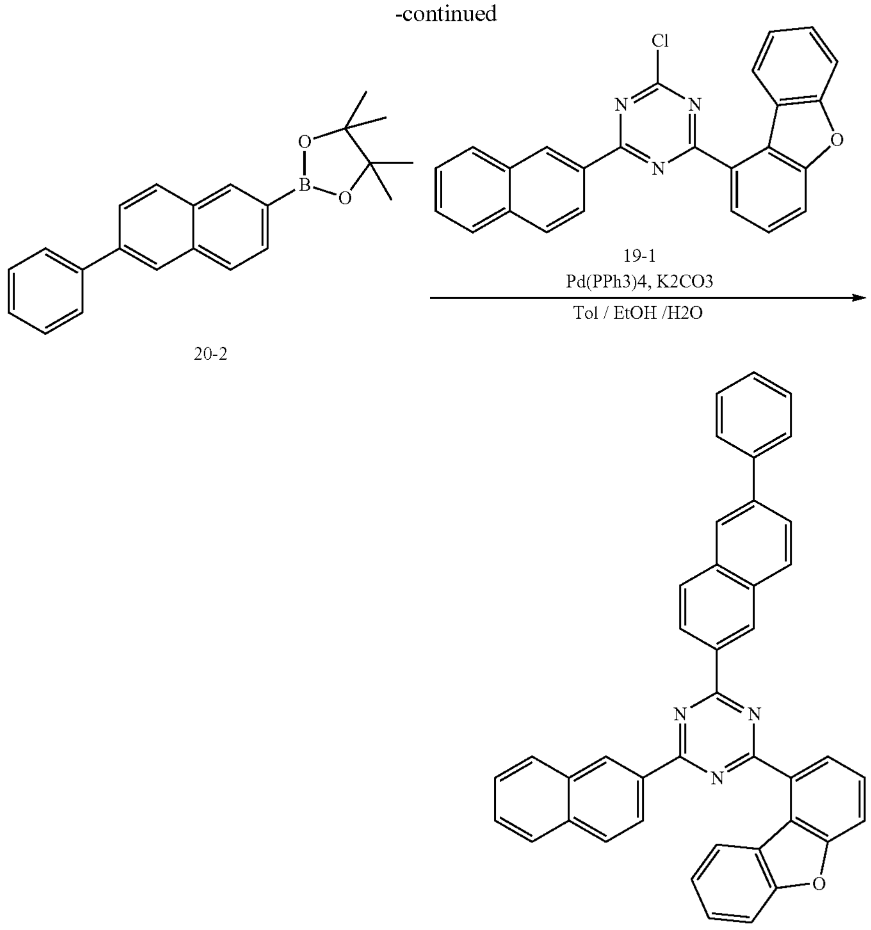

20-2

E-145

Synthesis of Compound 20-1

In a flask, 2,6-dibromonaphthalene (20 g, 70 mmol), phenylboronic acid (9 g, 73.4 mmol), $K_2CO_3$ (24 g, 175 mmol), and $Pd(PPh_3)_4$ (4 g, 3.5 mmol) were dissolved in 350 mL of toluene, 170 mL of $H_2O$, and 170 mL of EtOH, and the mixture was fluxed at 130° C. for 1 hour. After completion of the reaction, an organic layer was extracted with ethyl acetate, and the residual moisture was removed using magnesium sulfate. The residue was dried, and separated by column chromatography to obtain compound 20-1 (13 g, yield: 67%).

Synthesis of Compound 20-2

In a flask, compound 20-1 (13 g, 45.9 mmol), (4,4,4',4',5,5,5',5'-octamethyl-2,2'-bi(1,3,2-dioxaborolane) (17.5 g, 68.8 mmol), KOAc (11.3 g, 114.75 mmol), and $PdCl_2(PPh_3)_2$(3.2 g, 4.59 mmol) were dissolved in 230 mL of 1,4-dioxane, and the mixture was fluxed at 150° C. for 2 hours. After completion of the reaction, an organic layer was extracted with ethyl acetate, and the residual moisture was removed using magnesium sulfate. The residue was dried, and separated by column chromatography to obtain compound 20-2 (9 g, yield: 59.3%).

Synthesis of Compound E-145

In a flask, compound 20-2 (6.4 g, 19.16 mmol), compound 19-1 (6.5 g, 15.96 mmol), $K_2CO_3$ (5.5 g, 39.9 mmol), and $Pd(PPh_3)_4$ (922 mg, 0.798 mmol) were dissolved in 80 mL of toluene, 40 mL of EtOH, and 40 mL of $H_2O$, and the mixture was fluxed at 130° C. for 2 hours. After completion of the reaction, an organic layer was extracted with ethyl acetate, and the residual moisture was removed using magnesium sulfate. The residue was dried, and separated by column chromatography to obtain compound E-145 (4.9 g, yield: 53.3%).

| Compound | MW | M.P. |
|---|---|---|
| E-145 | 575.20 | 242.5° C. |

Hereinafter, a method of producing an organic electroluminescent device (OLED) according to the present disclosure and the luminous efficiency and lifetime properties thereof will be explained in detail. However, the present disclosure is not limited by the following examples.

Device Examples 1 and 2: Producing an OLED According to the Present Disclosure

OLEDs according to the present disclosure were produced. A transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and then was stored in isopropanol. The ITO substrate was then mounted on a substrate holder of a vacuum vapor deposition apparatus. Compound HI-1 shown in Table 3 was introduced into a cell of the vacuum vapor deposition apparatus, and compound HT-1 shown in Table 3 was introduced into another cell of the vacuum vapor deposition apparatus. The two materials were evaporated at different rates, and compound HI-1 was deposited in a doping amount of 3 wt % based on the total amount of compound HI-1 and compound HT-1 to form a hole injection layer having a thickness of 10 nm on the ITO substrate. Next, compound HT-1 was deposited on the hole injection layer to form a first hole transport layer having a thickness of 80 nm on the hole injection layer. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: The first host compound and the second host compound shown in Table 1 below were introduced into two cells of the vacuum vapor depositing apparatus as hosts, and compound D-39 was introduced into another cell as a dopant. The two host materials were evaporated at a rate of 1:1 and the dopant material was simultaneously evaporated at a different rate, and the dopant was deposited in a doping amount of 3 wt % based on the total amount of the hosts and the dopant to form a light-emitting layer having a thickness of 40 nm on the second hole transport layer. Compound ETL-1 and compound EIL-1 were evaporated in a weight ratio of 50:50 to form an electron transport layer having a thickness of 35 nm on the light-emitting layer. After depositing compound EIL-1 as an electron injection layer having a thickness of 2 nm on the electron transport layer, an Al cathode having a thickness of 80 nm was deposited on the electron injection layer by another vacuum vapor deposition apparatus. Thus, an OLED was produced. All the materials used for producing the OLED were purified by vacuum sublimation at $10^{-6}$ torr.

Comparative Examples 1 and 2: Producing an OLED Comprising the Comparative Compound as a Host OLEDs were produced in the same manner as in Device Example 1, except that the compound shown in Table 1 below was used alone as the first host or the second host of the light-emitting layer.

The driving voltage, luminous efficiency, and light-emitting color at a luminance of 1,000 nit, and the time taken for luminance to decrease from 100% to 95% at a luminance of 5,000 nit (lifetime; T95) of the OLEDs produced in Comparative Examples 1 and 2 and Device Examples 1 and 2 are provided in Table 1 below.

TABLE 1

| | First Host | Second Host | Driving Voltage (V) | Luminous Efficiency (cd/A) | Light-Emitting Color | Life-time (T95, hr) |
|---|---|---|---|---|---|---|
| Comparative Example 1 | — | C-29 | 4.7 | 5.8 | Red | 9.3 |
| Comparative Example 2 | E-110 | — | 3.7 | 27.3 | Red | 18.8 |
| Device Example 1 | E-110 | C-29 | 2.9 | 35.6 | Red | 267 |
| Device Example 2 | E-110 | C-32 | 3.0 | 34.6 | Red | 267 |

From Table 1 above, it can be seen that the OLEDs comprising a plurality of host materials according to the present disclosure have improved driving voltage, luminous efficiency, and/or lifetime properties, compared to the conventional OLEDs. It is considered that by using the compound represented by formula 1 of the present disclosure in combination with the compound represented by formula 2 of the present disclosure, the balance between hole and electron and the formation of exciton may be improved, compared to the case when using the single host, thereby improving the driving voltage, luminous efficiency and/or lifetime properties of an OLED.

Device Examples 3 and 4: Producing an OLED According to the Present Disclosure OLEDs according to the present disclosure were produced. A transparent electrode indium tin oxide (ITO) thin film (10 Ω/sq) on a glass substrate for an OLED (GEOMATEC CO., LTD., Japan) was subjected to an ultrasonic washing with acetone and isopropyl alcohol, sequentially, and then was stored in isopropanol. The ITO substrate was then mounted on a substrate holder of a vacuum vapor deposition apparatus. Compound HI-1 shown in Table 3 was introduced into a cell of the vacuum vapor deposition apparatus, and compound HT-1 shown in Table 3 was introduced into another cell of the vacuum vapor deposition apparatus. The two materials were evaporated at different rates, and compound HI-1 was deposited in a doping amount of 3 wt % based on the total amount of compound HI-1 and compound HT-1 to form a hole injection layer having a thickness of 10 nm on the ITO substrate. Next, compound HT-1 was deposited on the hole injection layer to form a first hole transport layer having a thickness of 70 nm on the hole injection layer. Compound HT-3 was then introduced into another cell of the vacuum vapor deposition apparatus and was evaporated by applying an electric current to the cell, thereby forming a second hole transport layer having a thickness of 5 nm on the first hole transport layer. After forming the hole injection layer and the hole transport layers, a light-emitting layer was formed thereon as follows: Compound BH shown in Table 3 was introduced into a cell of the vacuum vapor depositing apparatus as a host, and compound BD was introduced into another cell as a dopant. The host material and the dopant material were evaporated at different rates, and the dopant was deposited in a doping amount of 3 wt % based on the total amount of the host and the dopant to form a light-emitting layer having a thickness of 20 nm on the second hole transport layer. Compound B-1 was evaporated to form an electron buffer layer having a thickness of 5 nm on the light-emitting layer. The compounds shown in Table 2 below were evaporated in a weight ratio of 50:50 to form an electron transport layer having a thickness of 30 nm on the electron buffer layer. After depositing compound EIL-1 as an electron injection layer having a thickness of 2 nm on the electron transport layer, an Al cathode having a thickness of 80 nm was deposited on the electron injection layer by another vacuum vapor deposition apparatus. Thus, an OLED was produced. All the materials used for producing the OLED were purified by vacuum sublimation at $10^{-6}$ torr.

Comparative Example 3: Producing an OLED Comprising the Comparative Compound as an Electron Transport Laver An OLED was produced in the same manner as in Device Example 3, except that the compound shown in Table 2 below was used as an electron transport layer.

The driving voltage and light-emitting color at a luminance of 1,000 nit, and the time taken for luminance to decrease from 100% to 50% at a luminance of 2,000 nit (lifetime; T50) of the OLEDs produced in Comparative Example 3 and Device Examples 3 and 4 are provided in Table 2 below.

TABLE 2

| | Electron Transport Layer | Driving Voltage (V) | Light-Emitting Color | Life-time (T50, hr) |
|---|---|---|---|---|
| Comparative Example 3 | E-132:EIL-1 | 3.8 | Blue | 474 |
| Device Example 3 | E-131:EIL-1 | 3.8 | Blue | 526 |
| Device Example 4 | E-145:EIL-1 | 3.8 | Blue | 620 |

From Table 2 above, it can be seen that the OLEDs comprising the compound according to the present disclosure in an electron transport layer have an improved lifetime property, compared to the conventional OLED.

The compounds used in the Device Examples and the Comparative Examples are shown in Table 3.

TABLE 3

| | |
|---|---|
| Hole Injection Layer/ Hole Transport Layer | 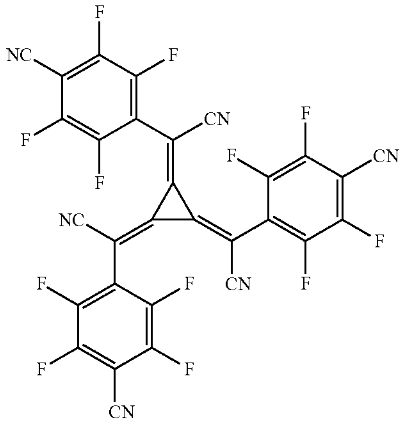 HI-1 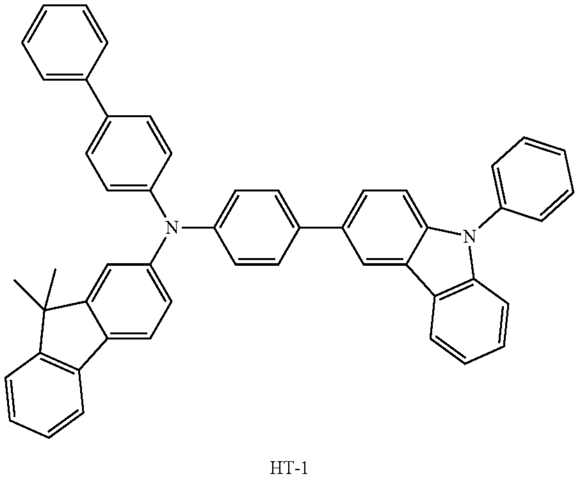 HT-1 |

TABLE 3-continued
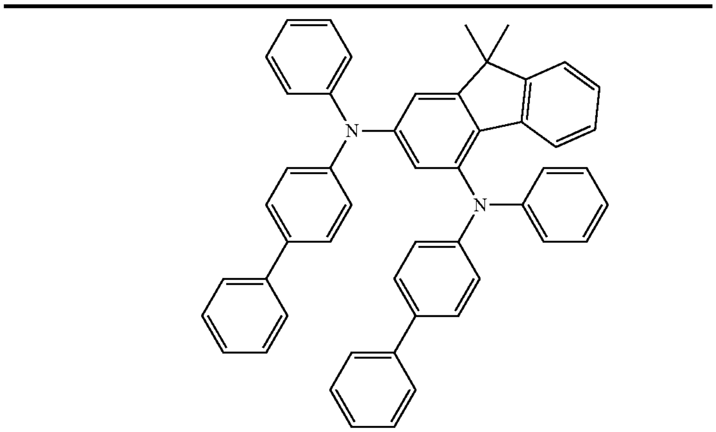
HT-2
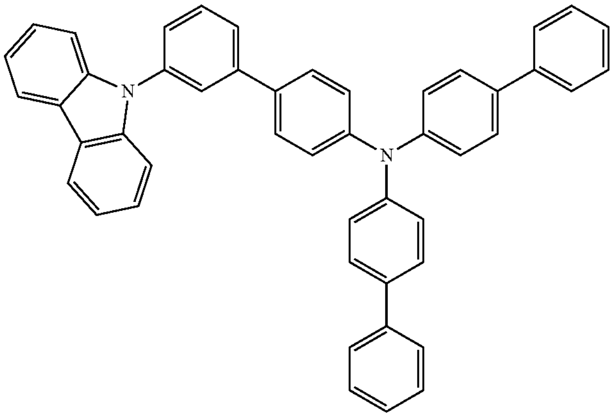
HT-3
Light-Emitting Layer
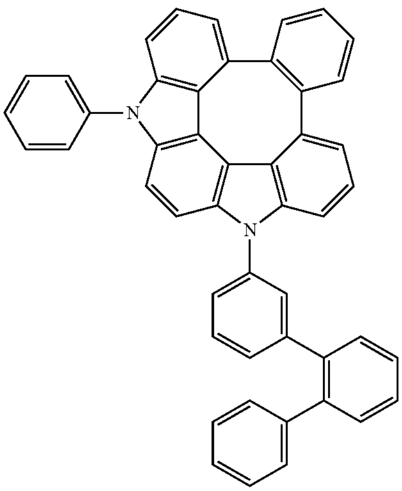
C-29

TABLE 3-continued
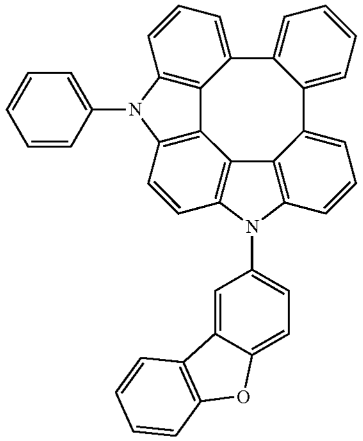
C-32
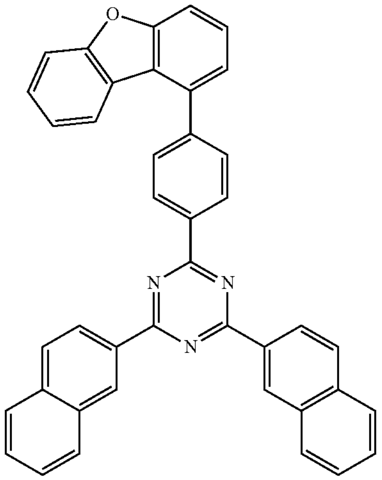
E-110
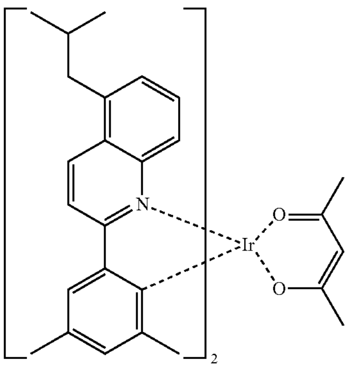
D-39

TABLE 3-continued
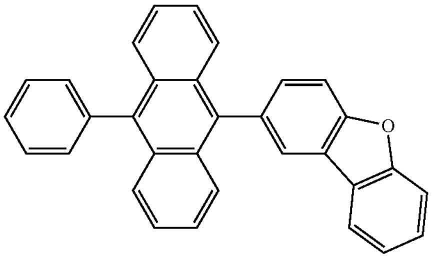
BH
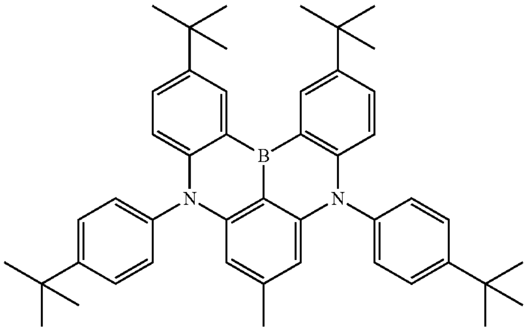
BD
Electron Buffer Layer/ Electron Transport Layer/ Electron Injection Layer
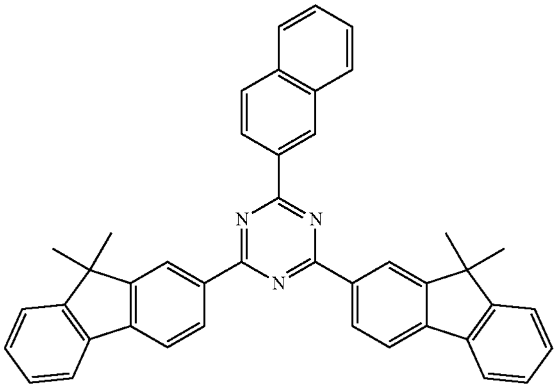
ETL-1
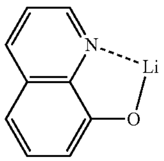
EIL-1

TABLE 3-continued
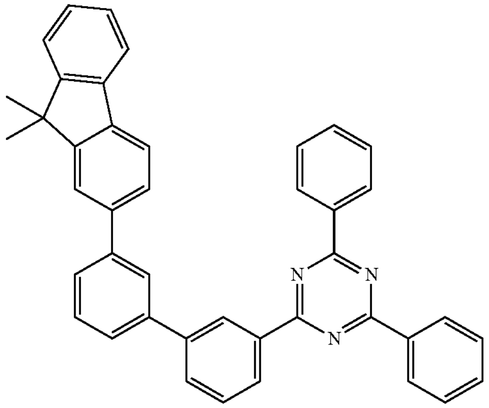
B-1
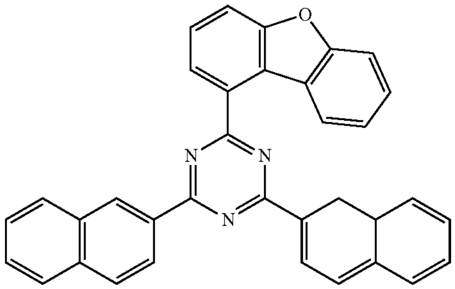
E-132
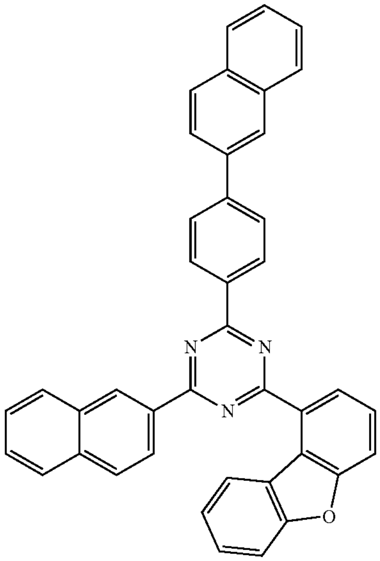
E-131

TABLE 3-continued

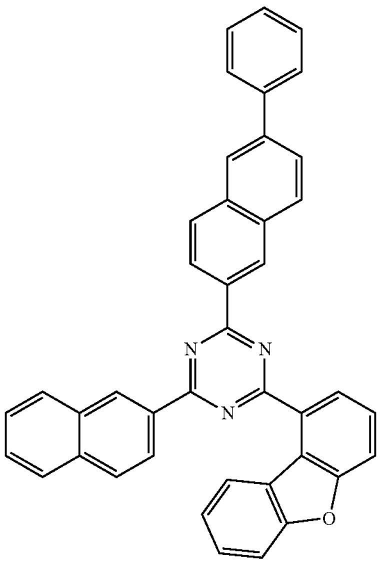

E-145

The invention claimed is:

1. A plurality of host materials comprising at least one first host compound and at least one second host compound, wherein the first host compound is represented by at least one of the following formulas 1-1 to 1-3, and the second host compound is represented by at least one of the following formulas 2-1 and 2-2:

(1-1)

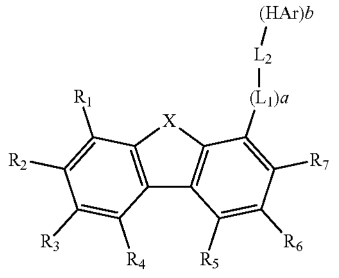

(1-2)

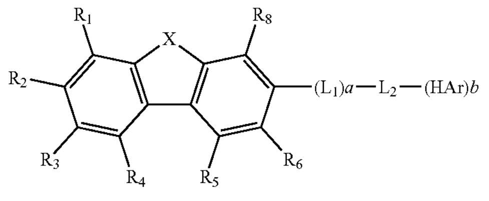

(1-3)

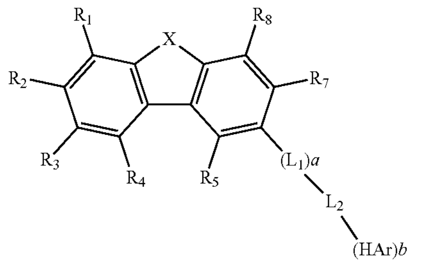

In formulas 1-1 to 1-3,

X represents O or S;

$R_1$ to $R_8$, each independently, represent hydrogen, deuterium, a halogen, a cyano, a substituted or unsubstituted (C1-C30)alkyl, a substituted or unsubstituted (C3-C30) cycloalkyl, a substituted or unsubstituted (C3-C30) cycloalkenyl, a substituted or unsubstituted (3-to 7-membered)heterocycloalkyl, a substituted or unsubstituted (C6-C30)aryl, a substituted or unsubstituted (3-to 30-membered)heteroaryl, —$NR_{22}R_{23}$, or-$SiR_{24}R_{25}R_{26}$; or may be linked to an adjacent substituent to form a ring(s);

$L_1$, each independently, represents a substituted or unsubstituted (C1-C30)alkylene, a substituted or unsubstituted (C6-C30)arylene, or a substituted or unsubstituted (C3-C30)cycloalkylene;

$L_2$ represents an unsubstituted (3-to 30-membered)heteroarylene;

HAr, each independently, represents deuterium, a halogen, a cyano, a substituted or unsubstituted (C1-C30) alkyl, a substituted or unsubstituted (C3-C30)cycloalkyl, a substituted or unsubstituted (C3-C30) cycloalkenyl, a substituted or unsubstituted (3-to 7-membered)heterocycloalkyl, a substituted or unsubstituted (C6-C30)aryl, a substituted or unsubstituted (3-to 30-membered)heteroaryl, —$NR_{22}R_{23}$, or-$SiR_{24}R_{25}R_{26}$;

$R_{22}$ to $R_{26}$, each independently, represent hydrogen, deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3-to 7-membered)heterocycloalkyl, a substituted or unsubstituted (C6-C30)aryl, or a substituted or unsubstituted (3-to 30-membered)heteroaryl; or may be linked to an adjacent substituent to form a ring(s); and a represents an integer of 1 to 2, and b represents an integer of 1 to 4, where if each of a and b is an integer of 2 or more, each of $L_1$ and each of HAr may be the same or different;)

(2-1)

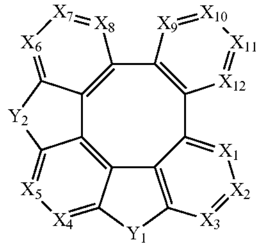

(2-2)

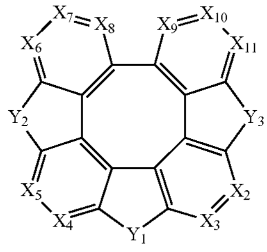

in formulas 2-1 and 2-2, $Y_1$ represents —$N(L_3\text{-}(Ar)_n)$—;

$Y_2$ and $Y_3$, each independently, represent $N(L_3\text{-}(Ar)_n)$—, —O—, —S—, or —$C(R_{31})(R_{32})$—, wherein;

$L_3$ represents a single bond, a substituted or unsubstituted (C1-C30)alkylene, a substituted or unsubstituted (C6-C30)arylene, a substituted or unsubstituted (3-to 30-membered)heteroarylene, or a substituted or unsubstituted (C3-C30)cycloalkylene;

Ar represents a substituted or unsubstituted (C6-C30)aryl, a substituted or unsubstituted (3-to 30-membered)heteroaryl, or —$NR_{33}R_{34}$;

$R_{31}$ to $R_{34}$, each independently, represent hydrogen, deuterium, a halogen, a cyano, a substituted or unsubstituted (C1-C30)alkyl, a substituted or unsubstituted (C6-C30)aryl, a substituted or unsubstituted (3-to 30-membered)heteroaryl, or a substituted or unsubstituted (C3-C30)cycloalkyl; or may be linked to an adjacent substituent to form a ring(s); and n represents an integer of 1 or 2, where if n is 2, each of Ar may be the same or different;

where if a plurality of Ar's are present, each of Ar may be the same or different;

$X_1$ to $X_{12}$, each independently, represent —N═ or —$C(R_a)$═; and $R_a$, each independently, represents hydrogen.

2. The plurality of host materials according to claim 1, wherein the substituent(s) of the substituted alkyl, the substituted alkylene, the substituted aryl, the substituted arylene, the substituted heteroaryl, the substituted heteroarylene, the substituted cycloalkyl, the substituted cycloalkylene, the substituted cycloalkenyl, and the substituted heterocycloalkyl, each independently, are at least one selected from the group consisting of deuterium; a halogen; a cyano; a carboxyl; a nitro; a hydroxyl; a phosphineoxide; a (C1-C30)alkyl; a halo (C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3-to 7-membered)heterocycloalkyl; a (C6-C30)aryloxy; a (C6-C30)arylthio; a (3-to 30-membered)heteroaryl unsubstituted or substituted with at least one of a (C1-C30)alkyl(s) and a (C6-C30)aryl(s); a (C6-C30)aryl unsubstituted or substituted with at least one of deuterium, a (C1-C30)alkyl(s), a (3-to 30-membered)heteroaryl(s), and a mono-or di-(C1-C30)arylamino(s); a tri(C1-C30)alkylsilyl; a tri(C6-C30)arylsilyl; a di (C1-C30)alkyl (C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono-or di-(C1-C30)alkylamino; a mono-or di-(C2-C30)alkenylamino; a mono-or di-(C6-C30)arylamino; a mono-or di-(3-to 30-membered)heteroarylamino; a (C1-C30)alkyl (C2-C30)alkenylamino; a (C1-C30)alkyl (C6-C30)arylamino; a (C1-C30)alkyl (3-to 30-membered)heteroarylamino; a (C2-C30)alkenyl (C6-C30)arylamino; a (C2-C30)alkenyl (3-to 30-membered)heteroarylamino; a (C6-C30)aryl (3-to 30-membered)heteroarylamino; a (C1-C30)alkylcarbonyl; a (C1-C30)alkoxycarbonyl; a (C6-C30)arylcarbonyl; a (C6-C30)arylphosphine; a di (C6-C30)arylboronyl; a di (C1-C30)alkylboronyl; a (C1-C30)alkyl (C6-C30)arylboronyl; a (C6-C30)aryl (C1-C30)alkyl; and a (C1-C30)alkyl (C6-C30)aryl.

3. The plurality of host materials according to claim 1, wherein $L_2$ of formula 1 represents a triazinylene, a pyridylene, a pyrimidinylene, a quinazolinylene, a benzoquinazolinylene, a quinoxalinylene, a benzoquinoxalinylene, a quinolylene, a benzoquinolylene, an isoquinolylene, a benzoisoquinolylene, a triazolylene, a pyrazolylene, a naphthyridinylene, a triazanaphthylene, a pyridopyrazinylene, or a benzothienopyrimidinylene.

4. The plurality of host materials according to claim 1, wherein at least one of Ar(s), each independently, is at least one selected from those listed in the following group 1:

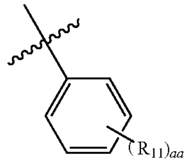

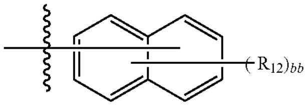

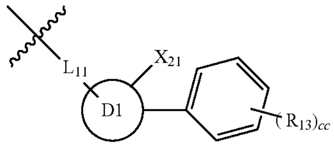

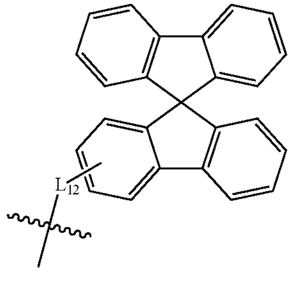

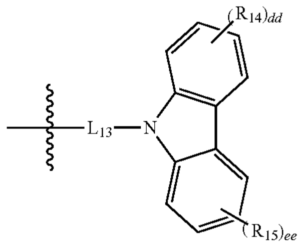

-continued

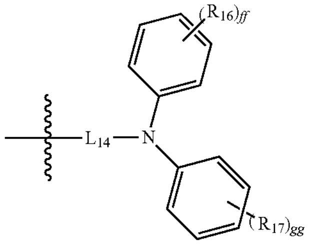

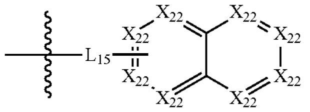

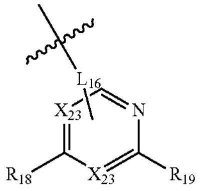

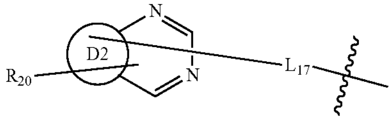

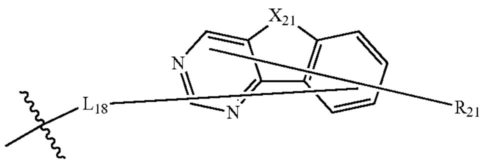

in group 1,

D1 and D2, each independently, represent a benzene ring or a naphthalene ring;

$X_{21}$ represents O, S, $NR_{35}$, or $CR_{36}R_{37}$;

$X_{22}$, each independently, represents $CR_{38}$ or N, with the proviso that at least one of $X_{22}$ represents N;

$X_{23}$, each independently, represents $CR_{39}$ or N;

$L_{11}$ to $L_{18}$, each independently, represent a single bond, a substituted or unsubstituted (C6-C30)arylene, or a substituted or unsubstituted (3-to 30-membered)heteroarylene;

$R_{11}$ to $R_{21}$ and $R_{35}$ to $R_{39}$, each independently, represent hydrogen, deuterium, a halogen, a cyano, a substituted or unsubstituted (C1-C30)alkyl, a substituted or unsubstituted (C6-C30)aryl, a substituted or unsubstituted (3-to 30-membered)heteroaryl, or a substituted or unsubstituted (C3-C30)cycloalkyl, or may be linked to an adjacent substituent to form a ring(s); and aa, ff, and gg, each independently, represent an integer of 1 to 5, bb represents an integer of 1 to 7, and cc, dd, and ee, each independently, represent an integer of 1 to 4, where each of aa to gg represents an integer of 2 or more, each $R_{11}$ to each of $R_{17}$ may be the same or different.

5. The plurality of host materials according to claim 1, wherein at least one of Ar(s), each independently, is at least one selected from those listed in the following groups 2 and 3:

[Group 2]

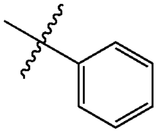

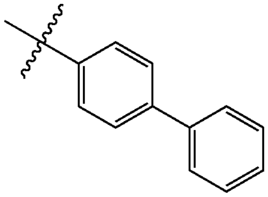

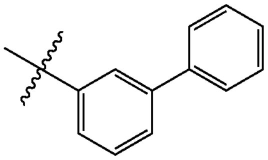

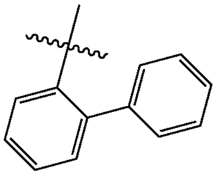

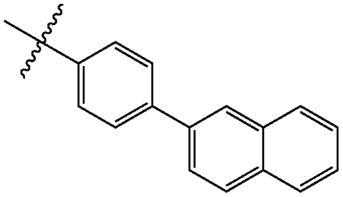

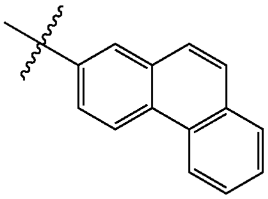

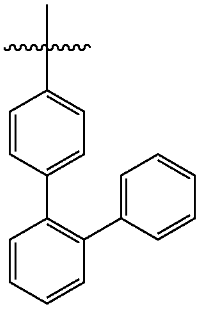

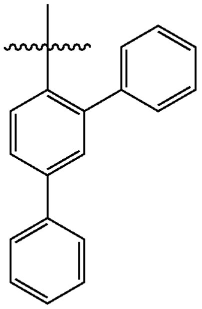

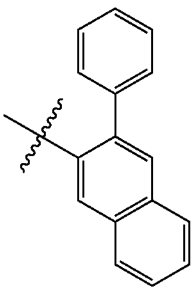

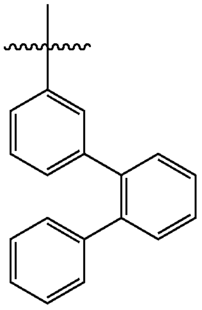

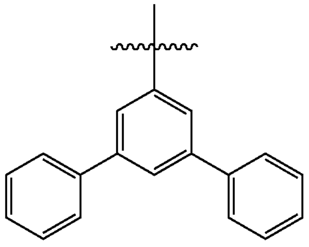

-continued
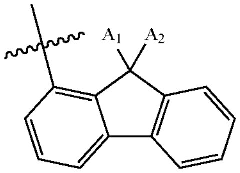
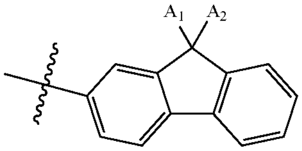
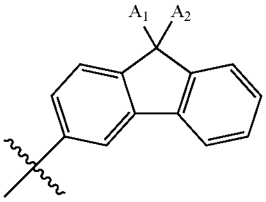
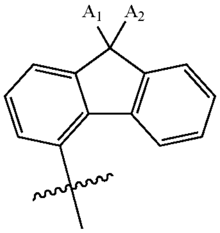
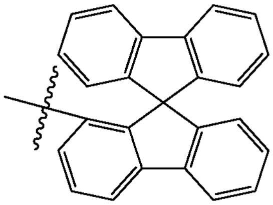
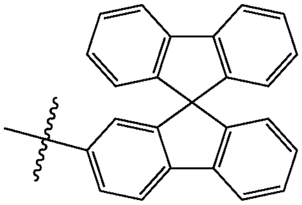
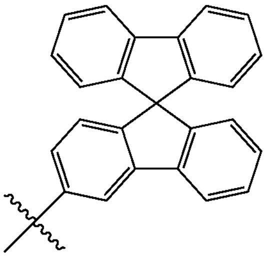
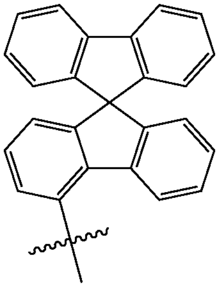
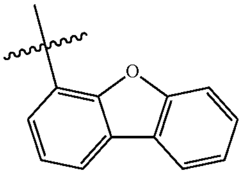
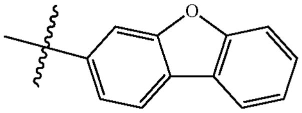
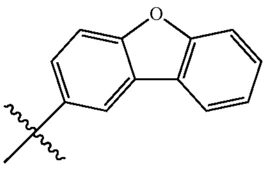
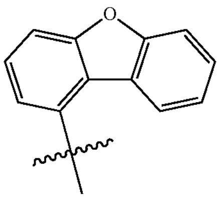
-continued
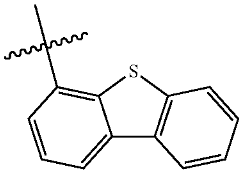
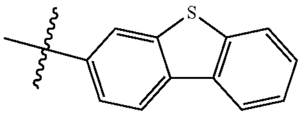
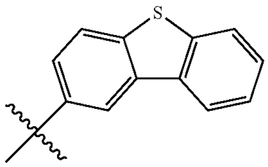
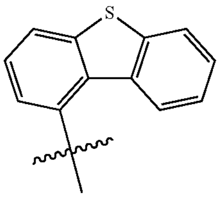
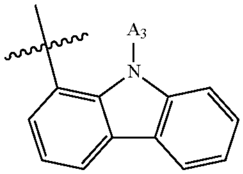
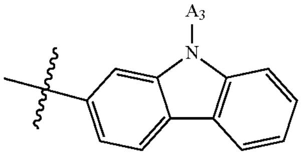
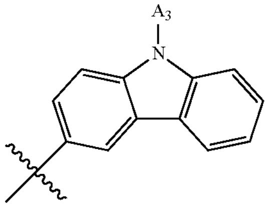
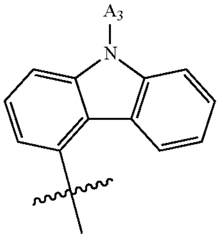
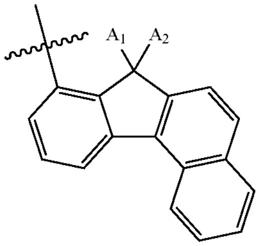
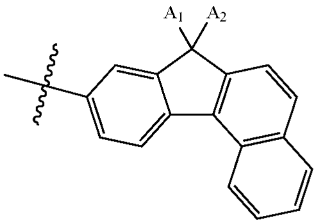

-continued
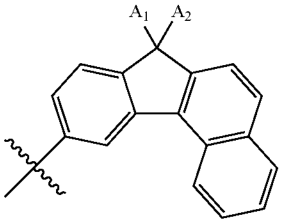
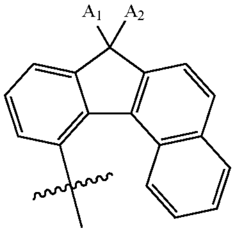
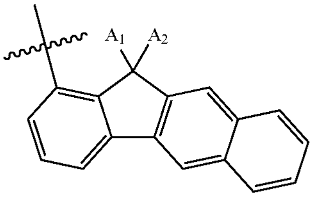
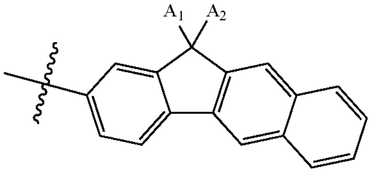
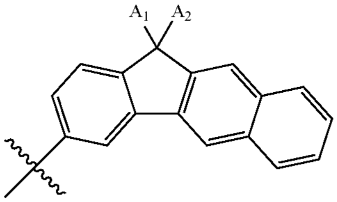
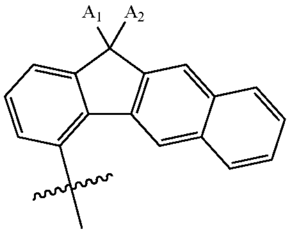
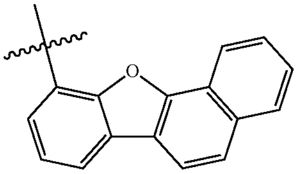
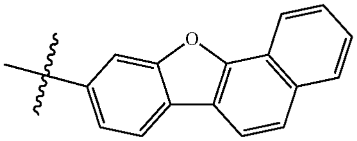
-continued
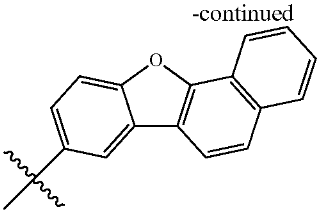
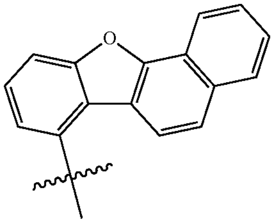
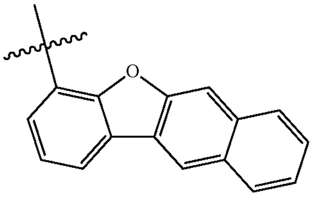
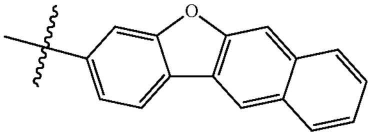
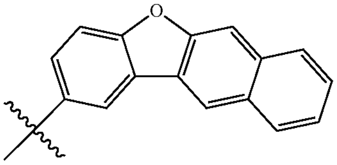
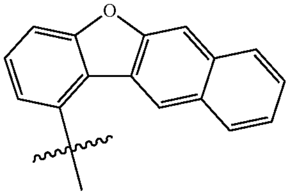
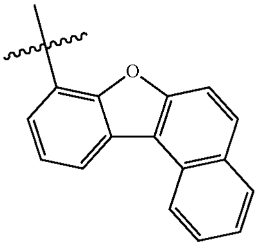
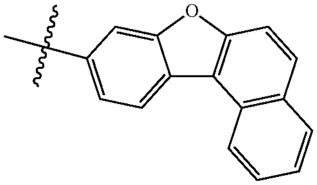
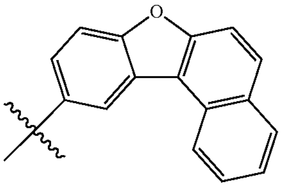

-continued
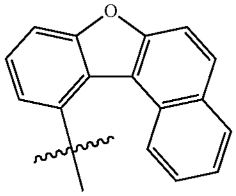
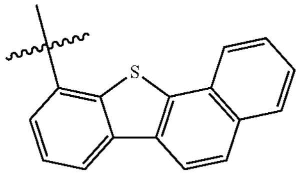
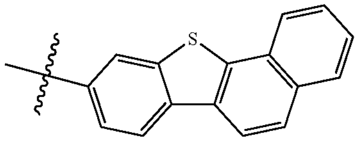
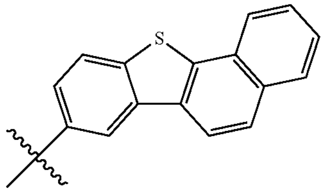
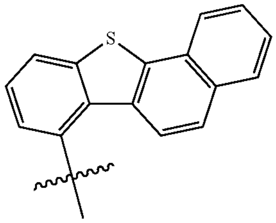
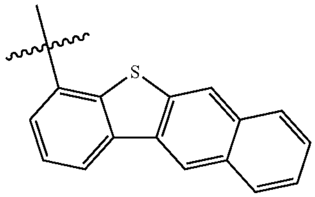
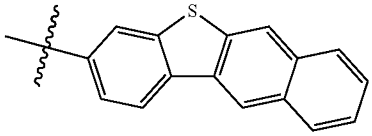
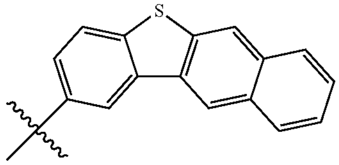
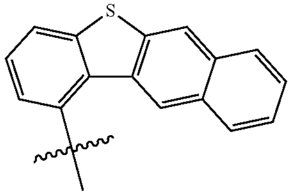
-continued
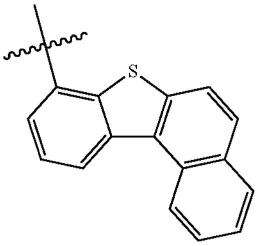
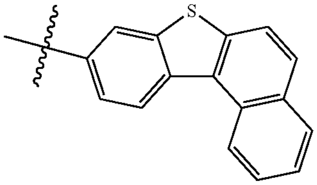
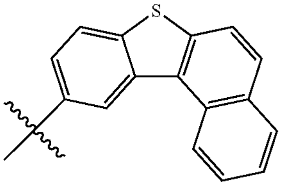
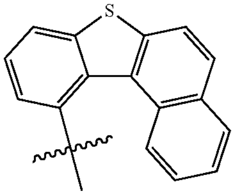
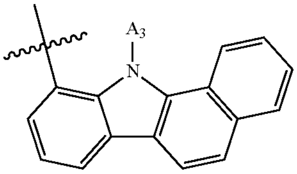
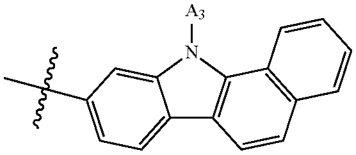
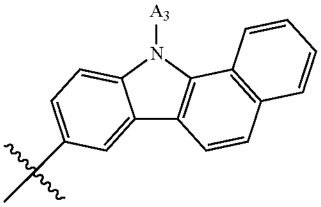
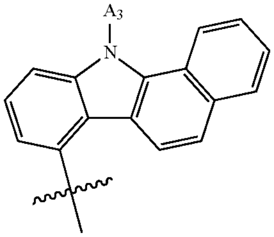

-continued
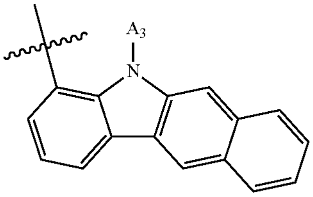
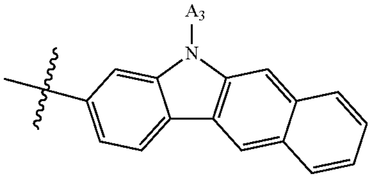
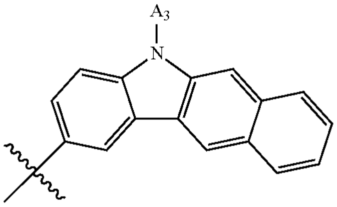
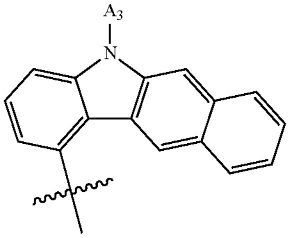
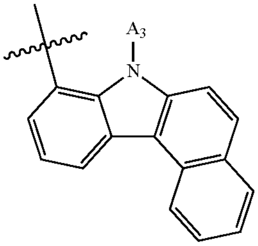
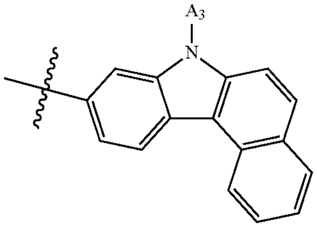
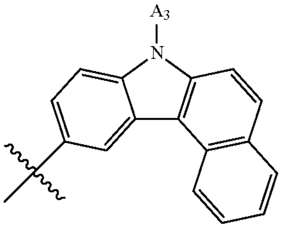
-continued
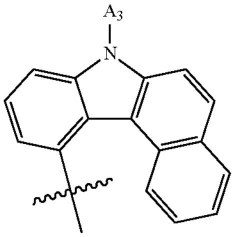
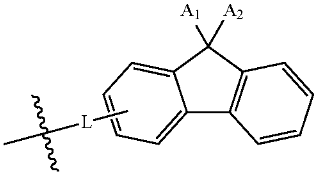
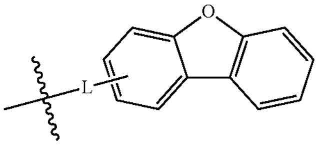
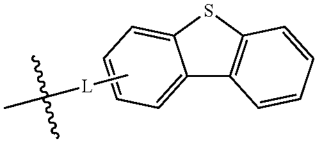
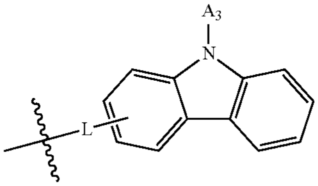
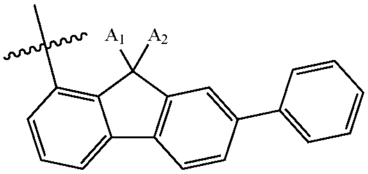
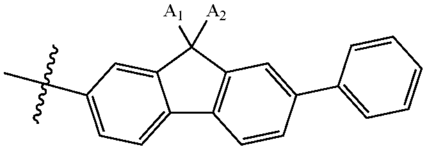
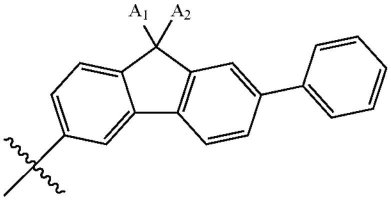
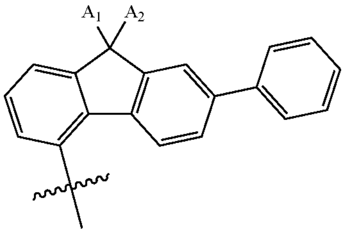

-continued
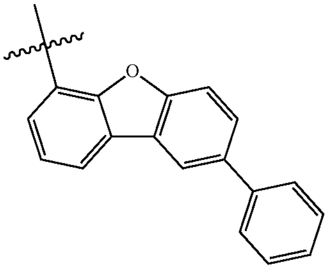
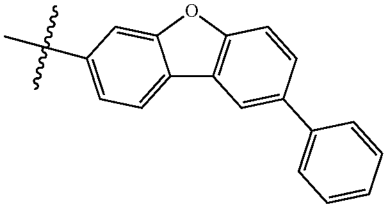
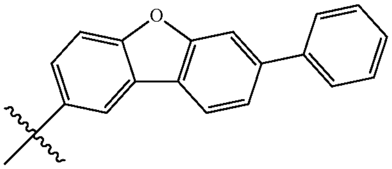
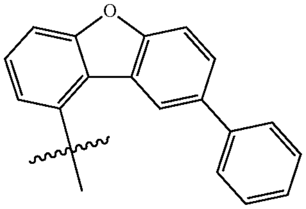
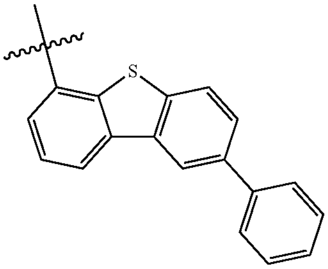
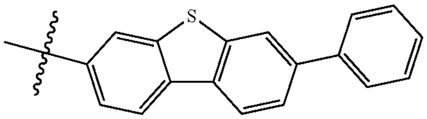
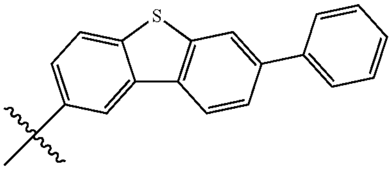
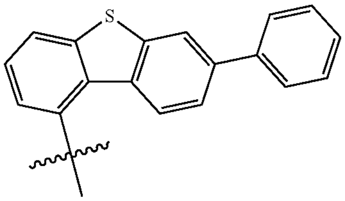
-continued
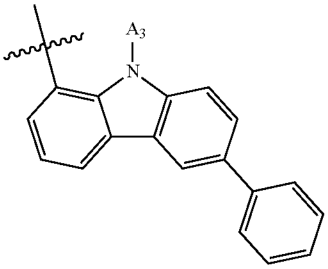
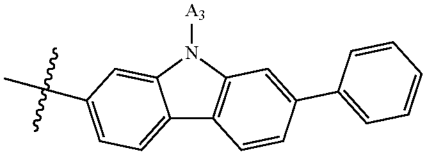
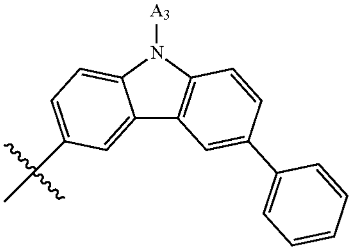
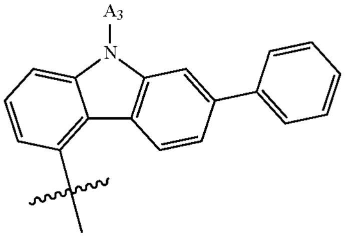
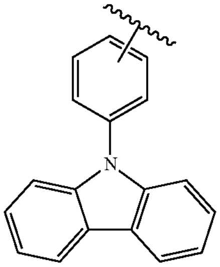
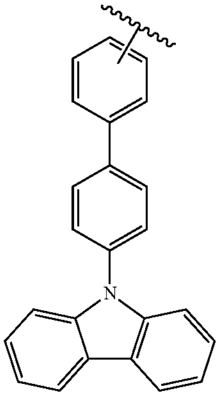
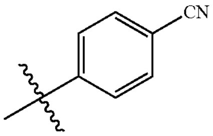
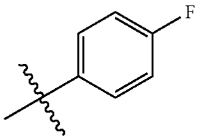
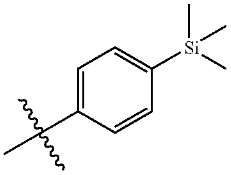
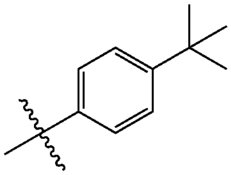

-continued
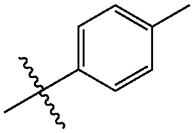
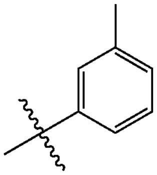
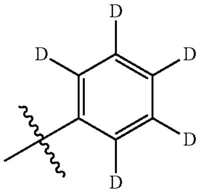
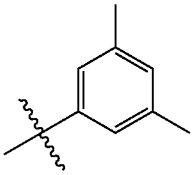
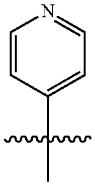
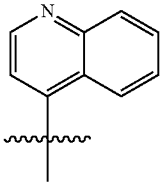
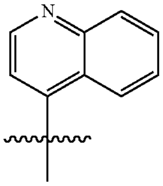
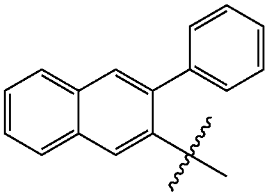
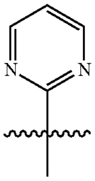
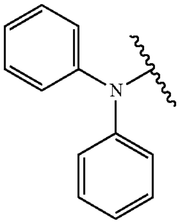
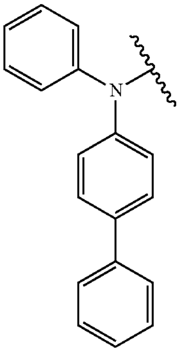
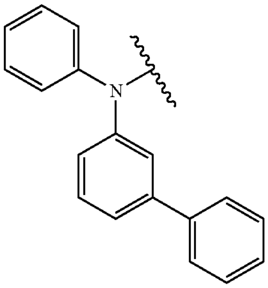
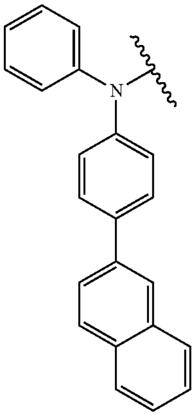
-continued
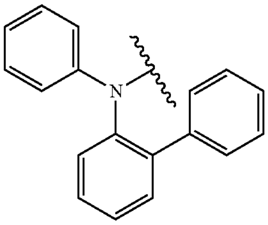
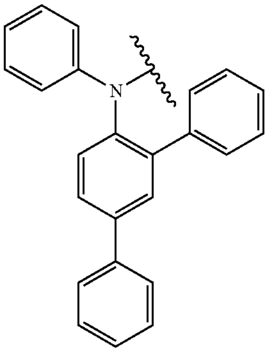
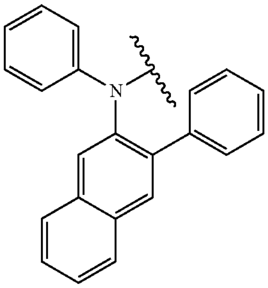
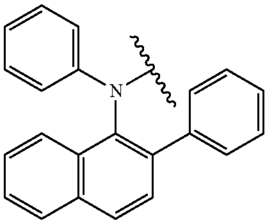
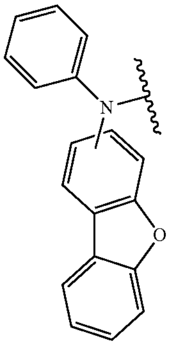
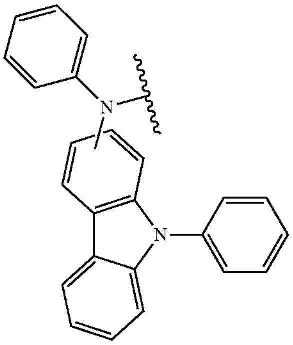

-continued
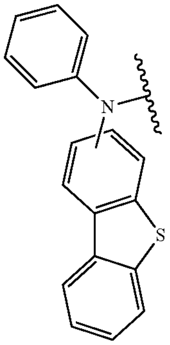
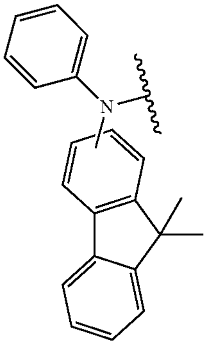
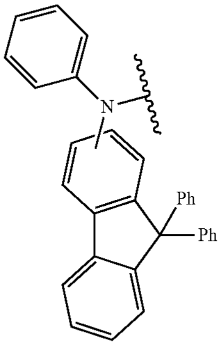
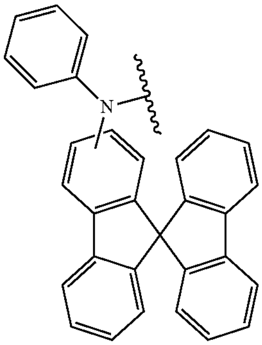
[Group 3]
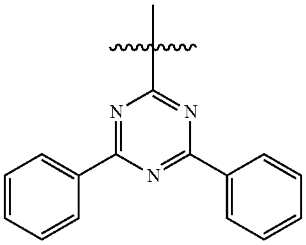
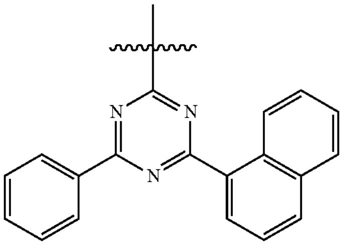
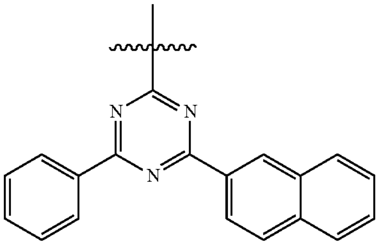
-continued
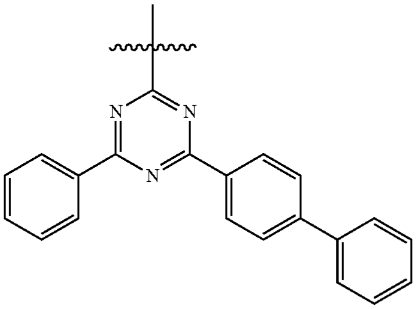
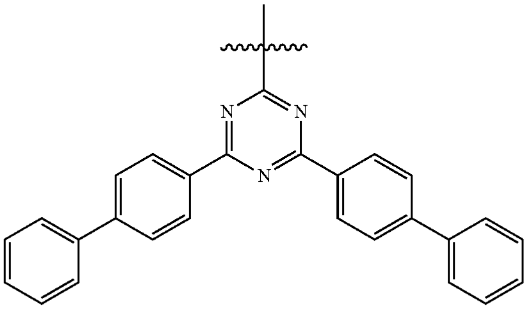
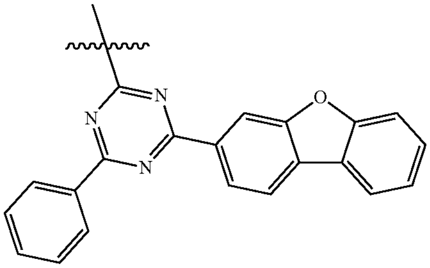
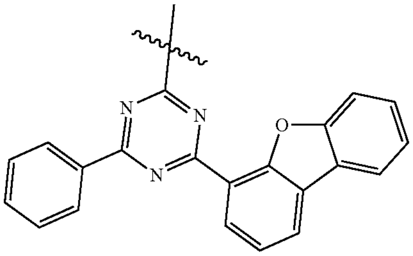
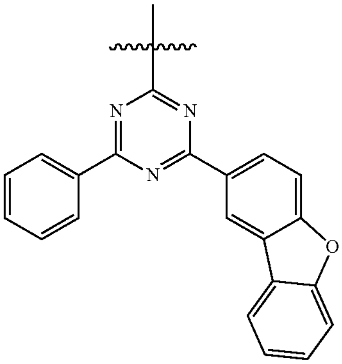

-continued
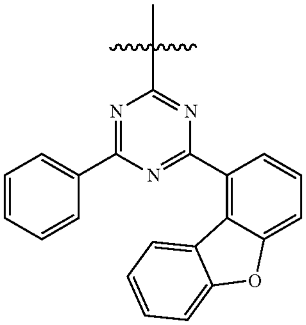
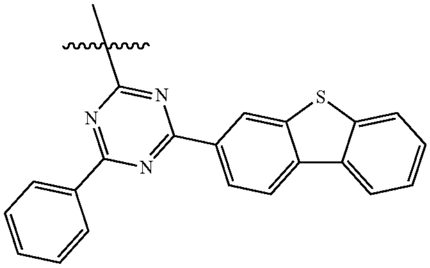
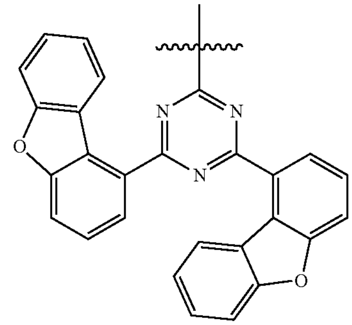
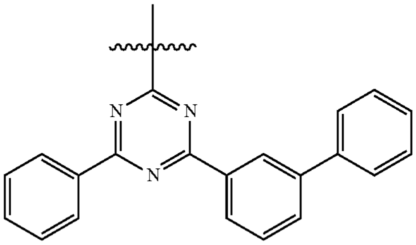
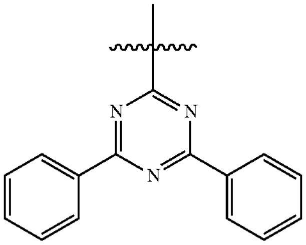
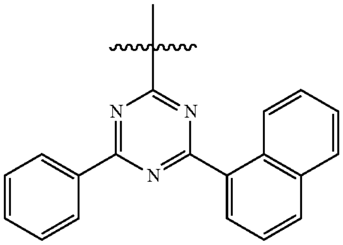
-continued
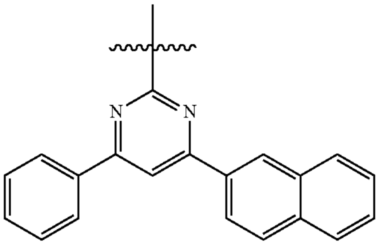
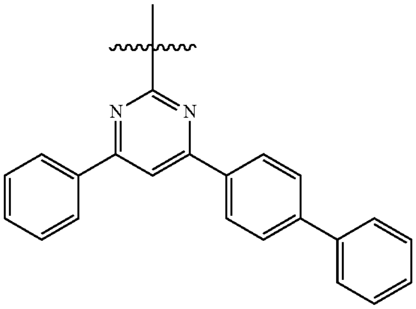
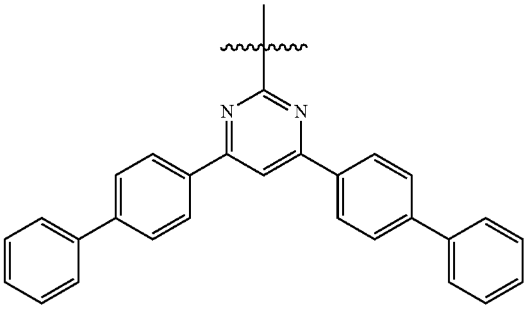
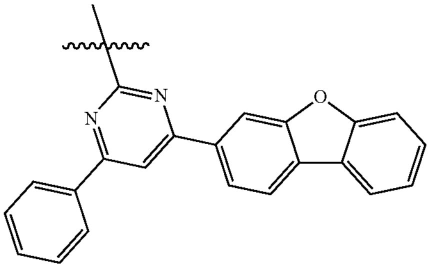
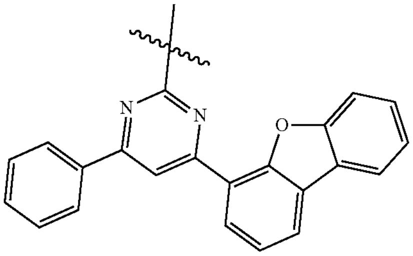

-continued
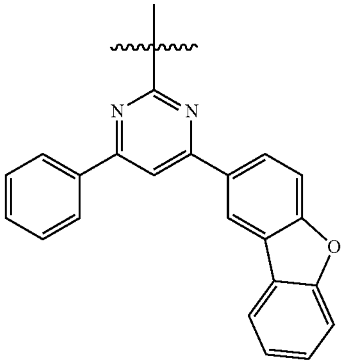
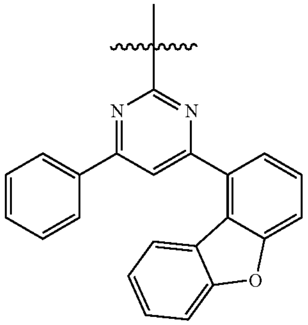
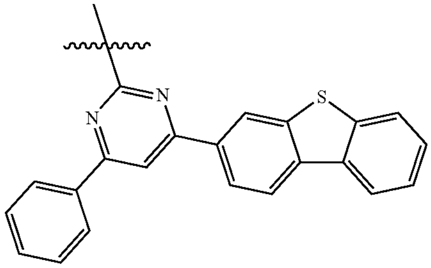
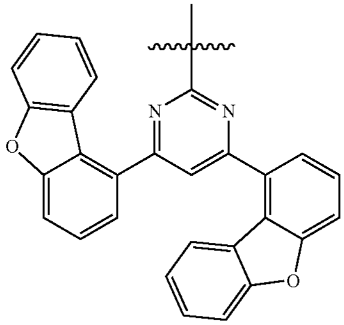
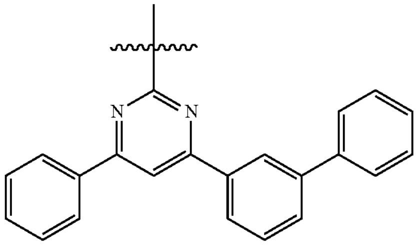
-continued
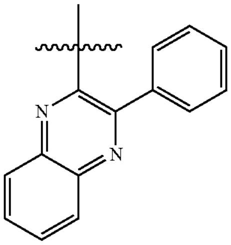
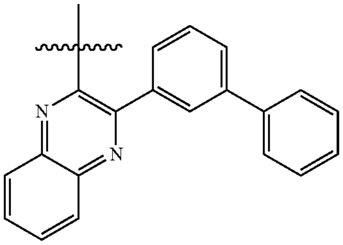
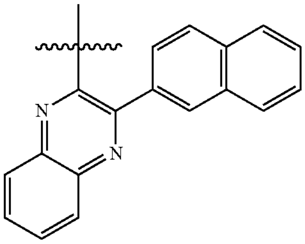
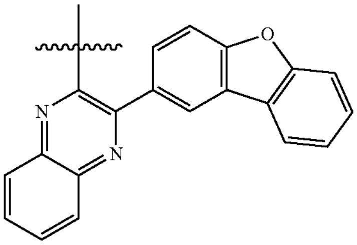
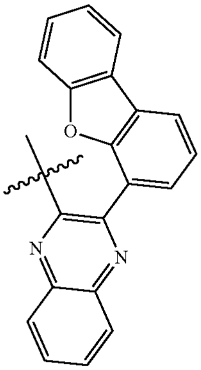
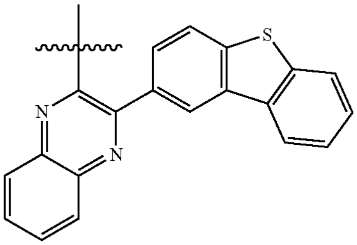

-continued
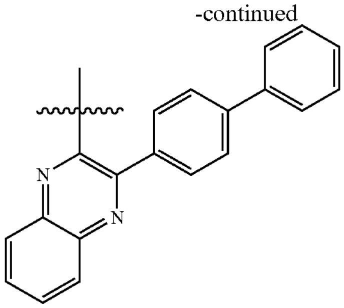
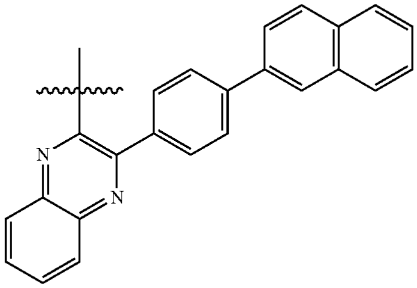
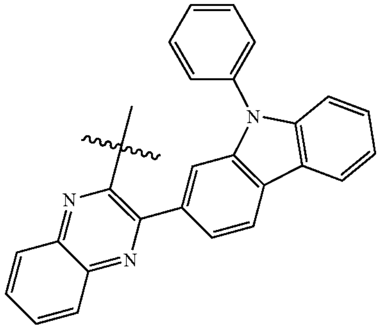
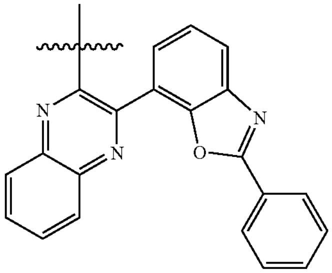
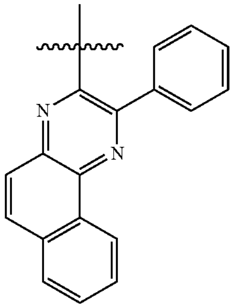
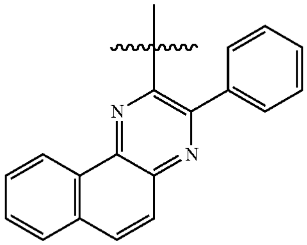
-continued
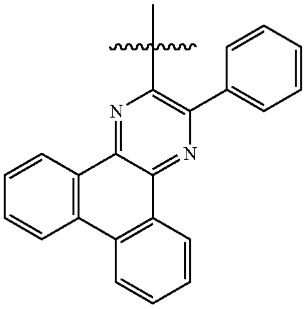
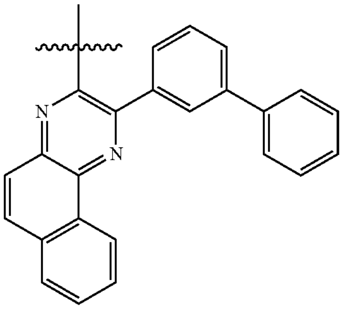
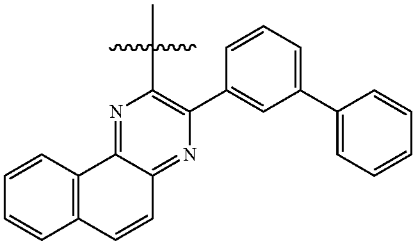
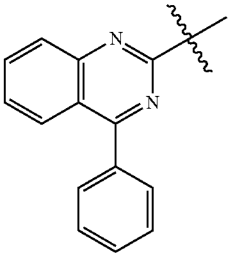
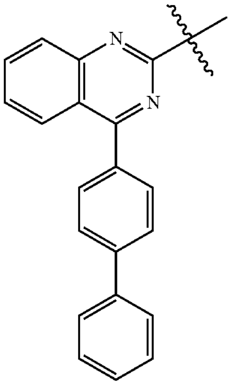
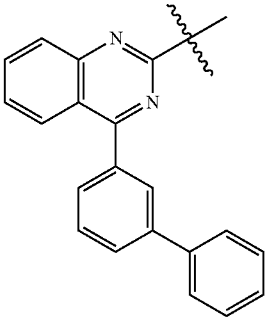

-continued
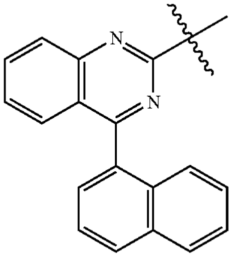
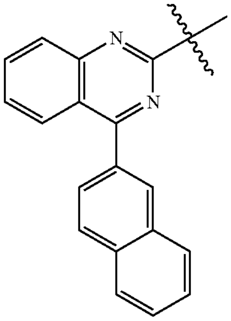
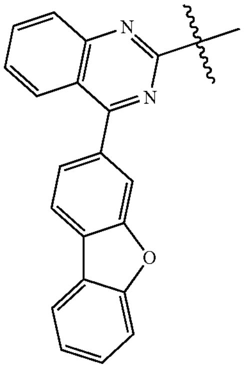
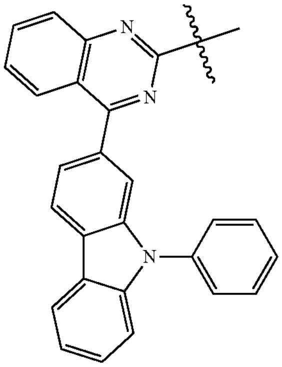
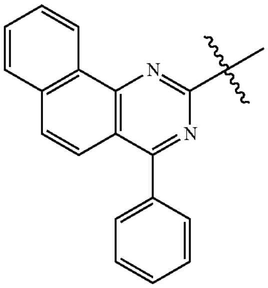
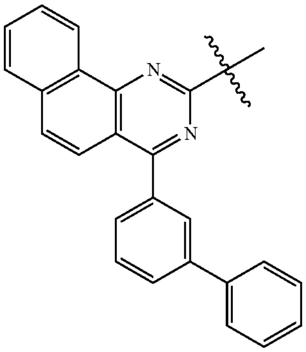
-continued
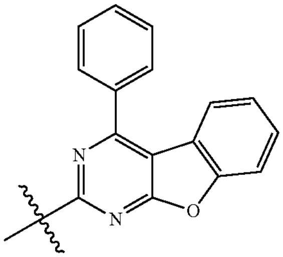
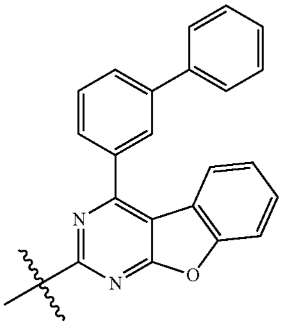
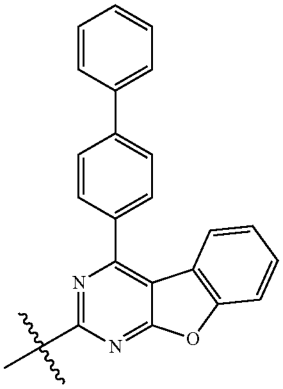
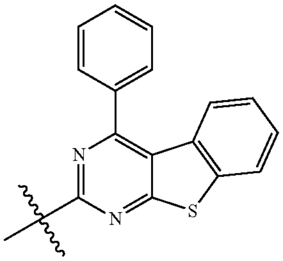
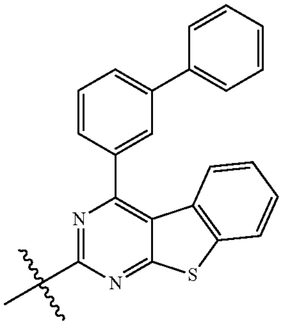

-continued
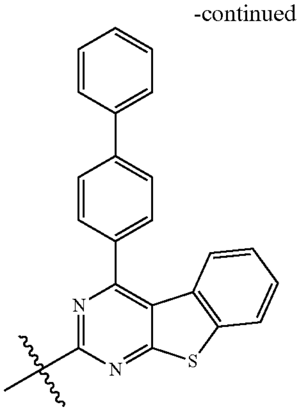
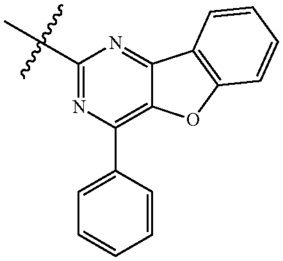
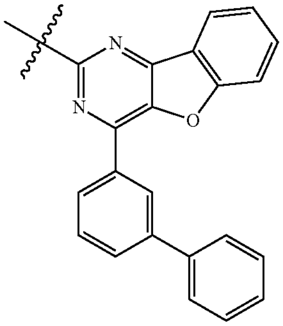
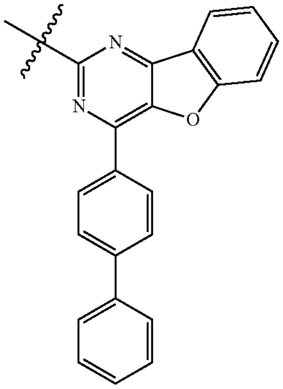
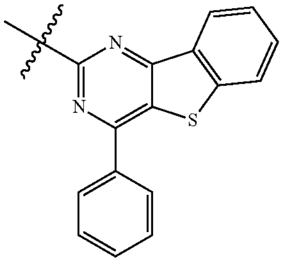
-continued
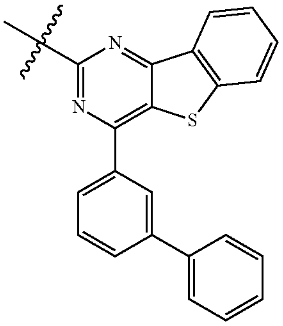
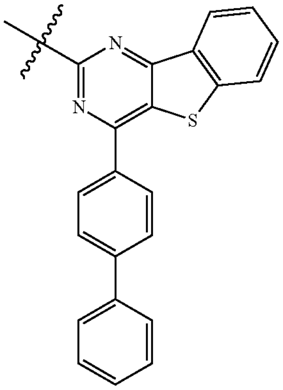
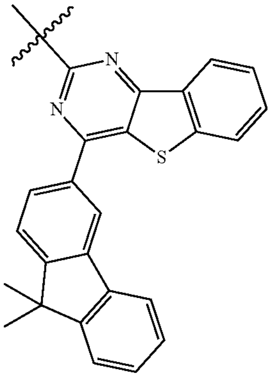
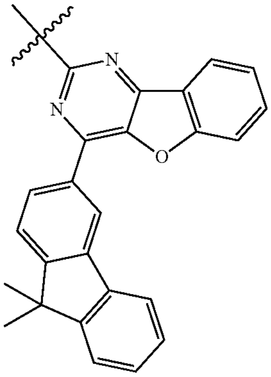

-continued

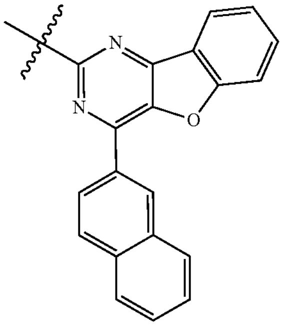

in group 2,

L represents a single bond, a substituted or unsubstituted (C6-C30)arylene, or a substituted or unsubstituted (3- to 30-membered)heteroarylene; and $A_1$ to $A_3$, each independently, represent a substituted or unsubstituted (C1-C30)alkyl, or a substituted or unsubstituted (C6-C30)aryl.

6. The plurality of host materials according to claim 1, wherein the compound represented by formulas 1-1 to 1-3 is at least one selected from the following compounds:

E-36

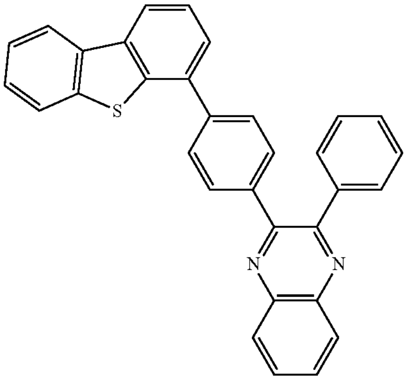

E-48

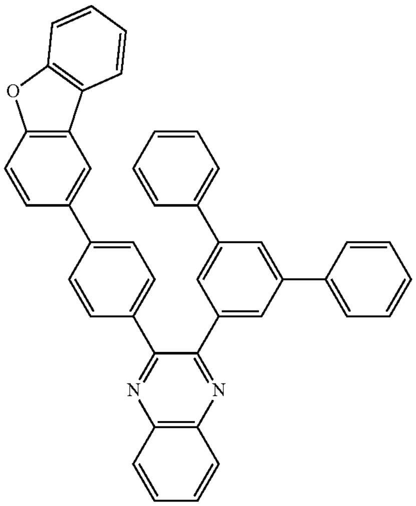

-continued

E-49

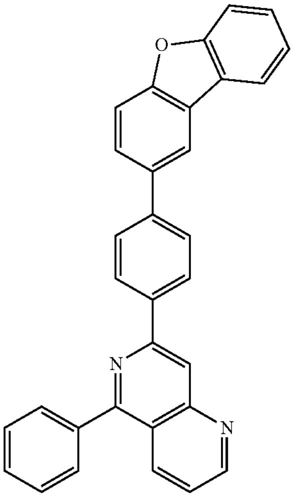

E-50

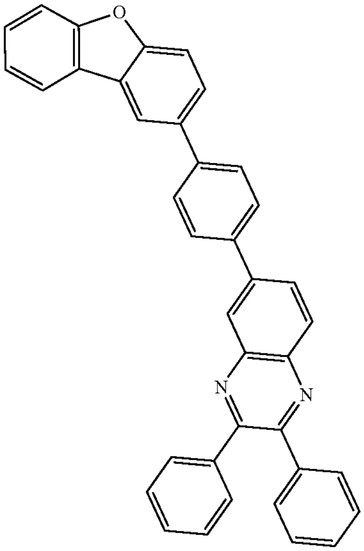

E-51

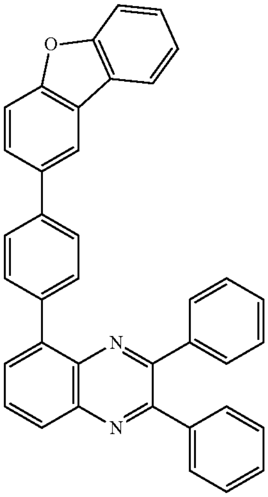

-continued
E-52
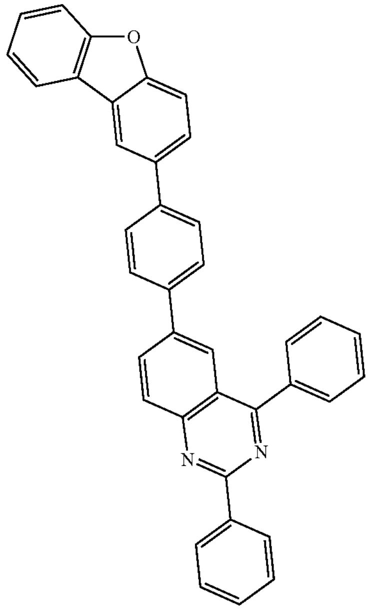
E-57
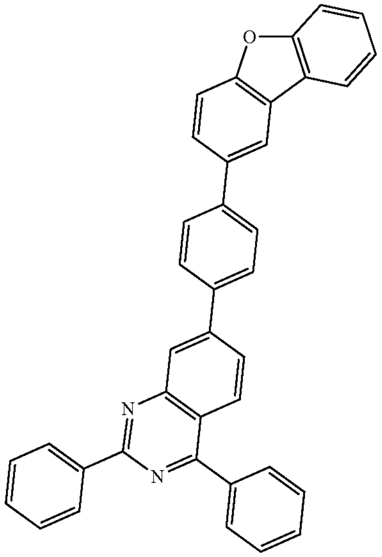
E-58
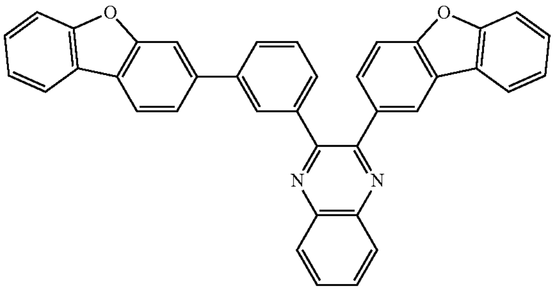
-continued
E-59
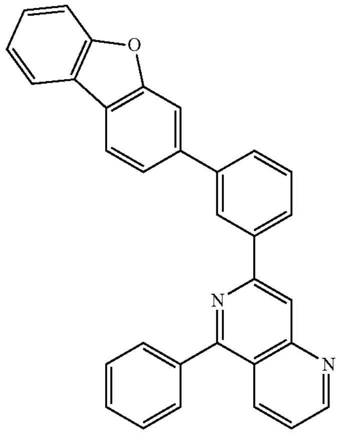
E-60
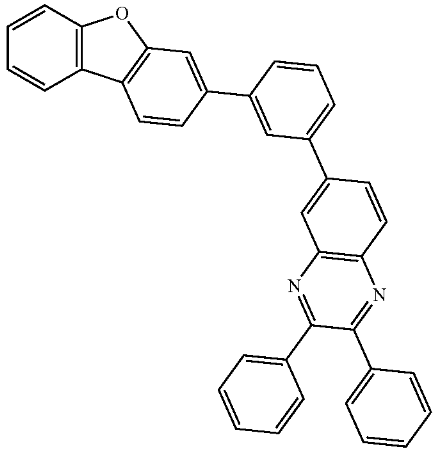
E-61
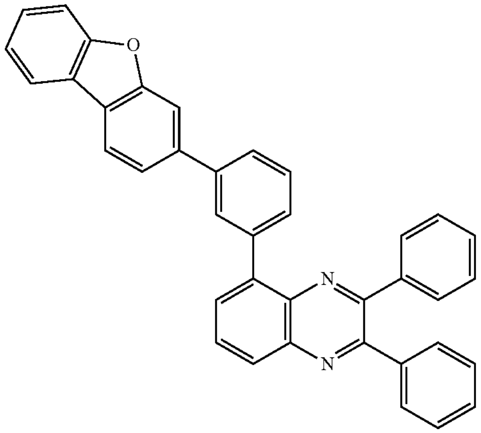

-continued
E-62
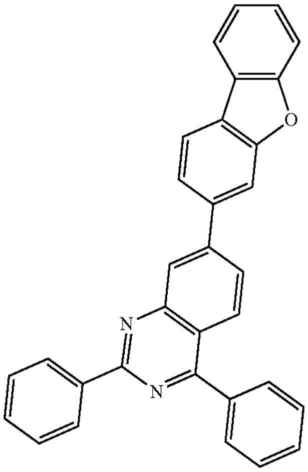
E-65
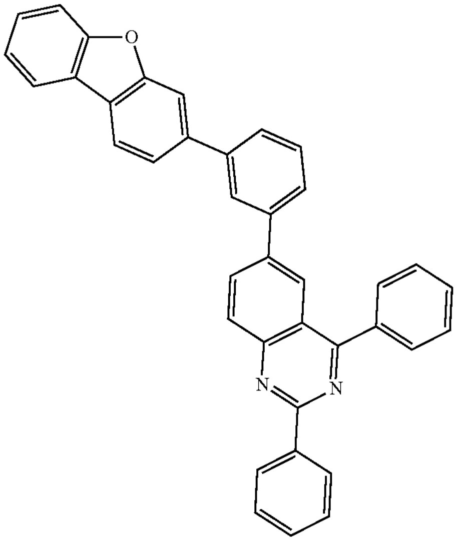
E-66
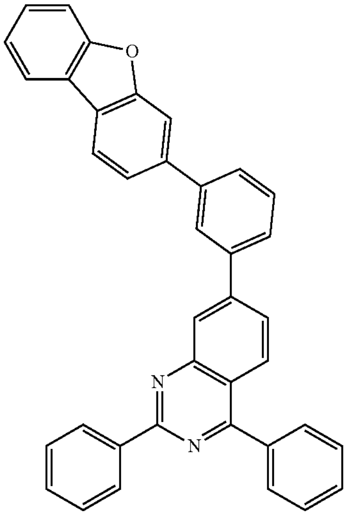
-continued
E-73
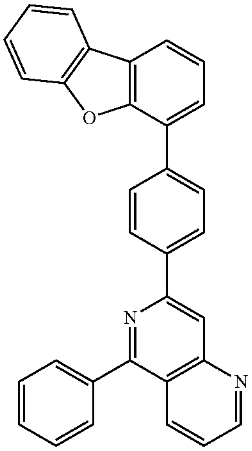
E-74
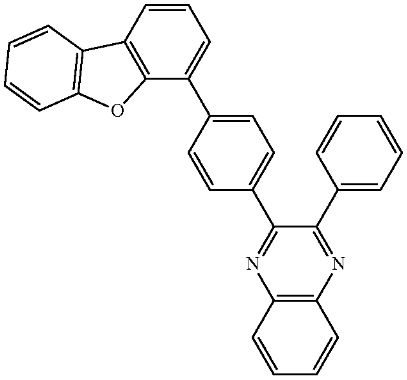
E-75
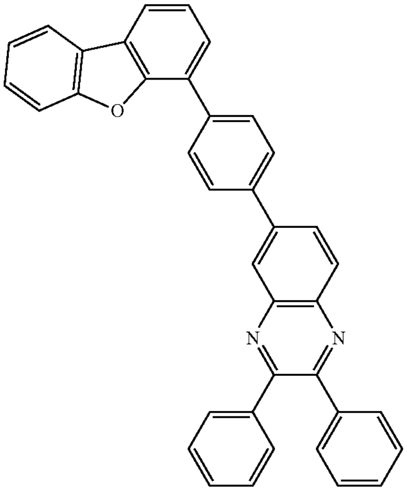

-continued
E-76
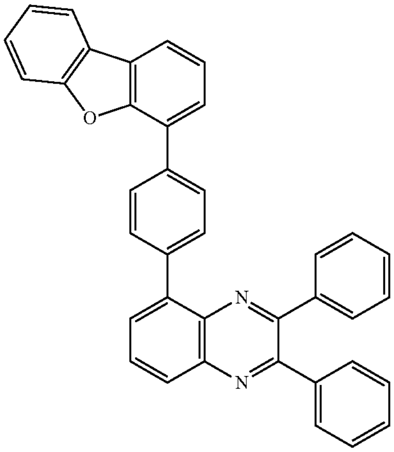
E-77
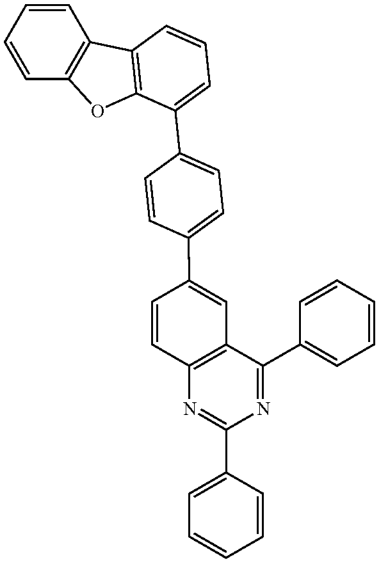
E-78
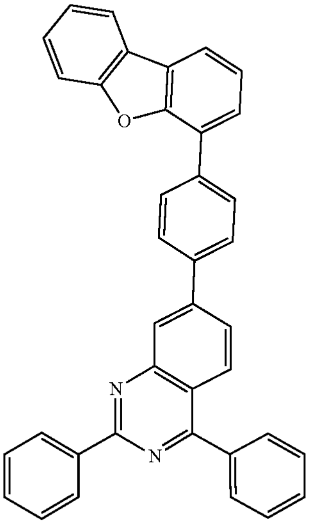
-continued
E-84
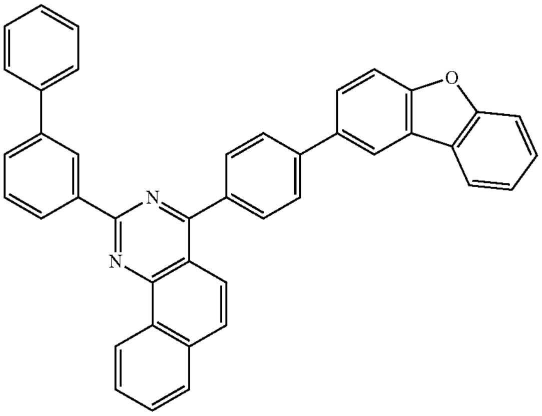
E-108
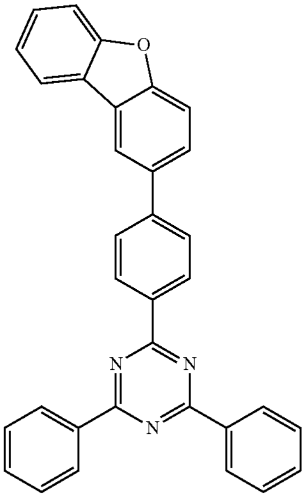
E-109
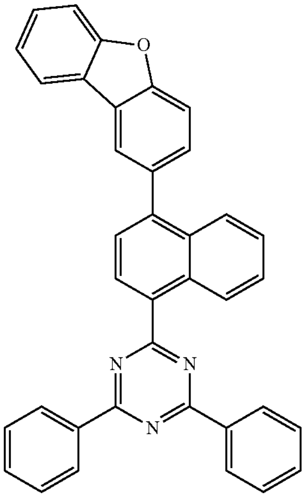

-continued
E-113
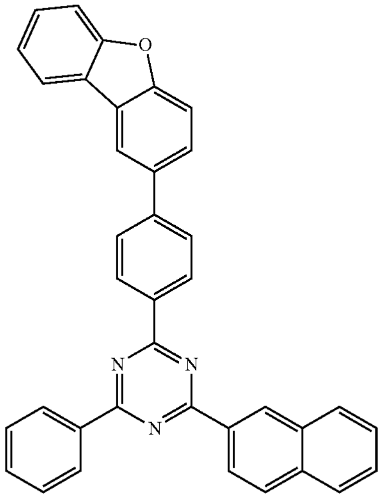
E-114
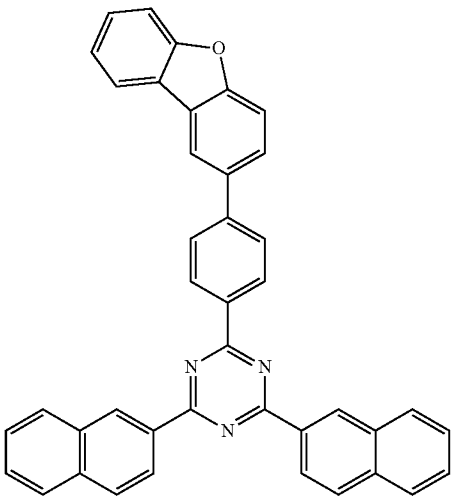
E-115
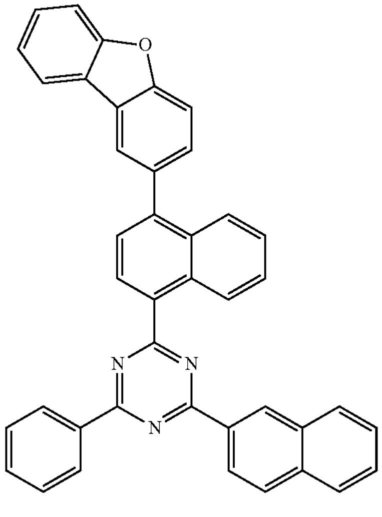
-continued
E-117
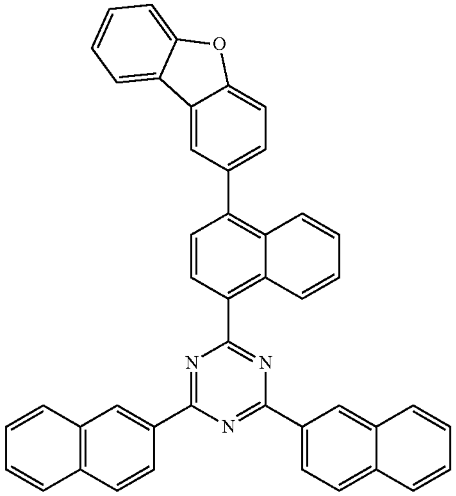
E-120
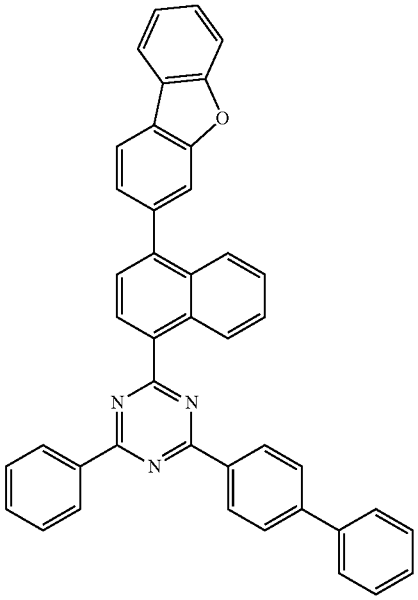
E-121
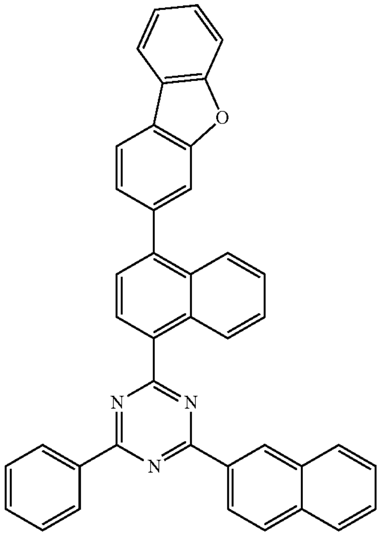

-continued
E-122
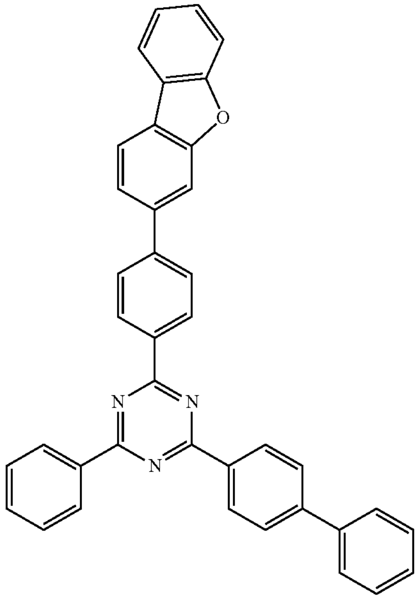
E-126
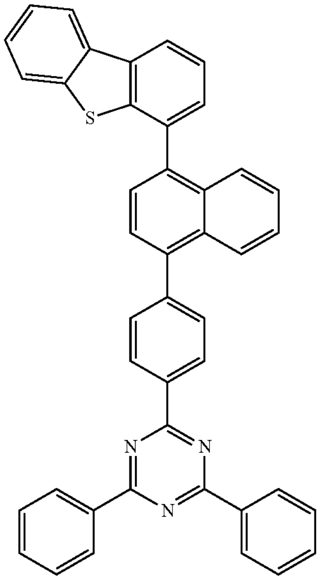
E-127
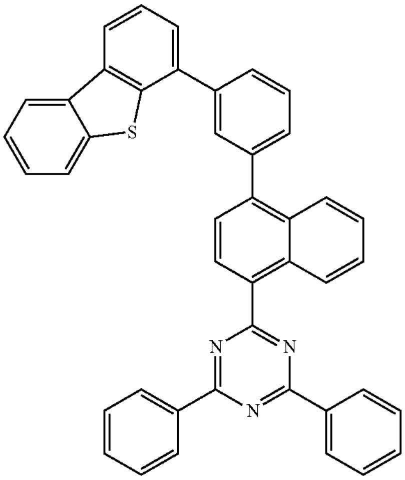
-continued
E-128
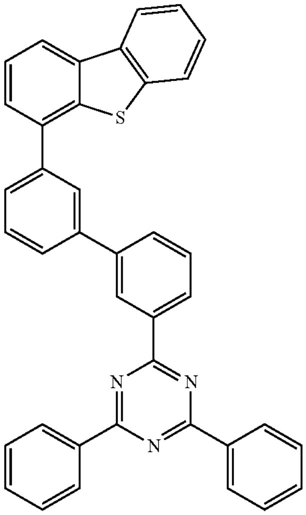
and
E-129
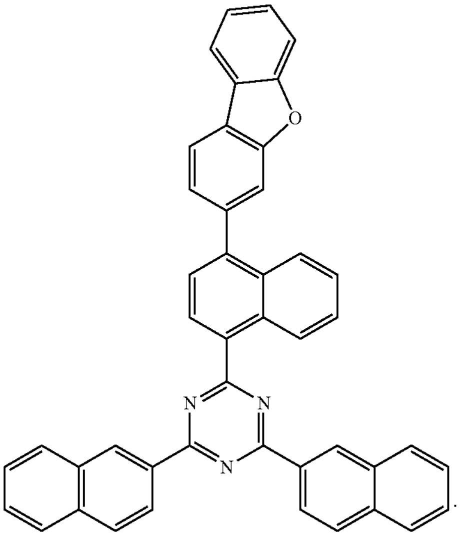
7. The plurality of host materials according to claim 1, wherein the compound represented by formulas 2-1 and 2-2 is at least one selected from the following compounds:
C-1
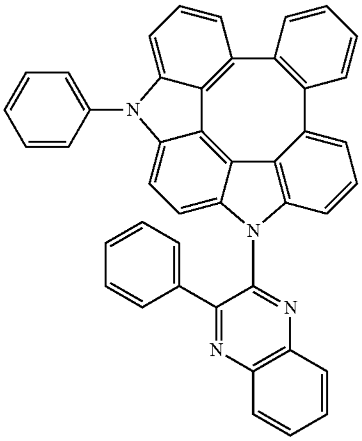

-continued
C-2
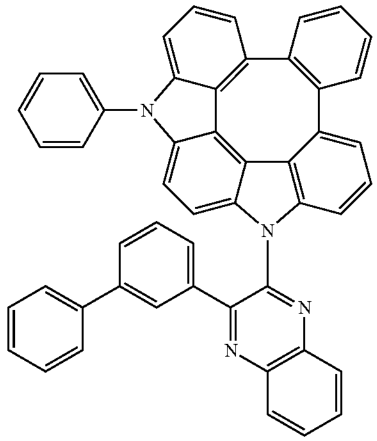
C-3
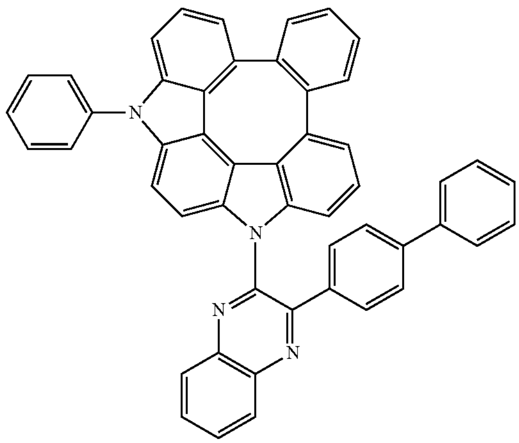
C-4
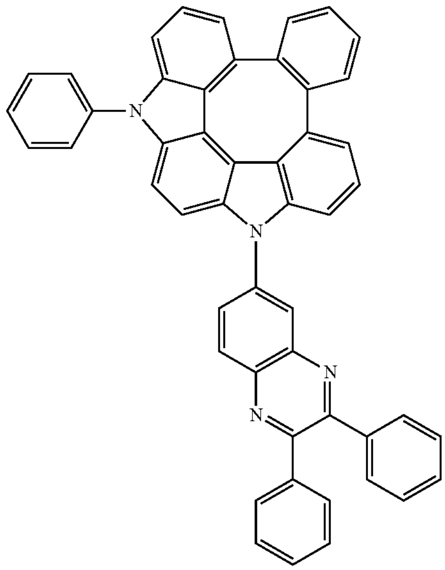
-continued
C-5
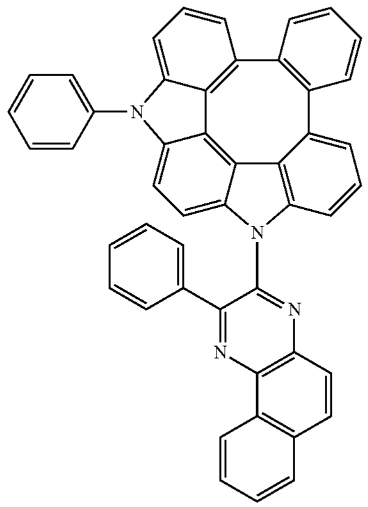
C-6
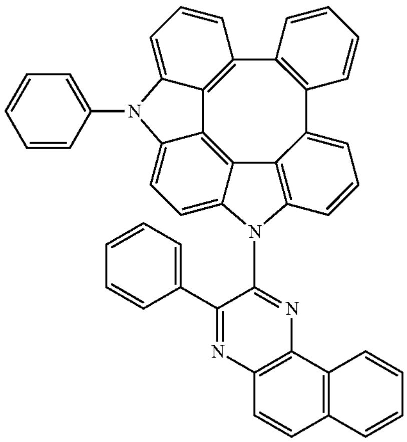
C-7
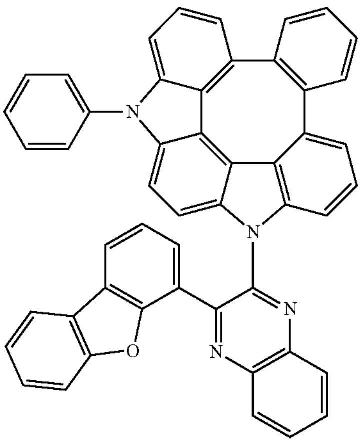

-continued
C-8
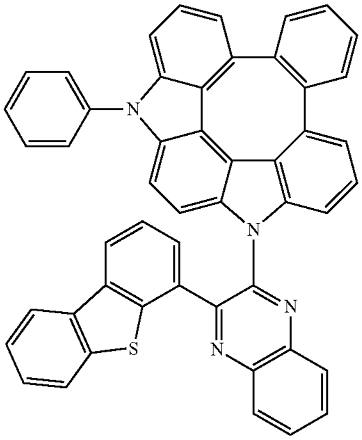
C-9
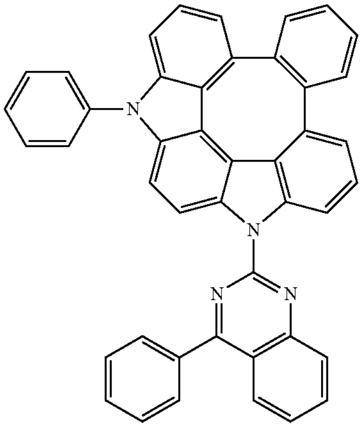
C-10
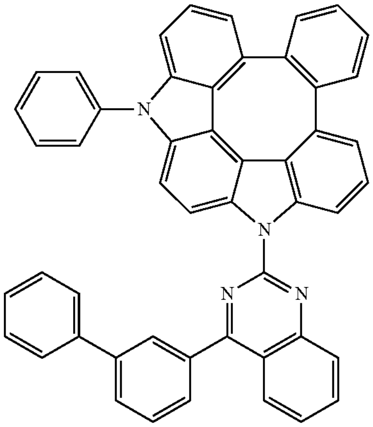
-continued
C-11
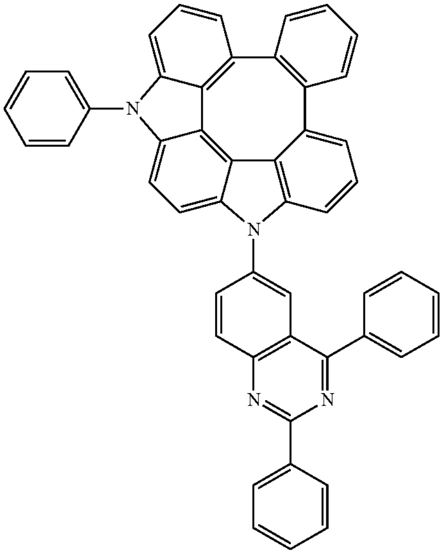
C-12
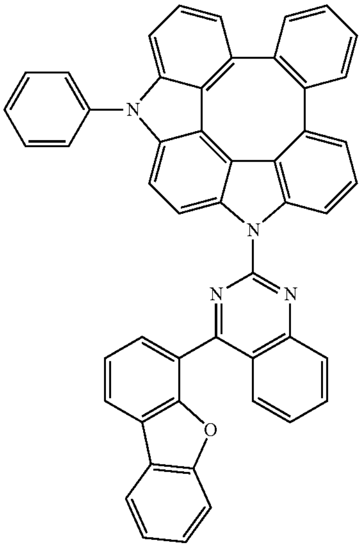
C-13
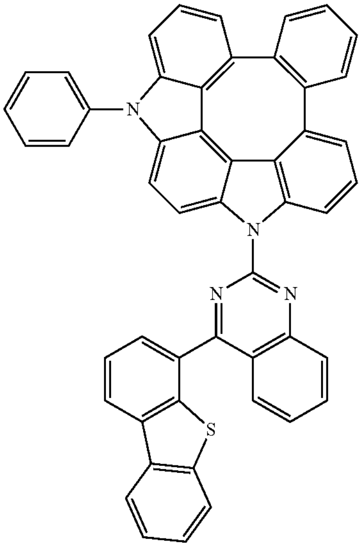

-continued
C-14
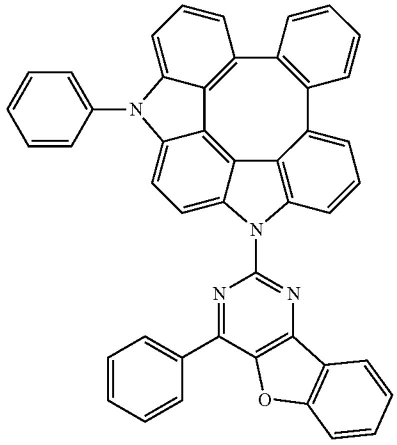
C-15
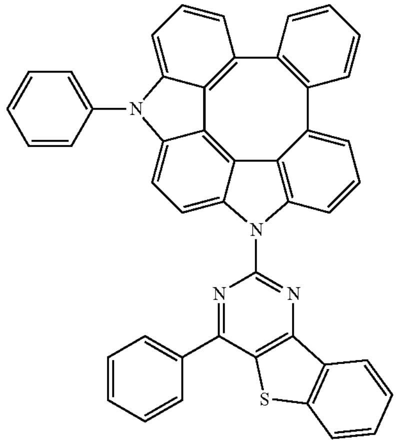
C-16
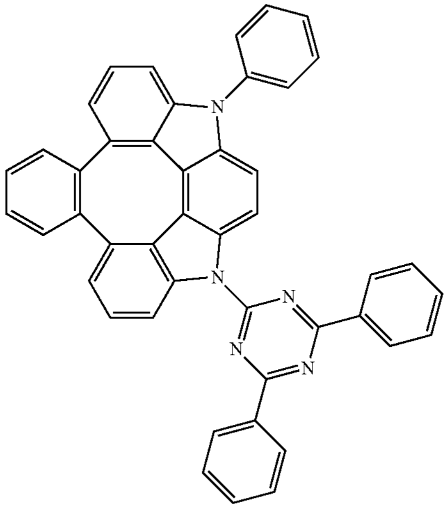
-continued
C-17
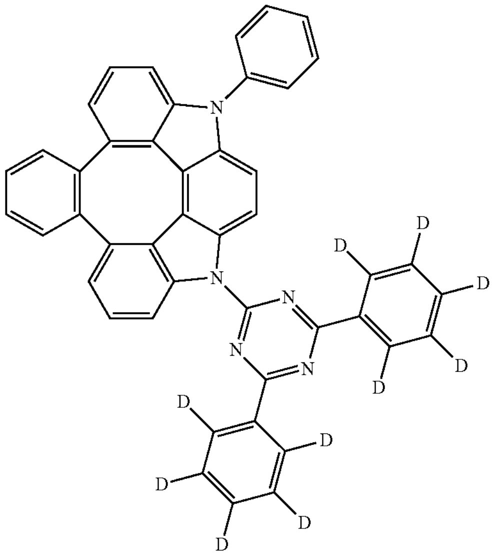
C-18
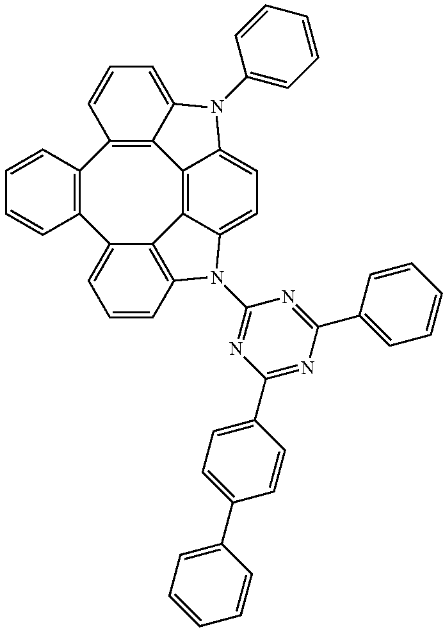

-continued
C-19
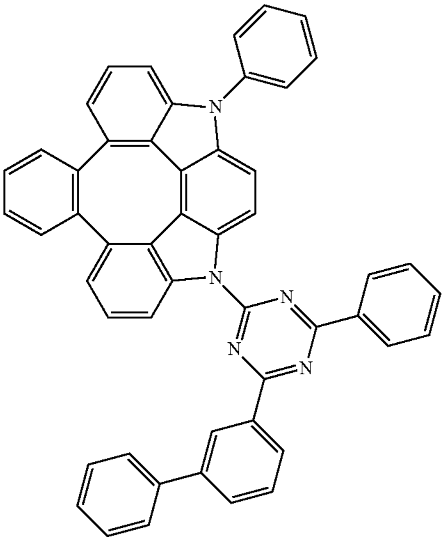
C-20
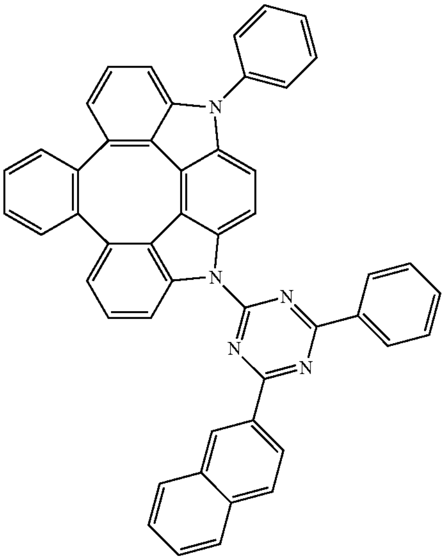
-continued
C-21
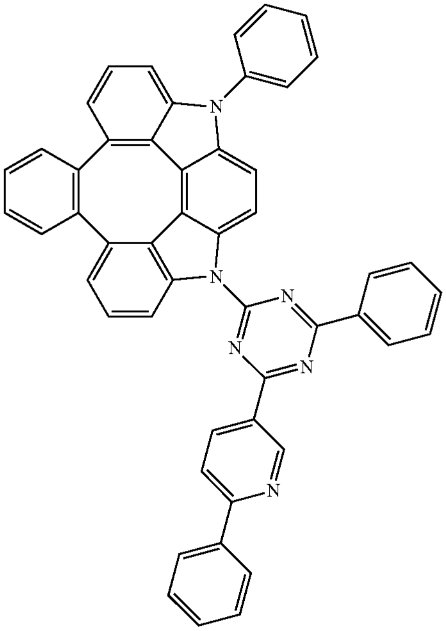
C-22
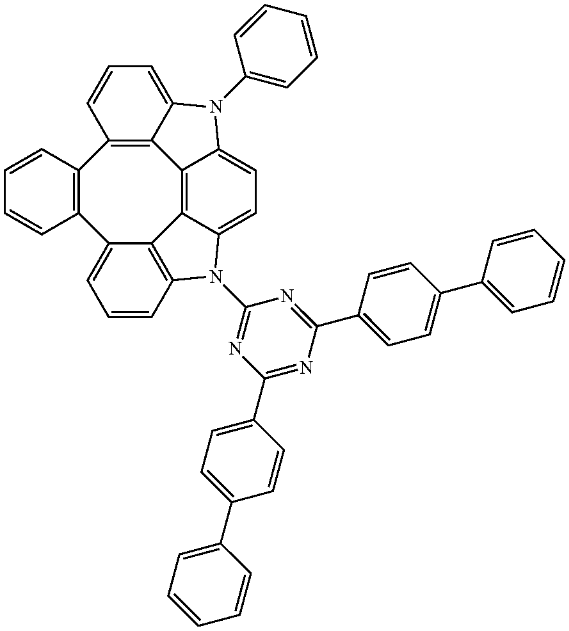

-continued
C-23
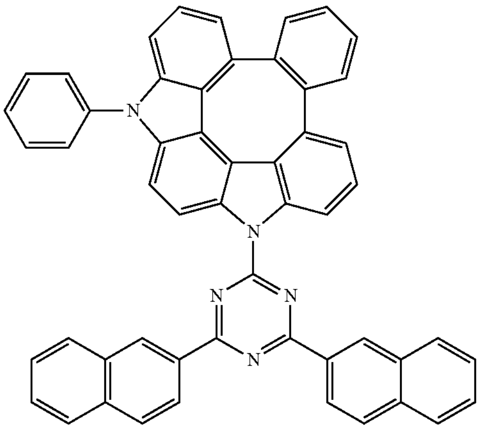
C-24
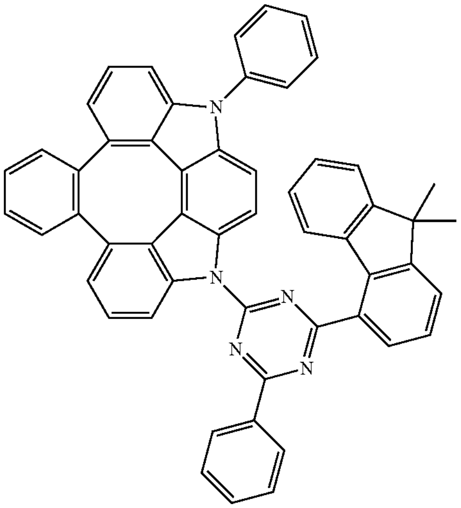
C-25
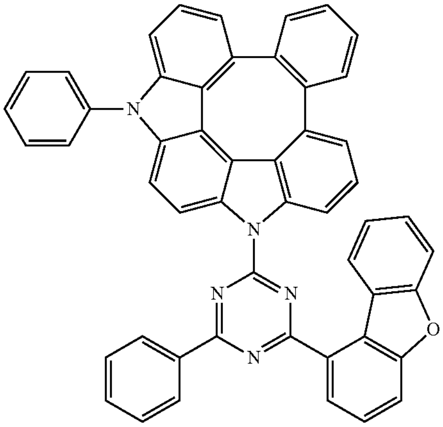
-continued
C-26
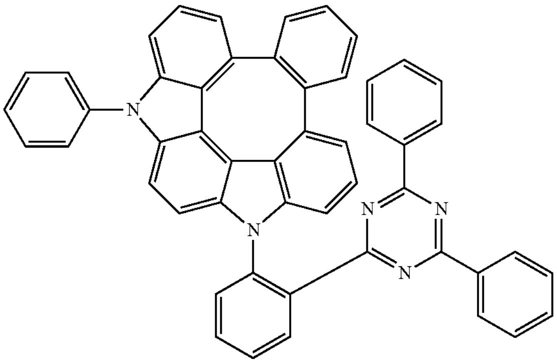
C-27
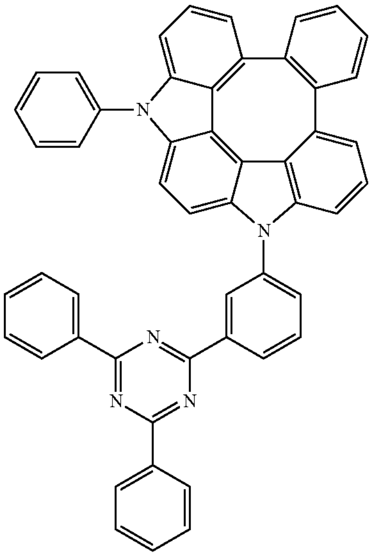
C-28
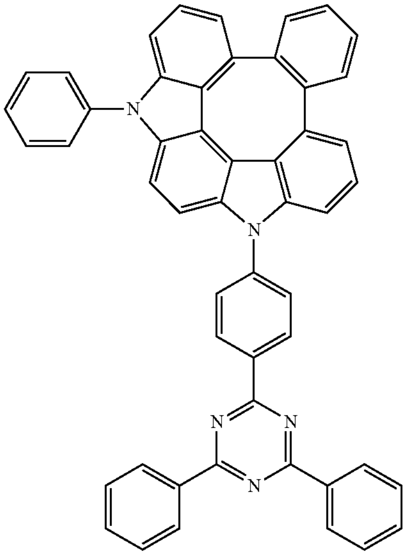

-continued
C-29
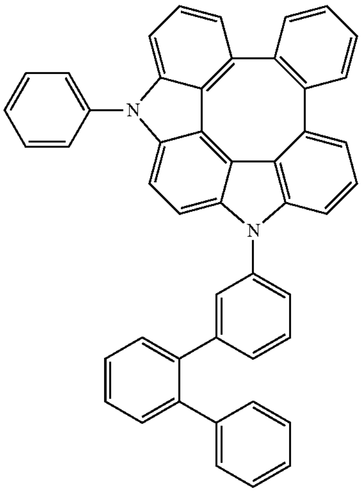
C-30
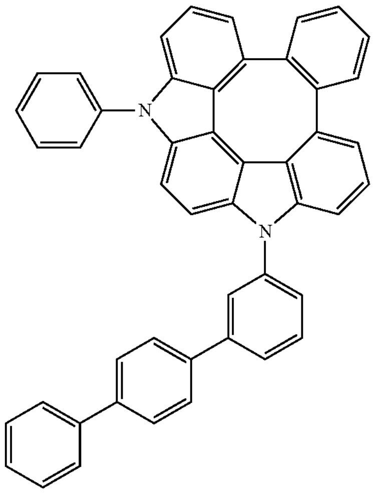
C-31
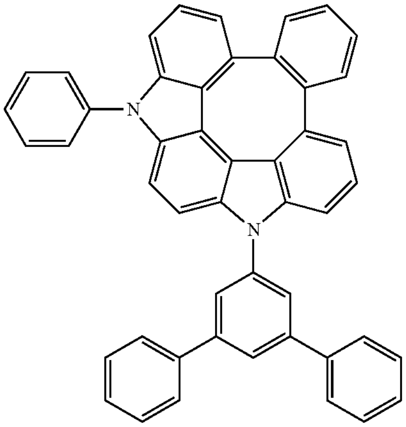
-continued
C-32
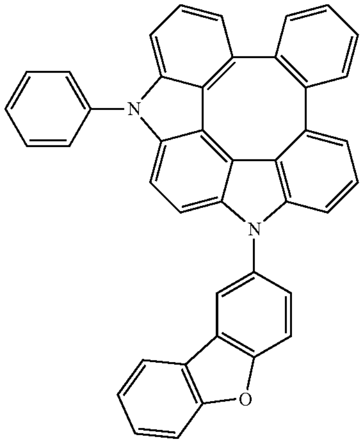
C-33
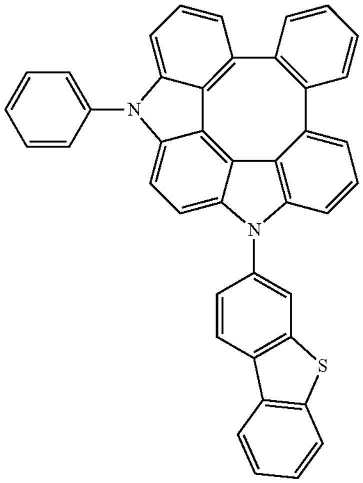
C-34
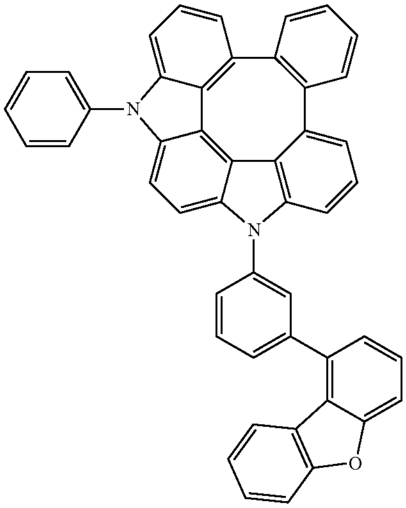

-continued
C-35
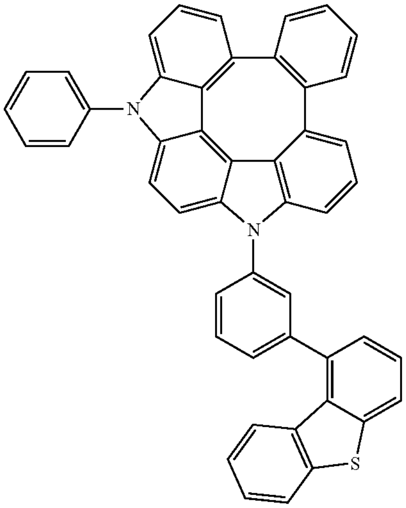
C-36
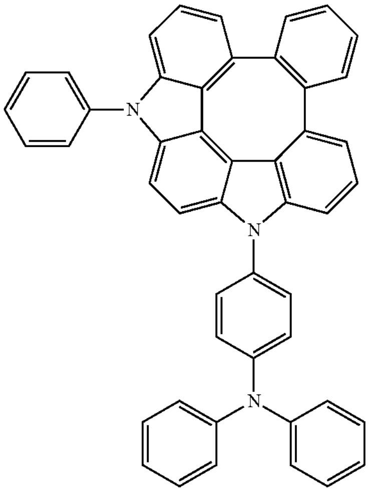
C-65
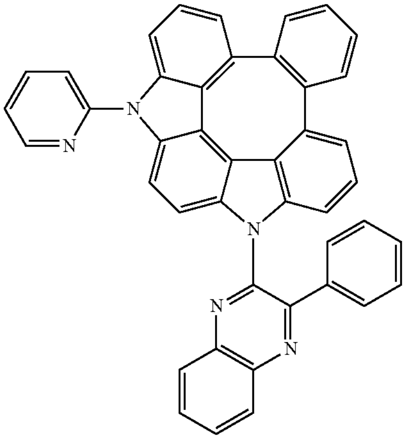
-continued
C-66
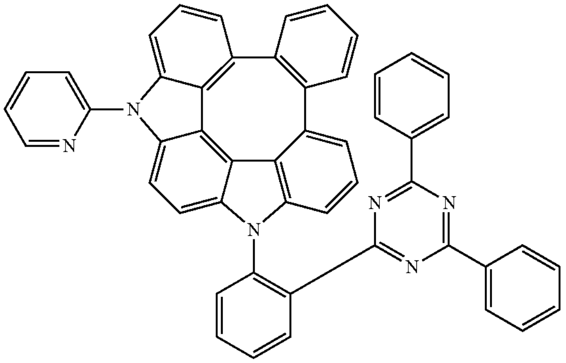
C-67
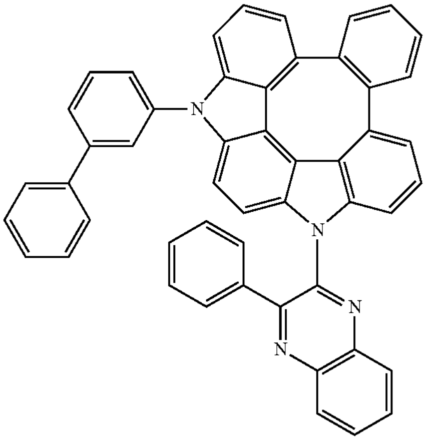
C-68
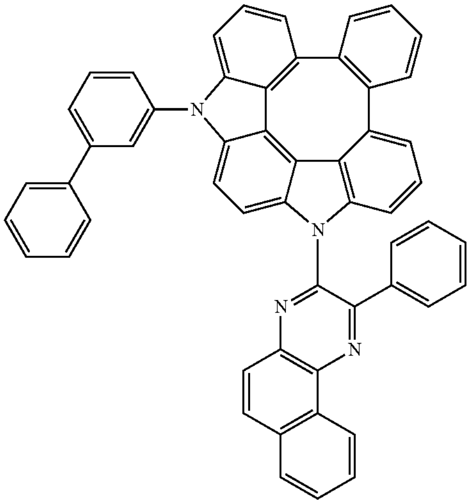

-continued
C-69
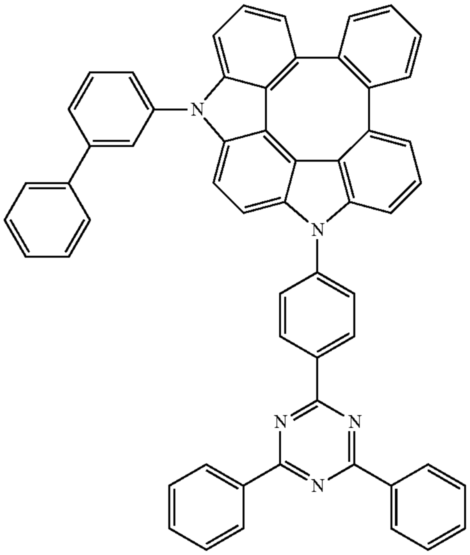
C-70
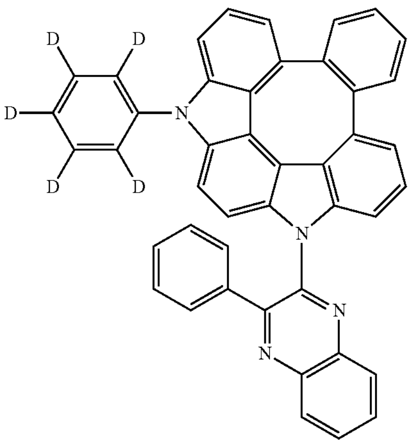
C-71
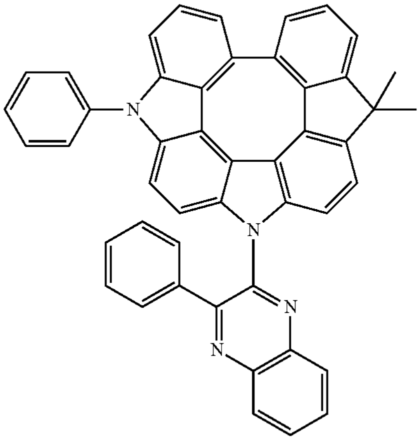
-continued
C-72
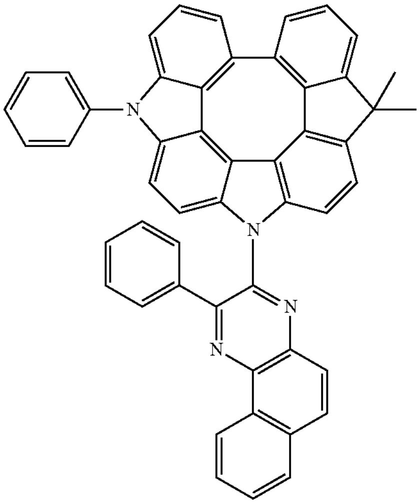
C-73
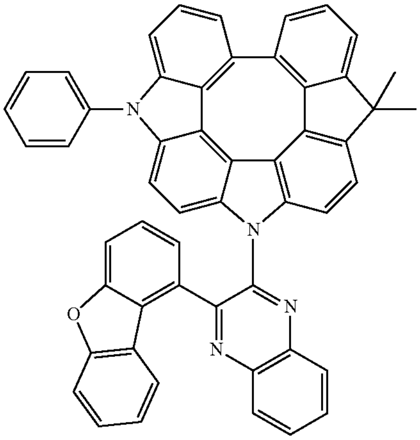
C-74
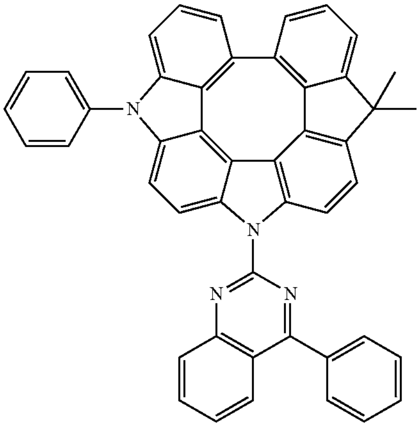

-continued
C-75
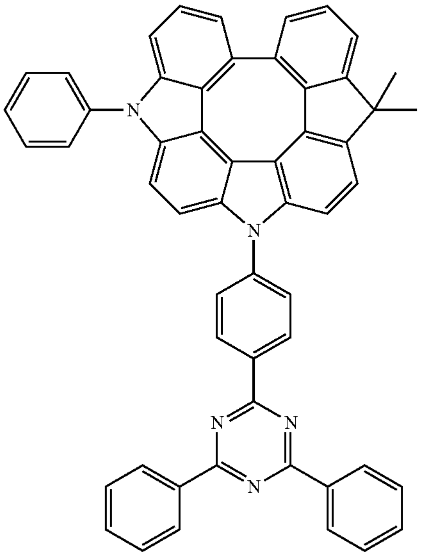
C-76
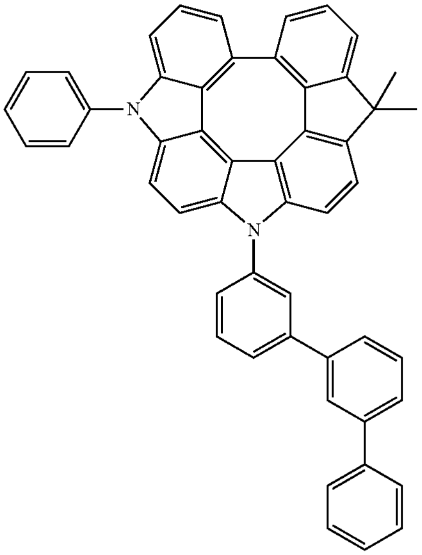
C-77
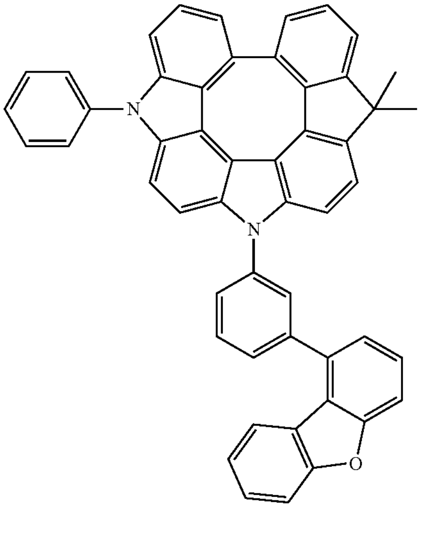
-continued
C-78
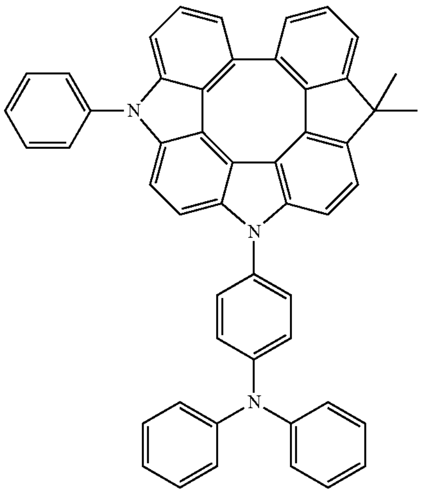
C-79
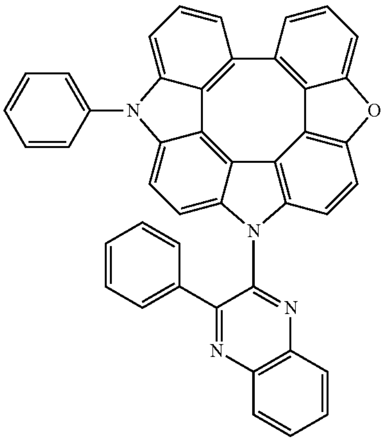
C-80
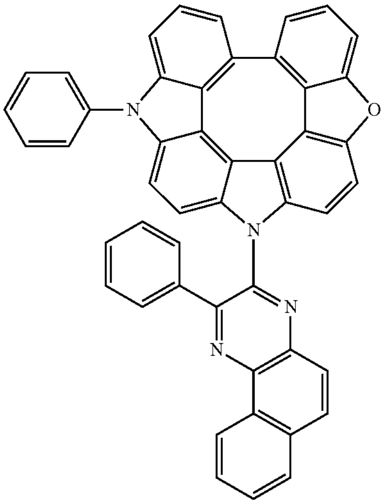

-continued
C-81
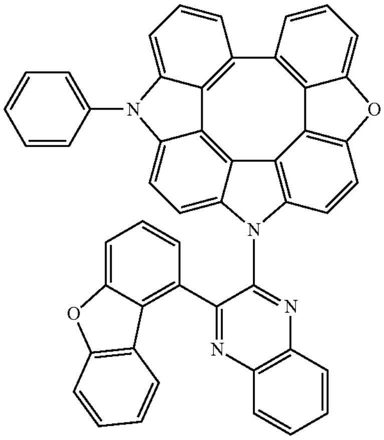
C-82
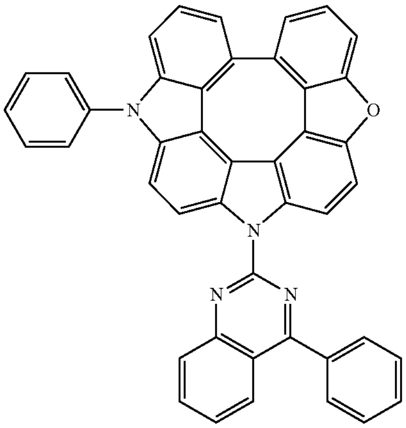
C-83
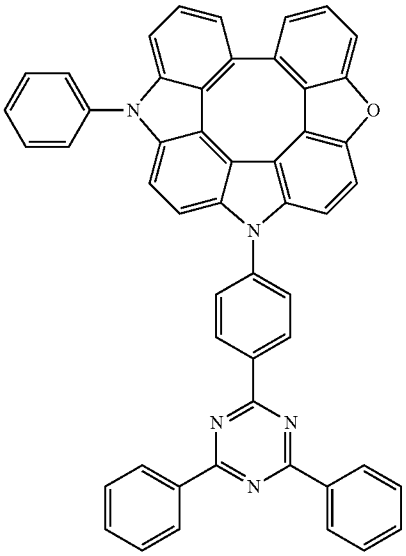
-continued
C-84
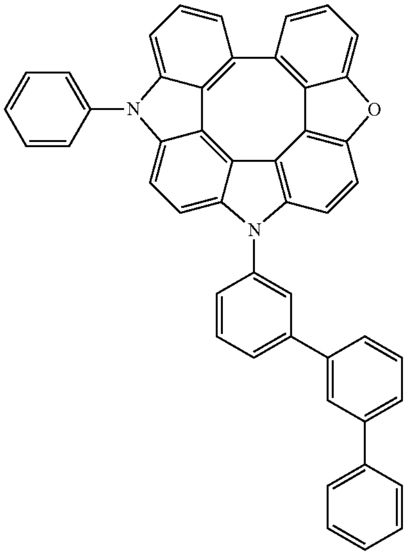
C-85
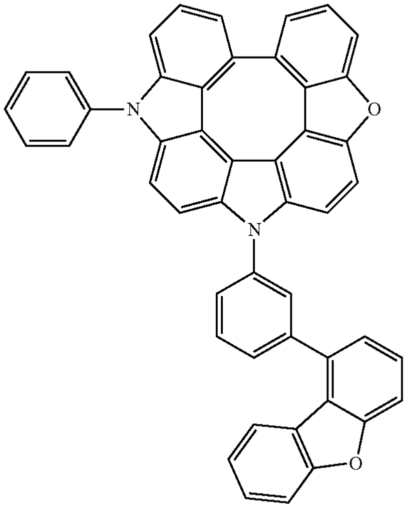
C-86
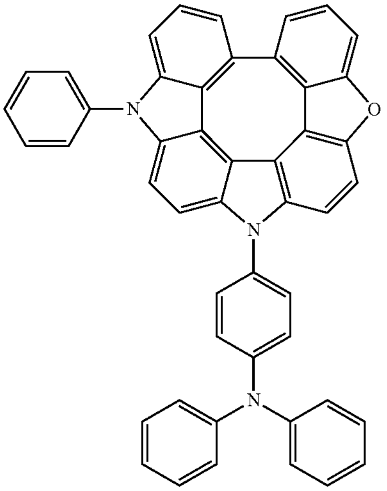

-continued
C-87
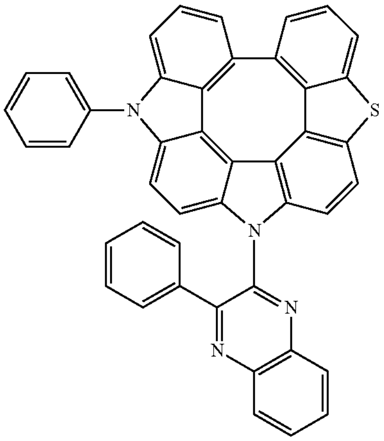
C-88
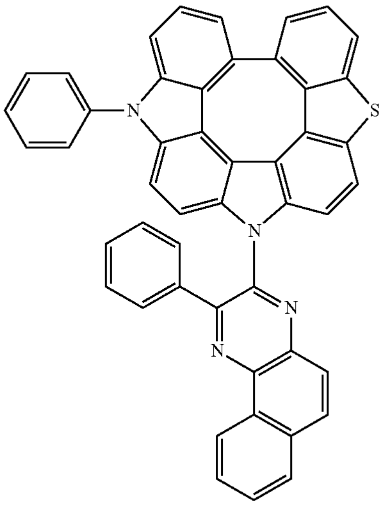
C-89
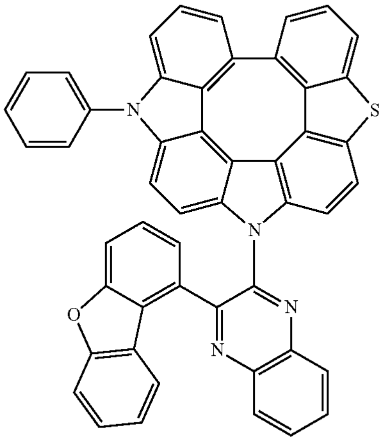
-continued
C-90
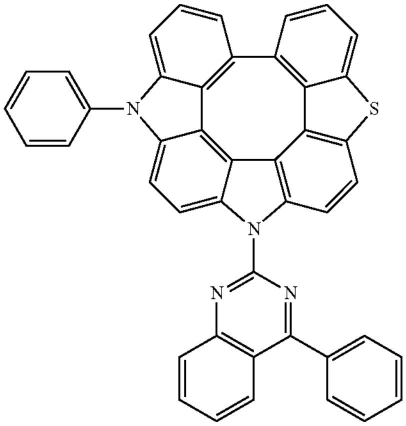
C-91
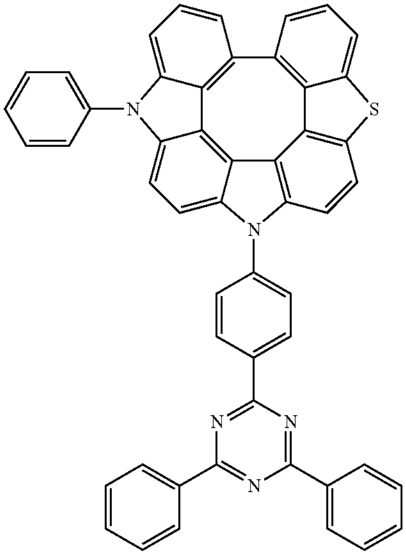
C-92
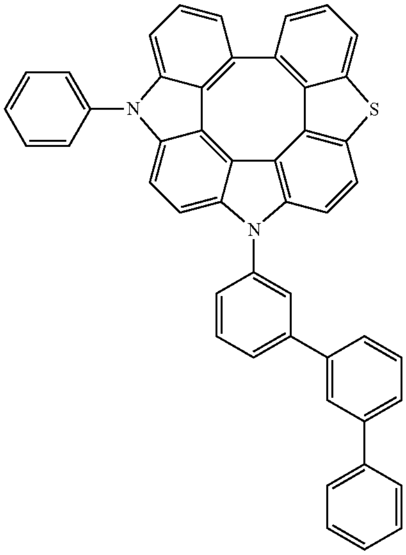

-continued
C-93
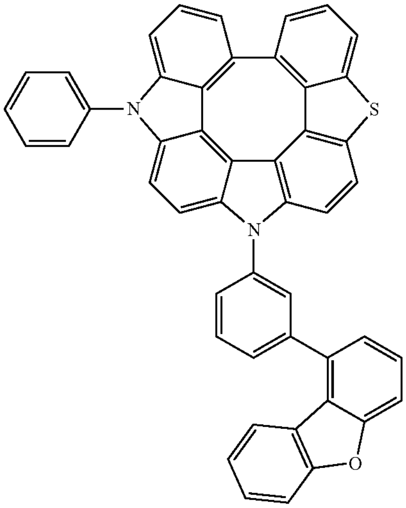
C-94
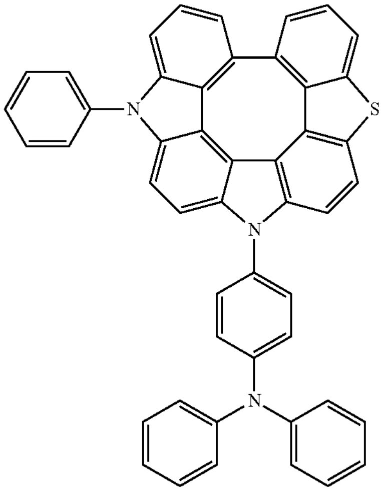
C-119
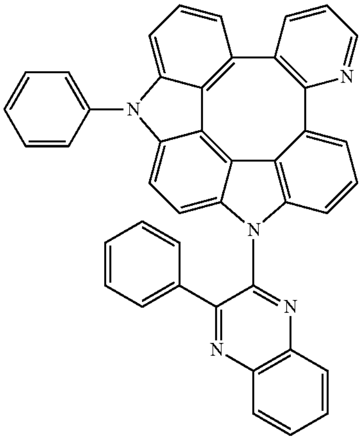
-continued
C-120
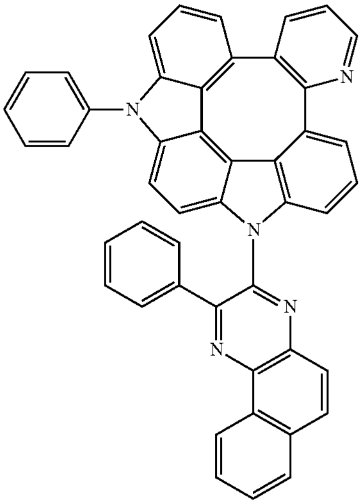
C-121
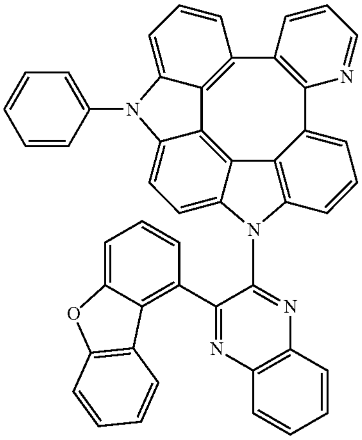
C-122
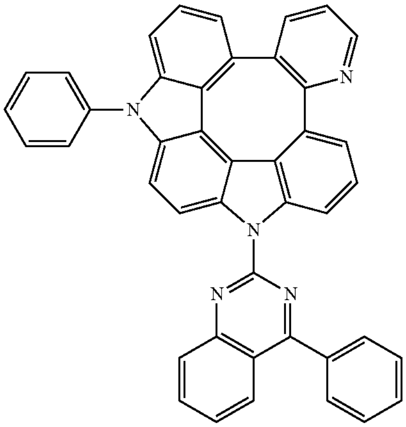

-continued
C-136
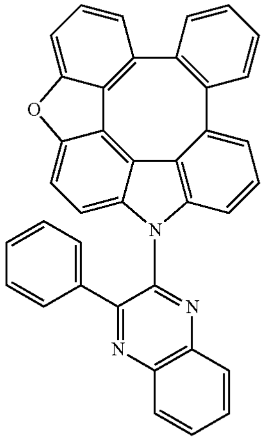
C-137
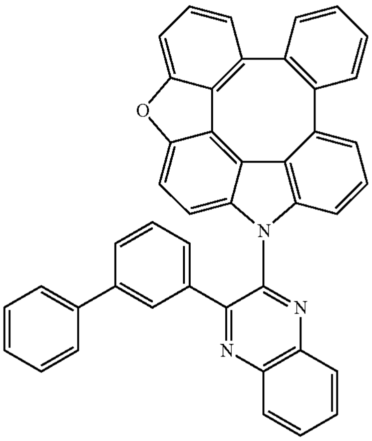
C-138
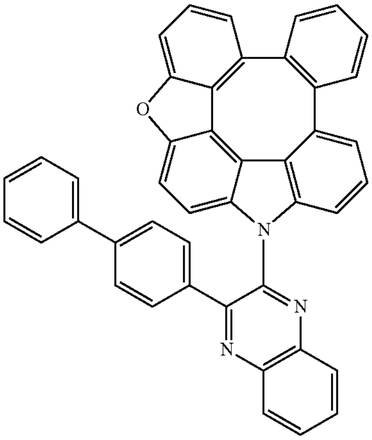
-continued
C-139
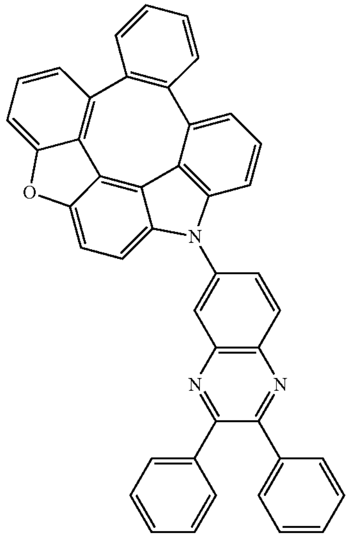
C-140
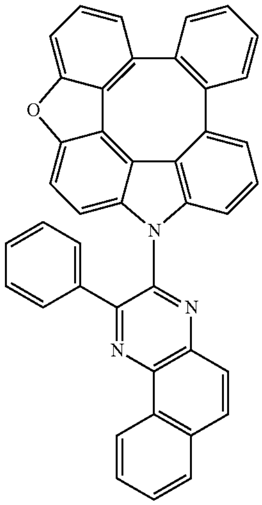
C-141
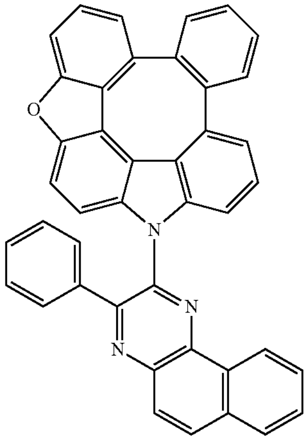

-continued
C-142
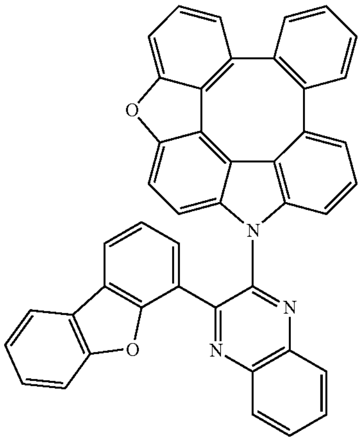
C-143
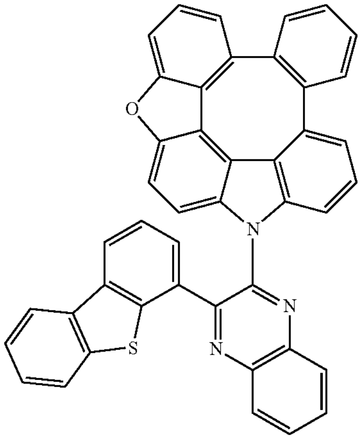
C-144
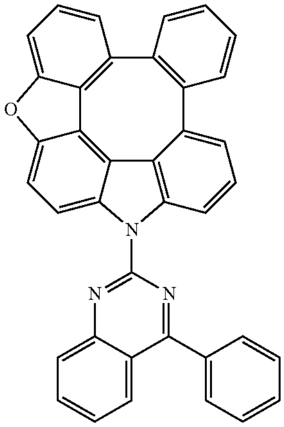
-continued
C-145
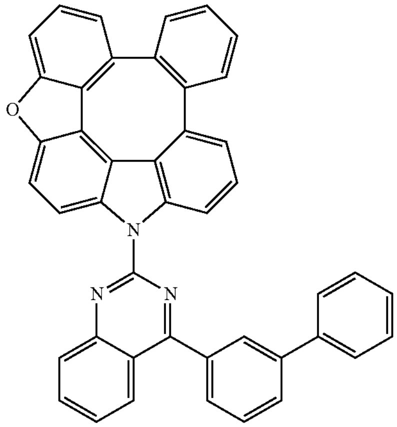
C-146
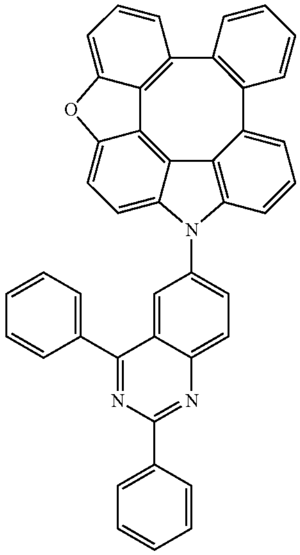
C-147
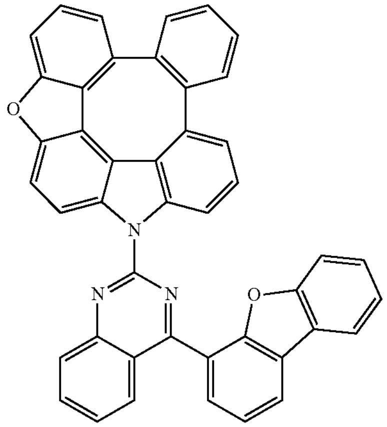

-continued
C-148
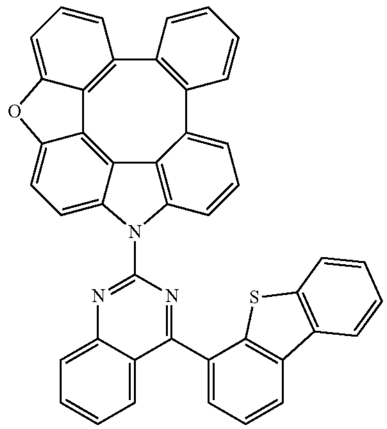
C-149
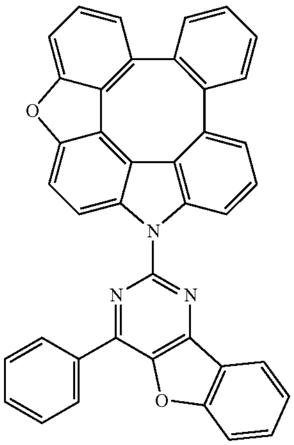
C-150
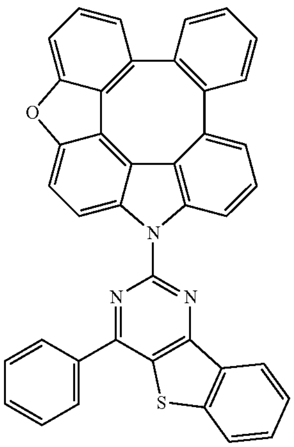
-continued
C-151
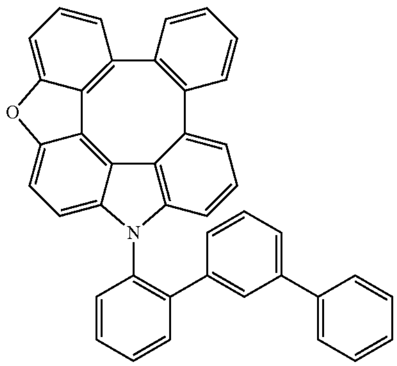
C-152
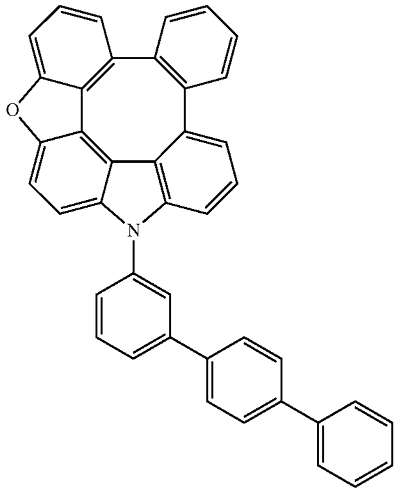
C-153
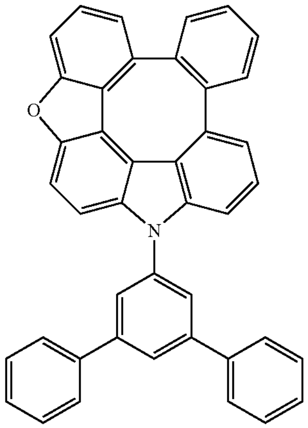

-continued
C-154
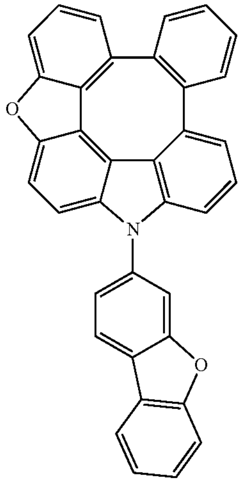
C-155
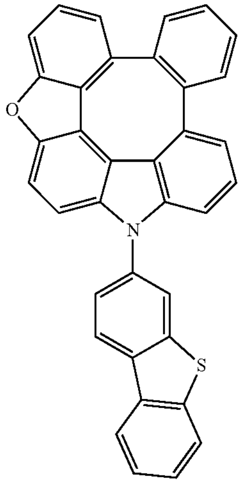
C-156
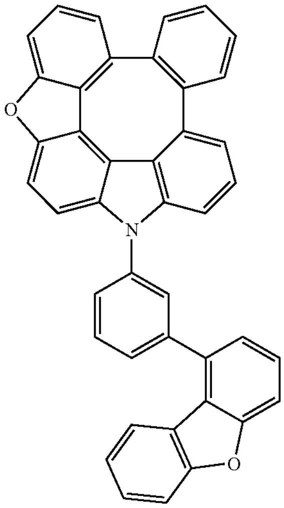
-continued
C-157
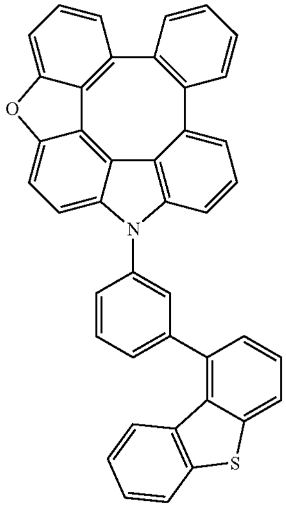
C-158
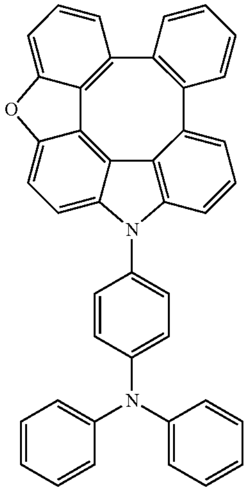
C-159
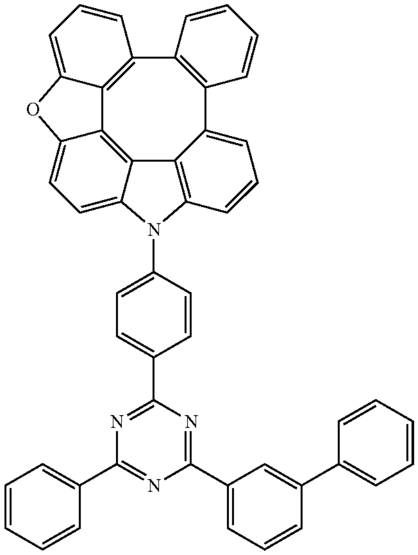

-continued
C-160
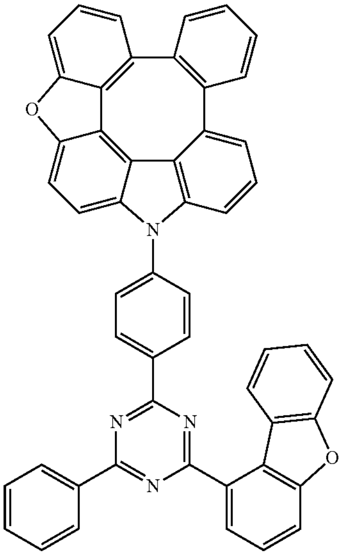
C-161
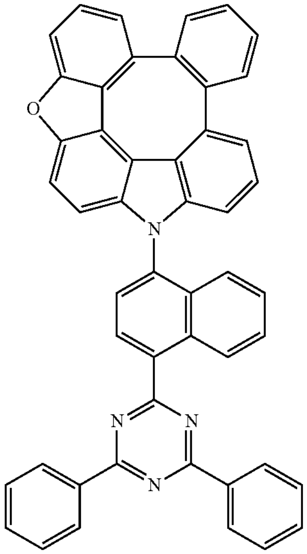
C-162
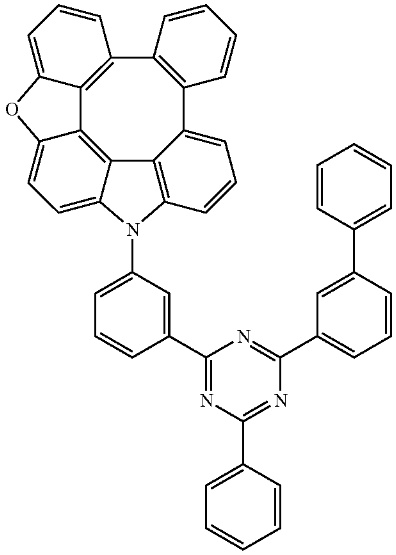
-continued
C-163
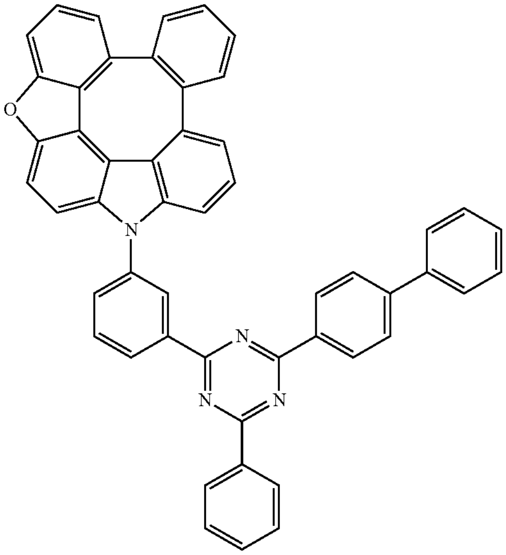
C-164
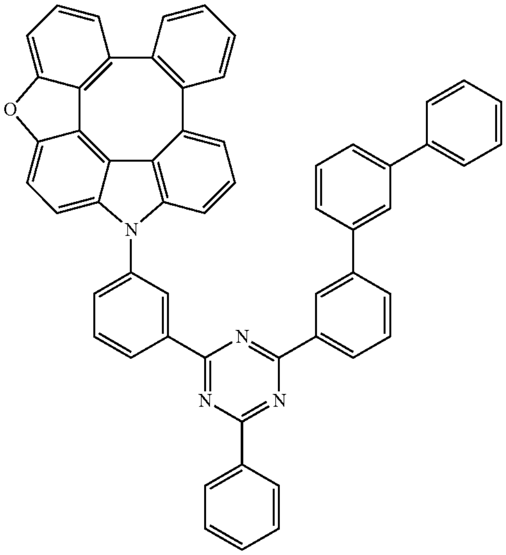

-continued
C-165
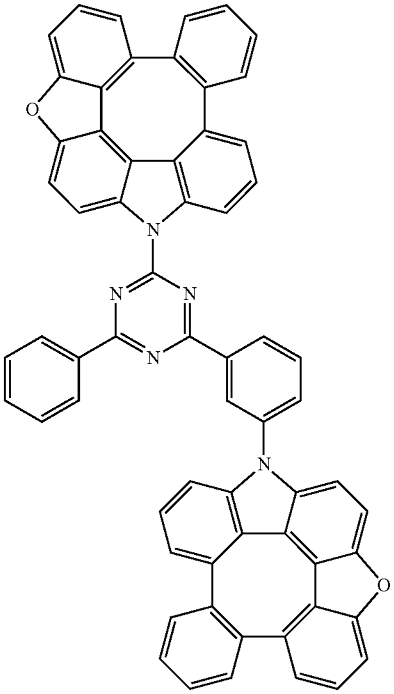
C-166
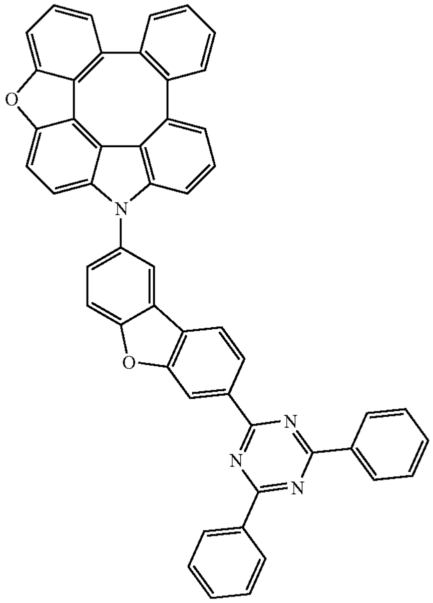
-continued
C-167
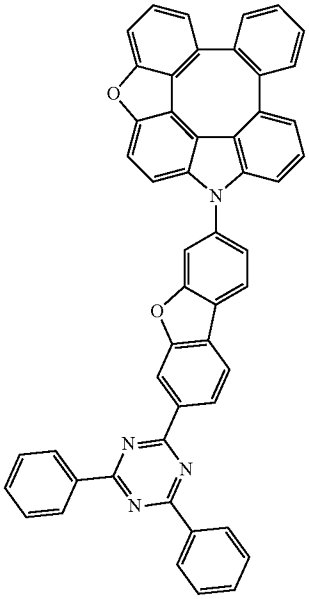
C-168
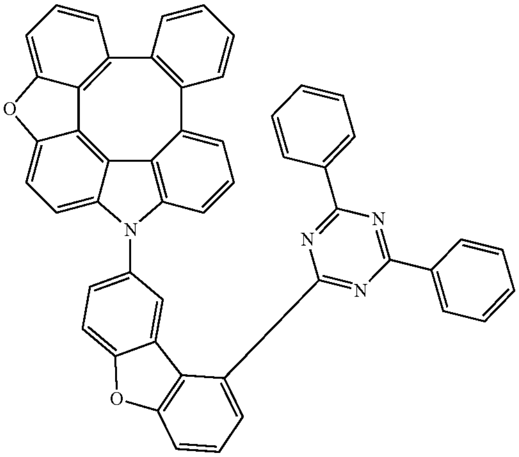
C-173
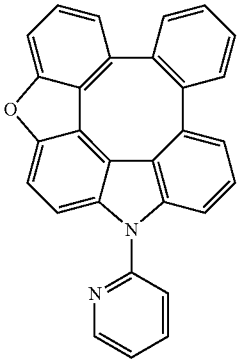

-continued
C-174
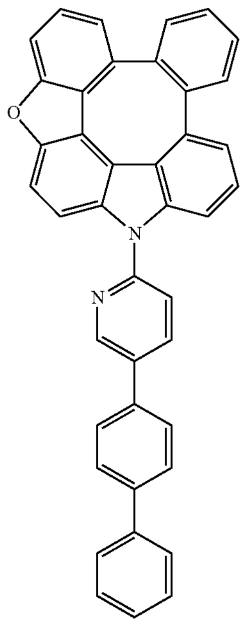
C-175
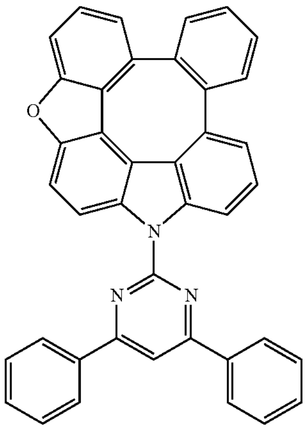
C-176
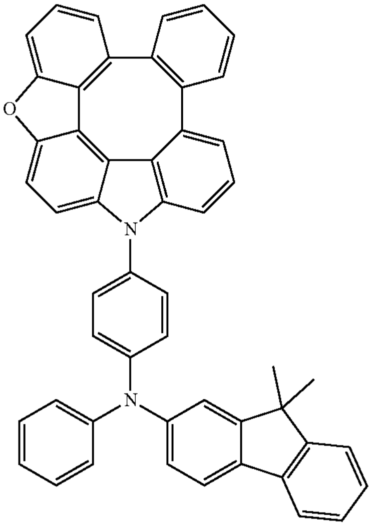
-continued
C-177
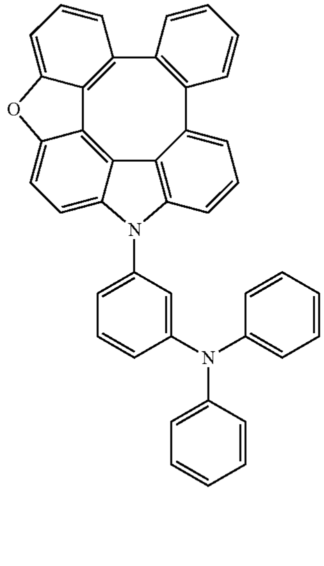
C-178
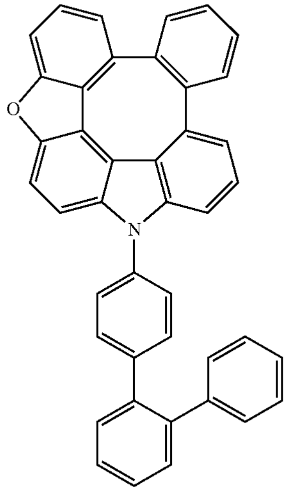
C-179
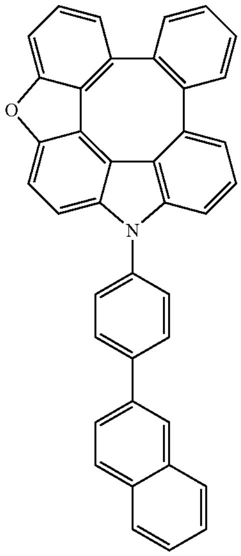

-continued
C-180
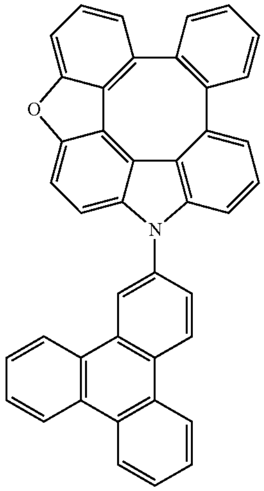
C-181
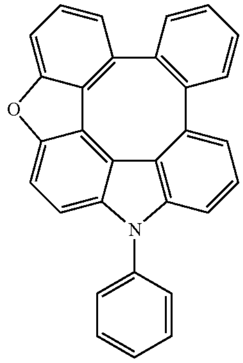
C-183
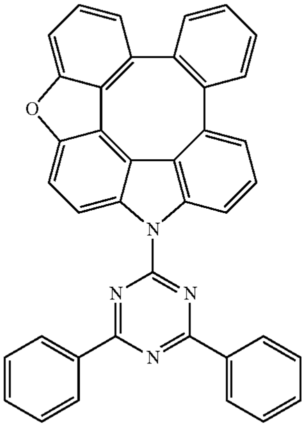
-continued
C-184
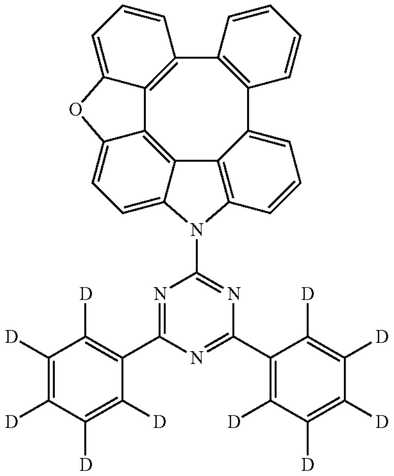
C-185
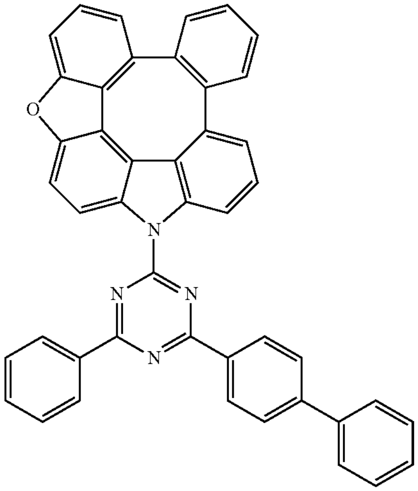
C-186
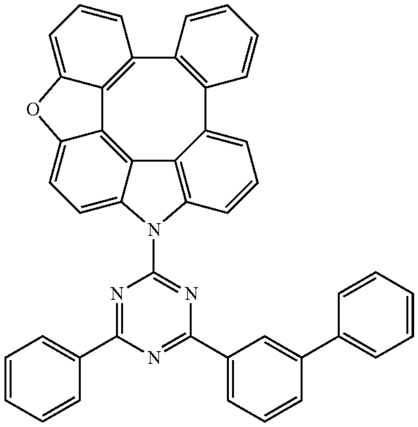

-continued
C-187
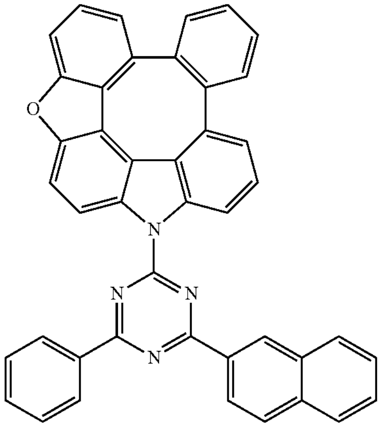
C-188
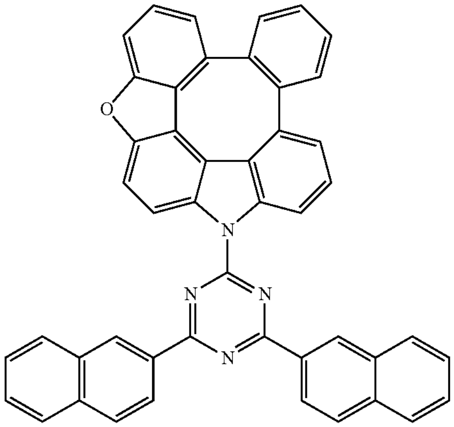
C-189
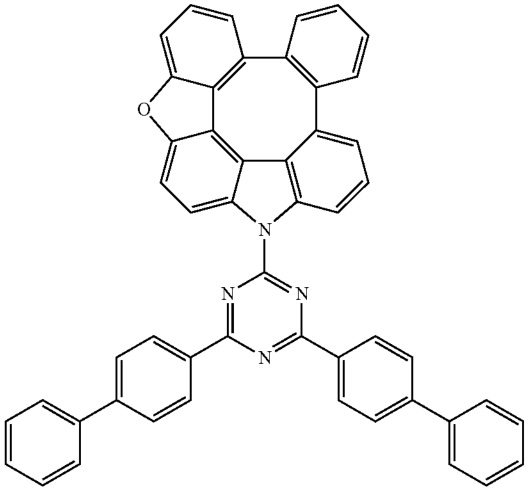
-continued
C-190
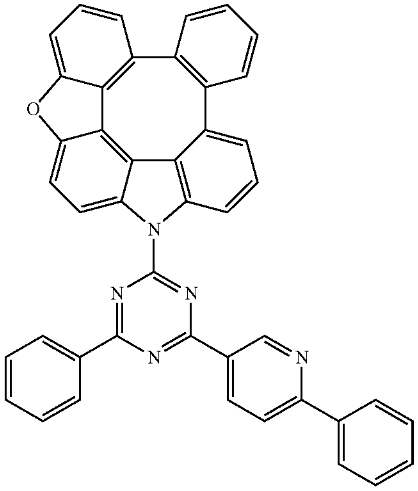
C-191
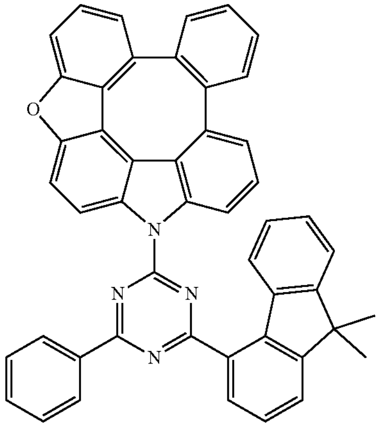
C-192
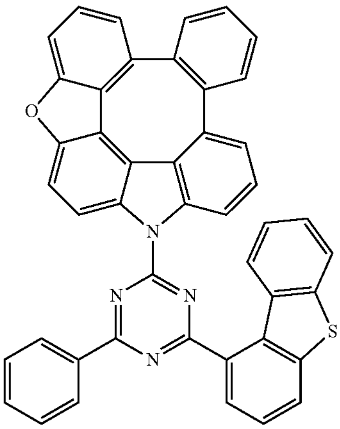

-continued
C-193
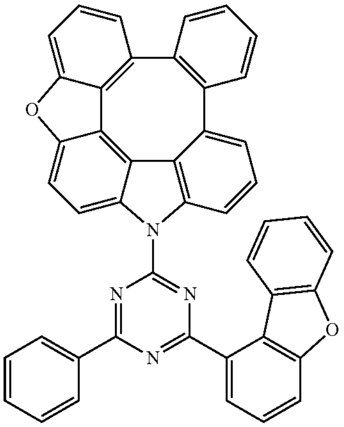
C-194
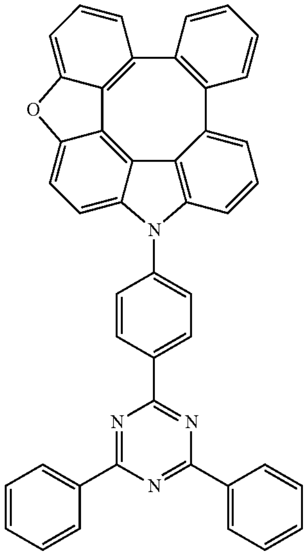
C-195
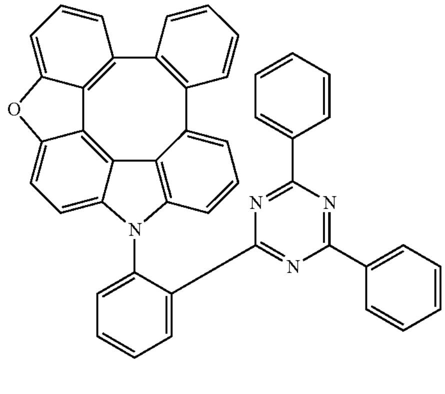
-continued
C-196
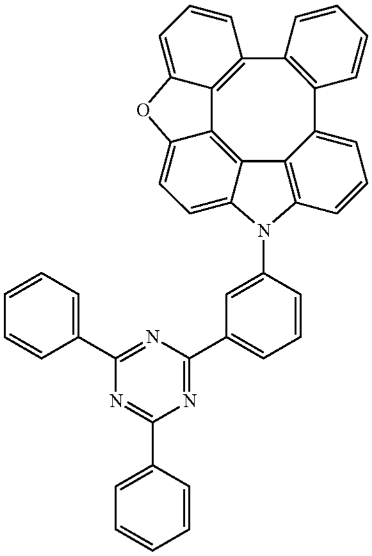
C-197
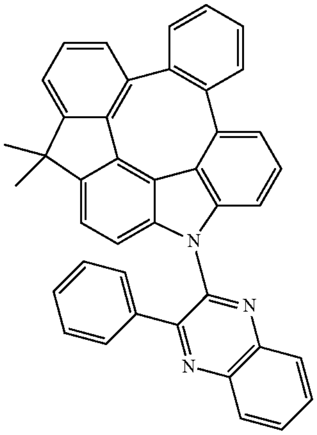
C-198
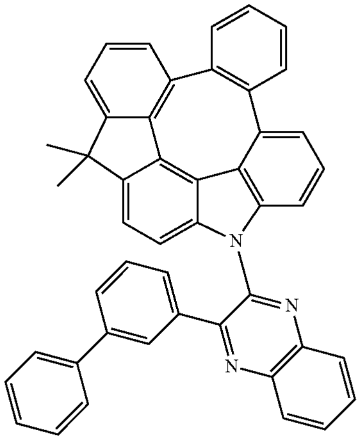

-continued
C-199
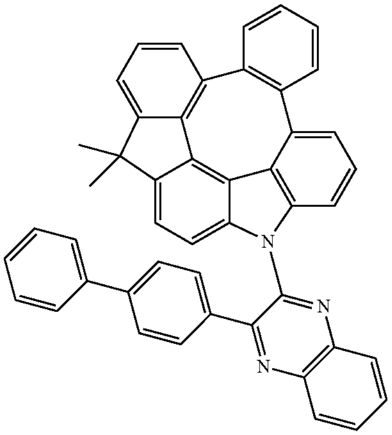
C-200
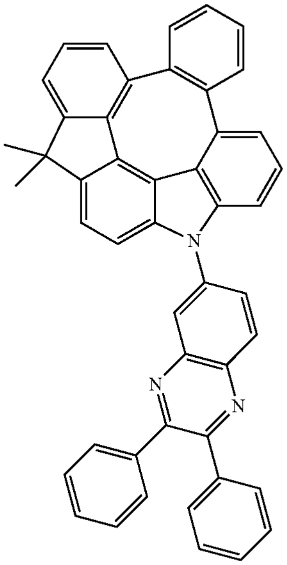
C-201
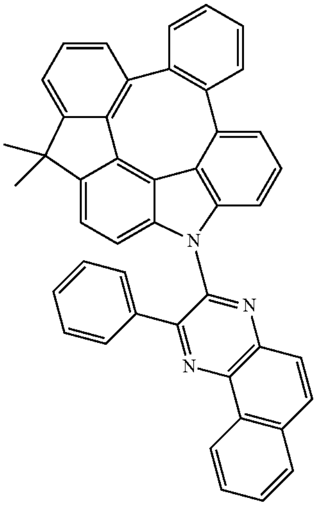
-continued
C-202
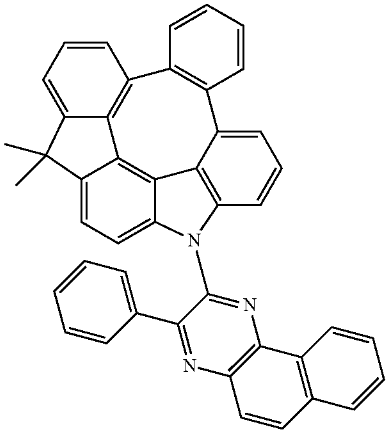
C-203
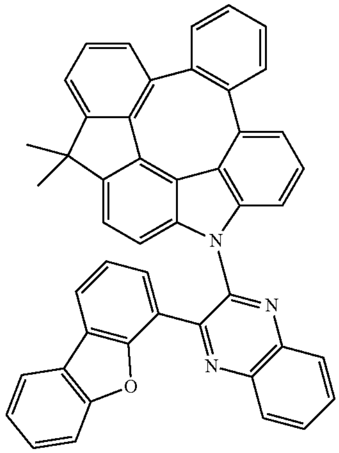
C-204
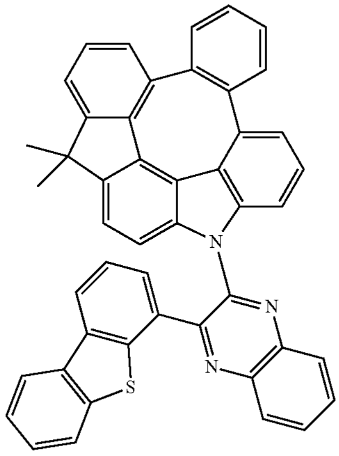

C-205
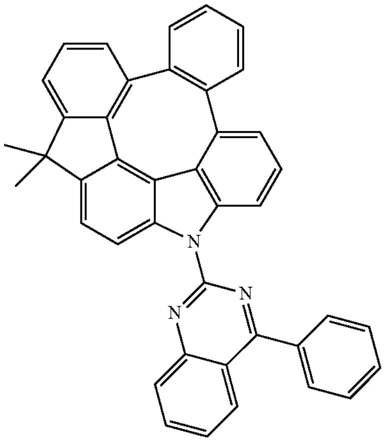
C-206
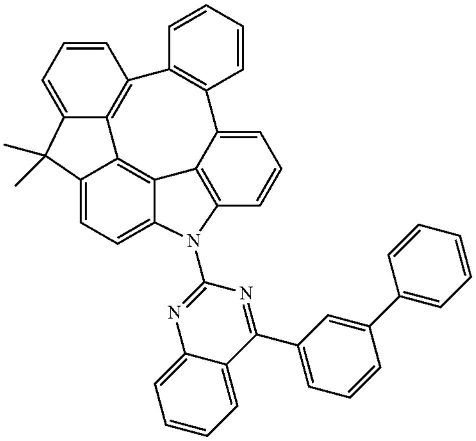
C-207
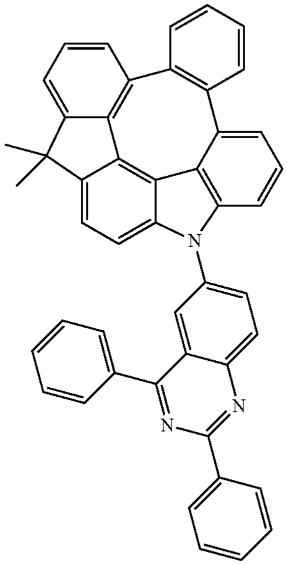
C-208
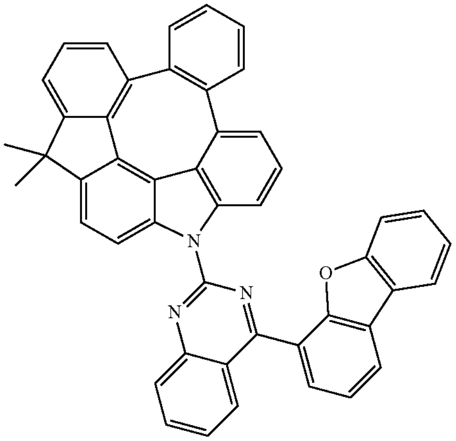
C-209
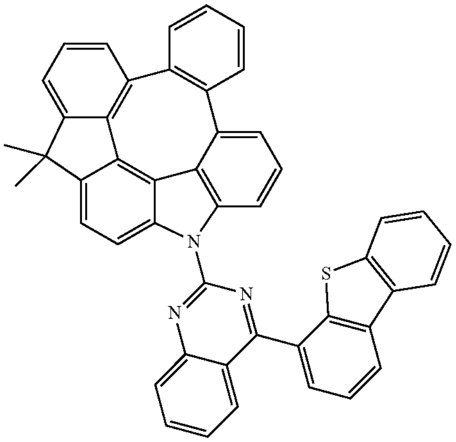
C-210
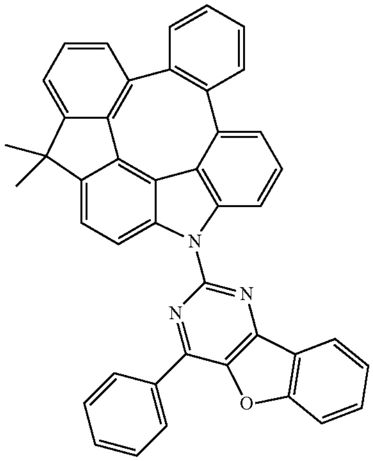

-continued
C-211
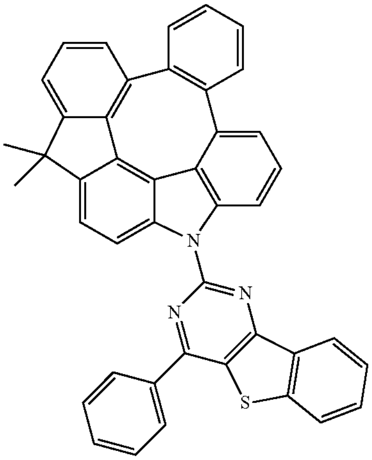
C-212
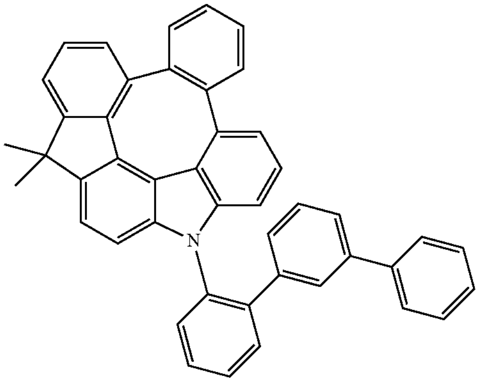
C-213
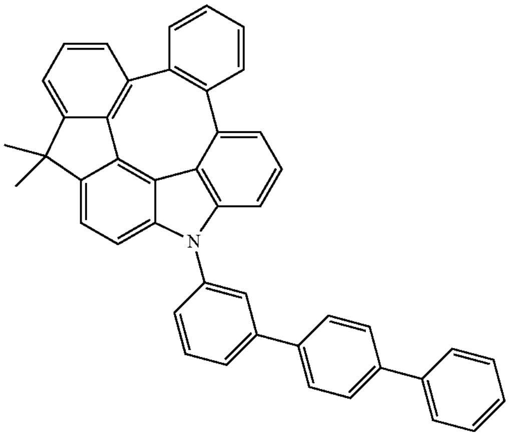
-continued
C-214
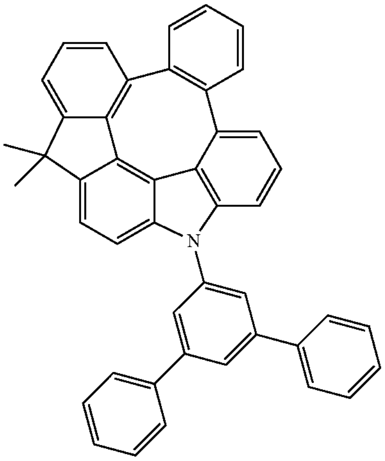
C-215
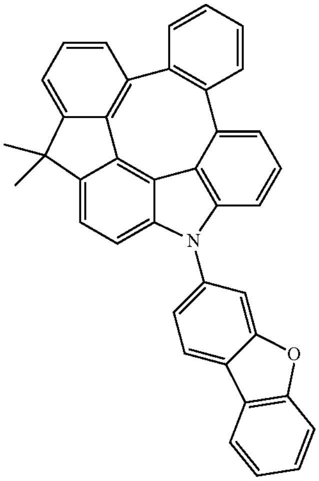
C-216
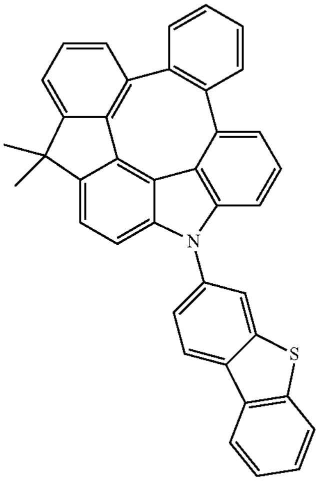

-continued
C-217
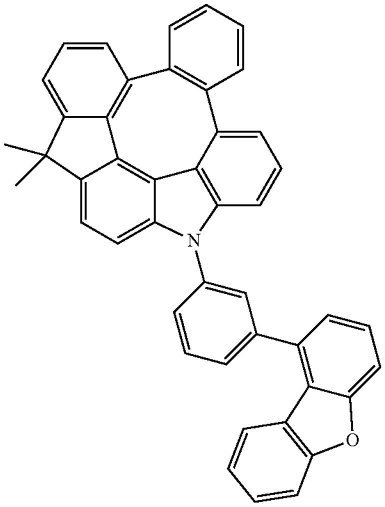
C-218
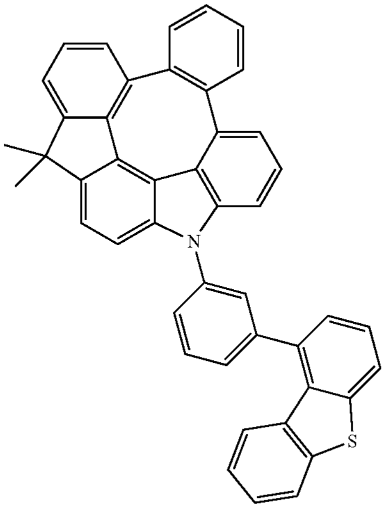
C-219
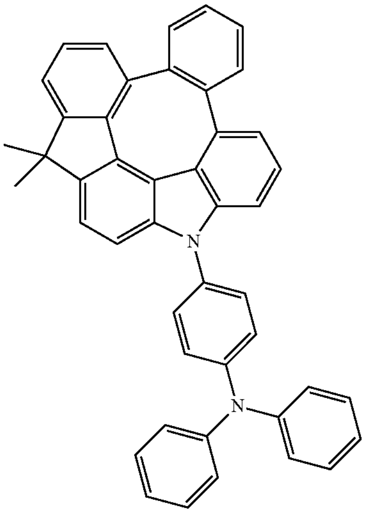
-continued
C-220
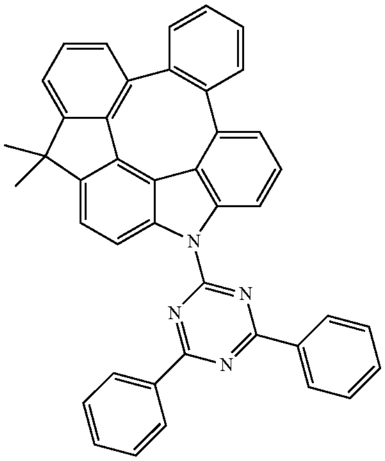
C-221
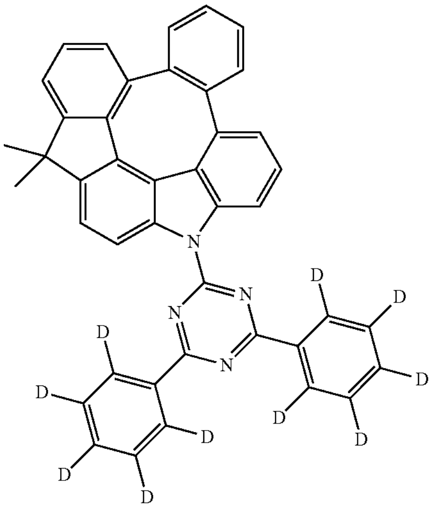
C-222
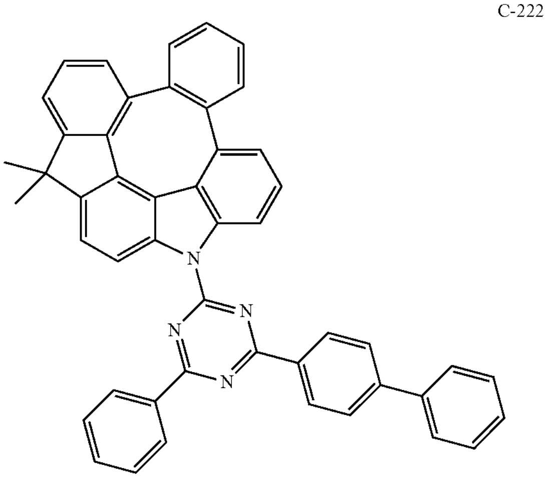

-continued
C-223
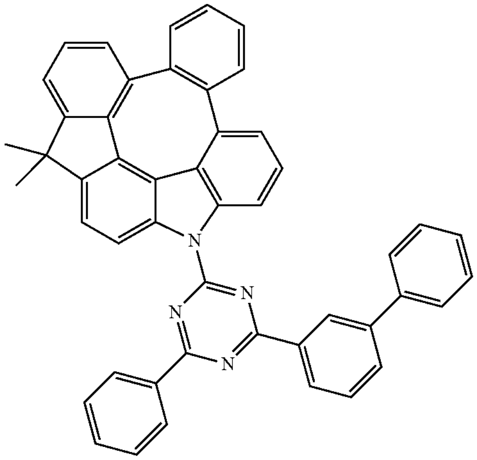
C-224
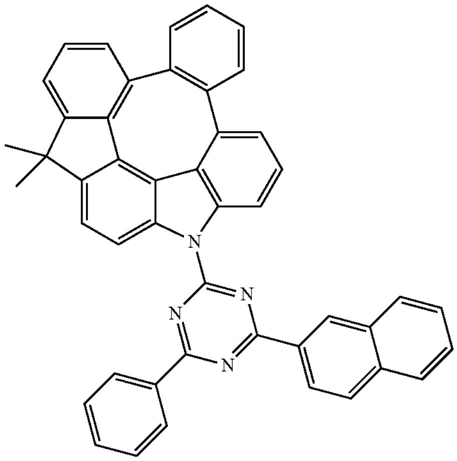
C-225
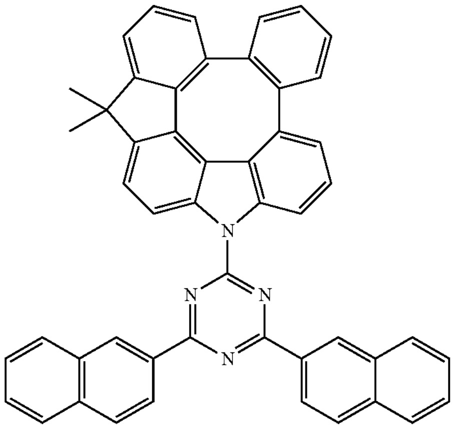
-continued
C-226
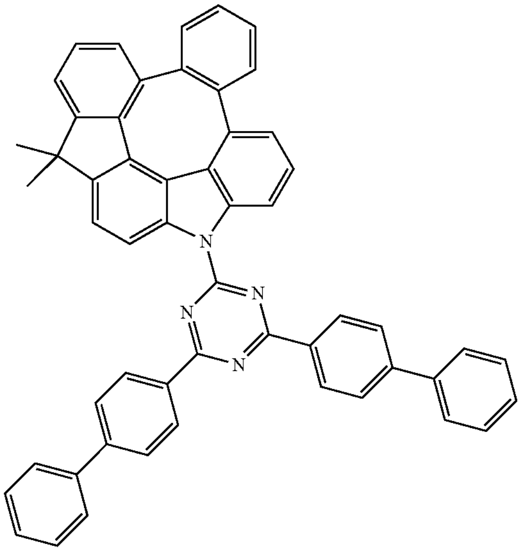
C-227
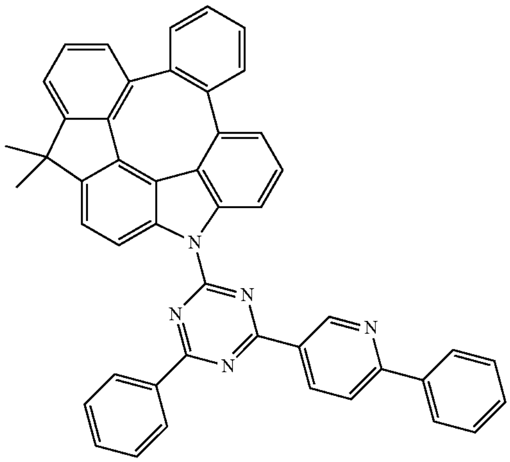
C-228
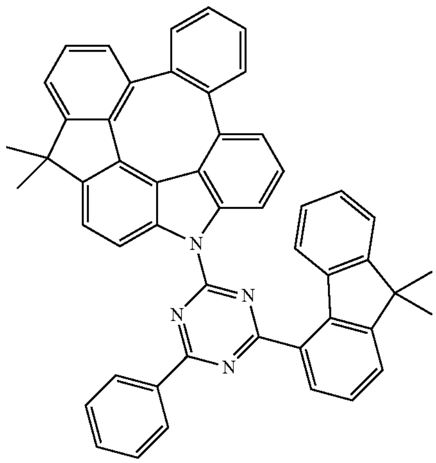

-continued
C-229
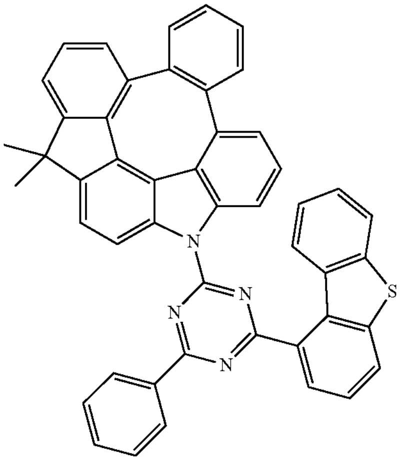
C-230
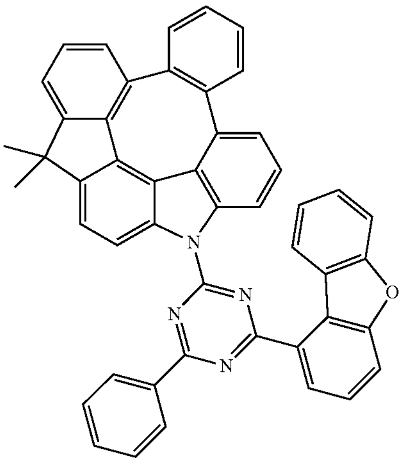
C-231
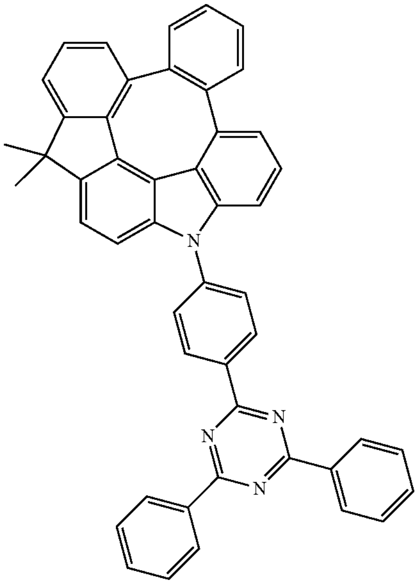
-continued
C-232
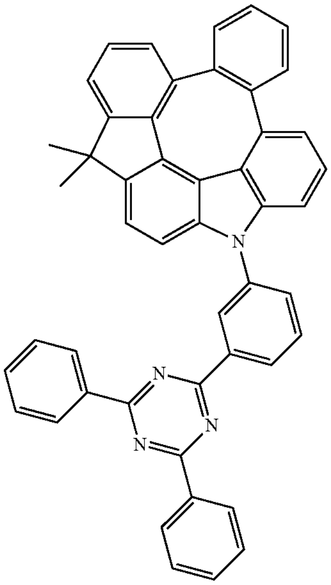
C-233
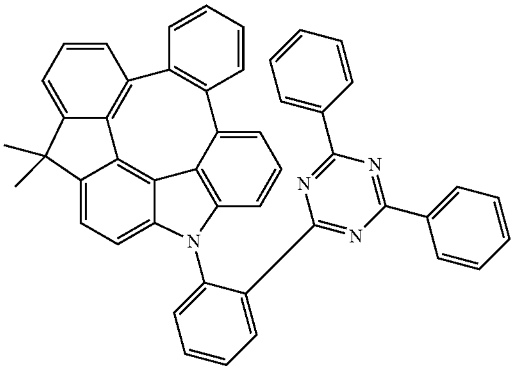
C-234
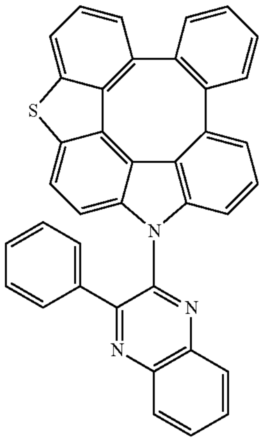

C-236
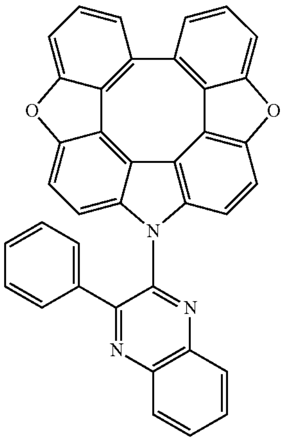
C-249
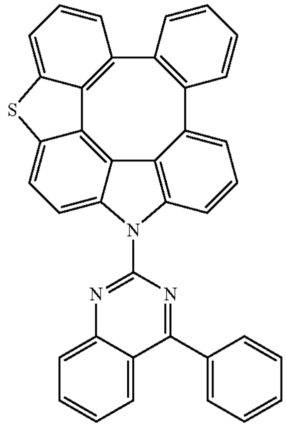
C-251
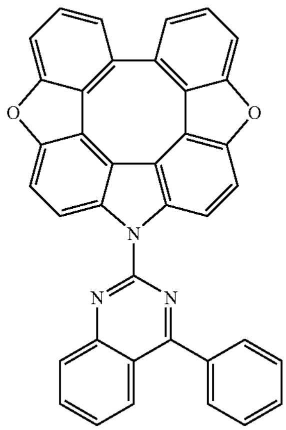
C-264
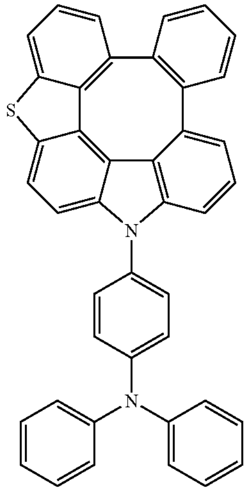
C-266
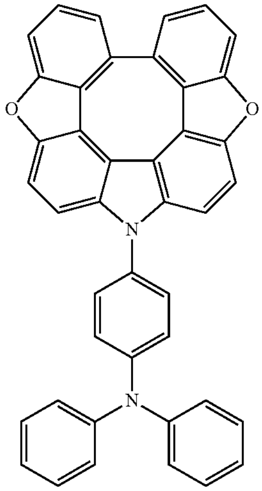
C-279
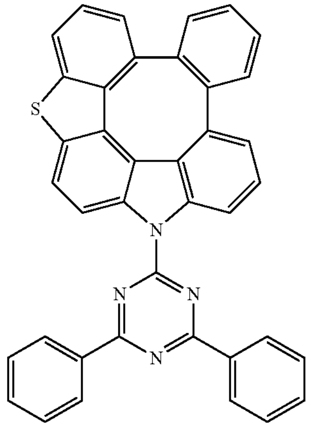

C-281
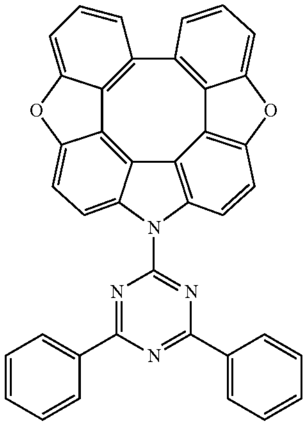
C-296
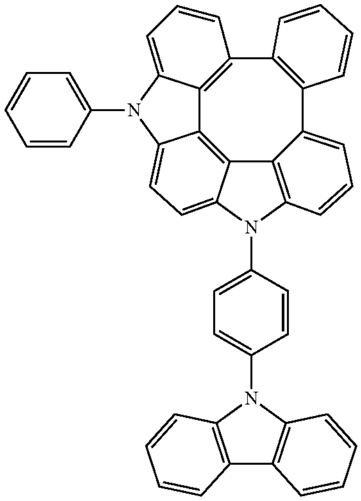
C-297
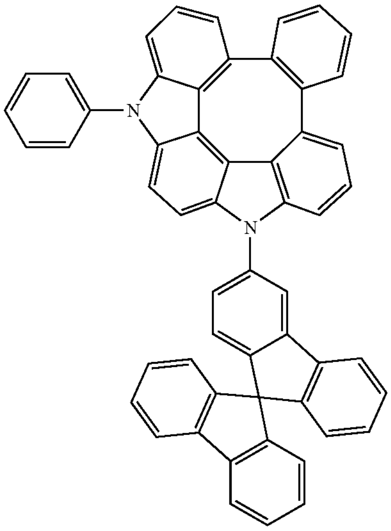
-continued
C-298
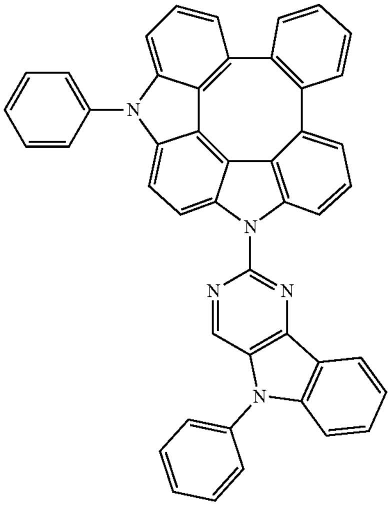
C-299
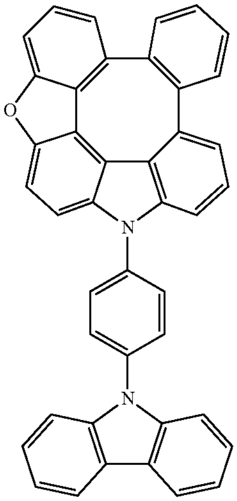
and
C-300
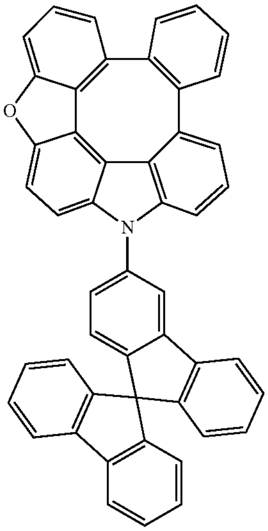
.
8. An organic electroluminescent device comprising an anode, a cathode, and at least one light-emitting layer between the anode and the cathode, wherein at least one of the light-emitting layers comprises the plurality of host materials according to claim 1.

* * * * *